United States Patent
Sato

(10) Patent No.: US 9,676,616 B2
(45) Date of Patent: Jun. 13, 2017

(54) SEMICONDUCTOR PRESSURE SENSOR AND METHOD OF FABRICATING SAME

(71) Applicant: Mitsubishi Electric Corporation, Tokyo (JP)

(72) Inventor: Kimitoshi Sato, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/956,675

(22) Filed: Dec. 2, 2015

(65) Prior Publication Data

US 2016/0272487 A1 Sep. 22, 2016

(30) Foreign Application Priority Data

Mar. 19, 2015 (JP) .................................. 2015-055907

(51) Int. Cl.
  *H01L 29/84* (2006.01)
  *B81C 1/00* (2006.01)

(52) U.S. Cl.
  CPC .. *B81C 1/00182* (2013.01); *B81B 2201/0264* (2013.01); *B81B 2203/0127* (2013.01); *B81B 2203/0307* (2013.01); *B81B 2203/04* (2013.01); *B81B 2207/015* (2013.01); *B81C 2203/0714* (2013.01); *B81C 2203/0735* (2013.01)

(58) Field of Classification Search
  CPC .... B81B 2201/0264; B81B 2203/0307; B81B 2203/04; B81B 2207/015; B81B 3/0054; B81C 1/00166; B81C 2203/0172; B81C 2203/0714
  USPC ......................................... 257/416–417, 254
  See application file for complete search history.

(56) References Cited

U.S. PATENT DOCUMENTS

| 6,167,761 B1 | 1/2001 | Hanzawa et al. | |
|---|---|---|---|
| 6,965,468 B2 * | 11/2005 | Huibers | B82Y 30/00 359/290 |
| 2002/0072144 A1 * | 6/2002 | Gogoi | G01L 9/0073 438/50 |
| 2002/0167380 A1 * | 11/2002 | Kang | H01H 59/0009 333/262 |
| 2011/0248364 A1 * | 10/2011 | Huang | B81B 7/0061 257/416 |
| 2014/0319585 A1 | 10/2014 | Sato | |

FOREIGN PATENT DOCUMENTS

| JP | H11-281509 A | 10/1999 |
|---|---|---|
| JP | 2004-526299 A | 8/2004 |
| JP | 2014-215206 A | 11/2014 |

* cited by examiner

*Primary Examiner* — Benjamin Sandvik
*Assistant Examiner* — Herve Assouman
(74) *Attorney, Agent, or Firm* — Studebaker & Brackett PC

(57) ABSTRACT

In a semiconductor pressure sensor, a fixed electrode is formed as the same layer as a diffusion layer formed to extend from a surface of a semiconductor substrate to inside of the semiconductor substrate. A void is formed by removing a sacrifice film, which is a region constituted of the same film as a floating gate electrode. A movable electrode includes an anchor portion which supports the movable electrode via the void relative to the fixed electrode and in which the sacrifice film is at least partially opened. The anchor portion has a first anchor provided to divide the movable electrode into a plurality of movable electrode units when viewed in a plan view such that one pair of adjacent movable electrode units of the plurality of movable electrode units divided share the same first anchor.

11 Claims, 95 Drawing Sheets

SEMICONDUCTOR PRESSURE SENSOR AND METHOD OF FABRICATING SAME

BACKGROUND OF THE INVENTION

Field of the Invention

The present invention relates to a semiconductor pressure sensor and a method of fabricating the semiconductor pressure sensor, particularly a semiconductor pressure sensor including a MOS circuit, and a method of fabricating such a semiconductor pressure sensor.

Description of the Background Art

In recent years, semiconductor pressure sensors are used in various fields such as in vehicles. Some semiconductor pressure sensors are integrated with MOS (Metal Oxide Semiconductor) circuits. A semiconductor pressure sensor disclosed in Japanese National Patent Publication No. 2004-526299 (Patent Document 1) will be described as this type of semiconductor pressure sensor.

The semiconductor pressure sensor has a semiconductor substrate including the following defined regions: a region (MOS region) in which a MOS circuit is formed; and a region (pressure sensor region) in which a pressure sensor is formed. In the MOS region, a MOS circuit is formed including an n channel type MOS transistor and a p channel type MOS transistor. In the pressure sensor region, a capacitive type pressure sensor is formed. The capacitive type pressure sensor includes a fixed electrode and a movable electrode, and has a vacuum chamber provided between the fixed electrode and the movable electrode. The vacuum chamber is sealed by a sealing film. The pressure is measured by detecting a change in the distance between the movable electrode and the fixed electrode as a change in the capacitance value.

Meanwhile, for the movable electrode of such a pressure sensor, an anchor for supporting the movable electrode is preferably formed as disclosed in Japanese Patent Laying-Open No. 11-281509 (Patent Document 2), for example. With this, reliability of control for position of the movable electrode relative to the fixed electrode can be improved more.

SUMMARY OF THE INVENTION

However, for example, if a plurality of movable electrodes are arranged when viewed in a plan view and one anchor is formed for each of the plurality of movable electrodes, the anchors may cause increase of the area of the entire pressure sensor region when viewed in a plan view. Japanese Patent Laying-Open No. 11-281509 does not take this into consideration.

Moreover, when the pressure sensor region and the MOS region are formed in the same semiconductor substrate and a step of forming each member of the pressure sensor is configured as a step different from a step of forming each member of the MOS circuit, the number of steps is increased, thereby presumably resulting in increased fabrication cost. Although Japanese National Patent Publication No. 2004-526299 takes this into consideration to a certain extent, there is room to reduce the number of steps.

The present invention has been made in view of the above-mentioned problem, and has an object to provide a semiconductor pressure sensor allowing for reduction of plane area of the entire pressure sensor without increasing the number of steps as well as a method of fabricating such a semiconductor pressure sensor.

A semiconductor pressure sensor of one embodiment of the present invention includes first region and second region, a pressure sensor, a transistor, an interlayer insulation film, a hole, a sealing portion, and an opening. The first region and second region are each defined in a surface of a semiconductor substrate. The pressure sensor is formed in the first region and includes a fixed electrode, a void, and a movable electrode, the void being provided above the fixed electrode, the movable electrode being provided above the void. The transistor is formed in the second region and includes a first electrode and a second electrode as a gate electrode, the second electrode being provided above the first electrode. The interlayer insulation film is formed to cover the pressure sensor and the transistor. The hole is formed in the interlayer insulation film and communicates with the void. The sealing portion seals the void. The opening is formed in the interlayer insulation film to expose the movable electrode. The fixed electrode is formed as the same layer as the first electrode. The void is formed by removing a sacrifice film, which is a region constituted of the same film as the second electrode. The movable electrode includes an anchor portion which supports the movable electrode via the void relative to the fixed electrode and in which the sacrifice film is at least partially opened. The anchor portion has a first anchor provided to divide the movable electrode into a plurality of movable electrode units when viewed in a plan view such that one pair of adjacent movable electrode units of the plurality of movable electrode units divided share the same first anchor.

A semiconductor pressure sensor of another embodiment of the present invention includes first region and second region, a pressure sensor, a transistor, an interlayer insulation film, a hole, a sealing portion, and an opening. The first region and second region are each defined in a surface of a semiconductor substrate. The pressure sensor is formed in the first region and includes a fixed electrode, a void, and a movable electrode, the void being provided above the fixed electrode, the movable electrode being provided above the void. The transistor is formed in the second region and includes a floating gate electrode. The interlayer insulation film is formed to cover the pressure sensor and the transistor. The hole is formed in the interlayer insulation film and communicates with the void. The sealing portion seals the void. The opening is formed in the interlayer insulation film to expose the movable electrode. The fixed electrode is formed as the same layer as a diffusion layer formed to extend from the surface of the semiconductor substrate to inside of the semiconductor substrate. The void is formed by removing a sacrifice film, which is a region constituted of the same film as the floating gate electrode. The movable electrode includes an anchor portion which supports the movable electrode via the void relative to the fixed electrode and in which the sacrifice film is at least partially opened. The anchor portion has a first anchor provided to divide the movable electrode into a plurality of movable electrode units when viewed in a plan view such that one pair of adjacent movable electrode units of the plurality of movable electrode units divided share the same first anchor.

A semiconductor pressure sensor of still another embodiment of the present invention includes first region and second region, a pressure sensor, a transistor, an interlayer insulation film, a hole, a sealing portion, and an opening. The first region and second region are each defined in a surface of a semiconductor substrate. The pressure sensor is formed in the first region and includes a fixed electrode, a void, and a movable electrode, the void being provided above the fixed electrode, the movable electrode being provided above the void. The transistor is formed in the second region and includes a first electrode and a second electrode as a gate electrode, the second electrode being provided above the first electrode. The interlayer insulation film is formed to cover the pressure sensor and the transistor. The hole is formed in the interlayer insulation film and communicates with the void. The sealing portion seals the void. The opening is formed in the interlayer insulation film to expose the movable electrode. The fixed electrode is formed as the same layer as a diffusion layer formed to extend from the surface of the semiconductor substrate to inside of the semiconductor substrate. The void is formed by removing a sacrifice film, which is a region constituted of the same film as the second electrode. The movable electrode includes an anchor portion which supports the movable electrode via the void relative to the fixed electrode and in which the sacrifice film is at least partially opened. The anchor portion has a first anchor provided to divide the movable electrode into a plurality of movable electrode units when viewed in a plan view such that one pair of adjacent movable electrode units of the plurality of movable electrode units divided share the same first anchor.

In a method of fabricating a semiconductor pressure sensor in one embodiment of the present invention, a first region and a second region are first defined in a surface of a semiconductor substrate, a pressure sensor being to be formed in the first region, a transistor being to be formed in the second region. A first conductor film is formed in the first and second regions. A first conductor film pattern is formed to serve as a fixed electrode in the first region and to serve as a first electrode of the transistor in the second region by patterning the first conductor film. A second conductor film is formed on the first conductor film pattern in the first and second regions. By patterning the second conductor film, a second conductor film pattern is formed to serve as a sacrifice film in the first region and serve as a second electrode provided above the first electrode of the transistor in the second region. A movable electrode is formed on the second conductor film pattern in the first region. An interlayer insulation film is formed to cover the movable electrode and the second electrode. A hole is formed at a portion of the interlayer insulation film in the first region so as to extend to the second conductor film pattern serving as the sacrifice film. A void is formed by removing the second conductor film pattern serving as the sacrifice film. A sealing portion is formed by closing the hole communicating with the void. An opening is formed at a portion of the interlayer insulation film in the first region so as to expose the movable electrode. When forming the second conductor film pattern, an opened portion is formed in the sacrifice film. When forming the movable electrode, an anchor portion is formed of the same material as the movable electrode to support the movable electrode, the anchor portion including a region formed to fill the opened portion in the sacrifice film. The anchor portion has a first anchor formed to divide the movable electrode into a plurality of movable electrode units when viewed in a plan view such that one pair of adjacent movable electrode units of the plurality of movable electrode units divided share the same first anchor.

In a method of fabricating a semiconductor pressure sensor in another embodiment of the present invention, a first region and a second region are first defined in a surface of a semiconductor substrate, a pressure sensor being to be formed in the first region, a transistor being to be formed in the second region. A diffusion layer is formed to extend from the surface of the semiconductor substrate in the first and second regions to inside of the semiconductor substrate, the diffusion layer being to serve as a fixed electrode in the first region. A first conductor film is formed in the first and second regions. A conductor film pattern is formed to serve as a sacrifice film in the first region and to serve as a first electrode of the transistor in the second region by patterning the first conductor film. A second conductor film is formed to serve as a second electrode provided above the first electrode in the second region. A movable electrode is formed on the conductor film pattern in the first region. An interlayer insulation film is formed to cover the movable electrode and the second electrode. A hole is formed at a portion of the interlayer insulation film in the first region so as to extend to the conductor film pattern serving as the sacrifice film. A void is formed by removing the conductor film pattern serving as the sacrifice film. A sealing portion is formed by closing the hole communicating with the void. An opening is formed at a portion of the interlayer insulation film in the first region so as to expose the movable electrode. When forming the conductor film pattern, an opened portion is formed in the sacrifice film. When forming the movable electrode, an anchor portion is formed of the same material as the movable electrode to support the movable electrode, the anchor portion including a region formed to fill the opened portion in the sacrifice film. The anchor portion has a first anchor formed to divide the movable electrode into a plurality of movable electrode units when viewed in a plan view such that one pair of adjacent movable electrode units of the plurality of movable electrode units divided share the same first anchor.

In a method of fabricating a semiconductor pressure sensor in still another embodiment of the present invention, a first region and a second region are first defined in a surface of a semiconductor substrate, a pressure sensor being to be formed in the first region, a transistor being to be formed in the second region. A diffusion layer is formed to extend from the surface of the semiconductor substrate in the first and second regions to inside of the semiconductor substrate, the diffusion layer being to serve as a fixed electrode in the first region. A first conductor film is formed in the second region and a second conductor film is formed in the first and second regions. A conductor film pattern is formed to serve as a sacrifice film in the first region and to serve as a second electrode of the transistor in the second region by patterning the second conductor film, the second electrode being provided above a first electrode of the transistor serving as the first conductor film. A movable electrode is formed on the conductor film pattern in the first region. An interlayer insulation film is formed to cover the movable electrode and the second electrode. A hole is formed at a portion of the interlayer insulation film in the first region so as to extend to the conductor film pattern serving as the sacrifice film. A void is formed by removing the conductor film pattern serving as the sacrifice film. A sealing portion is formed by closing the hole communicating with the void. An opening is formed at a portion of the interlayer insulation film in the first region so as to expose the movable electrode. When forming the conductor film pattern, an opened portion is formed in the sacrifice film. When forming the movable electrode, an anchor portion is formed of the same material as the movable electrode to support the movable electrode, the anchor portion including a region formed to fill the opened portion in the sacrifice film. The anchor portion has a first anchor formed to divide the movable electrode into a plurality of movable electrode units when viewed in a plan view such that one pair of adjacent movable electrode units of the plurality of movable electrode units divided share the same first anchor.

In the semiconductor pressure sensor of the present invention, one pair of adjacent movable electrode units are provided to share the same first anchor. Accordingly, the plane area of the entire pressure sensor can be reduced.

In the method of fabricating the semiconductor pressure sensor in the present invention, the fixed electrode and the sacrifice film are formed in the first region using the same layer as the film formed in the second region, thereby suppressing increase of the number of steps. Further, the previously opened portion in the sacrifice film serves as the anchor portion, whereby a necessary minimum area of the first anchor can be formed precisely and the plane area of the entire pressure sensor can be reduced by sharing the first anchor between the plurality of movable electrode units.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (First Embodiment)

The following describes an embodiment of the present invention based on figures.

Described first is a configuration of a semiconductor pressure sensor (semiconductor pressure sensor device 10) of the present embodiment with reference to FIG. 1 to FIG. 4.

Figure 1:
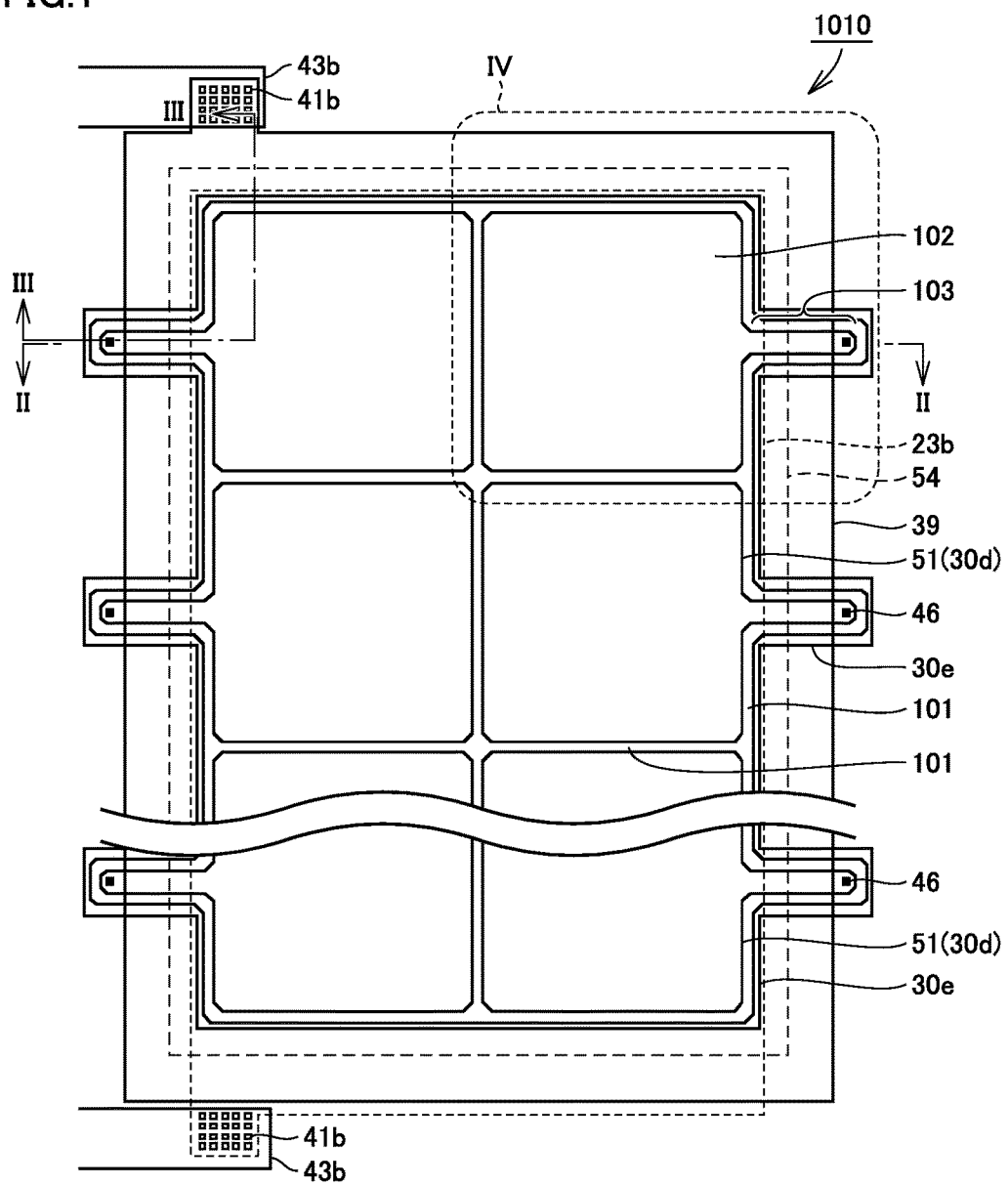
FIG. 1 is a schematic plan view showing a configuration of a detection pressure sensor of a first embodiment.
Figure 2:
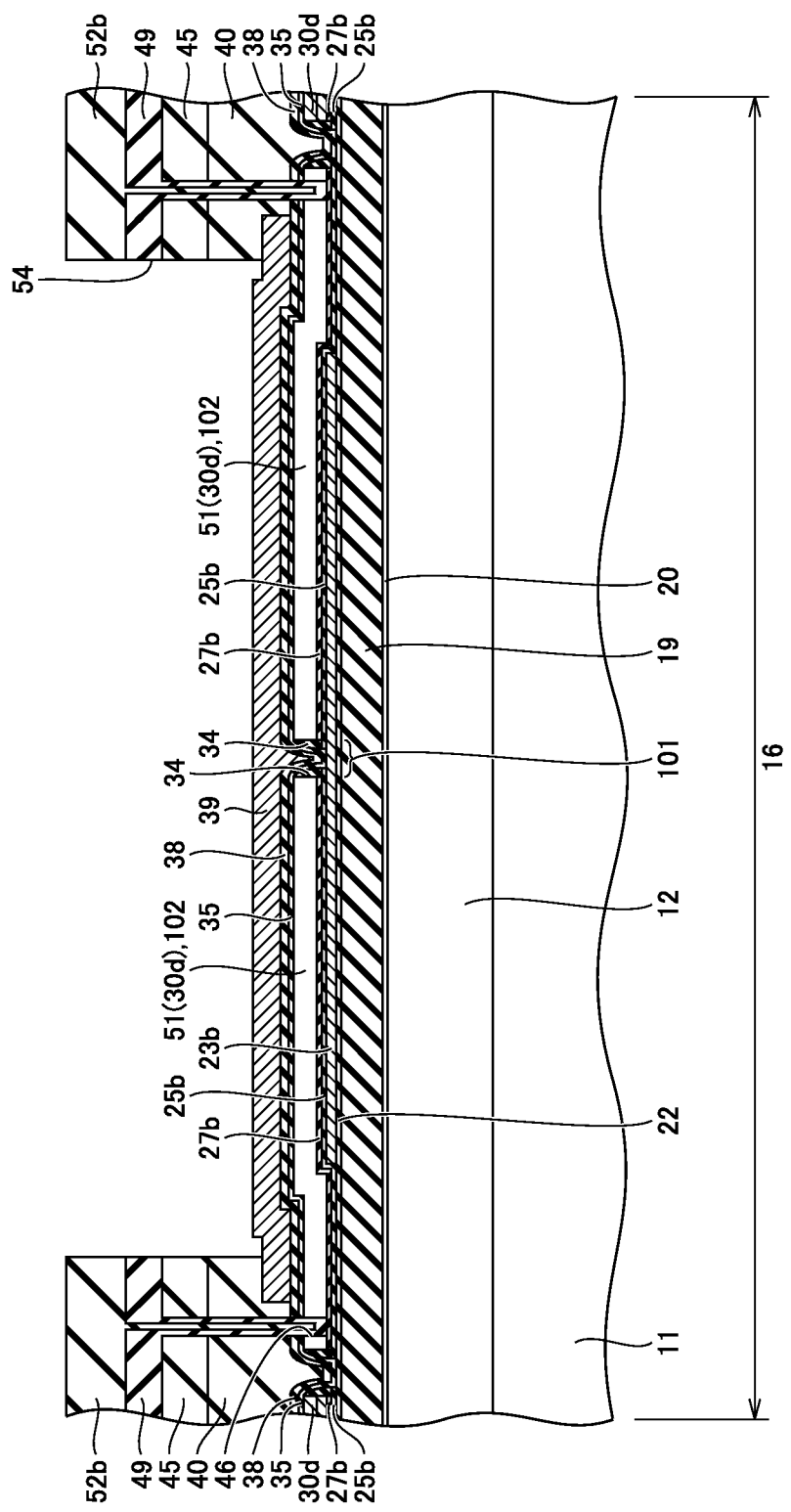
FIG. 2 is a schematic cross sectional view of a first region surrounded by a II-II line of FIG. 1.

With reference to FIG. 1 and FIG. 2, a detection pressure sensor 1010 included in semiconductor pressure sensor device 10 of the present embodiment is an exemplary pressure sensor and is formed in a pressure sensor region 16 (first region) defined in a surface (upper main surface) of a silicon substrate 11, which is a semiconductor substrate, for example.

Detection pressure sensor 1010 of the present embodiment has capacitance due to a fixed electrode 23b indicated by a dotted line in FIG. 1, a vacuum chamber 51 provided above fixed electrode 23b as a void, and a movable electrode 39 provided above vacuum chamber 51. Vacuum chamber 51 is formed by removing a conductor film 30d serving as a sacrifice film mentioned later. It should be noted that in FIG. 1, the end portion of vacuum chamber 51 formed by removing conductor film 30d is denoted as a conductor film end portion 30e.

Movable electrode 39 has a generally rectangular shape in FIG. 1 but may partially have a projection or the like. In detection pressure sensor 1010, this movable electrode 39 includes a detection anchor 101 (first anchor), and is divided by this detection anchor 101 into a plurality of regions, i.e., movable electrode units 102 (when viewed in a plan view). Here, the plurality of movable electrode units 102 each having a rectangular shape are provided in the form of matrix.

Therefore, a pair of movable electrode units 102 adjacent to each other with detection anchor 101 being interposed therebetween when viewed in a plan view are provided to share a region of the same detection anchor 101. That is, here, by the same detection anchor 101 formed in a region interposed between movable electrode units 102 arranged in two rows in the horizontal direction of FIG. 1, movable electrode 39 (respective movable electrode units 102) is supported relative to fixed electrode 23b via vacuum chamber 51.

Further, the plurality of movable electrode units 102 in FIG. 1 are provided in a manner symmetrical to, for example, detection anchor 101 extending, in the vertical direction of the figure, at the central portion in the horizontal direction of FIG. 1. It should be noted that the end portion of movable electrode unit 102 in FIG. 1 (substantially the same as conductor end portion 30e) does not match with the end portion of movable electrode 39 in a strict sense, and the end portion of movable electrode unit 102 (substantially the same as conductor end portion 30e) is provided to partially project relative to the end portion of movable electrode 39. However, at least in most of the region of the central portion when viewed in a plan view, detection anchor 101 divides movable electrode 39 into the plurality of movable electrode units 102 and therefore can be regarded as a reference for a boundary portion at which movable electrode 39 is divided into the plurality of movable electrode units 102. Hence, movable electrode units 102 (plurality of regions obtained by dividing movable electrode 39) each can be defined herein as a region, inclusive of the projecting region when it projects externally relative to the end portion of movable electrode 39, surrounded by detection anchor 101 extending in the form of a line in FIG. 1 (i.e., each region divided by detection anchor 101 extending in the form of a line).

The range of each movable electrode unit 102 is substantially the same as the range of vacuum chamber 51. Therefore, in FIG. 1, a total of six movable electrode units 102 are provided in three columns in the longitudinal direction and in two rows in the lateral direction, and each of movable electrode units 102 has a region projecting relative to movable electrode 39.

It should be noted that in FIG. 1, each of detection pressure sensor 1010 and movable electrode units 102 included therein has a rectangular planar shape, but the shape is not limited to this and they may have a circular planar shape, for example. For example, movable electrode unit 102 having a hexagonal or circular planar shape can reduce the maximum stress during application of pressure to movable electrode 39, as compared with movable electrode unit 102 having a rectangular shape.

The upper main surface of silicon substrate 11 is provided with a p type well region 12 described below. Moreover, a field oxide film 19 is formed on the surface of silicon substrate 11 in p type well region 12. Field oxide film 19 has a lowermost portion provided with a channel stopper 20.

In pressure sensor region 16, a first gate oxide film 22 is formed on field oxide film 19, and fixed electrode 23b is formed on first gate oxide film 22 particularly at (a portion of) a region just below movable electrode 39. In order to cover fixed electrode 23b, a first fixed electrode protection film 25b and a second fixed electrode protection film 27b are formed in this order on first gate oxide film 22. Vacuum chamber 51 (obtained by removing conductor film 30d therefrom) is formed above second fixed electrode protection film 27b, and has an end portion (conductor film end portion 30e in FIG. 1) at which a side wall oxide film 34 is formed. Furthermore, a silicon oxide film 35 and a TEOS (Tetra Ethyl Ortho Silicate glass) based oxide film 38 are formed in this order above vacuum chamber 51. Moreover, movable electrode 39 is formed on TEOS-based oxide film 38.

Silicon oxide film 35 and TEOS-based oxide film 38 are formed in contact with the lower surface of movable electrode 39, and serve as films for protecting movable electrode 39 when forming vacuum chamber 51 as a void by etching and removing conductor film 30d serving as a sacrifice film as described below. Etching selectivity between polycrystalline silicon based conductor film 30d and each of oxide film based silicon oxide film 35 and TEOS-based oxide film 38 is sufficiently high such as about not less than 5000 and not more than 10000 when TMAH (Tetra Methyl Ammonium Hydroxide), $XeF_2$, and the like are used to etch conductor film 30d. Accordingly, the thickness of each of silicon oxide film 35 and TEOS-based oxide film 38 can be thinned to be about not less than 10 nm and not more than 50 nm.

At the center in the horizontal direction of FIG. 2, vacuum chamber 51 is partially open. In other words, in this portion, conductor film 30d serving as the sacrifice film, by using which vacuum chamber 51 is formed, is removed by patterning, and is accordingly opened to expose the surface just therebelow. In the opened region formed by removing this conductor film 30d, silicon oxide film 35 and TEOS-based oxide film 38 are formed in this order directly on fixed electrode 23b with no vacuum chamber 51 (conductor film 30d) being interposed therebetween, and movable electrode 39 is formed to cover TEOS-based oxide film 38 and to be thicker than other regions. In this way, vacuum chamber 51 is at least partially provided with the opened region by partially opening conductor film 30d by means of the patterning and then movable electrode 39 is formed to fill the region and project downward (to be thicker than other regions), thereby forming detection anchor 101 as an anchor portion. Therefore, the anchor portion is included in movable electrode 39.

In pressure sensor region 16, vacuum chamber 51 has not only an overlapping region overlapping with movable electrode 39 when viewed in a plan view, but also a drawn region 103 extending in an elongated manner to be drawn therefrom toward a non-overlapping region external to the overlapping region. In order to cover movable electrode 39, a first interlayer insulation film 40 (interlayer insulation film) and a second interlayer insulation film 45 (interlayer insulation film) are formed on TEOS-based oxide film 38. Here, at the non-overlapping region not overlapping with movable electrode 39 in pressure sensor region 16, an etching hole 46 (hole) is formed in first interlayer insulation film 40 and second interlayer insulation film 45. Specifically, etching hole 46 is formed in drawn region 103 in which movable electrode unit 102 externally projects relative to movable electrode 39 in FIG. 1.

In the non-overlapping region (drawn region 103), etching hole 46 is formed to extend from the uppermost surface of second interlayer insulation film 45, through second interlayer insulation film 45 and first interlayer insulation film 40, to vacuum chamber 51 just therebelow.

It should be noted that because etching hole 46 extends through vacuum chamber 51, vacuum chamber 51 is substantially provided with an opening by etching hole 46. However, it is defined herein that vacuum chamber 51 is opened by detection anchor 101 to divide into the plurality of movable electrode units 102, and is not to divide into the plurality of movable electrode units 102 by etching hole 46.

By etching and removing conductor film 30d (which is the same layer as gate electrodes 30a, 30b, 30c described below) from above via etching hole 46, a void (vacuum chamber 51) is formed in the region in which conductor film 30d has been formed. Accordingly, etching hole 46 communicates with vacuum chamber 51.

On the surface of second interlayer insulation film 45, a first sealing film 49 and a second sealing film 52b are provided in this order. First sealing film 49 is formed on second interlayer insulation film 45 to cover the inner wall surface of etching hole 46, and second sealing film 52b is formed on first sealing film 49 to cover first sealing film 49 in etching hole 46 and, for example, fill the inside of etching hole 46.

These first sealing film 49 and second sealing film 52b are formed in etching hole 46, whereby regions communicating vacuum chamber 51 and etching hole 46 with each other are closed from outside vacuum chamber 51. Thus, first sealing film 49 and second sealing film 52b serve to a sealing portion for vacuum chamber 51 in etching hole 46 (i.e., sealing portion blocking vacuum chamber 51 from external air).

As described above, in pressure sensor region 16, first interlayer insulation film 40, second interlayer insulation film 45, first sealing film 49, and second sealing film 52b are provided in this order to cover the pressure sensor. However, first interlayer insulation film 40, second interlayer insulation film 45, first sealing film 49, and second sealing film 52b are removed from most of the region (central portion) overlapping with movable electrode 39 when viewed in a plan view, with the result that a pressure sensor opening 54 (opening) is formed in this region to expose movable electrode 39.

Figure 3:
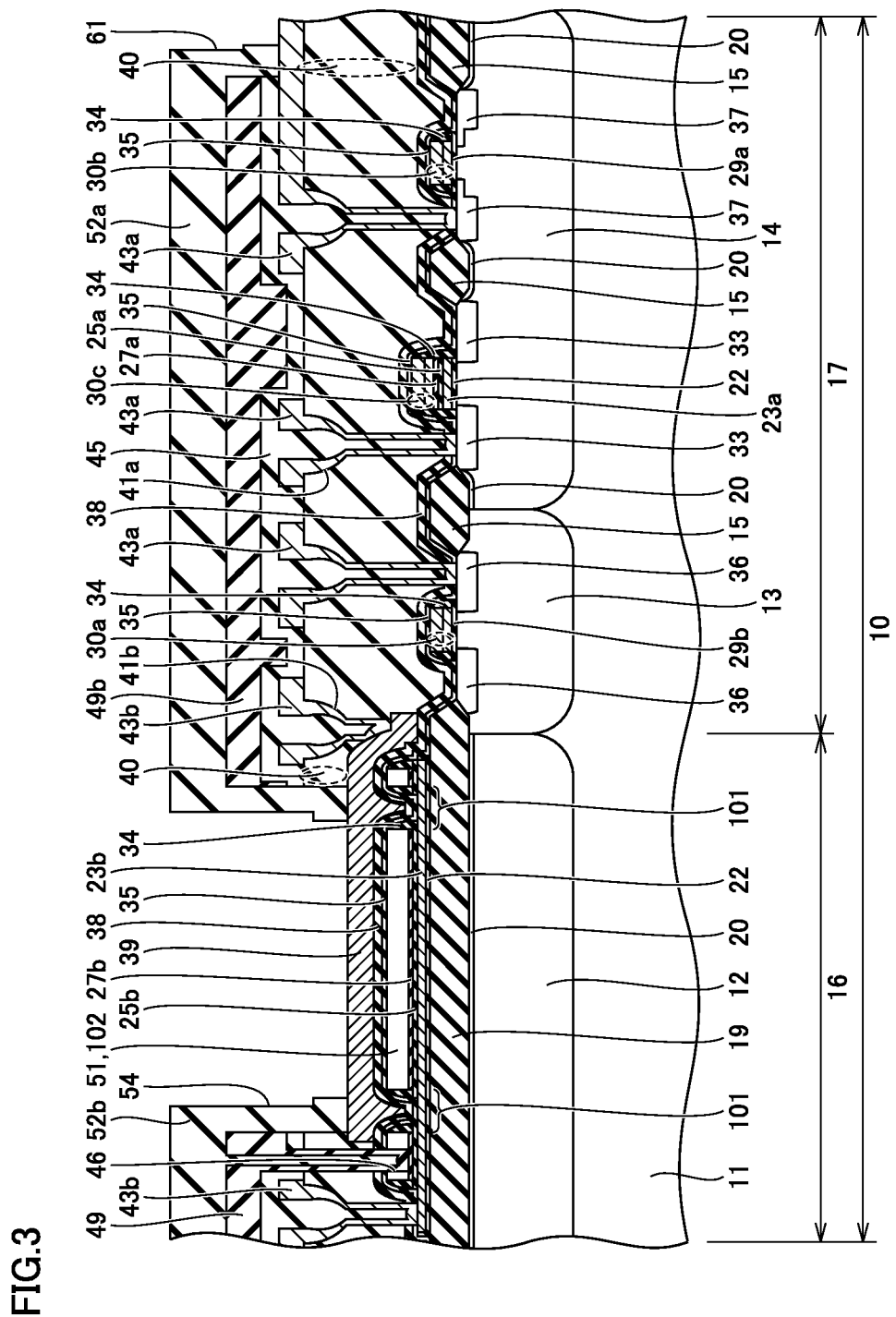
FIG. 3 is a schematic cross sectional view showing configurations of a first region surrounded by a III-III line of FIG. 1 and a second region defined around the first region.

With reference to FIG. 1 and FIG. 3, when the region having the pressure sensor (detection pressure sensor 1010) formed therein is viewed in a direction (cross section) different from FIG. 2, it is understood that a contact hole 41b and an interconnection 43b are formed. Contact hole 41b is a hole portion formed to extend from the uppermost surface of first interlayer insulation film 40 to fixed electrode 23b or movable electrode 39 just therebelow. Interconnection 43b is formed of a conductor film formed on the uppermost surface of first interlayer insulation film 40 around contact hole 41b to fill at least part of contact hole 41b, and is a member for electrically connecting to fixed electrode 23b or movable electrode 39.

Hereinafter, with reference to particularly FIG. 3, in semiconductor pressure sensor device 10 of the present embodiment, a MOS region 17 (second region) is defined in the surface of silicon substrate 11 in addition to pressure sensor region 16 having detection pressure sensor 1010 formed therein. In MOS region 17, the following three transistors are formed with a space interposed therebetween in the horizontal direction of FIG. 3: a p channel type MOS transistor at the leftmost side; an n channel type MOS transistor at the rightmost side; and an EPROM (Erasable Programmable Read Only Memory), which serves as a memory cell transistor, at the center. Thus, MOS region 17 is a region provided with the memory cell transistor and the like each serving as an MOS circuit.

In the surface of silicon substrate 11 in MOS region 17, an n type well region 13 and a p type well region 14 are formed, for example. The p channel type MOS transistor is formed in n type well region 13, whereas the EPROM and the n channel type MOS transistor are formed in p type well region 14. The p channel type MOS transistor, the EPROM, and the n channel type MOS transistor are separated from each other when viewed in a plan view by field oxide film 15 formed on the surface of silicon substrate 11.

The p channel type MOS transistor has one pair of p type source/drain regions 36, a third gate oxide film 29b, and a gate electrode 30a. Each of the pair of p type source/drain regions 36 is formed in the surface of silicon substrate 11 with a space interposed therebetween. On the surface of silicon substrate 11 between the pair of p type source/drain regions 36, gate electrode 30a is formed with third gate oxide film 29b being interposed therebetween. Gate electrode 30a has a side wall on which side wall oxide film 34 serving as the TEOS film is formed, for example.

The n channel type MOS transistor has one pair of n type source/drain regions 37, a third gate oxide film 29a, a gate electrode 30b, and side wall oxide film 34. Their structures are the same as those of the p channel type MOS transistor.

The EPROM has one pair of n type source/drain regions 33, and in addition to these, has a structure such that first gate oxide film 22, a polycrystalline silicon film 23a serving as a floating gate electrode (first electrode), a second gate oxide film 25a, a first silicon nitride film 27a, and a gate electrode 30c (second electrode) are laminated on one another. A combination of polycrystalline silicon film 23a and gate electrode 30c is defined as a gate electrode of the whole of the EPROM. The laminated structure has a side wall on which side wall oxide film 34 is formed. Among these, polycrystalline silicon film 23a is formed as the same layer as fixed electrode 23b of pressure sensor region 16 (using the same material).

Thin silicon oxide film 35 and TEOS-based oxide film 38 are formed in this order so as to cover the p channel type MOS transistor, the EPROM, the n channel type MOS transistor, and field oxide film 15 that separates them from each other.

As with pressure sensor region 16, also in MOS region 17, first interlayer insulation film 40, second interlayer insulation film 45, third interlayer insulation film 49b, and a passivation film 52a are laminated on one another in this order to cover each of the above-mentioned elements. It should be noted that third interlayer insulation film 49b is the same layer as first sealing film 49 of pressure sensor region 16, and passivation film 52a (protection film) is the same layer as second sealing film 52b (formed on interlayer insulation films 40, 45) of pressure sensor region 16. It should be also noted that a contact hole 41a is formed to extend from the uppermost surface of first interlayer insulation film 40 to n type source/drain regions 33, 37 and p type source/drain region 36 just therebelow, and an interconnection 43a is formed by a conductor film that at least partially fills contact hole 41a. Interconnection 43a is formed on a portion of the region of the uppermost surface of first interlayer insulation film 40. A portion of interconnection 43a on the portion of the region of the uppermost surface of this first interlayer insulation film 40 is exposed through a pad opening 61 provided in second interlayer insulation film 45, third interlayer insulation film 49b, and passivation film 52a just thereabove.

Figure 4:
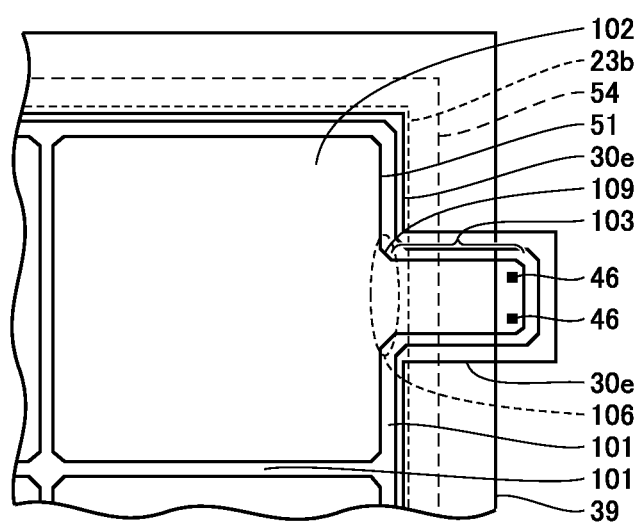
FIG. 4 is an enlarged schematic plan view of a region IV surrounded by a dotted line of FIG. 1, i.e., a movable electrode unit.

With reference to FIG. 4, although one etching hole 46 is formed for each drawn region 103 in FIG. 1, two etching holes 46 may be formed and arranged for each drawn region 103.

Moreover, in a movable electrode drawn root portion 106, which is a root portion of drawn region 103 of movable electrode unit 102, a stress relaxation chamfering 109 may be formed to have a so-called C-plane shape (shape extending in a direction angled by 45° relative to each of the longitudinal direction and the lateral direction of FIG. 4), while stress relaxation chamfering 109 is a portion essentially supposed to be substantially orthogonally bent.

When etching hole 46 is formed in the tip portion of drawn region 103 as in the present embodiment, the maximum stress is exerted to a detection anchor edge portion of movable electrode drawn root portion 106 (portion of detection anchor 101 in contact with movable electrode drawn root portion 106) under application of pressure to movable electrode 39. The stress can be relaxed by providing stress relaxation chamfering 109 as described above, thereby improving the maximum value of pressure that can be applied so as not to cause breakage of movable electrode 39.

Here, an operation principle of the pressure sensor will be illustrated briefly. In the pressure sensor, the surface side of movable electrode 39 is exposed to an external space via pressure sensor opening 54 by way of pressure externally applied to movable electrode 39. Accordingly, movable electrode 39 is displaced in the thickness direction (vertical direction), thereby changing a space between fixed electrode 23b and movable electrode 39. This change of space is detected as an amount of change of capacitance value constituted of fixed electrode 23b and movable electrode 39, whereby the magnitude of the applied pressure is measured. Further, semiconductor pressure sensor device 10 can function as an absolute pressure sensor by setting the pressure in vacuum chamber 51 located just below movable electrode 39 as the reference pressure.

Next, with reference to FIG. 5 to FIG. 30 and FIG. 2 and FIG. 3, the following describes a method of fabricating the semiconductor pressure sensor (semiconductor pressure sensor device 10) including detection pressure sensor 1010 and the MOS circuits of the present embodiment.

Figure 5:
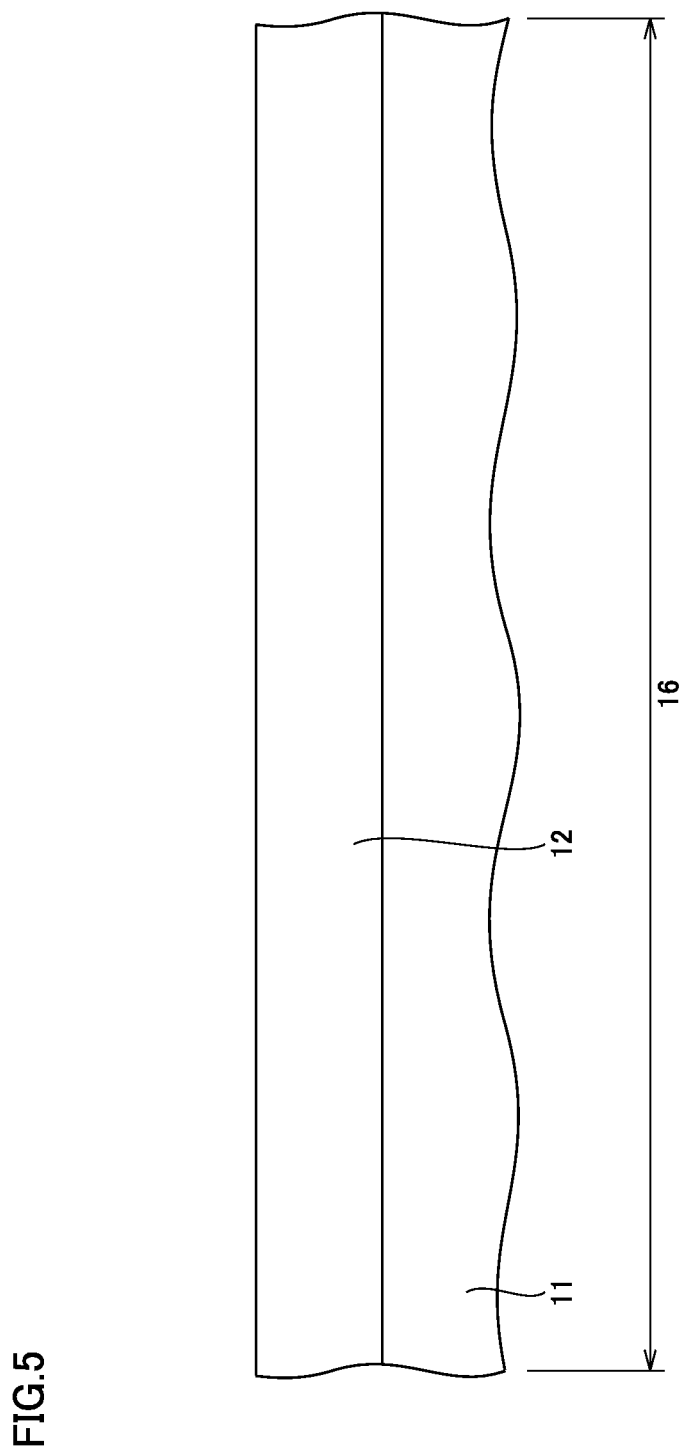
FIG. 5 is a schematic cross sectional view showing a first step of a method of fabricating the first region shown in FIG. 2 in the semiconductor pressure sensor of the first embodiment.
Figure 6:
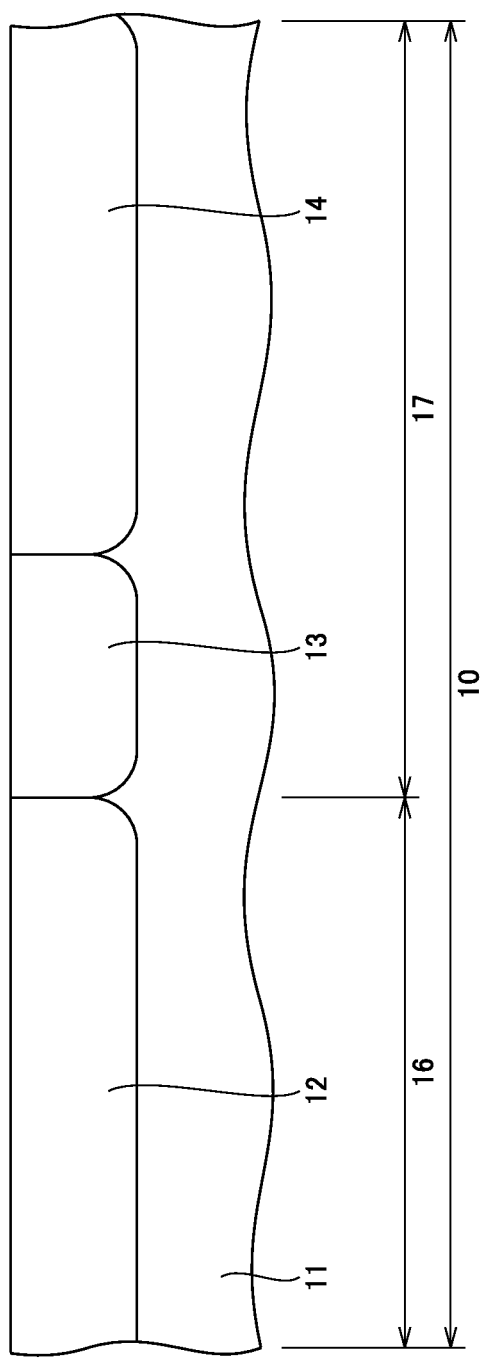
FIG. 6 is a schematic cross sectional view showing a first step of a method of fabricating the first and second regions shown in FIG. 3 in the semiconductor pressure sensor of the first embodiment.

With reference to FIG. 5 and FIG. 6, first, pressure sensor region 16 in which detection pressure sensor 1010 is to be formed and MOS region 17 in which the MOS circuits such as the memory cell transistor are to be formed are defined in the surface of silicon substrate 11. In other words, in the surface of silicon substrate 11, the region in which detection pressure sensor 1010 is to be formed and the region in which the MOS circuits are to be formed are clearly distinguished (determined) from each other. For the distinction, silicon substrate 11 may be provided with a marking, for example. In pressure sensor region 16, p type well region 12 is formed, whereas in MOS region 17, n type well region 13 and p type well region 14 are formed.

Specifically, for example, a p type silicon substrate is prepared, and then a silicon oxide film and a silicon nitride film are sequentially formed so as to cover the silicon substrate. Next, a resist mask (not shown) is formed to remove the silicon nitride film from the region of pressure sensor region 16 in which detection pressure sensor 1010 is to be formed and from the region of MOS region 17 in which the n channel type transistor is to be formed.

By applying an etching process using that resist mask as an etching mask, the silicon nitride film is removed. Next, the resist mask having been used as an etching mask is employed as an implantation mask to implant a p type impurity (for example, boron) for forming p type well regions 12, 14. Then, the resist mask is removed.

Next, by applying a thermal oxidation process, a silicon oxide film is formed in the region from which the silicon nitride film has been removed. Accordingly, a relatively thick silicon oxide film is formed on the surface of each of p type well regions 12, 14, and then the silicon nitride film is removed. Next, the relatively thick silicon oxide film is employed as an implantation mask to implant an n type impurity (for example, phosphorus) for forming n type well region 13.

Then, by applying an annealing process under a predetermined condition, the implanted p type and n type impurities are activated to diffuse. Then, the silicon oxide film remaining on the surface of the silicon substrate is removed. In this way, as shown in FIG. 5, p type well region 12 is formed in pressure sensor region 16. In MOS region 17, n type well region 13 and p type well region 14 are formed. It should be noted that although p type well region 12 is formed in pressure sensor region 16 in the description above, an n type well region may be formed in pressure sensor region 16.

Figure 7:
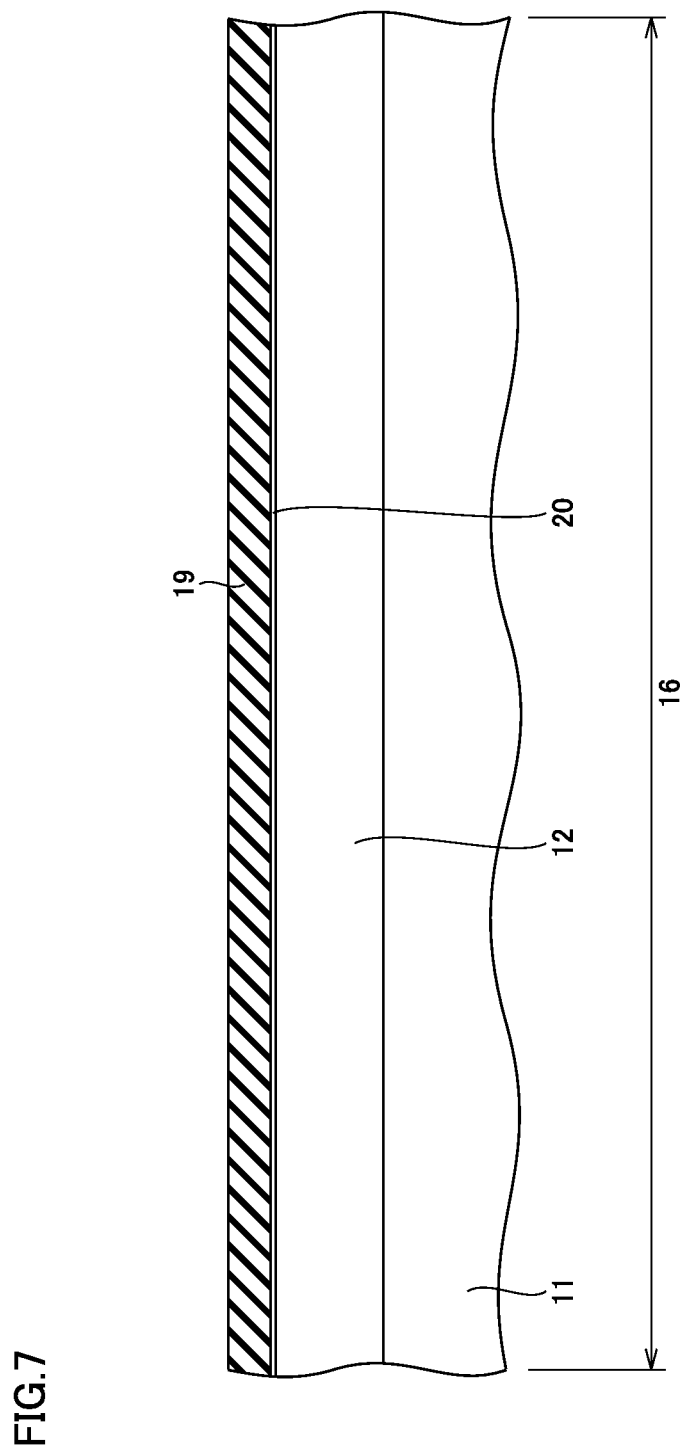
FIG. 7 is a schematic cross sectional view showing a second step of the method of fabricating the first region shown in FIG. 2 in the semiconductor pressure sensor of the first embodiment.
Figure 8:
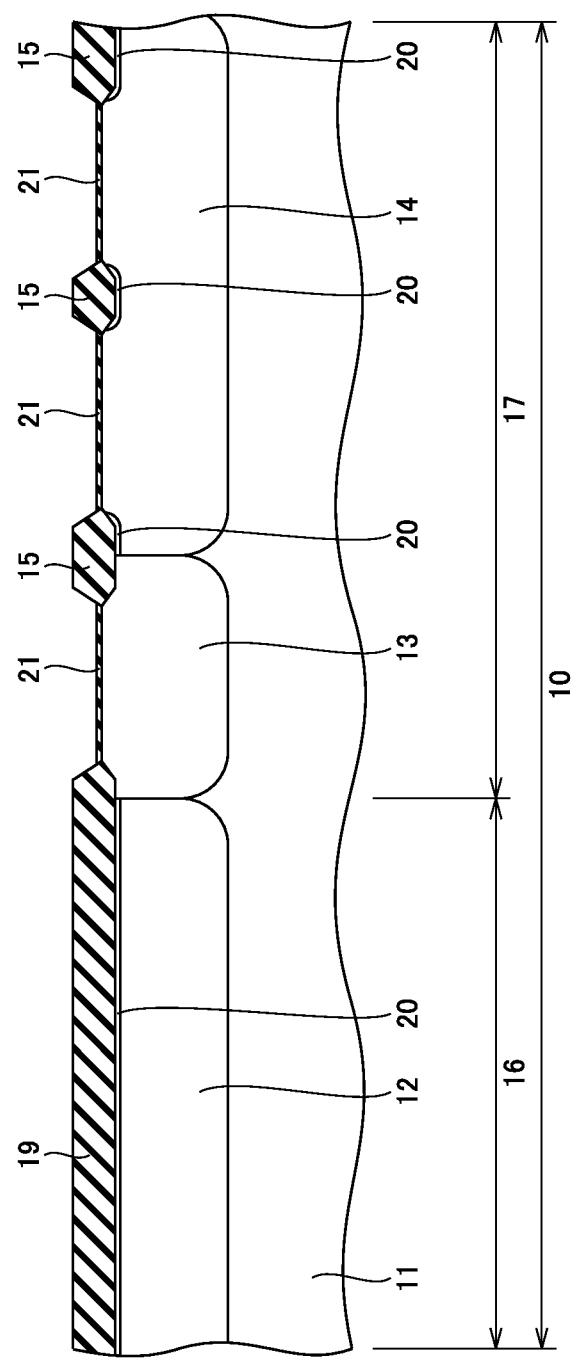
FIG. 8 is a schematic cross sectional view showing a second step of the method of fabricating the first and second regions shown in FIG. 3 in the semiconductor pressure sensor of the first embodiment.

Next, with reference to FIG. 7 and FIG. 8, the process proceeds to a step of forming field oxide films 15, 19 by means of a LOCOS (Local Oxidation of Silicon) method, for example. On the surface of the silicon substrate, an underlying oxide film, a polycrystalline silicon film, and a silicon nitride film (all not shown) are sequentially formed. Then, by applying a predetermined photolithography process, a resist mask (not shown) for forming a field oxide film is provided. By applying an etching process using the resist mask as an etching mask, the silicon nitride film is removed from the region in which the field oxide film is to be formed. Subsequently, by applying a photolithography process again, a resist mask (not shown) for forming a channel stopper is provided. Using this resist mask as an implantation mask, a p type impurity (for example, boron) is implanted to the region that is to serve as to a channel stopper. Then, the resist mask is removed.

Next, by applying an oxidation process under a predetermined condition, the portion from which the silicon nitride film has been removed is locally oxidized to form field oxide films 15, 19. At this stage, the implanted p type impurity is activated to form channel stopper 20. Then, the remaining underlying oxide film, polycrystalline silicon film, and silicon nitride film are removed.

Thus, as shown in FIG. 7 and FIG. 8, field oxide film 19 is formed in pressure sensor region 16 whereas field oxide films 15, 19 are formed in MOS region 17. Field oxide films 15, 19 have a film thickness of approximately 0.2 to 1.0 μm. Underlying oxide film 21 is located on the surface of p type well region 12, n type well region 13, and p type well region 14. Semiconductor elements such as the MOS transistors to be formed in the regions defined by field oxide films 15, 19 will be electrically insulated from each other by field oxide films 15, 19 and channel stopper 20 formed just therebelow.

Figure 9:
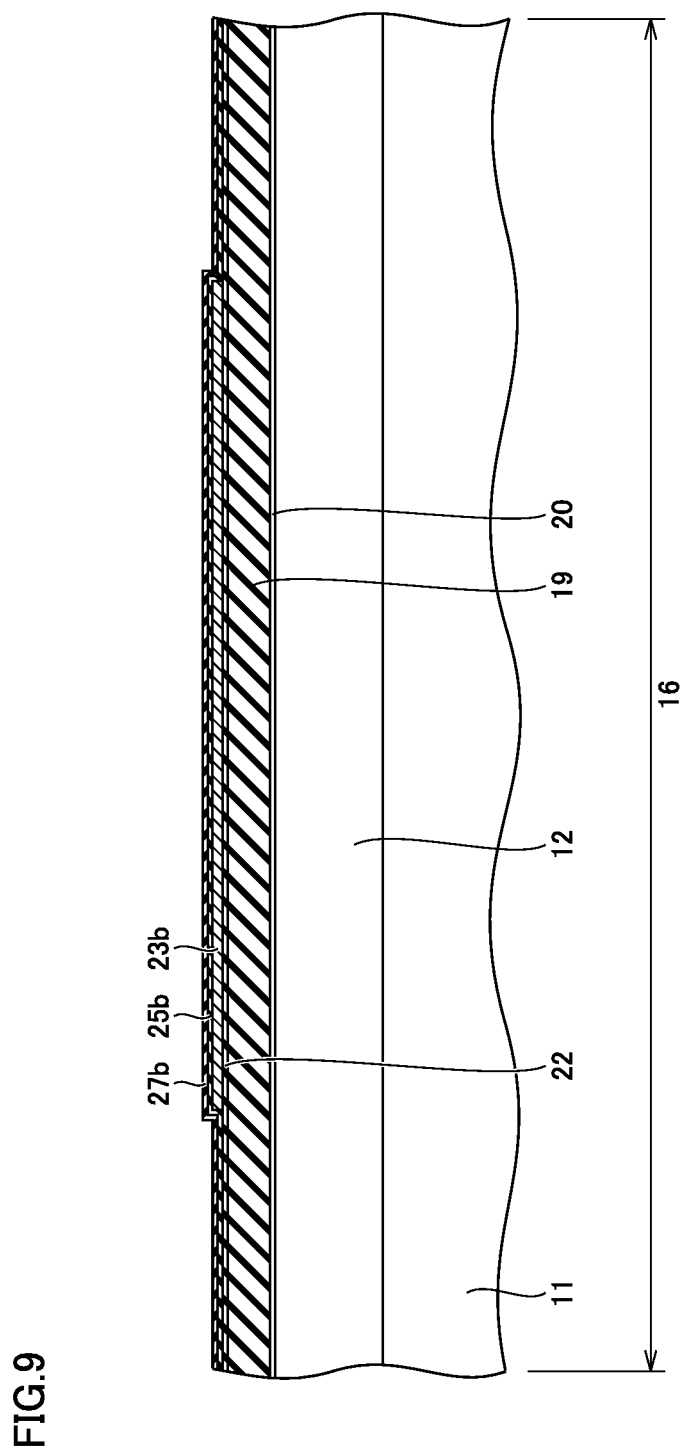
FIG. 9 is a schematic cross sectional view showing a third step of the method of fabricating the first region shown in FIG. 2 in the semiconductor pressure sensor of the first embodiment.
Figure 10:
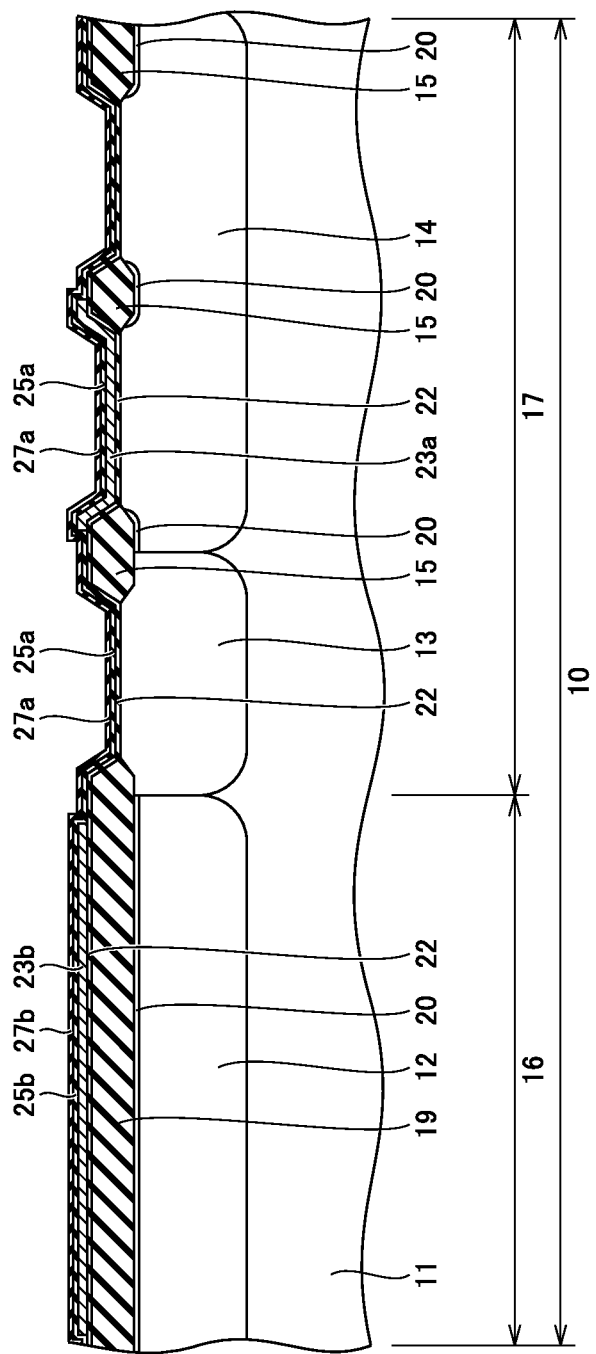
FIG. 10 is a schematic cross sectional view showing a third step of the method of fabricating the first and second regions shown in FIG. 3 in the semiconductor pressure sensor of the first embodiment.

Next, with reference to FIG. 9 and FIG. 10, the process proceeds to a step of forming a first conductor film pattern by forming a first conductor film in pressure sensor region 16 and MOS region 17 and patterning the first conductor film. In doing so, fixed electrode 23b in pressure sensor region 16 and polycrystalline silicon film 23a to serve as the floating gate electrode of the EPROM in MOS region 17 are formed as the same layer using the same material.

Specifically, first, a thermal oxidation process is applied to silicon substrate 11 from which the underlying oxide film and the like have been removed, whereby first gate oxide film 22 (film thickness of about 5 to 30 nm) is formed on the exposed surface of silicon substrate 11 in MOS region 17. This serves as the gate oxide film of the EPROM formed in MOS region 17. Simultaneously, an oxide film serving as the same layer as first gate oxide film 22 is formed on the surface of field oxide film 19 in pressure sensor region 16.

Next, a polycrystalline silicon film (first conductor film) is formed by the CVD (Chemical Vapor Deposition) method to cover first gate oxide film 22. At this stage, phosphorus is introduced by a well-known method during or immediately after formation of the polycrystalline silicon film to achieve the conductivity as an n type polycrystalline silicon film. Then, a photolithography process is applied to form a resist mask for patterning the fixed electrode and the floating gate. By applying a predetermined etching process using the resist mask as an etching mask, fixed electrode 23b constituted of the patterned polycrystalline silicon film is provided in pressure sensor region 16. On the other hand, in MOS region 17, a pattern (film thickness of about 50 to 300 nm) of polycrystalline silicon film 23a is formed (as the first conductor film pattern) to serve as the floating gate electrode (first electrode) of the EPROM. Then, the resist mask is removed.

Then, by the thermal oxidation method, for example, second gate oxide film 25a (film thickness of approximately 5 to 30 nm) is formed so as to cover polycrystalline silicon film 23a in MOS region 17 while first fixed electrode protection film 25b formed of the same film as the film to serve as the second gate oxide film is formed so as to cover fixed electrode 23b in pressure sensor region 16 simultaneously. By the CVD method, a first silicon nitride film 27a (film thickness of approximately 5 to 30 nm) is formed so as to cover second gate oxide film 25a in MOS region 17 while a second fixed electrode protection film 27b formed of the same film as the film to serve as the first silicon nitride film is formed in pressure sensor region 16 simultaneously. Each of first fixed electrode protection film 25b and second fixed electrode protection film 27b serves as a protection film for the fixed electrode during removal of the sacrifice film by way of an etching process as described below.

Then, a resist mask (not shown) is formed to expose n type well region 13 in which a p channel type MOS transistor is to be formed, and to cover other regions. Using this resist mask as an implantation mask, a predetermined impurity (for example, phosphorus or the like) for controlling the threshold voltage of the p type MOS transistor is implanted. Then, the resist mask is removed. Also, a resist mask (not shown) is formed to expose p type well region 14 in which an n channel type MOS transistor is to be formed, and to cover other regions. Using this resist mask as an implantation mask, a predetermined impurity (for example, boron) for controlling the threshold voltage of the n type MOS transistor is implanted. Then, the resist mask is removed.

Figure 11:
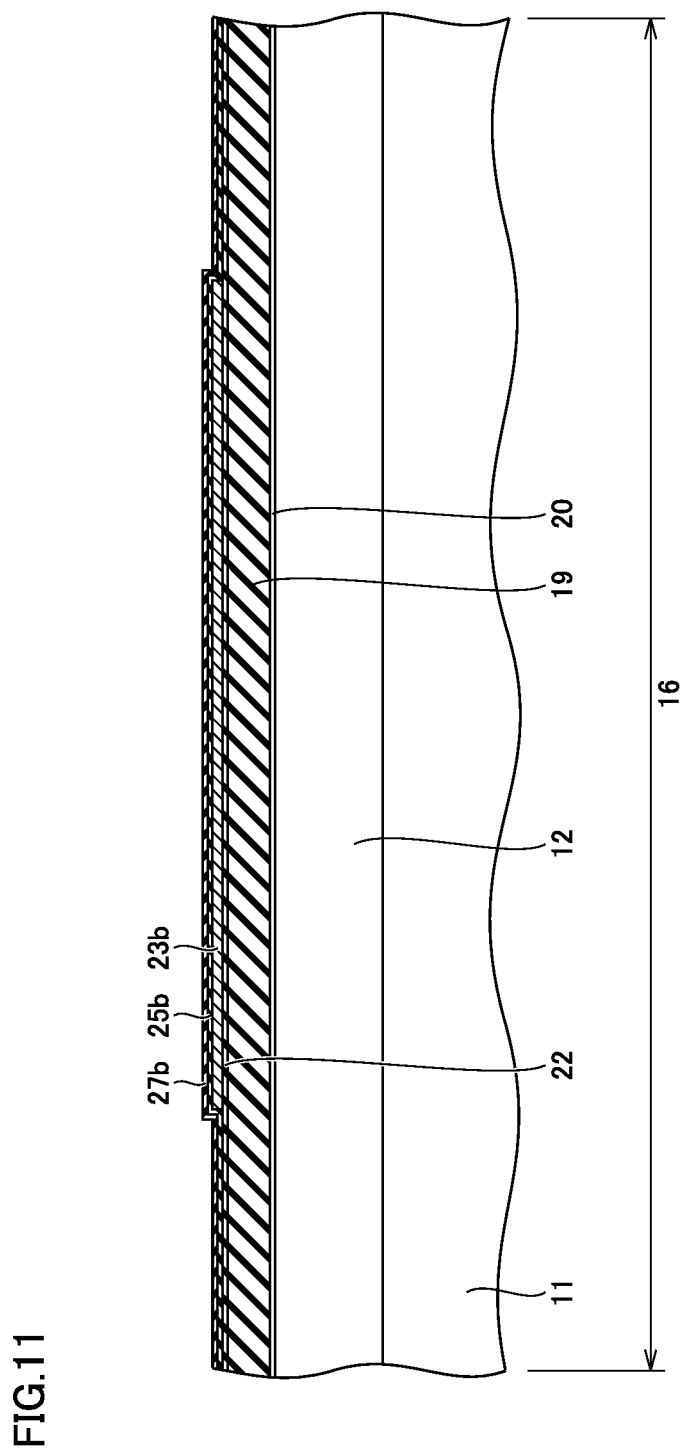
FIG. 11 is a schematic cross sectional view showing a fourth step of the method of fabricating the first region shown in FIG. 2 in the semiconductor pressure sensor of the first embodiment.
Figure 12:
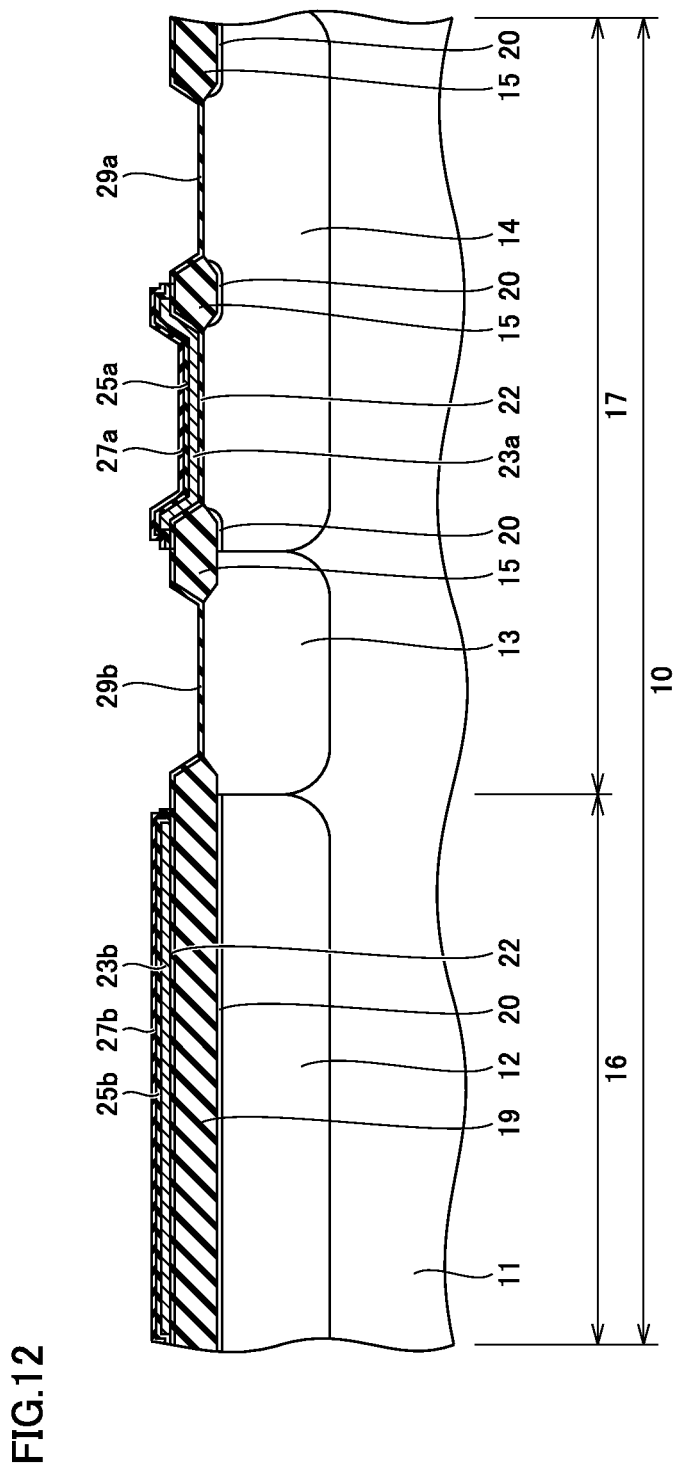
FIG. 12 is a schematic cross sectional view showing a fourth step of the method of fabricating the first and second regions shown in FIG. 3 in the semiconductor pressure sensor of the first embodiment.

Next, with reference to FIG. 11 and FIG. 12, a resist mask (not shown) is formed to expose the region in which the p channel type MOS transistor is to be formed in n type well region 13 in MOS region 17 as well as the region in which the n type channel MOS transistor is to be formed in p type well region 14 in MOS region 17, and to cover other regions. Using this resist mask as an etching mask, an etching process is applied to remove a portion of first gate oxide film 22a, a portion of second gate oxide film 25a, and a portion of first silicon nitride film 27a to expose a surface of silicon substrate 11. Then, the resist mask is removed.

Next, by providing a thermal oxidization process, a third gate oxide film 29b (film thickness of approximately 5 to 30 nm) is formed on the surface of the region in which the p channel type MOS transistor is to be formed in n type well region 13, and a third gate oxide film 29a (film thickness of approximately 5 to 30 nm) is formed on the surface of the region in which the n channel type MOS transistor is to be formed in p type well region 14, as shown in FIG. 12.

Figure 13:
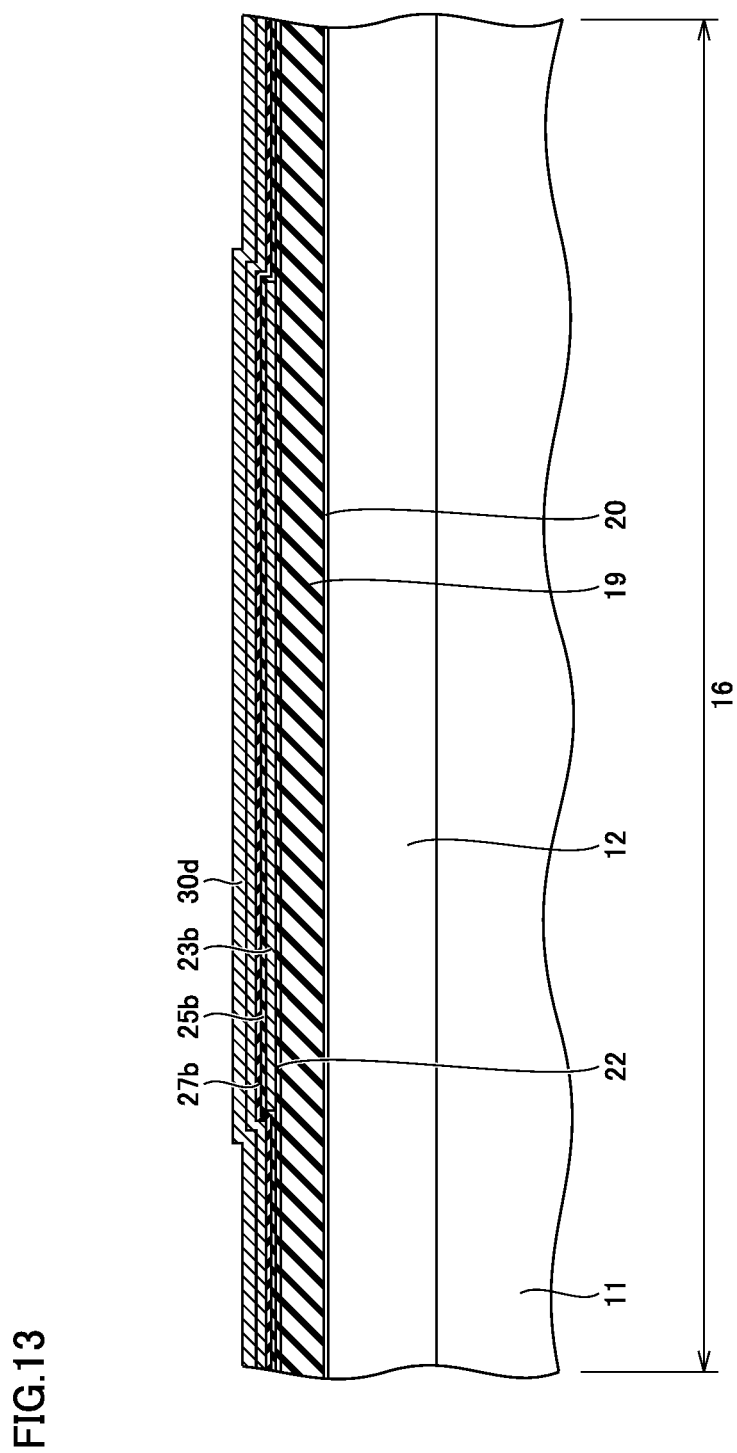
FIG. 13 is a schematic cross sectional view showing a fifth step of the method of fabricating the first region shown in FIG. 2 in the semiconductor pressure sensor of the first embodiment.
Figure 14:
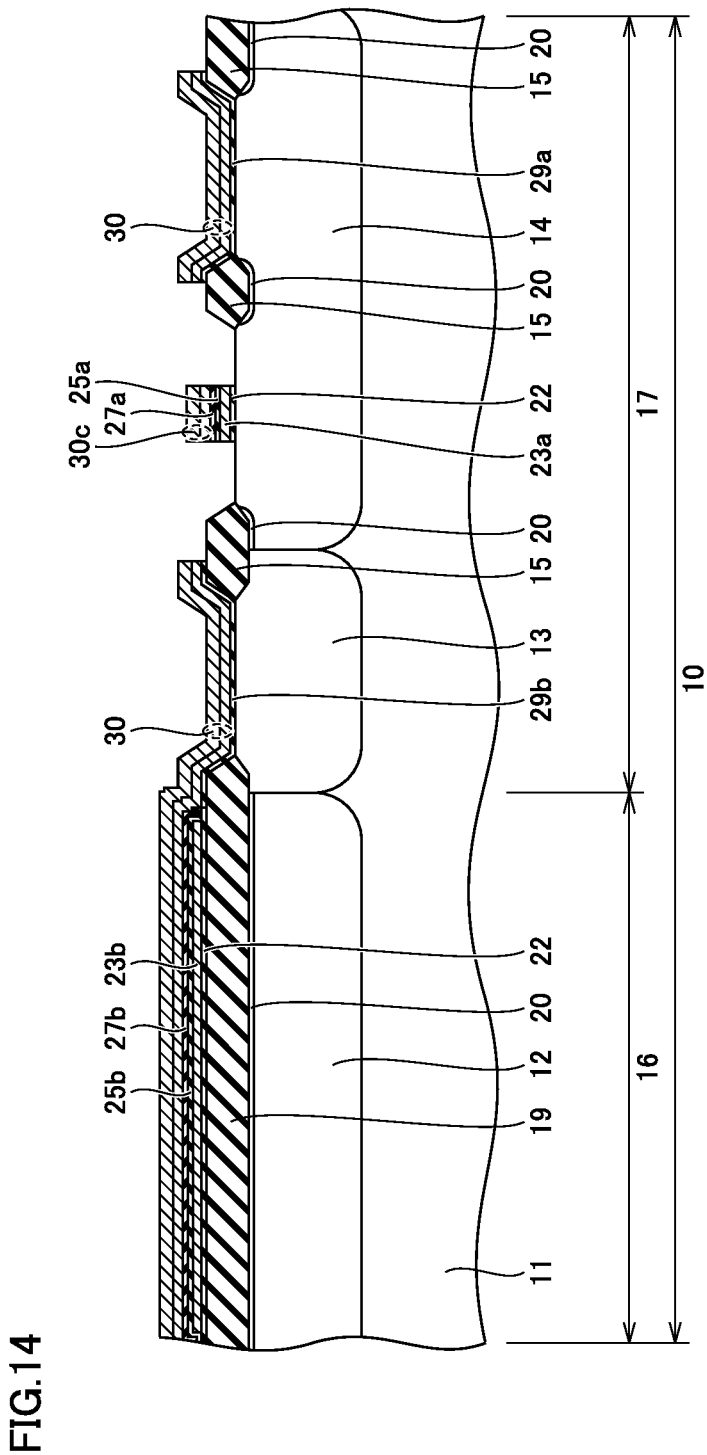
FIG. 14 is a schematic cross sectional view showing a fifth step of the method of fabricating the first and second regions shown in FIG. 3 in the semiconductor pressure sensor of the first embodiment.

With reference to FIG. 13 and FIG. 14, a conductor film 30 serving as a second conductor film is formed in pressure sensor region 16 and MOS region 17. This conductor film 30 is to serve as: conductor film 30d formed as the sacrifice film to be removed in pressure sensor region 16; conductor film 30 to serve as gate electrodes 30a, 30b of the p channel type and n channel type MOS transistors in MOS region 17; and gate electrode 30c of the EPROM. Therefore, they are formed as the same layer using the same material.

Specifically, first, a predetermined conductor film 30 is formed to cover first silicon nitride film 27a, second fixed electrode protection film 27b, and third gate oxide films 29a, 29b. This conductor film 30 is constituted of a laminated film of a two-layered structure including a polycrystalline silicon film (film thickness of approximately 50 to 300 nm) and a tungsten silicide ($WSi_2$) film (film thickness of approximately 50 to 300 nm), i.e., a polycide film. The polycrystalline silicon film is formed by the CVD method, and is configured as an n type polysilicon film by having phosphorus introduced during or immediately after formation of the polycrystalline silicon film. The tungsten silicide film is formed by sputtering or CVD method so as to cover the polycrystalline silicon film.

Then, a resist mask (not shown) for patterning the gate electrode of the EPROM is formed. By performing an etching process using the resist mask as an etching mask, the gate electrode of the EPROM is patterned. As shown in FIG. 14, in the EPROM (memory cell transistor) formation region in MOS region 17, an etching process is performed to conductor film 30, first silicon nitride film 27a, second gate oxide film 25a, the pattern of polycrystalline silicon film 23, and first gate oxide film 22. As result of patterning conductor film 30 in this way, floating gate electrode 23a (first electrode) and gate electrode 30c (second electrode) provided thereabove are formed. Accordingly, the gate electrode of the EPROM, inclusive of gate electrode 30c, is formed.

Figure 15:
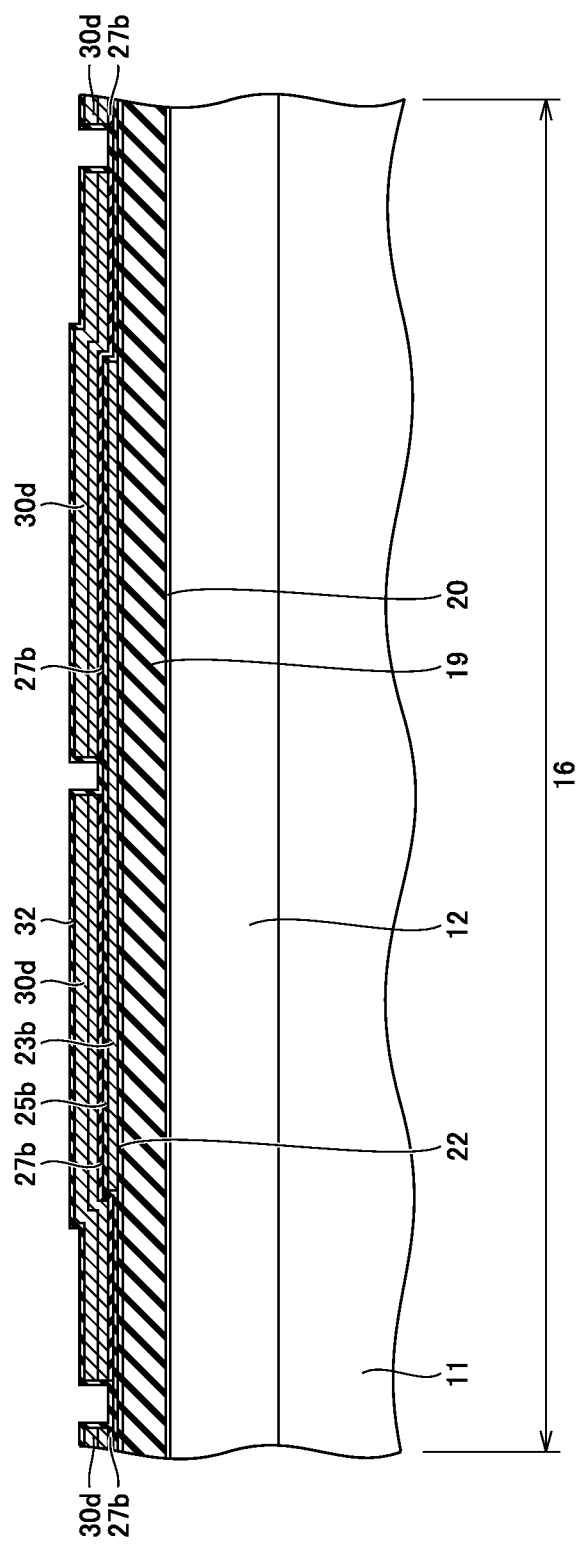
FIG. 15 is a schematic cross sectional view showing a sixth step of the method of fabricating the first region shown in FIG. 2 in the semiconductor pressure sensor of the first embodiment.
Figure 16:
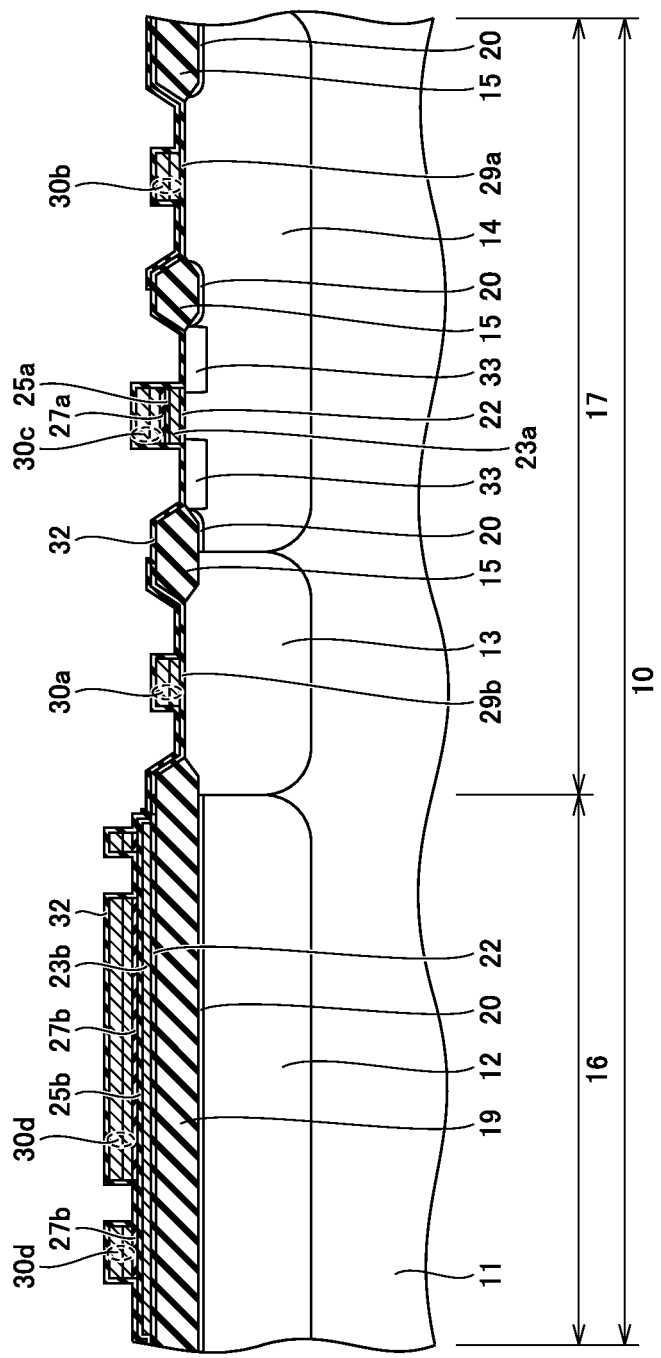
FIG. 16 is a schematic cross sectional view showing a sixth step of the method of fabricating the first and second regions shown in FIG. 3 in the semiconductor pressure sensor of the first embodiment.

With reference to FIG. 15 and FIG. 16, first in MOS region 17, after removing the resist mask for patterning the gate electrode of the EPROM, the gate electrode of the EPROM is employed as an implantation mask to implant an n type impurity (for example, arsenic), thereby forming n type source/drain region 33. N type source/drain region 33 corresponds to the EPROM shown in FIG. 16.

Next, a resist mask (not shown) is formed to pattern the gate electrode of the p channel type MOS transistor, the gate electrode of the n channel type MOS transistor, and the sacrifice film. Then, an etching process is performed to conductor film 30 using the resist mask as the etching mask. As a result of patterning conductor film 30 in this way, as shown in FIG. 16, gate electrode 30b of the n channel type MOS transistor and gate electrode 30a of the p channel type MOS transistor are formed in MOS region 17. Moreover, as shown in FIG. 15 and FIG. 16, in pressure sensor region 16, conductor film 30d serving as the sacrifice film is formed. As described below, by removing conductor film 30d to form a void, the vacuum chamber is formed.

After removing the resist mask, heat treatment is performed under a predetermined condition to activate first source/drain region 33, thereby forming a thin oxide film 32.

Thus, conductor film 30d is formed as the second conductor film pattern at the same time in the step of forming conductor film 30 to serve as gate electrodes 30a, 30b, 30c, and the step of forming gate electrodes 30a, 30b, 30c by etching conductor film 30.

It should be noted that in the step of forming the second conductor film pattern by patterning conductor film 30, conductor film 30d is formed to have an opened portion through which the surface just therebelow is exposed as a result of removal thereof, i.e., is formed to be divided into a plurality of patterns in the horizontal direction of FIG. 15 and FIG. 16. For example, at the central portion in the horizontal direction of FIG. 15, the opened portion of conductor film 30d is formed. Thus, the pattern of the sacrifice film is formed to have the previously opened portion.

Figure 17:
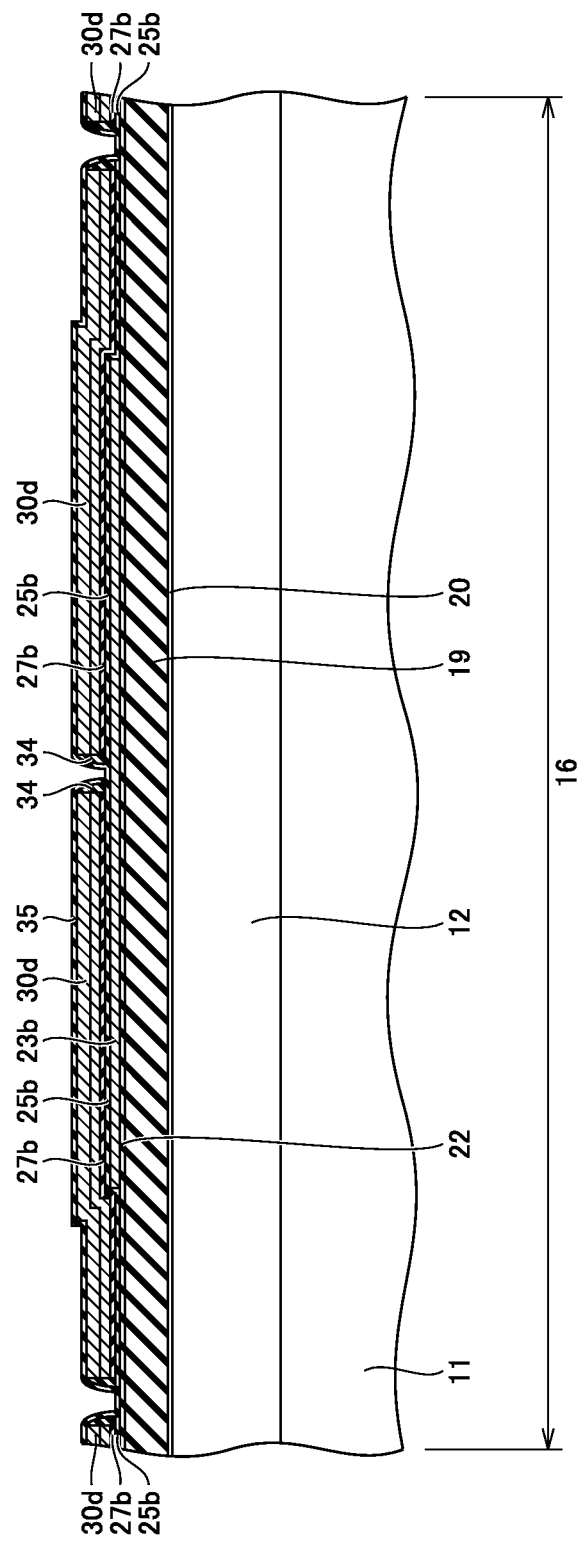
FIG. 17 is a schematic cross sectional view showing a seventh step of the method of fabricating the first region shown in FIG. 2 in the semiconductor pressure sensor of the first embodiment.
Figure 18:
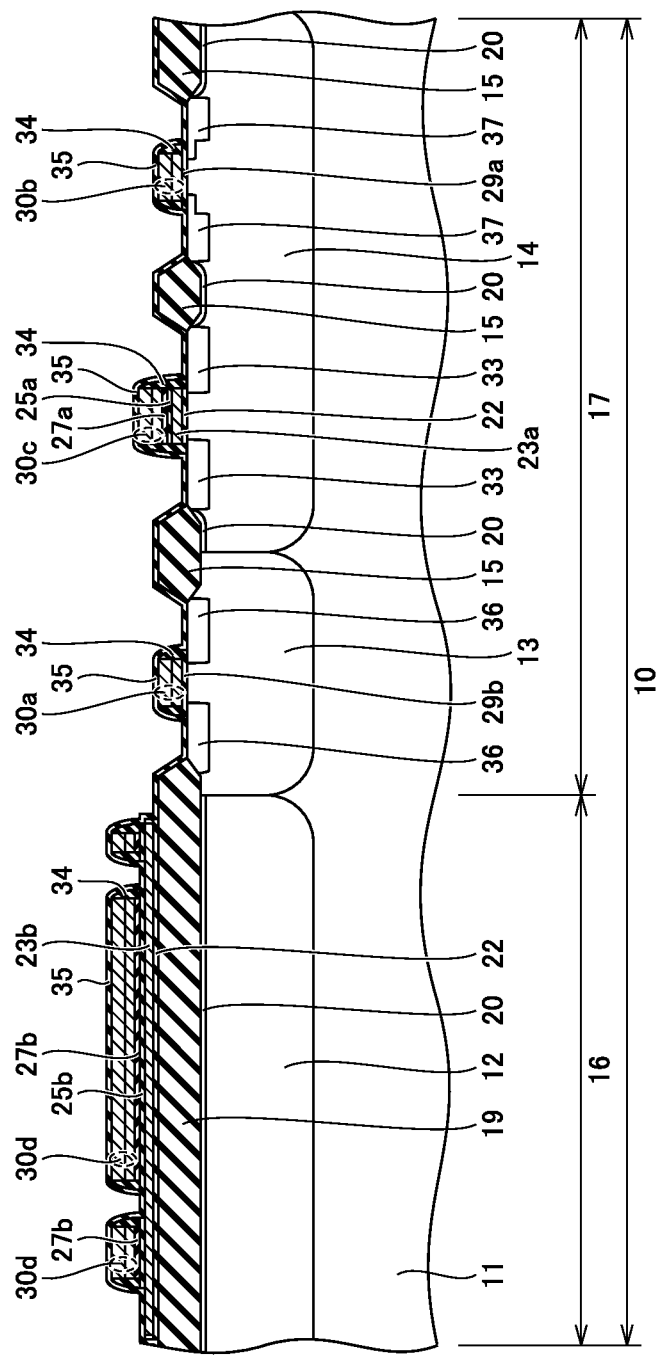
FIG. 18 is a schematic cross sectional view showing a seventh step of the method of fabricating the first and second regions shown in FIG. 3 in the semiconductor pressure sensor of the first embodiment.

Next, with reference to FIG. 17 and FIG. 18, a resist mask (not shown) is formed to expose only the region in which the n channel type MOS transistor is to be provided and cover other regions. By implanting an n type impurity (for example, phosphorus) using the resist mask and gate electrode 30b as an implantation mask, an LDD (Lightly Doped Drain) region is provided. Then, the resist mask is removed. Next, a TEOS film (not shown) is formed to cover gate electrodes 30a, 30b, 30c and conductor film 30d, for example. By applying an anisotropic dry etching process to the entire surface of the TEOS film, sidewall oxide film 34 is formed on each sidewall surface of gate electrodes 30a, 30b, 30c and conductor film 30d. Particularly, by forming sidewall oxide film 34 also on the sidewall surface of conductor film 30d, the stepped portion around conductor film 30d can be reduced. Moreover, particularly with side wall oxide film 34 formed on the side portion of conductor film 30d, the edge shape of the supporting portion for movable electrode 39 to be formed in a subsequent step is rounded, thereby relaxing stress concentration on the edge portion of movable electrode 39 when flexed under application of pressure to movable electrode 39. This leads to improvement of reliability thereof.

Then, a resist mask (not shown) is formed in p type well region 14 to expose the region in which the n channel type MOS transistor is to be provided and cover other regions. By implanting an n type impurity (for example, phosphorus or the like) using that resist mask and gate electrode 30b as an implantation mask, n type source/drain region 37 is formed. Then, the resist mask is removed. Then, in n type well region 13, a resist mask (not shown) is formed to expose the region in which the p channel type MOS transistor is to be formed, and cover other regions. By implanting a p type impurity (for example, boron difluoride) using that resist mask and gate electrode 30a as an implantation mask, p type source/drain region 36 is formed.

Next, after removing the resist mask, an annealing process is applied under a predetermined condition to activate n type source/drain region 37 and p type source/drain region 36. By performing a thermal oxidation process together with the annealing process, thin silicon oxide film 35 is formed to cover gate electrodes 30a, 30b, 30c and conductor film 30d. This thin silicon oxide film 35 is formed in one piece with third gate oxide film 29b and thin oxide film 32, so that third gate oxide film 29b and thin oxide film 32 are not in FIG. 17 and FIG. 18.

Figure 19:
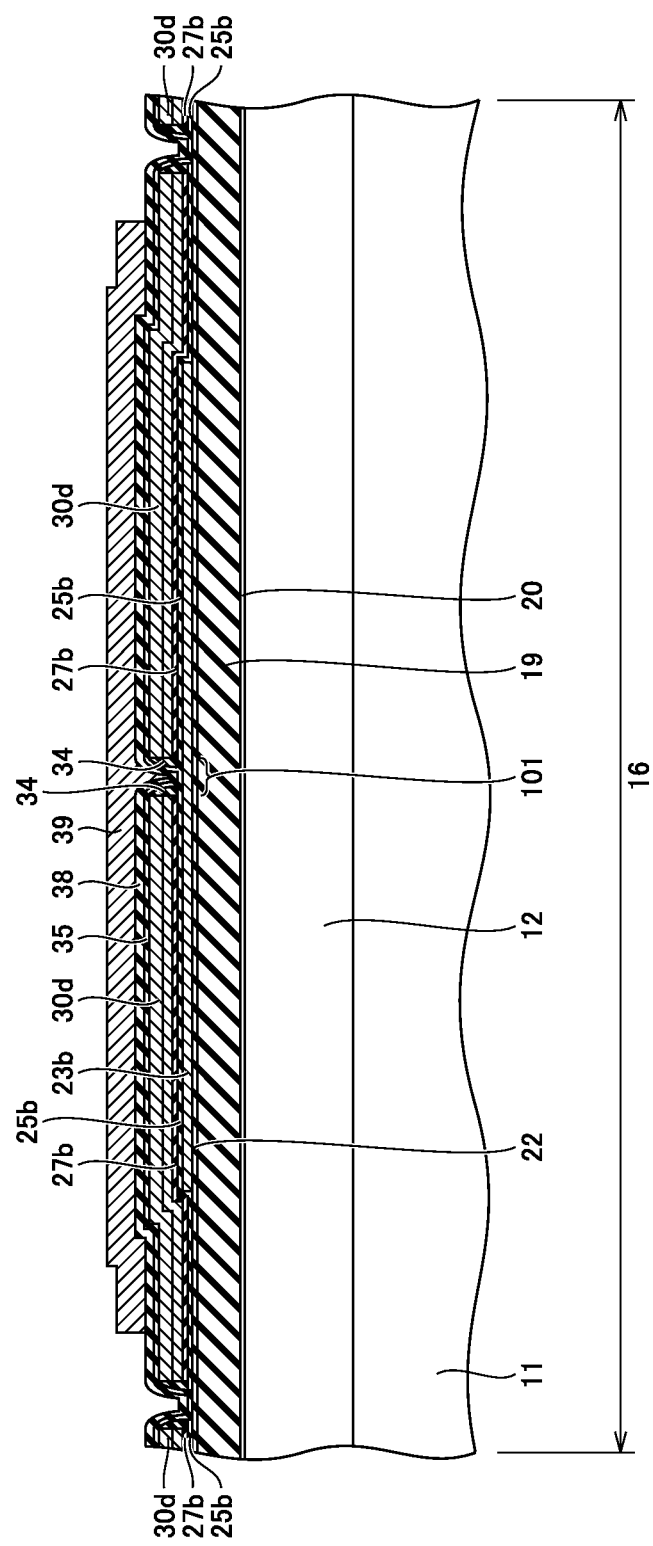
FIG. 19 is a schematic cross sectional view showing an eighth step of the method of fabricating the first region shown in FIG. 2 in the semiconductor pressure sensor of the first embodiment.
Figure 20:
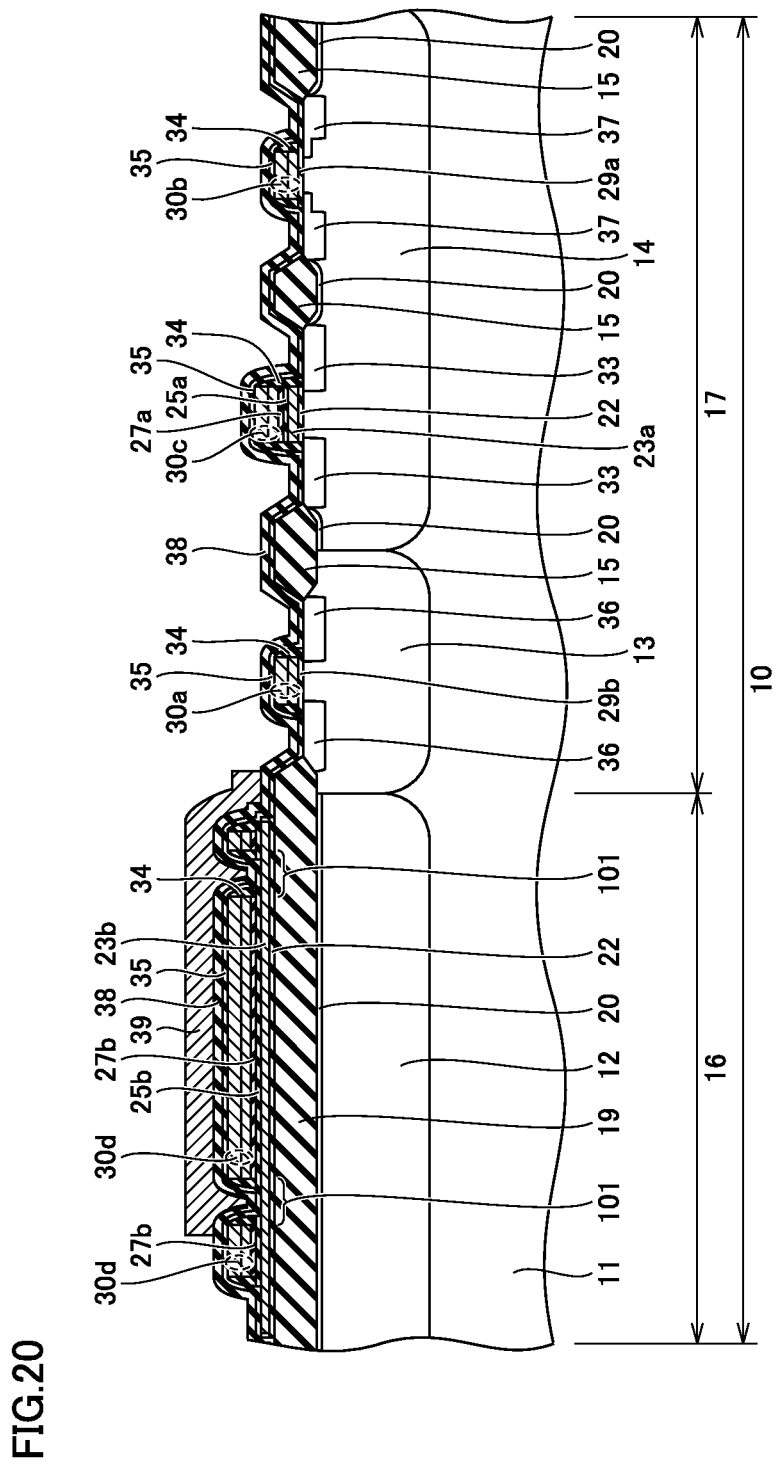
FIG. 20 is a schematic cross sectional view showing an eighth step of the method of fabricating the first and second regions shown in FIG. 3 in the semiconductor pressure sensor of the first embodiment.

Next, with reference to FIG. 19 and FIG. 20, TEOS-based oxide film 38 is formed to cover silicon oxide film 35. Then, a conductive polycrystalline silicon film to serve as the movable electrode is formed in pressure sensor region 16 to cover TEOS-based oxide film 38. Then, a photolithography process is applied to form a resist mask (not shown) covering a portion of conductor film 30d and exposing other regions. Then, the resist mask is employed as an etching mask to perform an etching process, thereby removing the exposed polycrystalline silicon film to form movable electrode 39 to cover conductor film 30d. Then, the resist mask is removed. On this occasion, the stepped portion around conductor film 30d is reduced by sidewall oxide film 34, thereby preventing discontinuation of shield film 39 caused by a crack or insufficient coverage and improving the range of setting the film thickness of shield film 39.

First fixed electrode protection film 25b, second fixed electrode protection film 27b and conductor film 30d in pressure sensor region 16 are formed at the same time as the step of forming second gate oxide film 25a, first silicon nitride film 27a and gate electrodes 30a, 30b 30c in MOS region 17. Furthermore, the heat treatment condition is the same as the condition employed for the MOS transistor and the like formed in MOS region 17. Accordingly, while a significant modification may be restricted, the pressure sensor can be modified in conformity with the specification of a semiconductor element such as the MOS transistor formed in the MOS region.

Further, by adjusting the film thickness of each shield film 39 and oxide film 38, the sensitivity property with respect to the initial capacitance value of movable electrode 39 (the amount of deflection of the movable electrode) can be controlled. Particularly, movable electrode 39 is to serve as a diaphragm, which is the most important component in detection pressure sensor 1010, so that the step of forming movable electrode 39 is independent as a step of forming only movable electrode 39 rather than forming it as the same layer as a portion of the region of MOS region 17. This facilitates control for process conditions for forming movable electrode 39, thereby precisely controlling a characteristic, such as sensitivity, of the pressure sensor to be formed (thereby increasing sensitivity).

Specifically, the thickness of movable electrode 39 is, for example, about 50 to 1500 nm; however, this thickness can be also set freely without being restrained by the thickness of the other thin film formed in MOS region 17.

Meanwhile, during the formation of the polycrystalline silicon film for forming movable electrode 39, the polycrystalline silicon film is formed to fill, from above, the opened portion of conductor film 30d (central portion of FIG. 15 or the like). Accordingly, also in the opened portion of conductor film 30d, the same polycrystalline silicon film as movable electrode 39 is formed to project downward in the figure relative to movable electrode 39. The portion of the polycrystalline silicon film thus projecting downward is formed as the anchor portion, i.e., detection anchor 101. Detection anchor 101 is formed in one piece with movable electrode 39 and is therefore capable of supporting movable electrode 39 from below (when detection anchor 101 is fixed to TEOS-based oxide film 38 just therebelow, for example). Detection anchor 101 is formed to include, in at least a portion thereof, the region formed to fill the opened portion of conductor film 30d.

Figure 21:
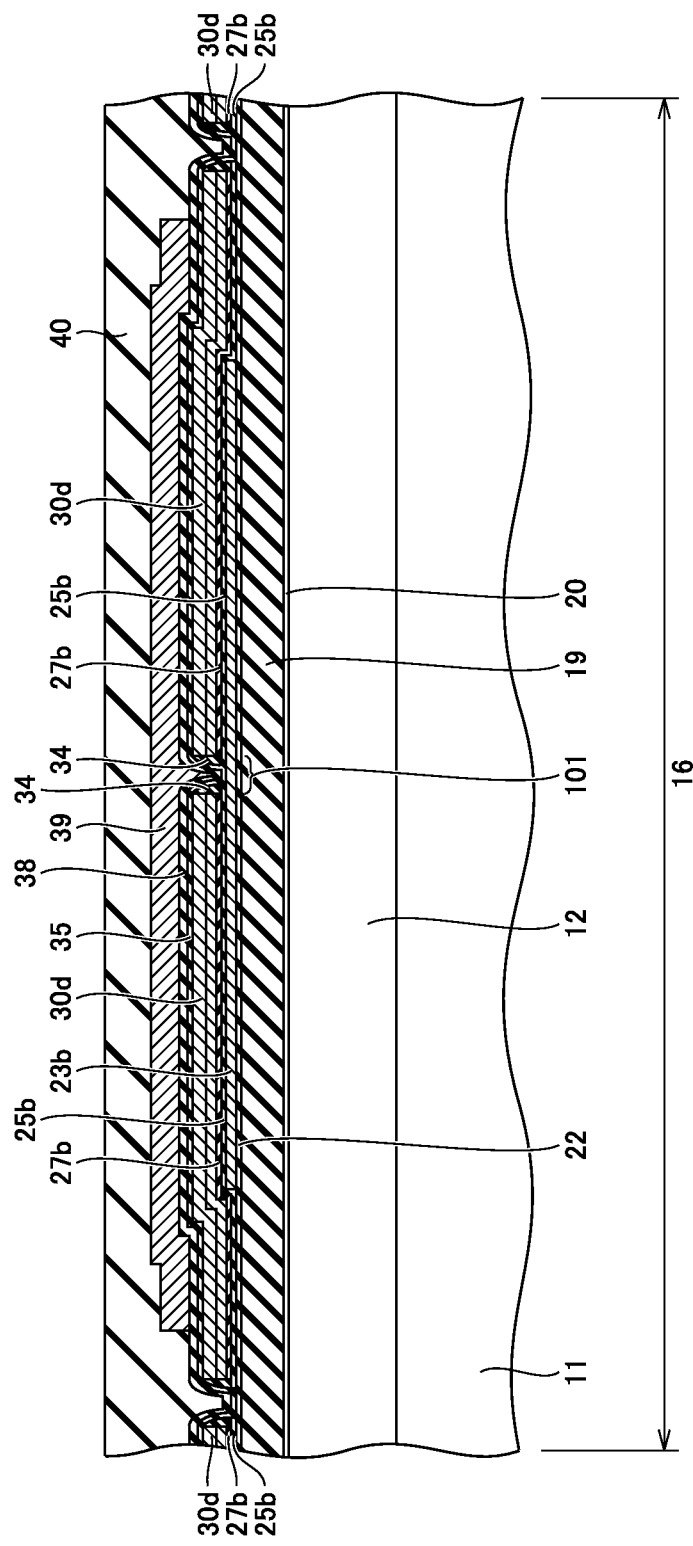
FIG. 21 is a schematic cross sectional view showing a ninth step of the method of fabricating the first region shown in FIG. 2 in the semiconductor pressure sensor of the first embodiment.
Figure 22:
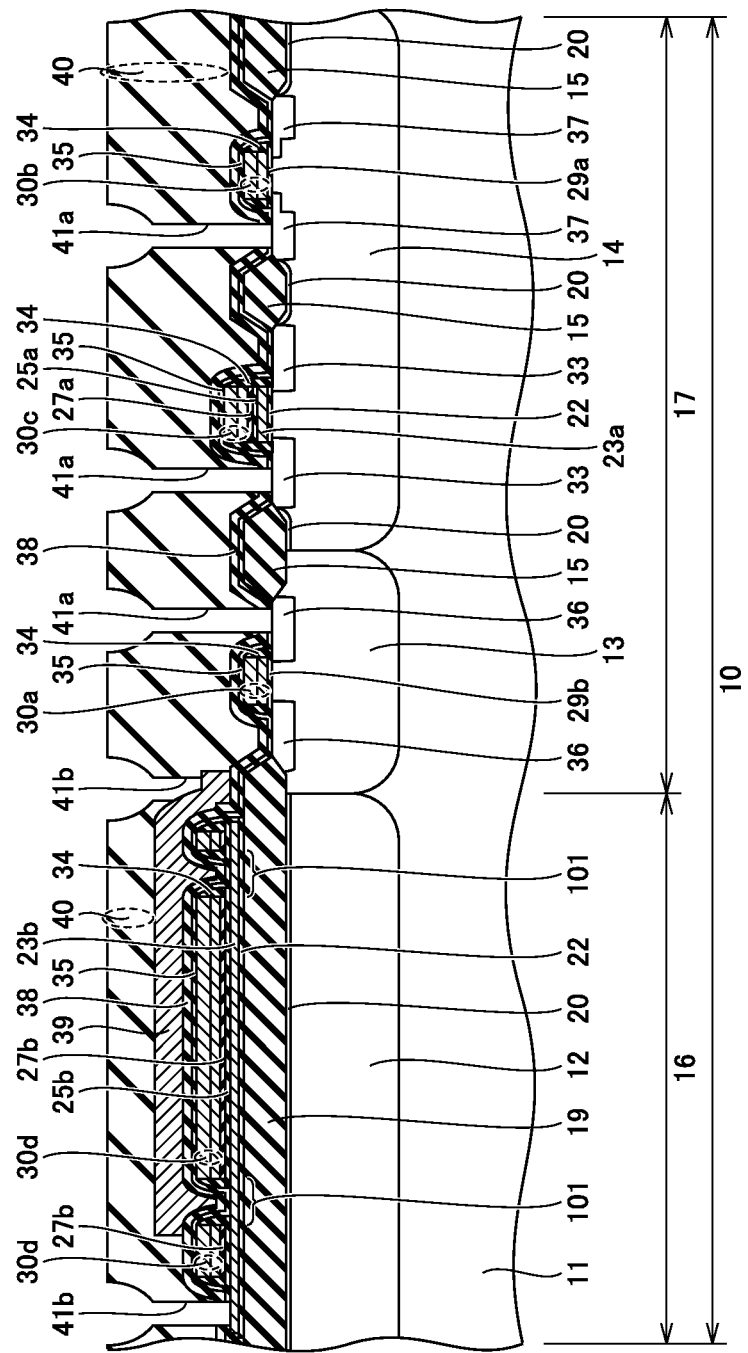
FIG. 22 is a schematic cross sectional view showing a ninth step of the method of fabricating the first and second regions shown in FIG. 3 in the semiconductor pressure sensor of the first embodiment.

Next, with reference to FIG. 21 and FIG. 22, first interlayer insulation film 40 (interlayer insulation film) is formed to cover TEOS-based oxide film 38 and movable electrode 39. First interlayer insulation film 40 is configured as a laminated structure including a TEOS film, a BPSG (Boro Phospho Silicate Glass) film, and a TEOS film, for example. It should be noted that the first interlayer insulation film is not limited to these films, and may employ another oxide film. By forming first interlayer insulation film 40 by providing the plurality of different insulation films on one another in this way, good affinity is attained between TEOS-based oxide film 38 and the TEOS film of first interlayer insulation film 40. Accordingly, first interlayer insulation film 40 can be formed simultaneously in pressure sensor region 16 and MOS region 17 to attain high affinity between the formation process for pressure sensor region 16 and the formation process for MOS region 17, thus facilitating the process.

Furthermore, for planarizing first interlayer insulation film 40, an etch-back process may be applied to the BPSG film. Also, a CMP (Chemical Mechanical Polishing) process may be applied.

Next, a resist mask (not shown) for forming a contact hole is provided by applying a photolithography process. Using the resist mask as an etching mask, an etching process is applied under a condition in conformity with the specification of the semiconductor element to be formed in MOS region 17. Accordingly, in MOS region 17, contact hole 41a is formed to extend through first interlayer insulation film 40 and the like so as to expose respective portions of n type source/drain region 33, n type source/drain region 37, and p type source/drain region 36. On the other hand, in pressure sensor region 16, contact hole 41b is formed to expose portions of fixed electrode 23b and movable electrode 39. Then, the resist mask is removed.

The etching process in this case may be a combination of wet etching and dry etching to form contact holes 41a, 41b. In this case, contact holes 41a, 41b have a spread at the upper region of the opening, as shown in FIG. 22. Contact holes 41a, 41b may be formed by an etching process including only dry etching.

Figure 23:
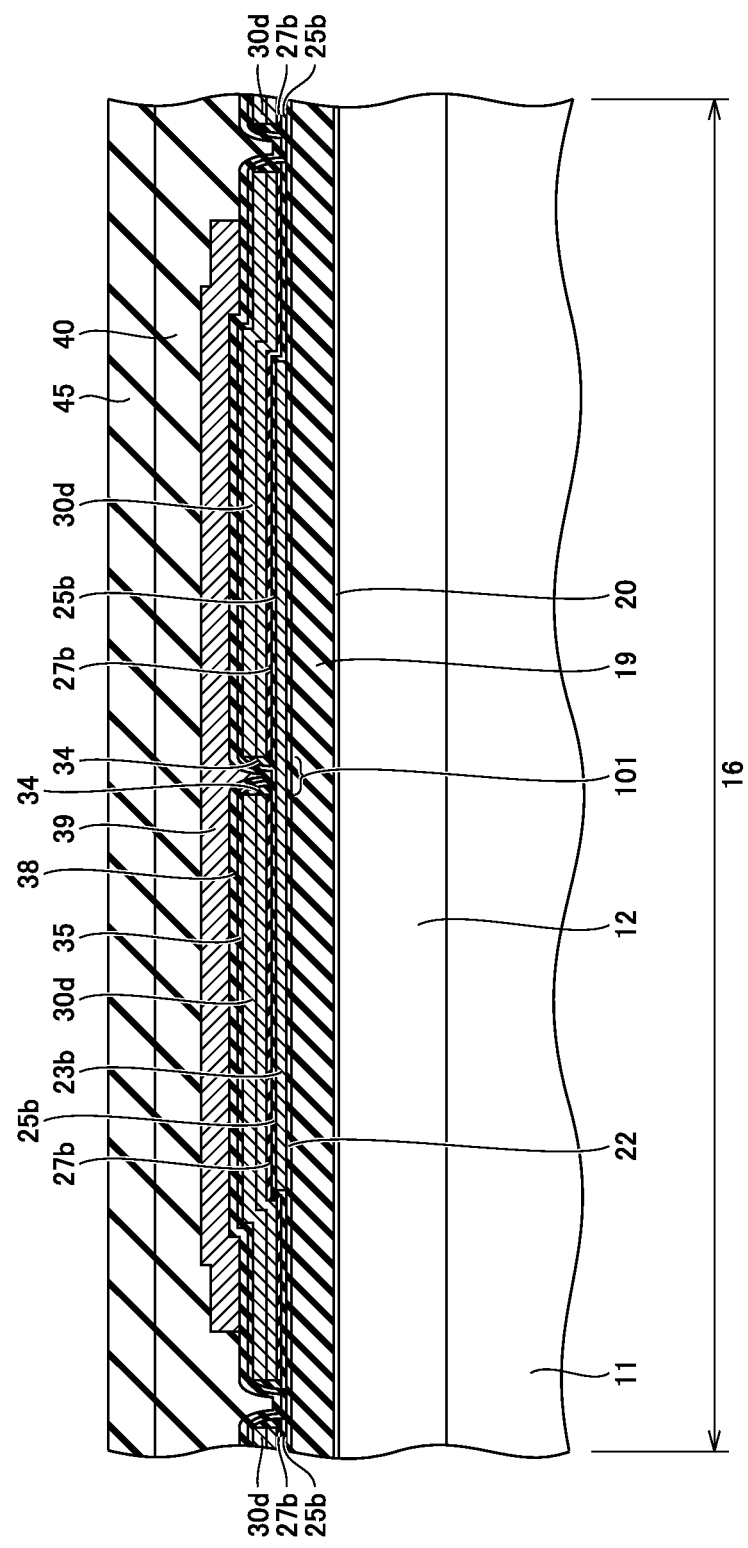
FIG. 23 is a schematic cross sectional view showing a tenth step of the method of fabricating the first region shown in FIG. 2 in the semiconductor pressure sensor of the first embodiment.
Figure 24:
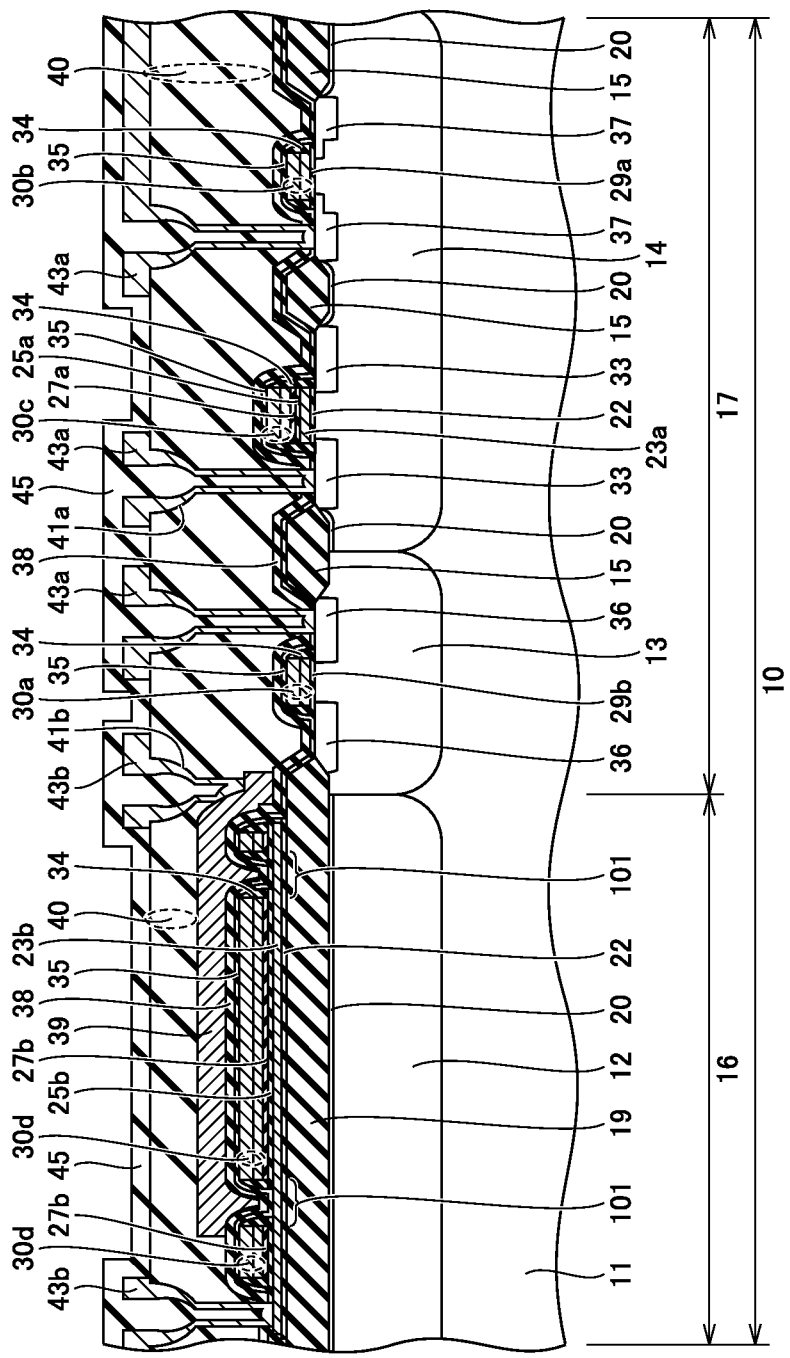
FIG. 24 is a schematic cross sectional view showing a tenth step of the method of fabricating the first and second regions shown in FIG. 3 in the semiconductor pressure sensor of the first embodiment.

With reference to FIG. 23 and FIG. 24, the process proceeds to a step of forming the interconnection and forming the second interlayer insulation film to cover the upper portion of the interconnection. First, an interconnection using a metal film is formed. A barrier metal film and an aluminum silicon copper (AlSiCu) film (both not shown) are formed so as to cover first interlayer insulation film 40. For the barrier metal film, a titanium nitride (TiN) film, for example, is applied. Next, by patterning the aluminum silicon copper film and the like, interconnections 43a (transistor interconnection portions) including one connected to a transistor such as the EPROM are formed in MOS region 17, and interconnections 43b (movable electrode interconnection portions) including one connected to movable electrode 39 are formed in pressure sensor region 16. More specifically, a resist mask is formed on the aluminum silicon copper film. The aluminum silicon copper film and barrier metal film are etched using the resist mask as an etching mask, followed by removal of the resist mask to form interconnection 43a and interconnection 43b. Interconnection 43a is electrically connected to each of n type source/drain region 33, n type source/drain region 37, and p type source/drain region 36. Interconnection 43b is electrically connected to movable electrode 39.

As the interconnection, a tungsten plug may be formed in contact holes 41a, 41b, and then the barrier metal and aluminum copper (AlCu) film may be formed and patterned. Suitable barrier metal in the case of such a configuration includes a titanium silicide ($TiSi_2$) or cobalt silicide ($CoSi_2$) film, and the like.

Next, second interlayer insulation film 45 (interlayer insulation film) is formed to cover interconnection 43a and interconnection 43b. Second interlayer insulation film 45 is formed under a condition in conformity with the specification of the semiconductor element formed in MOS region 17. An exemplary, suitable second interlayer insulation film 45 is a P-TEOS (Plasma CVD-Tetra Ethyl Ortho Silicate glass) film formed by a plasma CVD method or the like. For planarization, a three-layered, laminated structure including a SOG (Spin on Glass) film, i.e., P-TEOS/SOG/P-TEOS may be employed. A CMP process may be applied, as with the first interlayer insulation film.

Figure 25:
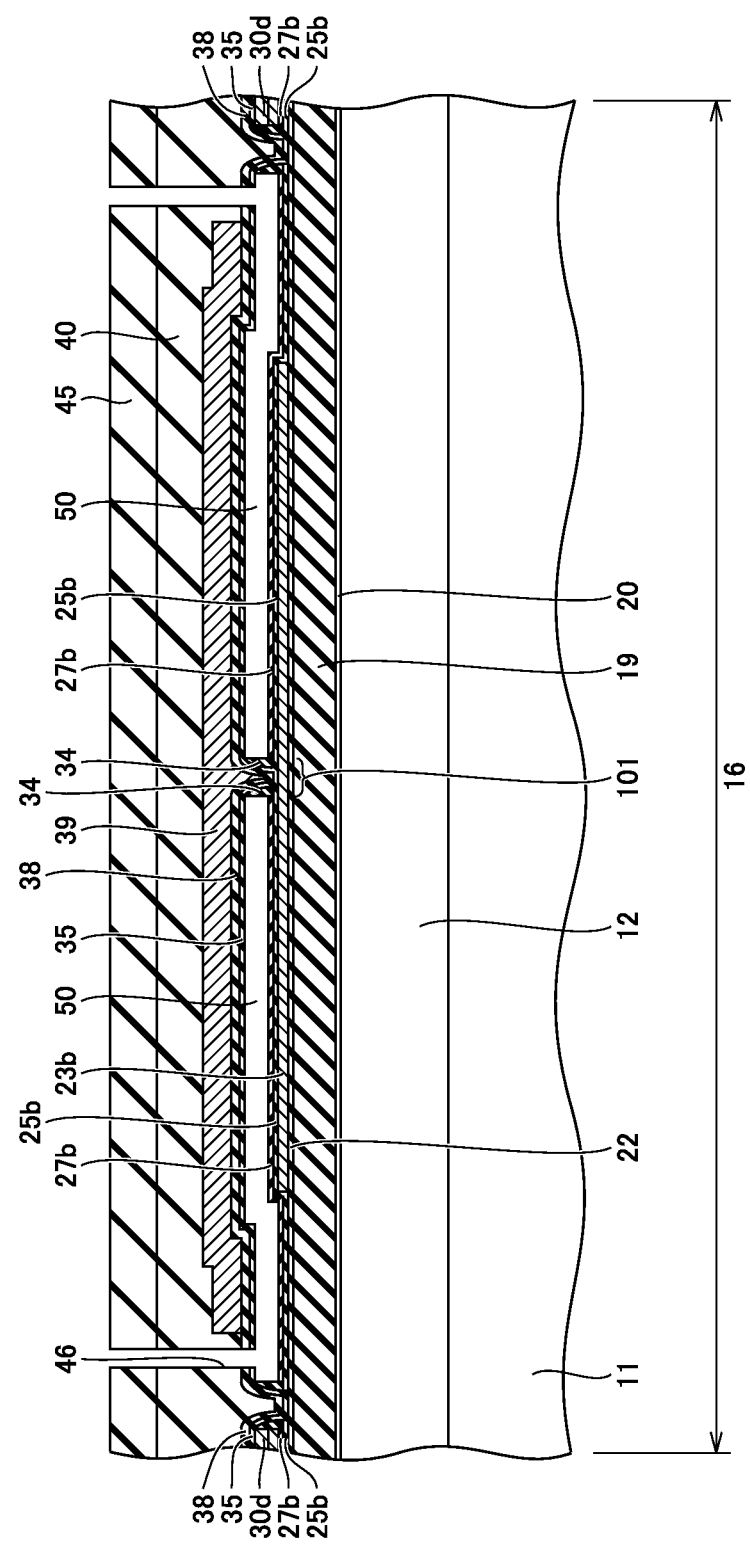
FIG. 25 is a schematic cross sectional view showing an eleventh step of the method of fabricating the first region shown in FIG. 2 in the semiconductor pressure sensor of the first embodiment.
Figure 26:
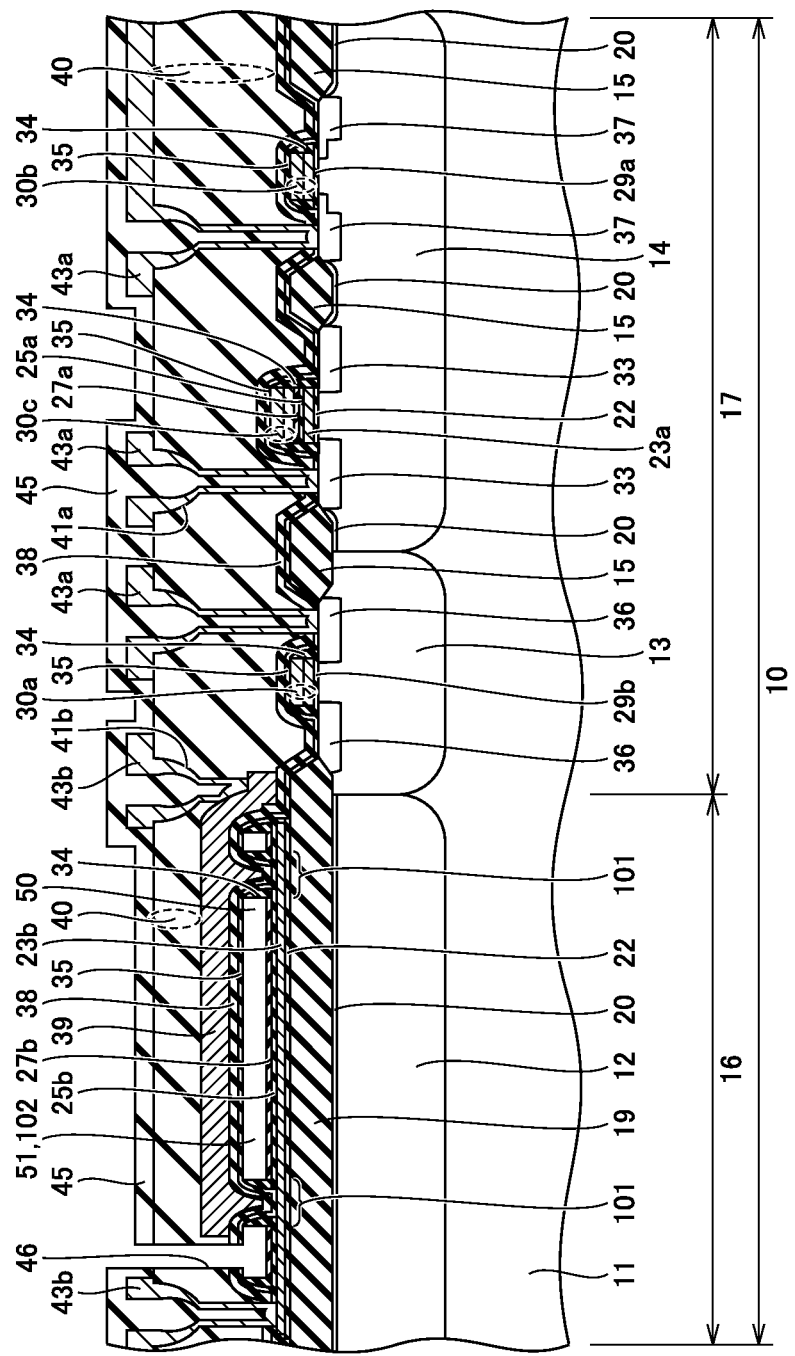
FIG. 26 is a schematic cross sectional view showing an eleventh step of the method of fabricating the first and second regions shown in FIG. 3 in the semiconductor pressure sensor of the first embodiment.

Next, with reference to FIG. 25 and FIG. 26, by applying a photolithography process, a resist mask (not shown) for forming an etching hole is provided. Then, the resist mask is employed as an etching mask to etch portions of first and second interlayer insulation films (interlayer insulation films) in pressure sensor region 16 up to conductor film 30d serving as the sacrifice film. Accordingly, in pressure sensor region 16, etching hole 46 (hole) for etching the sacrifice film is formed external to movable electrode 39. Then, the resist mask is removed.

Next, a wet etching process is performed via etching hole 46 to remove conductor film 30d serving as the sacrifice film having the two-layered structure including the polycrystalline silicon film and the tungsten silicide ($WSi_2$) film. Accordingly, void 50 is formed in the region having had conductor film 30d formed therein, i.e., the region between movable electrode 39 and fixed electrode 23b. For this etching process, TMAH for wet etching is used, for example. Moreover, etching hole 46 communicates with void 50.

Moreover, in the etching process employing the chemical agent (TMAH), the etching rate of the laminated film including the polycrystalline silicon film and the tungsten silicide ($WSi_2$) film constituting sacrifice film 30d is about 5000 to 10000 times (etching selectivity of about 5000 to 10000) as large as the etching rate of the oxide film constituting second interlayer insulation film 45 and first interlayer insulation film 40. Therefore, the elements formed in MOS region 17 and pressure sensor region 16 can be protected by second interlayer insulation film 45 and first interlayer insulation film 40 formed under a condition in conformity with the specification of the semiconductor element formed in the MOS region.

As described above, the step of forming void 50 by forming etching hole 46 and removing conductor film 30d is performed after the step of forming interconnections 43a, 43b. As to the process of removing conductor film 30d, dry etching applying xenon difluoride ($XeF_2$) or the like may be employed other than wet etching.

Moreover, by etching conductor film 30d after forming first interlayer insulation film 40 and second interlayer insulation film 45 on movable electrode 39 as described above, movable electrode 39 can be protected surely by first interlayer insulation film 40 and the like during the formation of etching hole 46. In other words, movable electrode 39 is protected by thick first interlayer insulation film 40 and the like during the formation of etching hole 46 and the removal of conductor film 30d, thereby suppressing a problem such as movable electrode 39 being etched. Further, interlayer insulation films 40, 45 serving as the protection film are simultaneously formed as the same layer as interlayer insulation films 40, 45 in MOS region 17, so that the MOS standard process is intentionally applied to the step of forming pressure sensor region 16, thereby suppressing increase of fabrication steps and contributing to reduction of the production cost.

Figure 27:
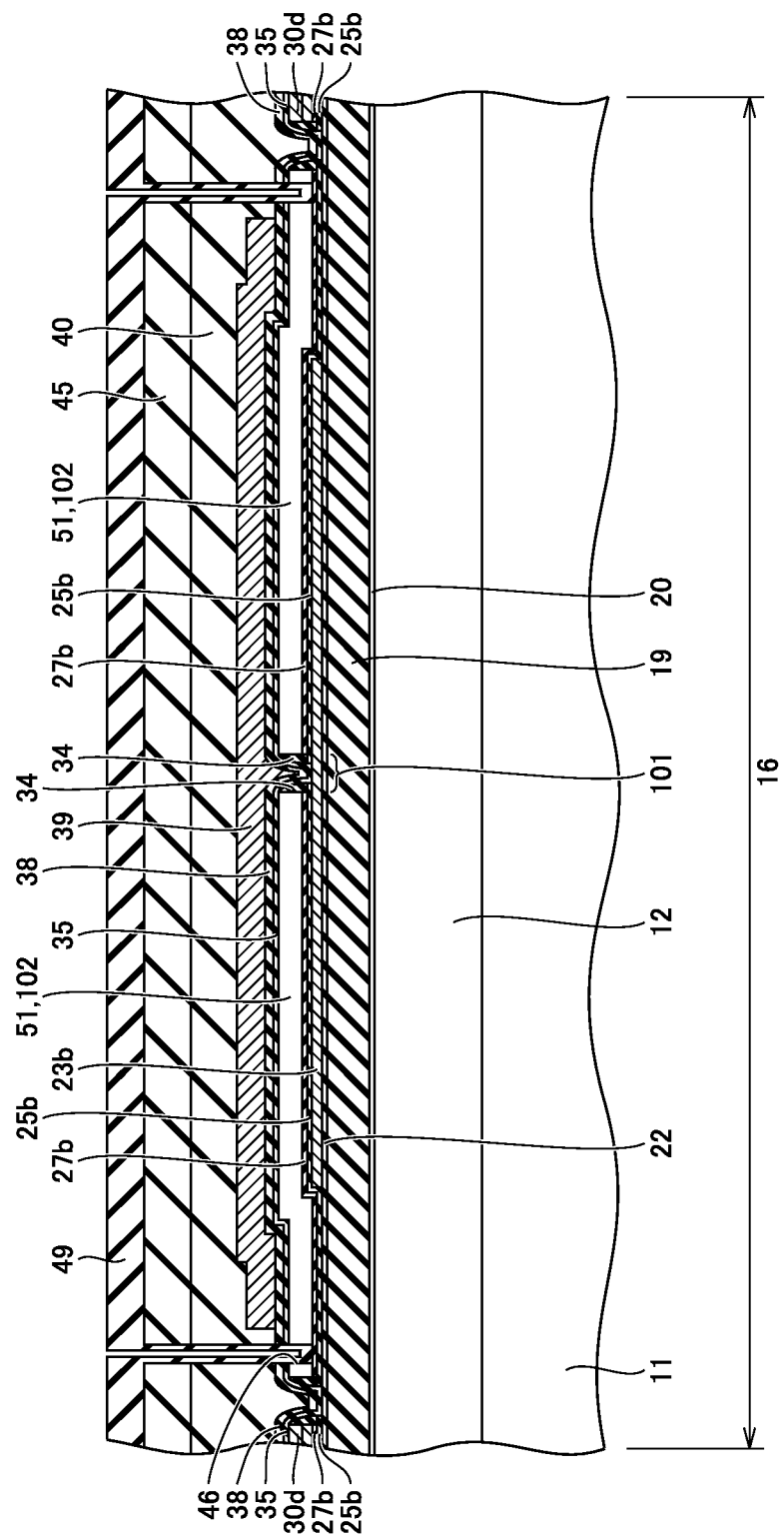
FIG. 27 is a schematic cross sectional view showing a twelfth step of the method of fabricating the first region shown in FIG. 2 in the semiconductor pressure sensor of the first embodiment.
Figure 28:
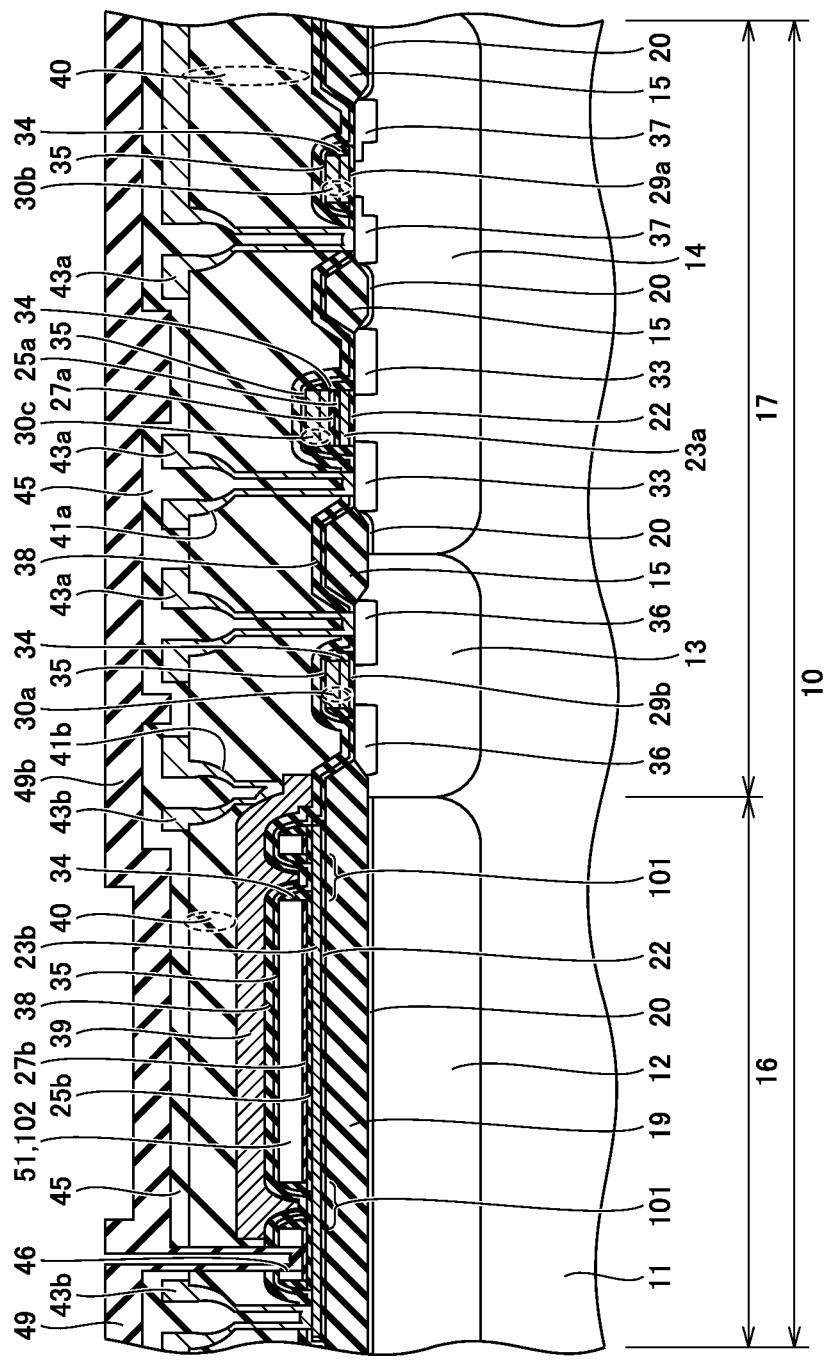
FIG. 28 is a schematic cross sectional view showing a twelfth step of the method of fabricating the first and second regions shown in FIG. 3 in the semiconductor pressure sensor of the first embodiment.

Next, with reference to FIG. 27 and FIG. 28, a process is performed to form, into the vacuum chamber, void 50 formed by removing conductor film 30d. First, for example, the same plasma CVD method as that in forming second interlayer insulation film 45 is employed to form a P-TEOS film on the entire surfaces of pressure sensor region 16 and MOS region 17. Accordingly, first sealing film 49 and third interlayer insulation film 49b are formed to close at least a portion (such as an inner wall surface) of etching hole 46. Here, first sealing film 49 in pressure sensor region 16 and third interlayer insulation film 49b in MOS region 17 are the same layer formed using the same material. The formation of first sealing film 49 and third interlayer insulation film 49b by the plasma CVD method on this occasion is performed under a reduced pressure (for example, not less than $1.3 \times 10^2$ Pa and not more than $1.3 \times 10^4$ Pa). In this way, void 50 is formed into vacuum chamber 51 having reduced pressure as described above, and vacuum chamber 51 becomes a space sealed against the outside by first sealing film 49 in etching hole 46.

Figure 29:
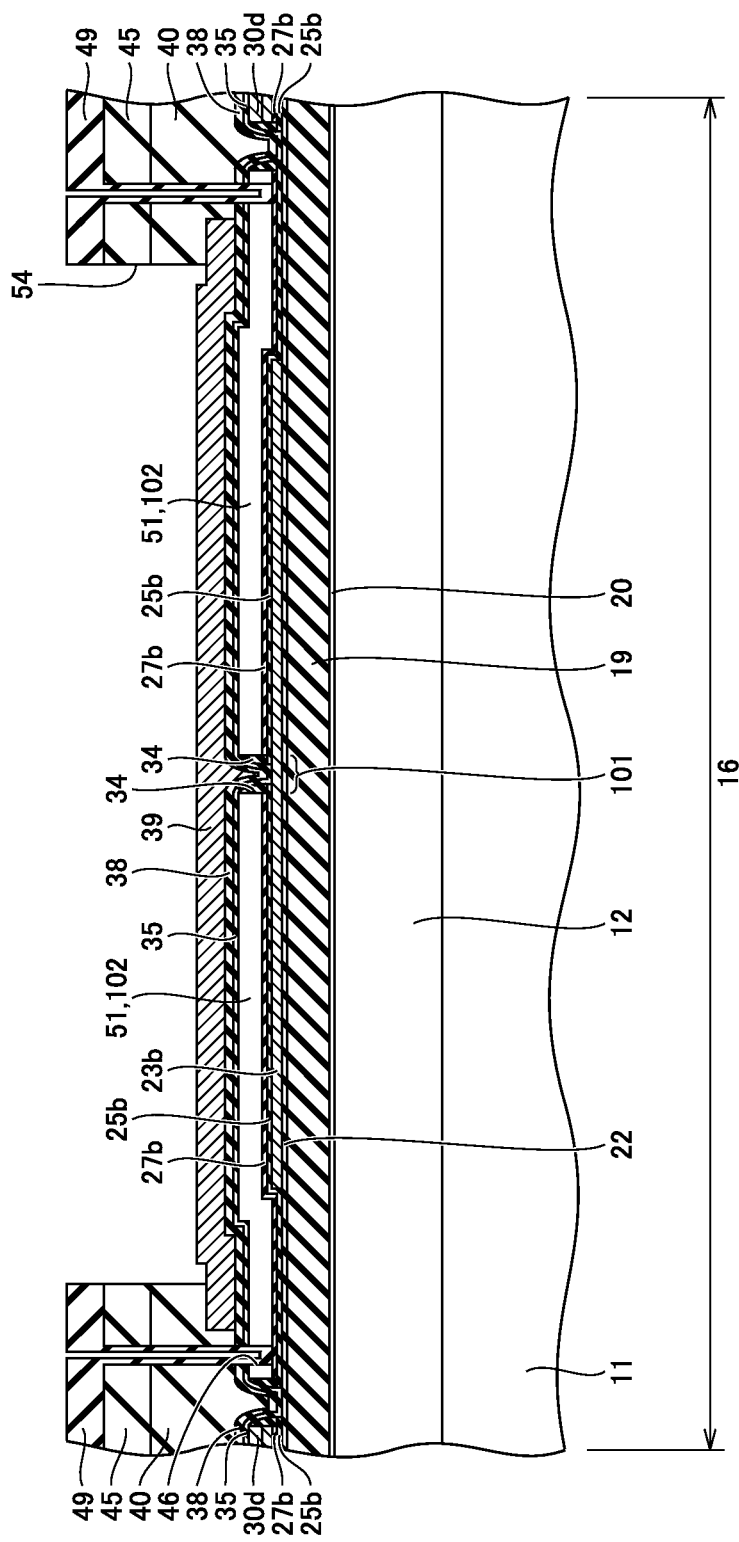
FIG. 29 is a schematic cross sectional view showing a thirteenth step of the method of fabricating the first region shown in FIG. 2 in the semiconductor pressure sensor of the first embodiment.
Figure 30:
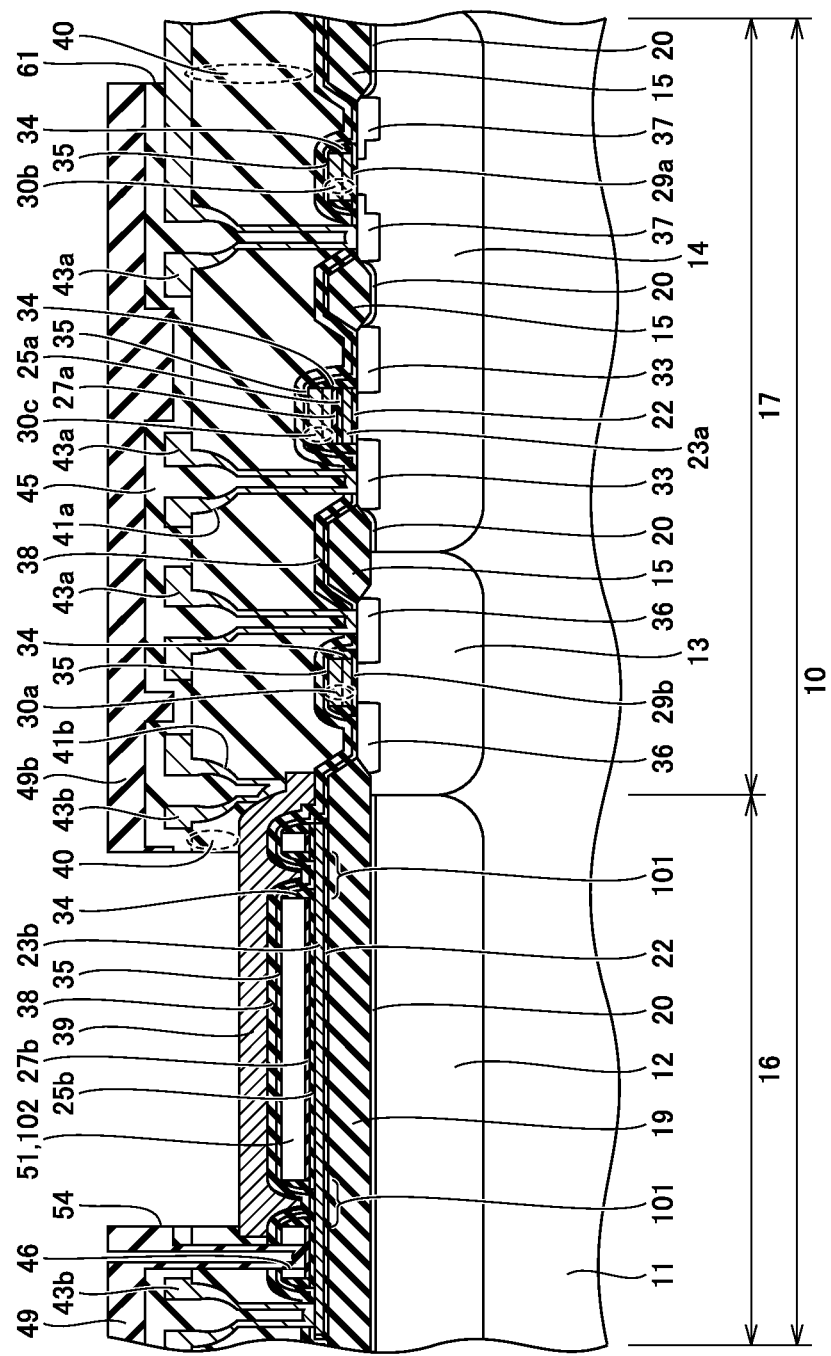
FIG. 30 is a schematic cross sectional view showing a thirteenth step of a method of fabricating the first and second regions shown in FIG. 3 in the semiconductor pressure sensor of the first embodiment.

Next, with reference to FIG. 29 and FIG. 30, a resist mask (not shown) is formed to expose a portion in which an opening is to be formed. Using that resist mask as an etching mask, a dry etching process or an etching process involving a combination of a dry etching process and a wet etching process is applied.

Accordingly, in pressure sensor region 16, portions of first sealing film 49, second interlayer insulation film 45, and first interlayer insulation film 40 are removed from the region in which the pressure sensor opening is to be formed. In pressure sensor region 16, they are removed from at least a portion of the region just above movable electrode 39, whereby pressure sensor opening 54 (opening) is formed in pressure sensor region 16 to expose movable electrode 39.

Meanwhile, in MOS region 17, portions of first sealing film 49 and second interlayer insulation film 45 are removed from the region in which the pad opening is to be formed. Accordingly, in this region, pad opening 61 is formed to expose interconnection 43a.

With reference to FIG. 2 and FIG. 3 again, then, the plasma CVD method is employed to form a silicon nitride film (not shown), which is to serve as the passivation film and has a film thickness of about 0.5 to 1.0 μm, under conditions in conformity with the specification of the semiconductor element formed in MOS region 17 (under relatively low temperature condition and other conditions), so as to cover first sealing film 49 and third interlayer insulation film 49b.

Next, a resist mask (not shown) is formed to expose the portion in which pressure sensor opening 54 is to be formed in pressure sensor region 16, and to expose the portion in which pad opening 61 is to be formed in MOS region 17. By performing a dry etching process using the resist mask as an etching mask, portions of the silicon nitride film are removed from the region in which pressure sensor opening 54 and pad opening 61 are to be formed. Accordingly, passivation film 52a serving as a protection film is formed in MOS region 17, whereas second sealing film 52b further closing etching hole 46 is formed in pressure sensor region 16. Passivation film 52a and second sealing film 52b are the same layer formed using the same material. Since the second sealing film is thus formed as the same layer as the protection film, the number of steps can be reduced as compared with a case where they are formed in different steps.

In this way, vacuum chamber 51 is sealed twice by first sealing film 49 and second sealing film 52b. That is, the sealing portion filling etching hole 46 is formed by providing the plurality of thin films (first sealing film 49 and second sealing film 52b) made of different materials on each other. Accordingly, reliable vacuum sealing can be attained.

As described above, with reference to FIG. 29 and FIG. 2 particularly, according to the fabrication method in the present embodiment, detection anchor 101 divides movable electrode 39 into the plurality of movable electrode units 102, whereby one pair of adjacent movable electrode units 102 of the plurality of movable electrode units 102 divided are formed to share the same detection anchor 101.

Next, the following describes function and effect of the present embodiment.

In the present embodiment, one pair of adjacent movable electrode units 102 of the plurality of movable electrode units 102 divided by detection anchor 101 in, for example, the horizontal direction or vertical direction in the plan view of FIG. 1 are formed to share the same detection anchor 101. This leads to improved efficiency with regard to an area occupied by detection anchor 101 as compared with a case where detection anchors 101 are provided individually for movable electrode units 102, for example. Therefore, the plane area occupied by detection anchor 101 can be reduced. Accordingly, the plane area of the entire pressure sensor can be reduced. Moreover, by a capacitance corresponding to the reduced area of detection anchor 101, sensor capacitance can be suppressed from being increased due to parasitic capacitance included in the detection anchor 101.

Moreover, in the present embodiment, detection anchor 101 is formed to fill the opened portion obtained by (at least partially) removing the sacrifice film (conductor film 30d) in advance and formed precisely in terms of dimension by way of photolithography technique and etching. As a result, detection anchor 101 has a configuration such that it is formed to fill the opened portion provided in vacuum chamber 51 in advance.

Hence, detection anchor 101 can be formed highly precisely in terms of dimension to have necessary minimum width and area without causing a problem such as a change in area depending on etching time during formation of a groove for forming detection anchor 101, for example. As a result, the entire area of the pressure sensor including detection anchor 101 can also be necessary minimum. Moreover, since vacuum chamber 51 is formed by etching conductor film 30d patterned in advance in this way, vacuum chamber 51 can be formed highly precisely in terms of dimension without causing a problem such as change in area of vacuum chamber 51 depending on the etching time for conductor film 30d.

In the present embodiment, the range of movable electrode unit 102 is determined as the range of vacuum chamber 51 formed by forming void 50 by completely removing conductor film 30d (sacrifice film) from the region surrounded by detection anchor 101 when viewed in a plan view. Accordingly, the plane area of void 50 (vacuum chamber 51) of movable electrode unit 102 can be controlled with high precision.

Next, since the plurality of movable electrode units 102 are provided symmetrical to detection anchor 101 when viewed in a plan view, detection anchor 101 can support each movable electrode 39 with good balance.

Next, in the present embodiment, etching hole 46 is formed in the non-overlapping region external to movable electrode 39. For example, a thick film made of a material different from the movable electrode is provided on the movable electrode if a through hole is formed in the movable electrode, an etching hole extending to the through hole is formed by etching a viscously flowable film formed to cover the through hole, and a sealing film is formed to close the etching hole. This results in large flection of the movable electrode and accordingly results in complicated temperature characteristic of the movable electrode. This leads to a complicated circuit for performing temperature compensation when detecting a change in pressure of the pressure sensor as a change in capacitance value between the movable electrode and the fixed electrode, with the result that the plane area of the entire pressure sensor may become large.

However, in the present embodiment, movable electrode 39 is not provided with an etching hole and a sealing film for closing the etching hole. In this case, even when only one etching hole 46 having a maximum size (diameter in the case of a circular shape) of, for example, about 1 μm when viewed in a plan view is formed for movable electrode unit 102, conductor film 30d therebelow can be etched and etching hole 46 may be filled by sealing the formed void 50 with an optimal film thickness of sealing portion, which is not provided on movable electrode 39. With this, the thicknesses of first sealing film 49 and second sealing film 52b for closing etching hole 46 and sealing vacuum chamber 51 can be set freely, thus forming a more reliable sealing portion.

Moreover, because no etching hole 46 is provided above movable electrode 39 and no component is placed thereon, control for stress characteristic or the like of movable electrode 39 can be facilitated. Moreover, because no etching hole 46 is provided above movable electrode 39 and no component is placed thereon, movable electrode 39 can have a flat shape, thereby facilitating control for stress characteristic and temperature characteristic of movable electrode 39 and more simplifying the fabrication process of movable electrode 39.

It should be noted that in the present case, no component is placed on movable electrode 39 in the final product since pressure sensor opening 54 is formed thereabove; however, movable electrode 39 is covered with thick interlayer insulation films 40, 45 at least until conductor film 30d is removed. Hence, interlayer insulation films 40, 45 on this movable electrode 39 can be used as a protection film during the removal of conductor film 30d as described above.

Moreover, etching hole 46 is also formed external to fixed electrode 23b. Accordingly, etching hole 46 is formed to have a flat shape without being affected by irregularities in the surface of fixed electrode 23b. Hence, movable electrode 39 can be also formed to have a flat shape without being affected by the irregularities in the surface otherwise caused by etching hole 46.

Moreover, in the present embodiment, fixed electrode 23b and floating gate electrode 23a are formed simultaneously as the same layer, first fixed electrode protection film 25b and second gate oxide film 25a are formed simultaneously as the same layer, and second fixed electrode protection film 27b and first silicon nitride film 27a are formed simultaneously as the same layer. Further, conductor film 30d and gate electrodes 30a, 30b, 30c are formed as the same layer, and sealing portions 49, 52b in pressure sensor region 16 and protection films 49b, 52a in MOS region 17 are simultaneously formed as the same layers, respectively.

This means that fixed electrode 23b, first fixed electrode protection film 25b, and first silicon nitride film 27a do not need to be independently formed to form detection pressure sensor 1010 of pressure sensor region 16. Therefore, the MOS standard process can be applied intentionally to the step of forming pressure sensor region 16, thereby suppressing increase in the number of fabrication steps and contributing to reduction of the production cost. Thus, the process for pressure sensor region 16 is highly affinitive to the MOS process, thereby facilitating formation of semiconductor pressure sensor device 10 having both pressure sensor region 16 and MOS region 17.

Further, after formation of interconnections 43a, 43b, second interlayer insulation film 45 and etching hole 46 are formed, and conductor film 30d is removed. This leads to reduction of possibility of occurrence of a problem such as the resist being introduced into interconnections 43a, 43b during the etching of interlayer insulation films 40, 45 or conductor film 30d, thus facilitating handling of interconnections 43a, 43b during the process.

Moreover, by providing conductor film 30d as the sacrifice film between fixed electrode 23b and movable electrode 39, no process is required to suppress so-called sticking, i.e., suppress movable electrode 39 from sticking to fixed electrode 23 due to influence of surface tension during the wet process, so that the number of steps can be reduced and handling of the interconnections 43a, 43b in the step can be facilitated. Thus, after the formation of interconnections 43a, 43b, etching hole 46 is formed. Accordingly, damage to interconnections 43a, 43b can be suppressed by performing each wet process such as etching hole formation while covering interconnections 43a, 43b during the formation of etching hole 46 and the like.

(Second Embodiment)

A reference pressure sensor 1000 included in a semiconductor pressure sensor device 10 of the present embodiment is an exemplary pressure sensor, but is different from detection pressure sensor 1010 of the first embodiment in points described below.

Figure 31:
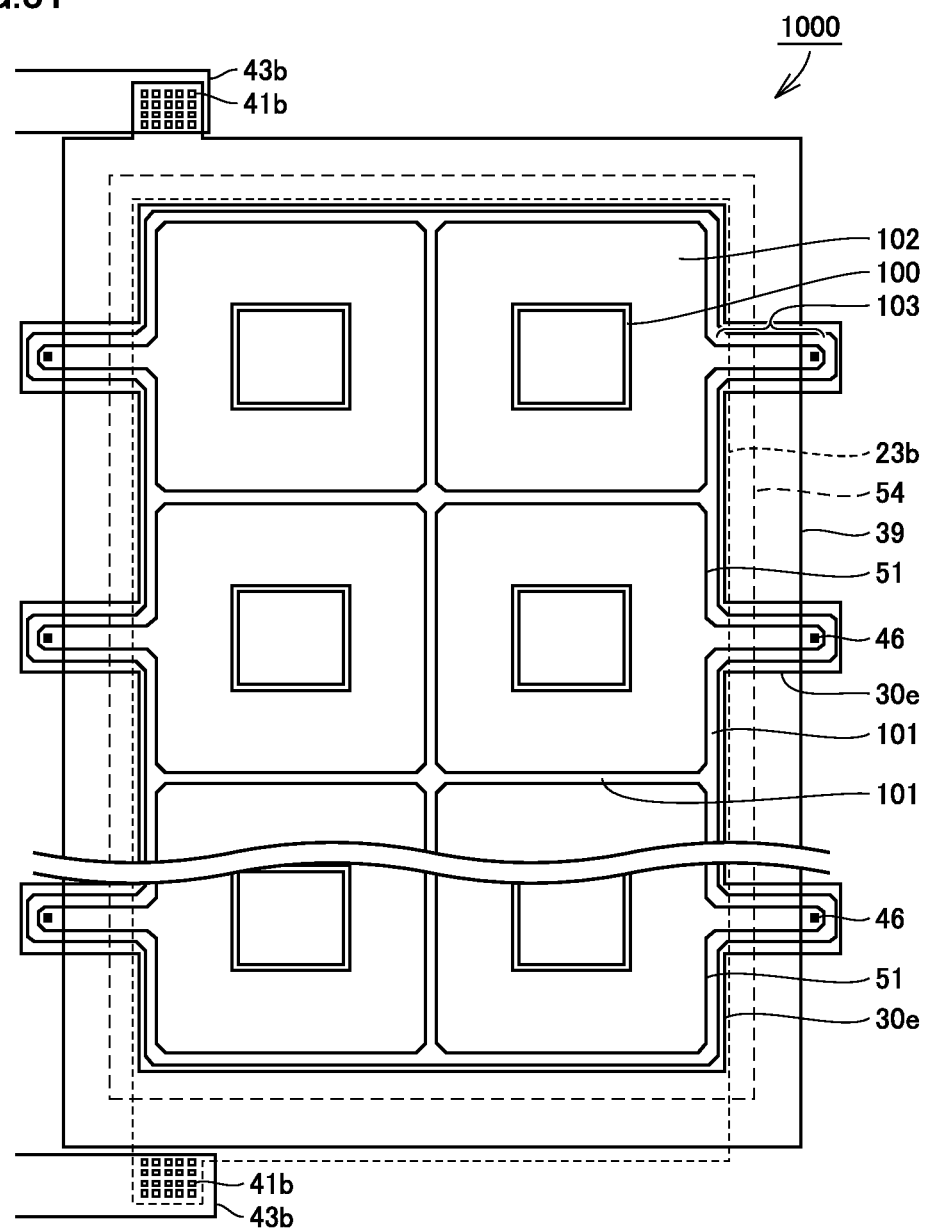
FIG. 31 is a schematic plan view showing a configuration of a reference pressure sensor of a second embodiment.

With reference to FIG. 31, as with the first embodiment, reference pressure sensor 1000 included in semiconductor pressure sensor device 10 of the present embodiment has a detection anchor 101 (first anchor) that divides into movable electrode units 102 in the form of matrix. However, in addition to this, in each movable electrode unit 102 of reference pressure sensor 1000, movable electrode 39 has a reference anchor 100 (second anchor) as an anchor portion.

Figure 32:
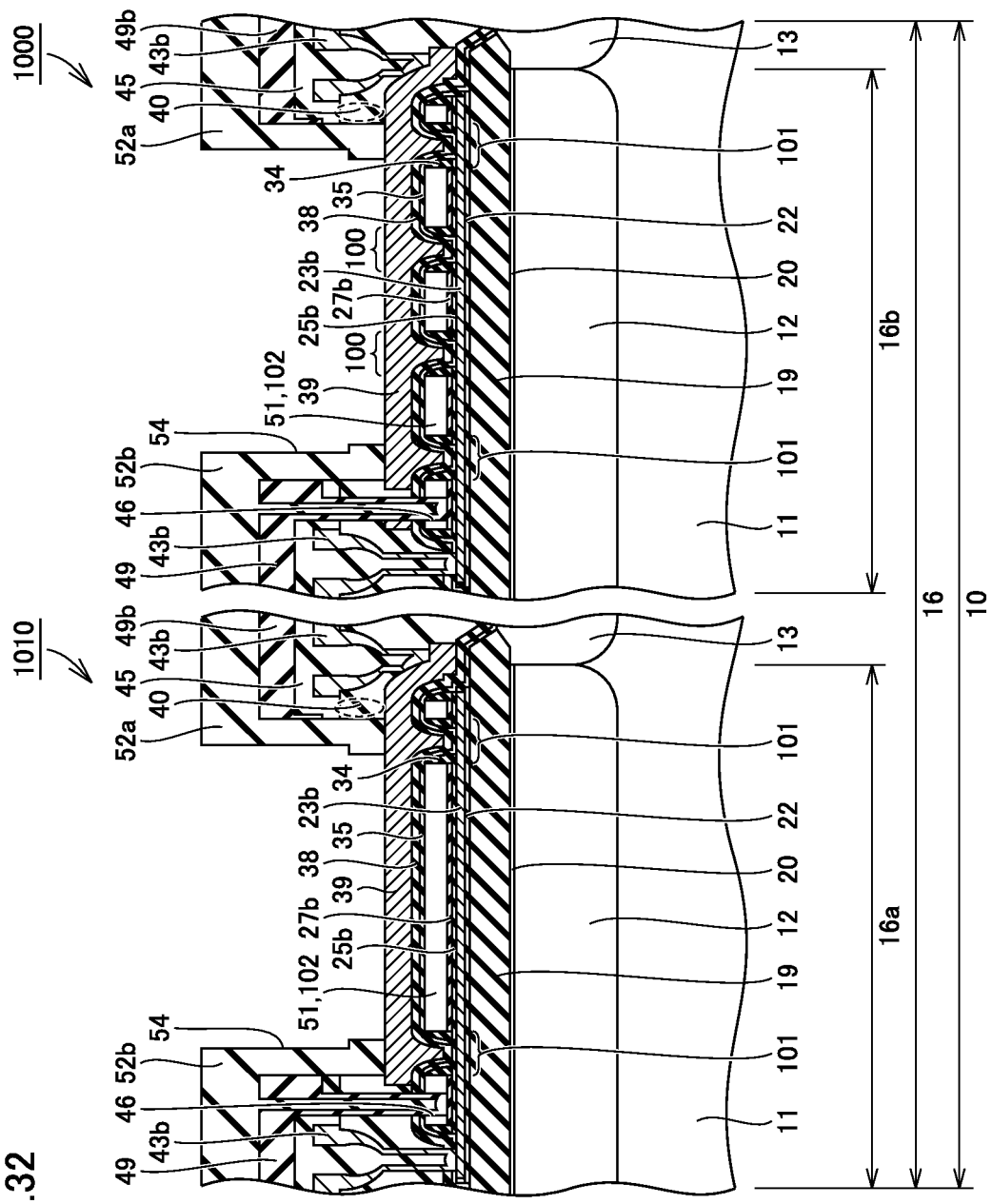
FIG. 32 is a schematic cross sectional view showing a configuration in which a detection pressure sensor and the reference pressure sensor are combined with each other in a first region in the second embodiment.

Specifically, with reference to FIG. 32, a detection pressure sensor 1010 formed in a detection pressure sensor region 16a on the left side has basically the same configuration as that in pressure sensor region 16 of FIG. 3, for example. Specifically, as with pressure sensor region 16 of FIG. 3, detection pressure sensor region 16a of FIG. 32 has detection anchor 101 formed therein, and movable electrode units 102 are formed by being surrounded by detection anchor 101, but no anchor portion is formed in each of movable electrode units 102.

In contrast, in a reference pressure sensor region 16b on the right side of FIG. 32, reference pressure sensor 1000 is formed. The configuration in reference pressure sensor region 16b is basically the same as that in detection pressure sensor region 16a (pressure sensor region 16 of FIG. 3). However, in reference pressure sensor 1000, in addition to detection anchor 101, reference anchor 100 is formed in the central portion of movable electrode unit 102.

The configuration of reference anchor 100 is basically same as that of detection anchor 101, and reference anchor 100 is configured such that movable electrode 39 extends downward (silicon substrate 11 side) to fill the opened portion in vacuum chamber 51 serving as a void.

Figure 33:
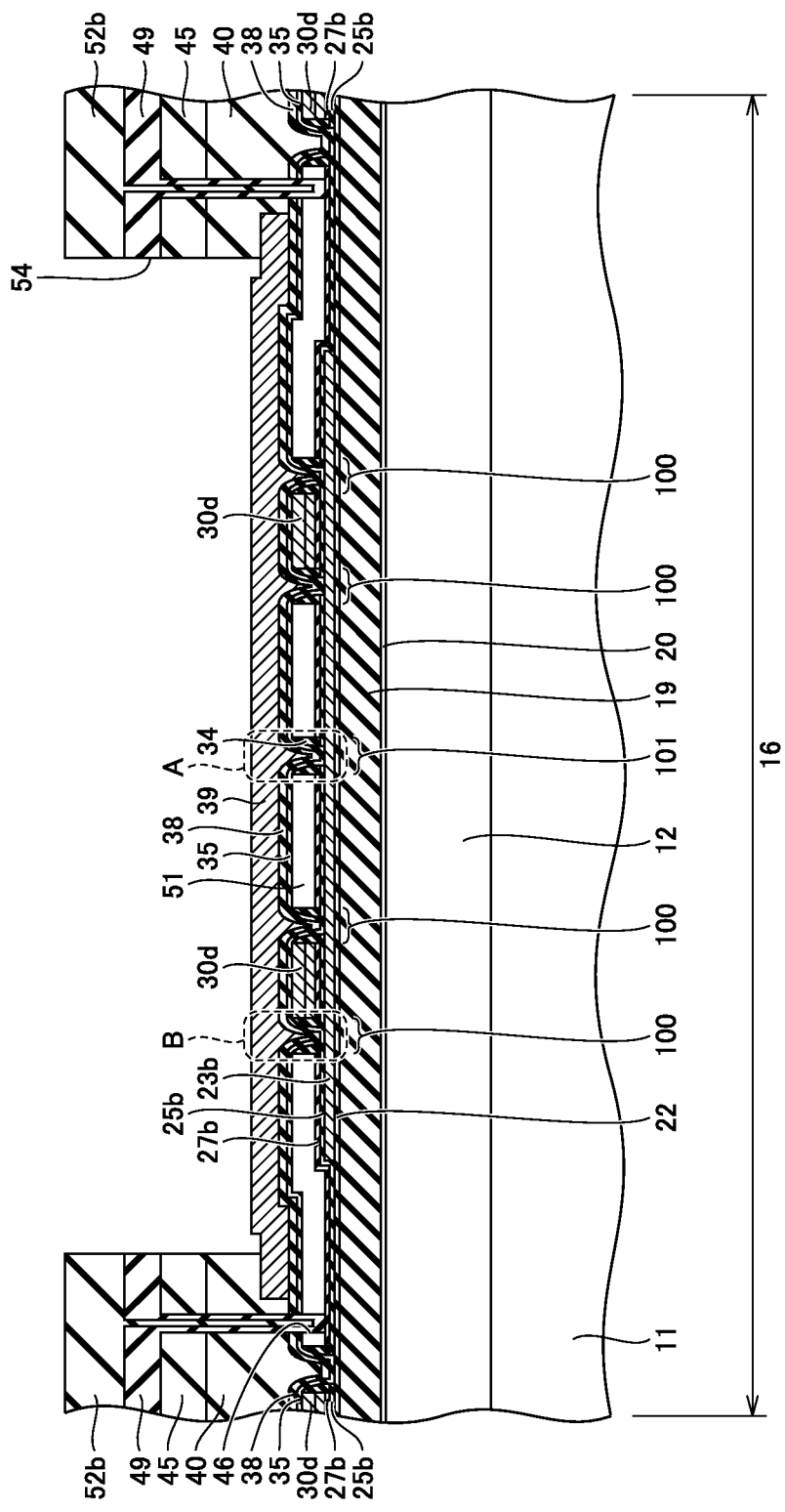
FIG. 33 is a schematic cross sectional view of a first region (reference pressure sensor) surrounded by a XXXIII-XXXIII line of FIG. 31.

With reference to FIG. 31 and FIG. 33, reference anchor 100 is formed as the opened portion of vacuum chamber 51, which is formed to have, for example, a loop-like planar shape in movable electrode unit 102, rather than being formed as an end portion that divides into movable electrode units 102. Thus, reference anchor 100 divides movable electrode unit 102 into an inner circumference side and an outer circumference side. In FIG. 31, reference anchor 100 is formed to have a rectangular planar shape, but the shape is not limited to this and reference anchor 100 may be formed to have a hexagonal or circular planar shape, for example. Moreover, conductor film 30d is not removed and remains in the inside of the opened portion of vacuum chamber 51 serving as reference anchor 100 when viewed in a plan view (in the region of reference anchor 100 surrounded in the form of a rectangle when viewed in a plan view), and it is preferable to have such a configuration.

With reference to FIG. 32 again, pressure sensor region 16 of semiconductor pressure sensor device 10 of the present embodiment may have a configuration such that detection pressure sensor 1010 and reference pressure sensor 1000 are combined with each other (both the sensors are combined to be arranged side by side, for example).

It should be noted that apart from this, the configuration of the present embodiment is substantially the same as that of the first embodiment and therefore the same elements are given the same reference characters and are not repeatedly described.

Next, the following describes function and effect of the present embodiment.

As described above, semiconductor pressure sensor device 10 detects a change in space between movable electrode 39 and fixed electrode 23b as an amount of change in capacitance value, thereby measuring pressure applied to movable electrode 39. Here, for example, in detection pressure sensor 1010 of FIG. 32, the following capacitances are actually included: a capacitance value A of first fixed electrode protection film 25b between fixed electrode 23b and vacuum chamber 51; a capacitance value B of second fixed electrode protection film 27b; a capacitance value C of silicon oxide film 35 and TEOS-based oxide film 38 between movable electrode 39 and vacuum chamber 51; and a capacitance value D of vacuum chamber 51. By combining these capacitance values, the capacitance value of the entire detection pressure sensor 1010 is found.

Among these capacitances, only capacitance value D of vacuum chamber 51 is changed depending on external pressure applied to movable electrode 39. Hence, in order to more precisely measure the value of pressure applied to movable electrode 39, the respective initial values of capacitance values A to C need to be precisely known.

However, regarding first fixed electrode protection film 25b, for example, it is difficult to precisely know the initial value of capacitance value A due to film thickness variation during formation of second gate oxide film 25a and first fixed electrode protection film 25b. Regarding second fixed electrode protection film 27b, it is difficult to precisely know the initial value of capacitance value B due to: film thickness variation during formation of first silicon nitride film 27a, which is the same layer as second fixed electrode protection film 27b; and variation of an amount of film decrease in second fixed electrode protection film 27b during removal of conductor film 30d (sacrifice film). Moreover, it is difficult to precisely know the initial value of capacitance value C due to: film thickness variation during formation of silicon oxide film 35 and TEOS-based oxide film 38 to serve as the movable electrode protection film in pressure sensor region 16; and variation of an amount of film decreases in silicon oxide film 35 and TEOS-based oxide film 38 in pressure sensor region 16 during etching and removal of conductor film 30d. Further, regarding vacuum chamber 51 for which the capacitance value is changed depending on external pressure, it is difficult to precisely know the initial value of capacitance value D due to film thickness variation during formation of gate electrode 30c as the same layer as conductor film 30d.

In view of these, in the present embodiment, in order to cancel such variations of the initial values of the capacitance values, reference pressure sensor region 16b is provided around (near) detection pressure sensor region 16a in pressure sensor region 16. In detection pressure sensor region 16a, detection pressure sensor 1010 having pressure sensor opening 54 is formed, whereas in reference pressure sensor region 16b, reference pressure sensor 1000 having pressure sensor opening 54 is formed. That is, semiconductor pressure sensor device 10 is configured such that detection pressure sensor region 16a and reference pressure sensor region 16b are combined with each other.

In reference pressure sensor 1000, reference anchor 100 is formed in movable electrode unit 102, so that the space between movable electrode 39 and fixed electrode 23b is less likely to be changed even when external pressure is changed, as compared with detection pressure sensor 1010. Hence, by subtracting the change of the capacitance value of the reference pressure sensor from the change of the capacitance value of detection pressure sensor 1010, the variations in the initial values of capacitance values A to D can be canceled. As a result, a pressure value can be measured with high precision.

In the present embodiment, it has been illustrated that one reference anchor 100 (having a rectangular shape) is formed for each movable electrode unit 102; however, the present invention is not limited to this and a plurality of reference anchors 100 may be formed for movable electrode unit 102.

In the inside of the opened portion of vacuum chamber 51 as reference anchor 100 when viewed in a plan view (the inside of the rectangular shape of reference anchor 100 when viewed in a plan view), conductor film 30d is not removed and remains, whereby as with reference anchor 100, movement of movable electrode 39 in the vertical direction can be suppressed with regard to the region thus having conductor film 30d remaining therein. This provides a more increased effect of suppressing the movement of movable electrode 39 in the vertical direction.

(Third Embodiment)

Figure 34:
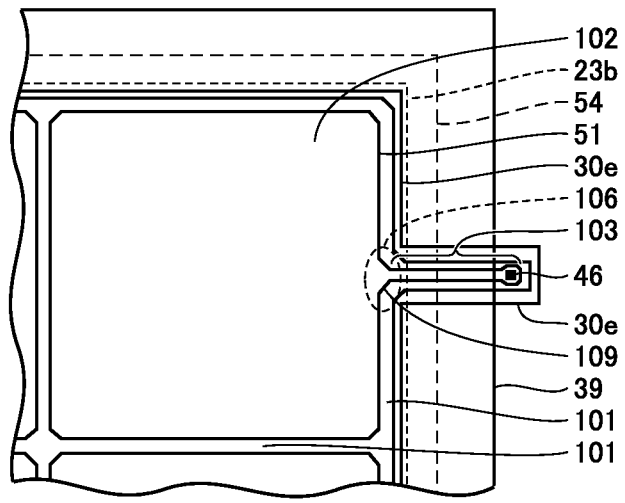
FIG. 34 is an enlarged schematic plan view of the same region as that of FIG. 4 in a first example of a third embodiment, i.e., a movable electrode unit.

With reference to FIG. 34, a movable electrode unit 102 of a first example of the present embodiment has basically the same configuration as that of movable electrode unit 102 of the first embodiment shown in FIG. 1 and FIG. 4, and has an etching hole 46 formed in a drawn region 103 as with the first embodiment. However, in FIG. 34, the width of drawn region 103 (in the vertical direction of FIG. 34) is smaller than the width of drawn region 103 of FIG. 1 and FIG. 4. Regarding this point, FIG. 34 is different from FIG. 1 and FIG. 4; however, the other points are basically the same as those in FIG. 1 and FIG. 4 and therefore the same elements are given the same reference characters and are not repeatedly described.

Only with such a configuration, stress concentration on a movable electrode drawn root portion 106 of movable electrode unit 102 can be relaxed. Specifically, in order to attain a better sealing state at a sealing portion that fills the inside of etching hole 46, the maximum size (diameter in the case of a circular shape) of etching hole 46 when viewed in a plan view is preferably not more than 1.0 μm. In this case, the width of drawn region 103 in which etching hole 46 is formed is set at about 1 μm, thereby relaxing the stress of movable electrode drawn root portion 106.

Figure 35:
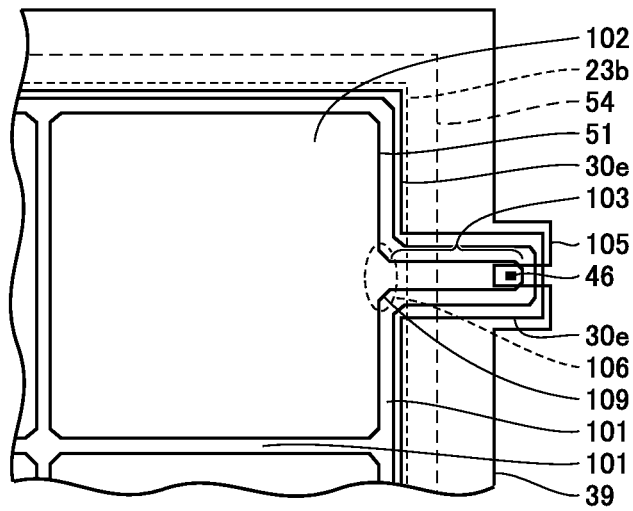
FIG. 35 is an enlarged schematic plan view of the same region as that of FIG. 4 in a second example of the third embodiment, i.e., a movable electrode unit.

With reference to FIG. 35, a movable electrode unit 102 of a second example of the present embodiment has basically the same configuration as that of movable electrode unit 102 of the first embodiment shown in FIG. 1 and FIG. 4, and has an etching hole 46 formed in a drawn region 103 as with the first embodiment. However, in FIG. 35, etching hole 46 is formed to be surrounded by the same layer (same material) as movable electrode 39 when viewed in a plan view. In other words, etching hole 46 is formed to extend through a portion of the region of movable electrode 39. The region formed of the same material as movable electrode 39 and surrounding etching hole 46 is formed as a sealing region reinforcement portion 105. Regarding this point, FIG. 35 is different from FIG. 1 and FIG. 4; however, the other points are basically the same as those in FIG. 1 and FIG. 4 and therefore the same elements are given the same reference characters and are not repeatedly described.

In this way, the strength of the sealing portion (first sealing film 49 and second sealing film 52b) filling etching hole 46 can be improved as compared with a case where the circumference of etching hole 46 is covered only with an oxide film or a nitride film, thereby improving reliability of the sealing portion of vacuum chamber 51.

Figure 36:
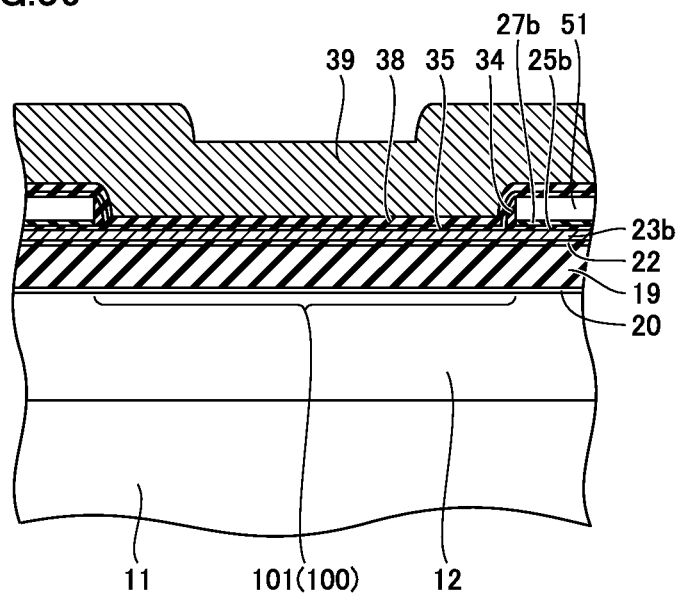
FIG. 36 is a schematic enlarged cross sectional view of an anchor portion in the first embodiment.

Next, with reference to FIG. 36, when the cross sectional shape of detection anchor 101 of the first embodiment as shown in, for example, FIG. 1 and the like (or reference anchor 100 of the second embodiment) is viewed in an enlarged manner, it is understood that the uppermost surface of movable electrode 39 in detection anchor 101 has a recess that is formed to be depressed downward (silicon substrate 11 side) as compared with the uppermost surfaces of the regions of movable electrode 39 other than detection anchor 101. This is due to the following reason: conductor film 30d (vacuum chamber 51) is opened in the region in which detection anchor 101 is formed, and in the regions other than detection anchor 101, movable electrode 39 is formed to be higher by the thickness of vacuum chamber 51, thereby forming a stepped portion between both the regions.

However, when pressure is applied to movable electrode 39, stress may be concentrated on this recess of the surface in detection anchor 101. Moreover, in the portion in which detection anchor 101 is formed, there are only thin silicon oxide film 35 and TEOS-based oxide film 38 between movable electrode 39 and fixed electrode 23b, so that when these thin oxide films have capacitance, detection anchor 101 may have a large parasitic capacitance.

Figure 37:
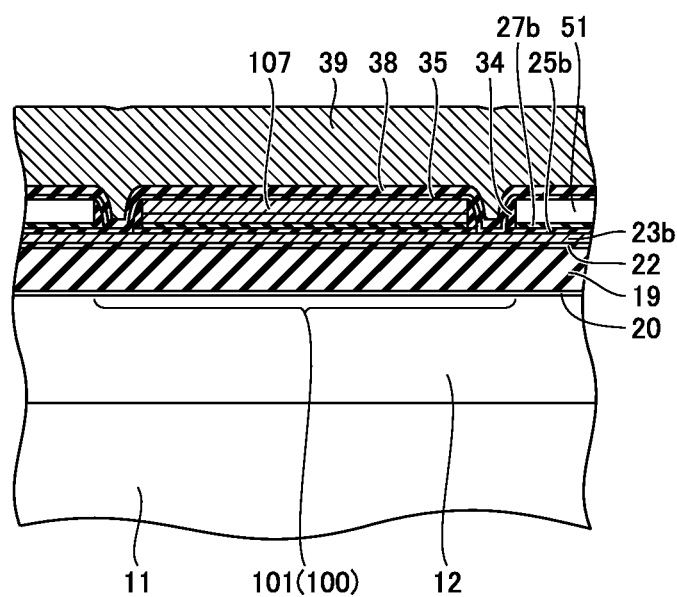
FIG. 37 is an enlarged schematic cross sectional view of an anchor portion in a third example of the third embodiment.

To address this, with reference to FIG. 37, a third example of the present embodiment provides the following configuration: a detection anchor 101 (reference anchor 100) has a opened portion in vacuum chamber 51 only at each of the right and left end portions in the width direction thereof (horizontal direction of FIG. 37) and has a remaining region 107, in which conductor film 30d is not opened and remains, in the region other than the end portions of detection anchor 101. Thus, the anchor portion may include, at least in a portion thereof, the opened portion of conductor film 30d (void 50). However, remaining region 107 is not limited to the same layer (the same material) as conductor film 30d serving as a sacrifice film, and may be formed as the same layer (the same material) as movable electrode 39. Regarding this point, FIG. 37 is different from FIG. 36; however, the other points are basically the same as those in FIG. 36 and therefore the same elements are given the same reference characters and are not repeatedly described.

When the opened portion of vacuum chamber 51 is thus formed only in a portion of the anchor portion, movable electrode 39 is formed to have, at the central portion of the anchor portion, a surface substantially as high as the surface thereof at the region, in which vacuum chamber 51 is not opened, other than the anchor portion. Because the opened portion of vacuum chamber 51 becomes very small (only at each of the end portions in the width direction of detection anchor 101), substantially the entire surface of movable electrode 39 just above detection anchor 101 can be substantially as high as that in the region other than detection anchor 101. Therefore, the (entire) uppermost surface of detection anchor 101 can be substantially flat.

Here, when the width of the opened portion of vacuum chamber 51 at the end portion of detection anchor 101 in the width direction is configured approximately twice or less as large as the total of the thicknesses of movable electrode 39 and oxide films 35, 38, the entire surface of movable electrode 39 can be substantially flat.

Even though there are only thin silicon oxide film 35 and TEOS-based oxide film 38 between movable electrode 39 and fixed electrode 23b, the small width (about 0.2 to 0.8 μm) of the opened portion of conductor film 30d can lead to a small parasitic capacitance.

Further, conductor film 30d is formed as the same layer as gate electrodes 30a to 30c of MOS region 17, so that side wall oxide film 34 formed at the side portion of conductor film 30d is provided at the opened portion of conductor film 30d. Accordingly, the area of the opened portion of conductor film 30d becomes smaller by the area of side wall oxide film 34 thus provided, thereby providing a narrower width of the region in which only thin silicon oxide film 35 and TEOS-based oxide film 38 are provided between movable electrode 39 and fixed electrode 23b. Accordingly, parasitic capacitance in the region can be further reduced and the upper surface of movable electrode 39 (to which pressure is applied) can be more flat. With the more flat upper surface of movable electrode 39, stress concentration on movable electrode 39 can be suppressed when excessive pressure is applied to movable electrode 39.

Further, since remaining region 107 serving as conductor film 30d is provided at the central portion of detection anchor 101, a space between movable electrode 39 and fixed electrode 23b in this region becomes larger than that at each of the right and left end portions of detection anchor 101. Here, capacitance provided by movable electrode 39 and remaining region 107 and capacitance provided by fixed electrode 23b and remaining region 107 may not be taken into consideration. Hence, the value of the parasitic capacitance in the central portion can be reduced, whereby the value of the parasitic capacitance of the whole of detection anchor 101 can be reduced and the sensitivity (ratio of change in capacitance) to a change in pressure applied to movable electrode 39 can be increased.

Figure 38:
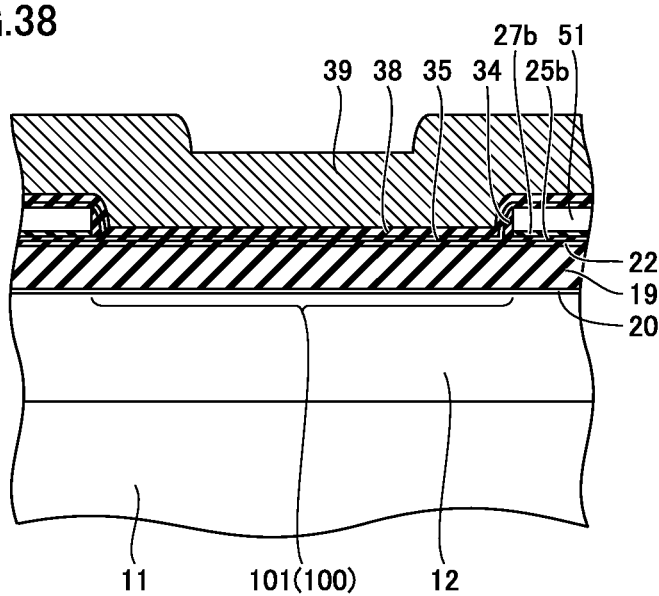
FIG. 38 is an enlarged schematic cross sectional view of an anchor portion in a fourth example of the third embodiment.

Furthermore, with reference to FIG. 38, a fourth example of the present embodiment provides a configuration such that a fixed electrode 23 is not provided in a portion in which a detection anchor 101 (reference anchor 100) is formed. Specifically, fixed electrode 23 is formed only at a net portion that faces a movable portion of movable electrode 39 and that constitutes detection pressure sensor 1010. Regarding this point, FIG. 38 is different from FIG. 36; however, the other points are basically the same as those in FIG. 36 and therefore the same elements are given same reference characters and are not repeatedly described.

In the case where no problem is caused when a recess is formed at the uppermost surface of movable electrode 39 (detection anchor 101), fixed electrode 23b may not be formed in the portion of detection anchor 101 (reference anchor 100). In this way, movable electrode 39 just above the portion having no fixed electrode 23b formed thereon is depressed downward in the figure (silicon substrate 11 side) by a degree corresponding to the portion having no fixed electrode 23b formed thereon, but no parasitic capacitance occurs at all in the region of detection anchor 101 (reference anchor 100). Accordingly, the capacitance of the entire pressure sensor corresponds to the capacitance value of the movable portion (other than the anchor portion) of movable electrode 39, thereby increasing sensitivity (ratio of change in capacitance) to a change in pressure applied to movable electrode 39.

It should be noted that FIG. 36 to FIG. 38 basically show regions A and B (detection anchor 101 or reference anchor 100) surrounded by the dotted line in FIG. 33. As described above, particularly in FIG. 37, the sacrifice film is provided at a portion of the anchor portion, so that there may be employed a configuration such that the opened portion in the sacrifice film is included only at a portion of the anchor portion as in the present embodiment.

(Fourth Embodiment)

A semiconductor pressure sensor device 10 of the present embodiment is configured such that two layers of interconnections are formed on a transistor in a MOS region 17 unlike the one layer of interconnection 43a in the first embodiment, and in this point, semiconductor pressure sensor device 10 of the present embodiment is different from semiconductor pressure sensor device 10 in the first embodiment. With reference to FIG. 39 to FIG. 43, the following describes a first example of a method of fabricating the semiconductor pressure sensor (semiconductor pressure sensor device 10) including a detection pressure sensor 1010 and MOS circuits in the present embodiment. The same configurations in the fabrication steps as those in the first embodiment are given the same reference characters and are not repeatedly described unless necessary. Moreover, in the present embodiment, since no interconnection appears in a region corresponding to the region of FIG. 2 of the first embodiment, the interconnection is not illustrated in the figures and explanation will be made only with reference to a region corresponding to only the region of FIG. 3 of the first embodiment.

Figure 39:
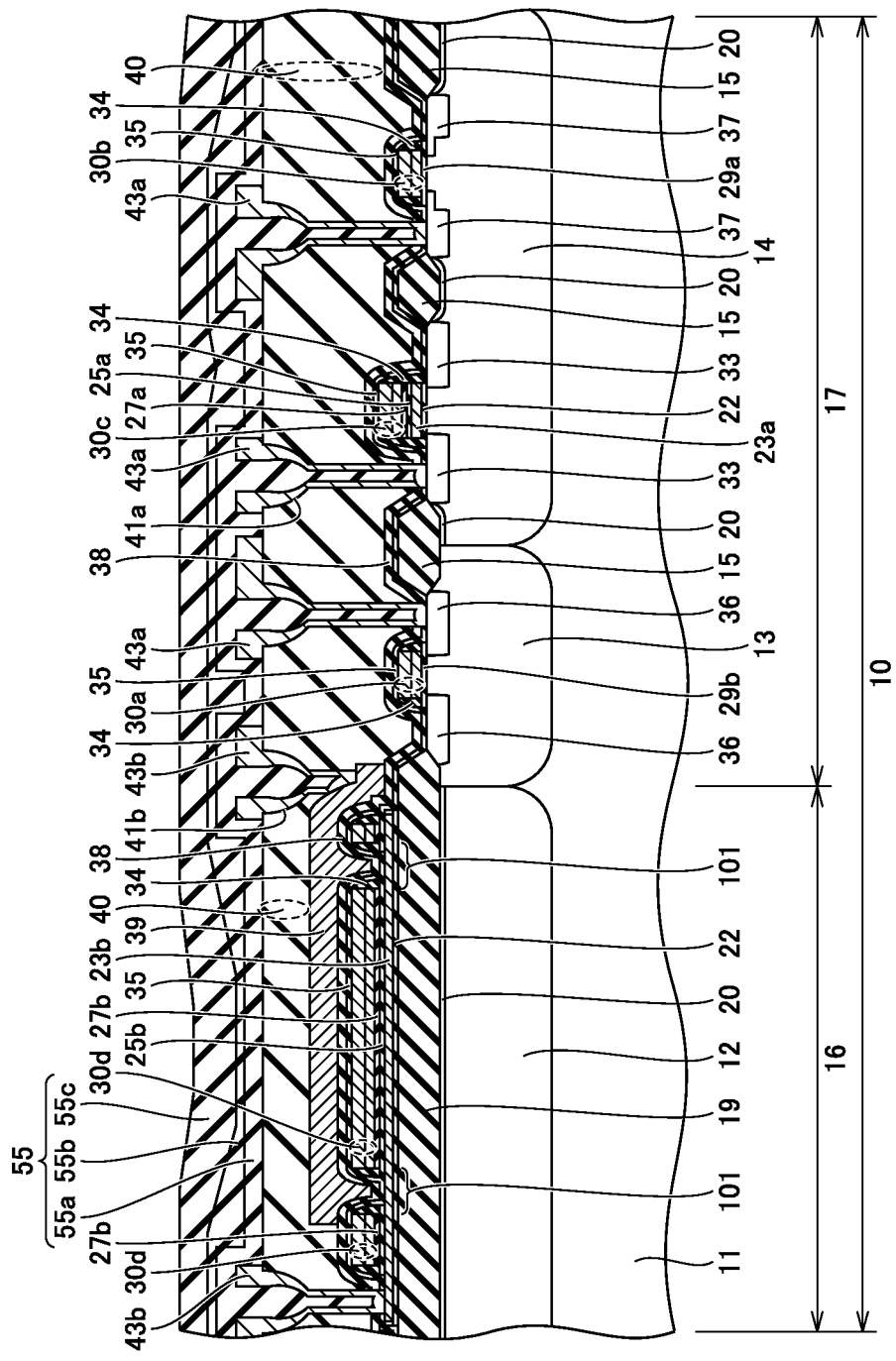
FIG. 39 is a schematic cross sectional view showing a first step of a method of fabricating first and second regions of a semiconductor pressure sensor of a first example of a fourth embodiment.

With reference to FIG. 39, the same process as the fabrication process of the first embodiment is performed until midpoint of the process, and after an interconnection 43a and an interconnection 43b are formed in the same manner as in the step of FIG. 24 of the first embodiment, a second interlayer insulation film 55 (interlayer insulation film) is formed to cover them. As second interlayer insulation film 55, a P-TEOS film or the like formed by a plasma CVD method is suitable, for example. For planarization, a three-layered, laminated structure including a SOG film, i.e., P-TEOS/SOG/P-TEOS may be employed. As one example, FIG. 39 shows second interlayer insulation film 55 including three layers, i.e., a P-TEOS layer 55a, a SOG layer 55b, and a P-TEOS layer 55c provided in this order from the lowest layer. A CMP process may be applied, as with the first interlayer insulation film.

Figure 40:
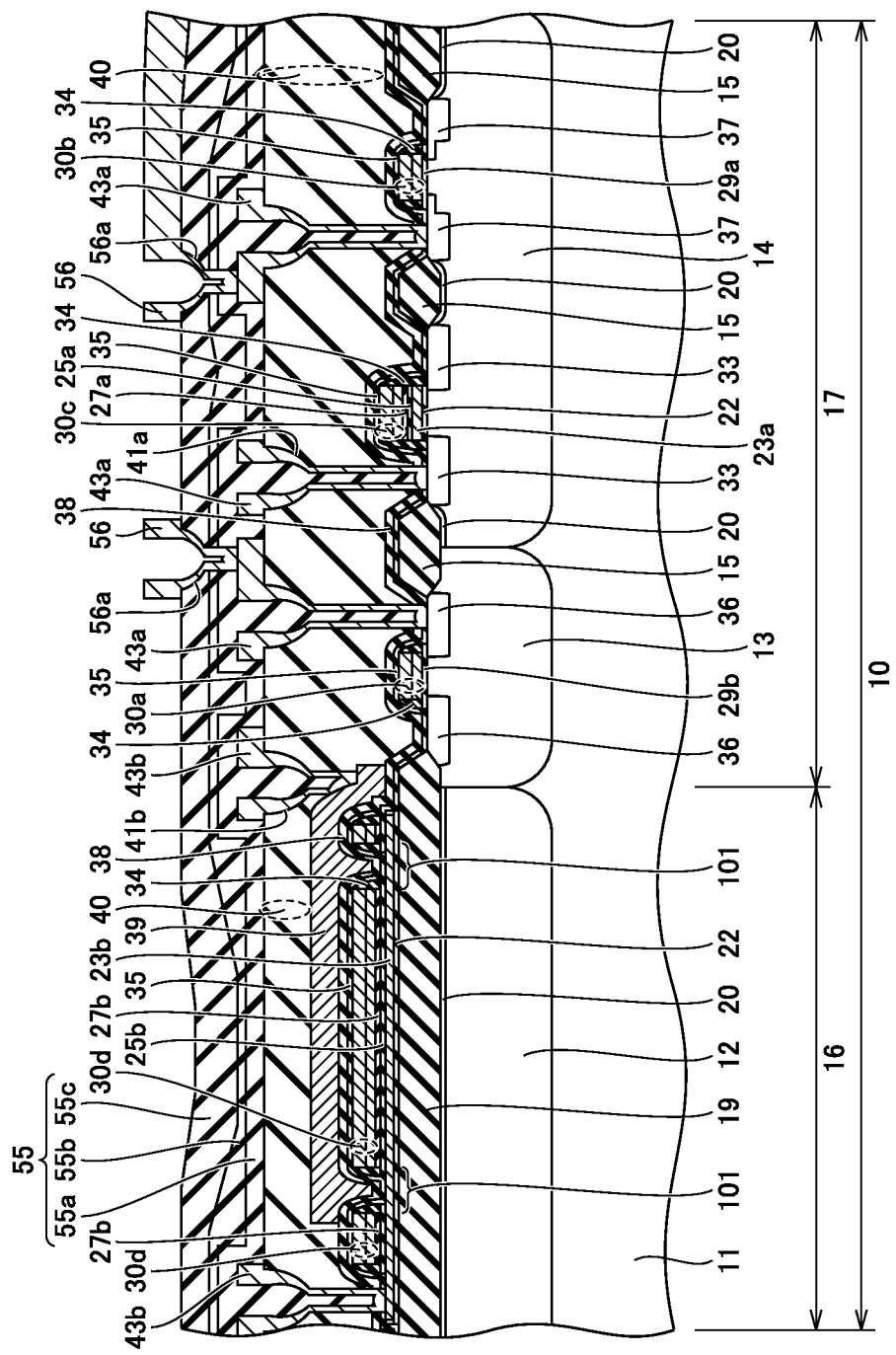
FIG. 40 is a schematic cross sectional view showing a second step of the method of fabricating the first and second regions of the semiconductor pressure sensor of the first example of the fourth embodiment.

Next, with reference to FIG. 40, a resist mask (not shown) for forming a contact hole is provided by applying a photolithography process. Then, the resist mask is used as an etching mask to form a contact hole 56a in second interlayer insulation film 55 so as to extend to interconnection 43a of the MOS region, for example. The process for forming contact hole 56a is similar to the process for forming contact holes 41a, 41b of FIG. 22, for example.

Next, with a process similar to the process for forming interconnections 43a, 43b of FIG. 24, an interconnection 56 is formed in contact hole 56a. This interconnection 56 serves as a second layer of interconnection (second interconnection) with respect to interconnections 43a, 43b (first layer of interconnection: first interconnection). It should be noted that although not shown in the figure, also in pressure sensor region 16, the second interconnection as the same layer as interconnection 56 may be formed in a contact hole formed to extend to interconnection 43b, for example.

Figure 41:
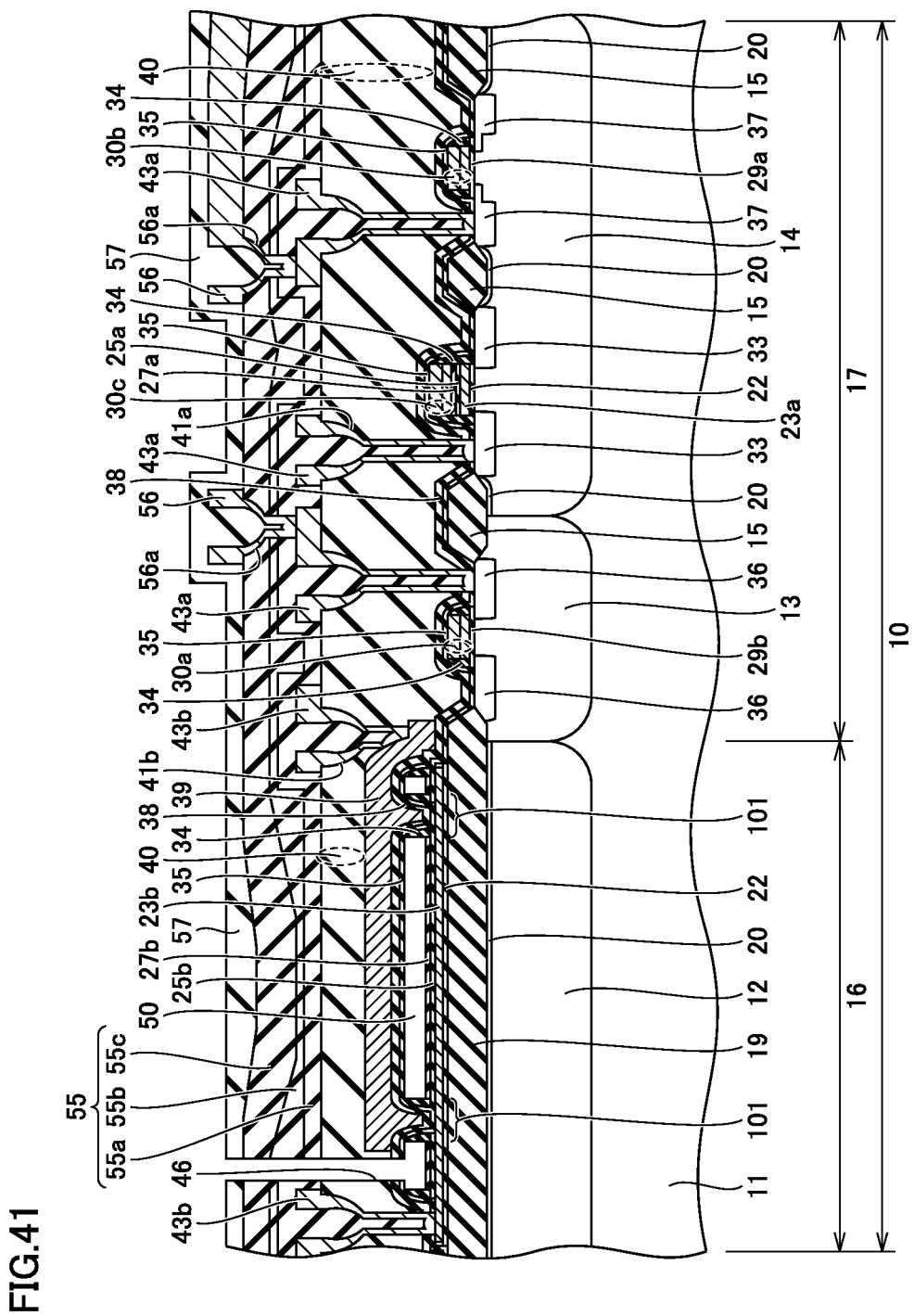
FIG. 41 is a schematic cross sectional view showing a third step of the method of fabricating the first and second regions of the semiconductor pressure sensor of the first example of the fourth embodiment.

With reference to FIG. 41, a third interlayer insulation film 57 is formed to cover interconnection 56. As third interlayer insulation film 57, a P-TEOS film or the like formed by the plasma CVD method is suitable, for example. For planarization, a three-layered, laminated structure including a SOG film, i.e., P-TEOS/SOG/P-TEOS may be employed. A CMP process may be applied, as with the first interlayer insulation film.

Next, by applying a photolithography method, a resist mask (not shown) for forming an etching hole is provided. Then, the resist mask is employed as an etching mask to etch portions of first, second, and third interlayer insulation films (interlayer insulation films) up to conductor film 30d serving as the sacrifice film. Accordingly, in pressure sensor region 16, an etching hole 46 (hole) for etching the sacrifice film is formed external to movable electrode 39. Then, the resist mask is removed.

Next, by a process similar to the process for forming void 50 of FIG. 26, a wet etching process is performed via etching hole 46, thereby removing conductor film 30d (sacrifice film) to form void 50 as in FIG. 26.

Figure 42:
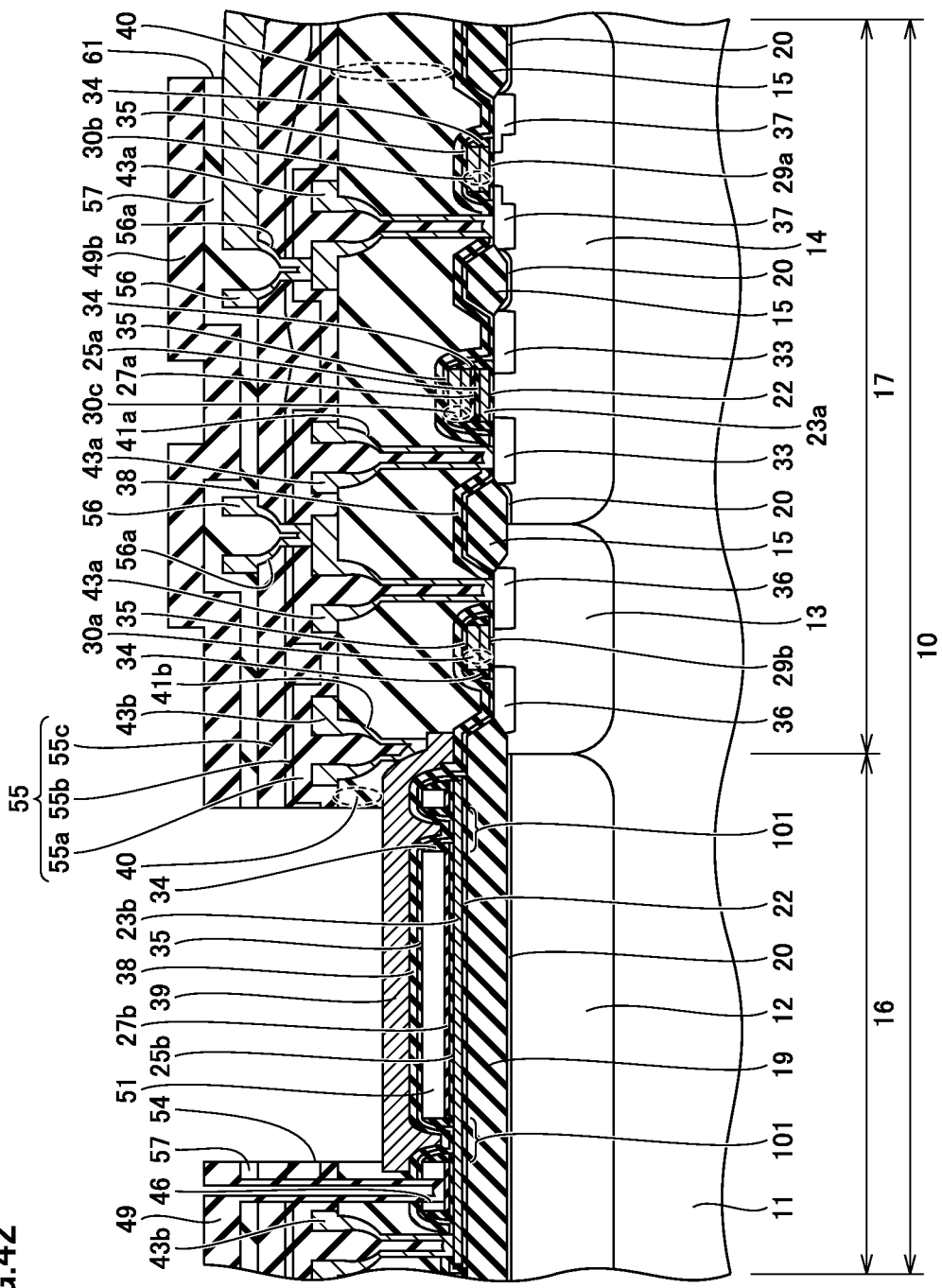
FIG. 42 is a schematic cross sectional view showing a fourth step of the method of fabricating the first and second regions of the semiconductor pressure sensor of the first example of the fourth embodiment.

Next, with reference to FIG. 42, a process is performed to form, into the vacuum chamber, void 50 formed by removing conductor film 30d. First, for example, the same plasma CVD method as that in forming third interlayer insulation film 57 is employed to form a P-TEOS film on the entire surfaces of pressure sensor region 16 and MOS region 17. Accordingly, first sealing film 49 and third interlayer insulation film 49b are formed to close at least a portion (such as an inner wall surface) of etching hole 46. Accordingly, as with the step of FIG. 28, void 50 is formed into vacuum chamber 51 having reduced pressure, and vacuum chamber 51 becomes a space sealed against the outside by first sealing film 49 in etching hole 46.

Next, by performing a process similar to the process for forming pressure sensor opening 54 and pad opening 61 in FIG. 30, pressure sensor opening 54 is formed in pressure sensor region 16 and pad opening 61 is formed in MOS region 17.

Figure 43:
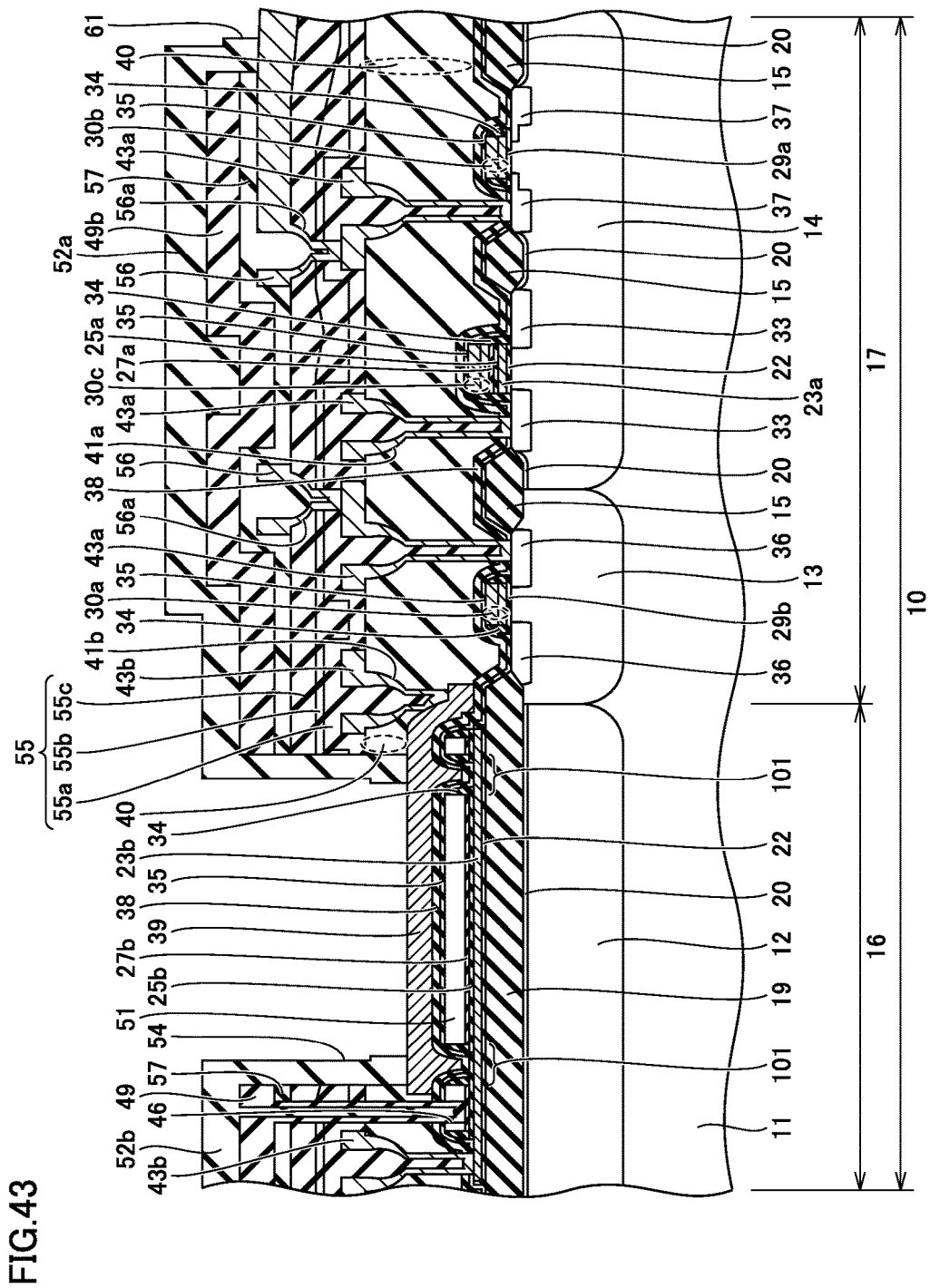
FIG. 43 is a schematic cross sectional view showing a fifth step of the method of fabricating the first and second regions of the semiconductor pressure sensor of the first example of the fourth embodiment.

Then, with reference to FIG. 43, the plasma CVD method is employed as in the first embodiment to form a passivation film 52a and a second sealing film 52b so as to cover first sealing film 49 and third interlayer insulation film 49b.

Next, the following describes function and effect of the first example of the present embodiment.

Also in the present embodiment, as with the first embodiment, third interlayer insulation film 57 and etching hole 46 are formed after forming interconnections 43a, 43b, 56. Accordingly, irrespective of the number of layers of interconnections (irrespective of two or more layers), handling of interconnections 43a, 43b, 56 is facilitated in the process as with the first embodiment, advantageously.

However, in the first example, etching hole 46 for removing conductor film 30d in pressure sensor region 16 is formed after formation of interconnection 56 of MOS region 17. However, in a second example described below, contact hole 56a for forming interconnection 56 of MOS region 17 and etching hole 46 may be formed simultaneously, whereas interconnection 56 and first sealing film 49 may be formed simultaneously. Next, with reference to FIG. 44 to FIG. 46, the following describes the second example of the method of fabricating the semiconductor pressure sensor (semiconductor pressure sensor device 10) including detection pressure sensor 1010 and the MOS circuits of the present embodiment.

Figure 44:
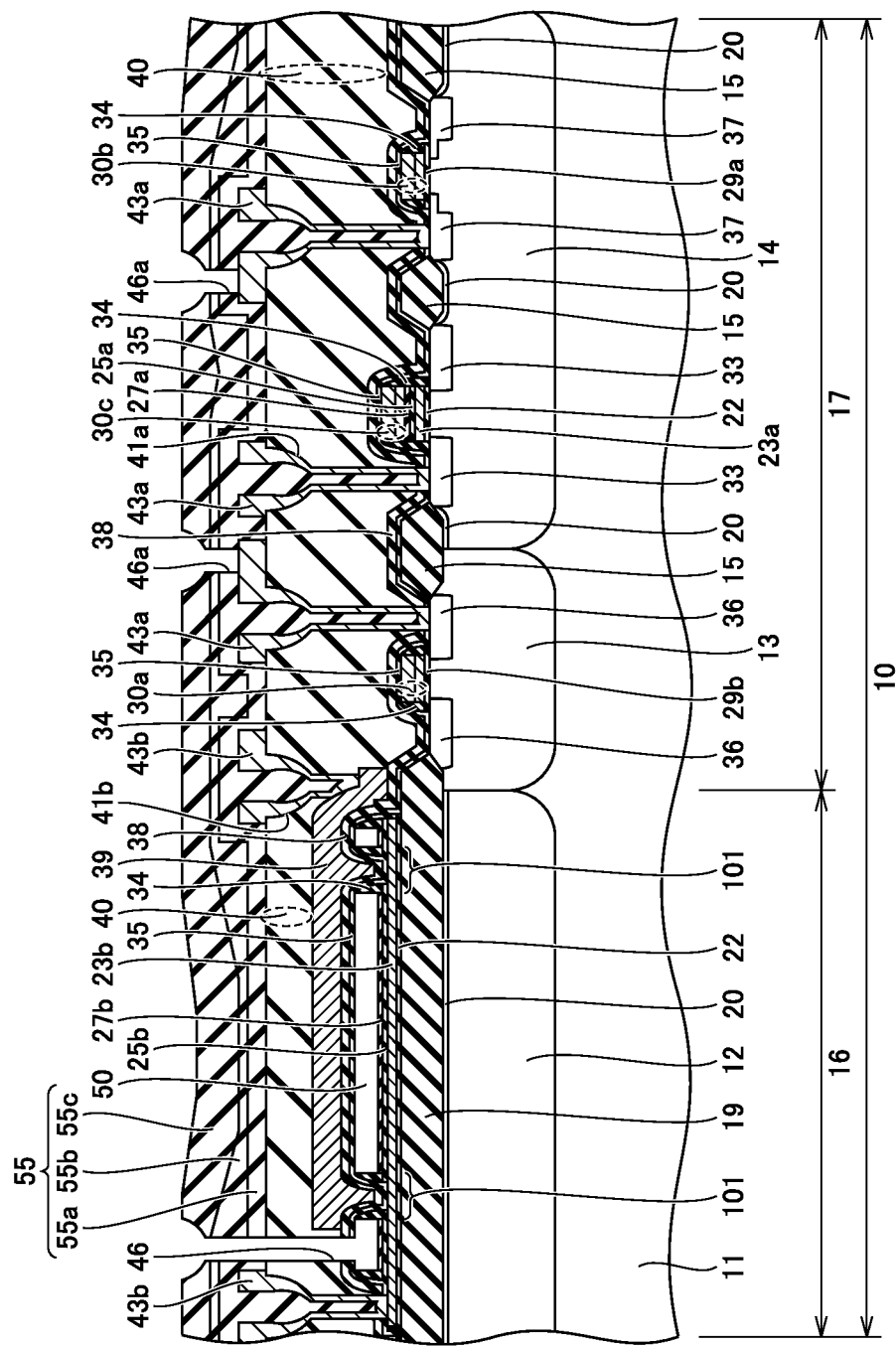
FIG. 44 is a schematic cross sectional view showing a first step of a method of fabricating first and second regions of a semiconductor pressure sensor of a second example of the fourth embodiment.

With reference to FIG. 44, the same process as the fabrication process of the first embodiment is performed until midpoint, and second interlayer insulation film 55 is formed as in FIG. 39. Then, a resist mask (not shown) for forming a contact hole and an etching hole is provided by applying a photolithography process. Then, the resist mask is used as an etching mask to simultaneously form a contact hole 46a similar to contact hole 56a of FIG. 40 in second interlayer insulation film 55 at MOS region 17 and an etching hole similar to etching hole 46 of FIG. 41 in second interlayer insulation film 55 at pressure sensor region 16. Then, the resist mask is removed.

Etching hole 46 and contact hole 46a are formed under conditions in conformity with the specifications of the elements formed in pressure sensor region 16 and MOS region 17. Contact hole 46a is formed by a process similar to the process for forming contact hole 41b of FIG. 22. Moreover, etching hole 46 is formed by a process similar to a process for forming etching hole 46 of FIG. 26.

Next, by a process similar to the process for forming interconnections 43a, 43b of FIG. 26, a wet etching process is performed via etching hole 46, thereby removing conductor film 30d (sacrifice film) to form void 50 as in FIG. 26.

Figure 45:
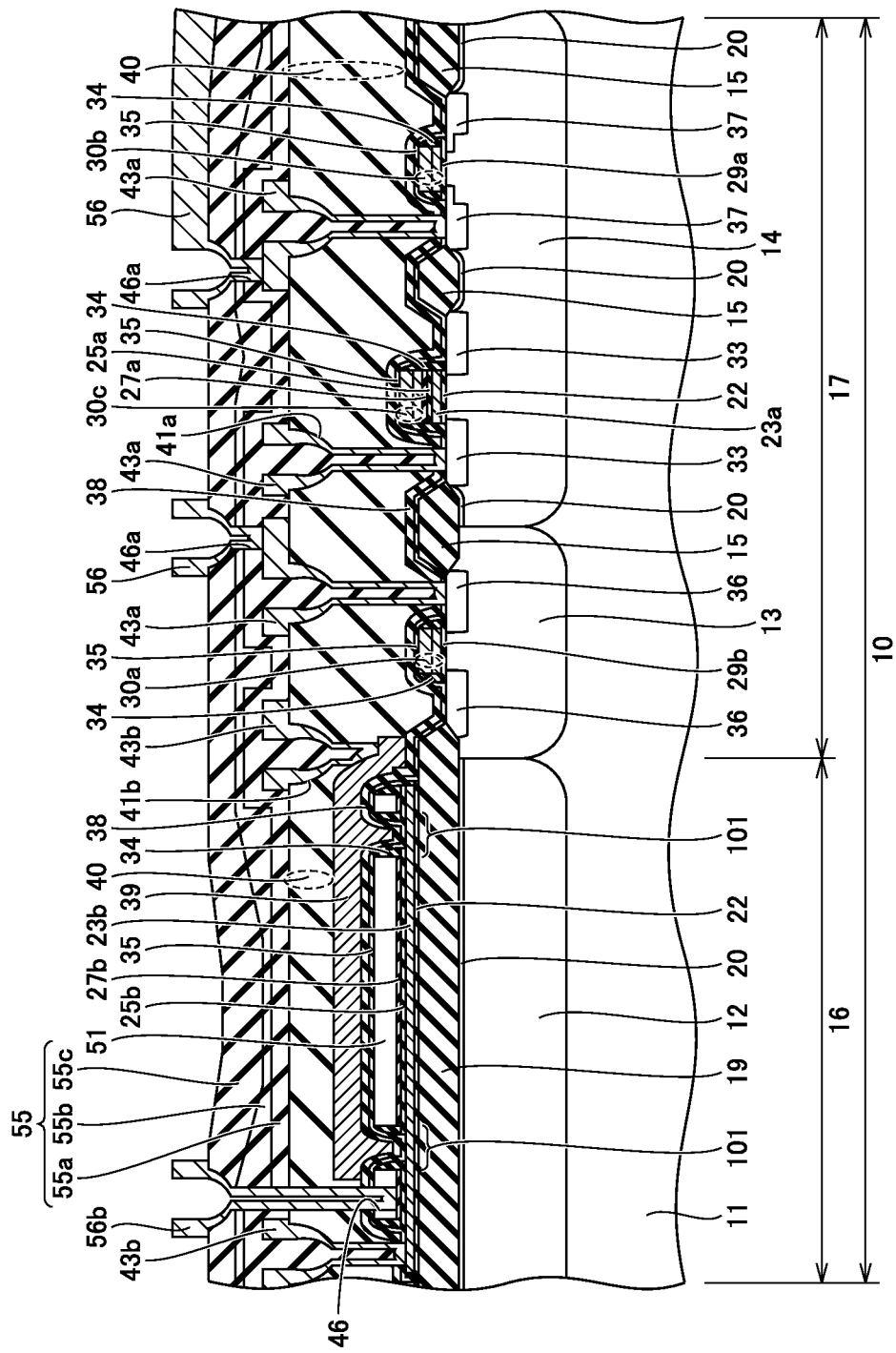
FIG. 45 is a schematic cross sectional view showing a second step of the method of fabricating the first and second regions of the semiconductor pressure sensor of the second example of the fourth embodiment.

Next, with reference to FIG. 45, a process similar to the process for forming interconnections 43a, 43b of FIG. 24 is employed to simultaneously form interconnection 56 in contact hole 46a and a first metal sealing film 56b in etching hole 46 as the same layer (same material) as interconnection 56. Interconnection 56 is electrically connected to interconnection 43a.

First metal sealing film 56b is obtained by forming an aluminum silicon copper film or the like by means of, for example, the sputtering method. Because the process of the sputtering method is performed in vacuum, void 50 is formed into vacuum chamber 51 having reduced pressure as described above, and vacuum chamber 51 becomes a space sealed against the outside by first metal sealing film 56b in etching hole 46.

Figure 46:
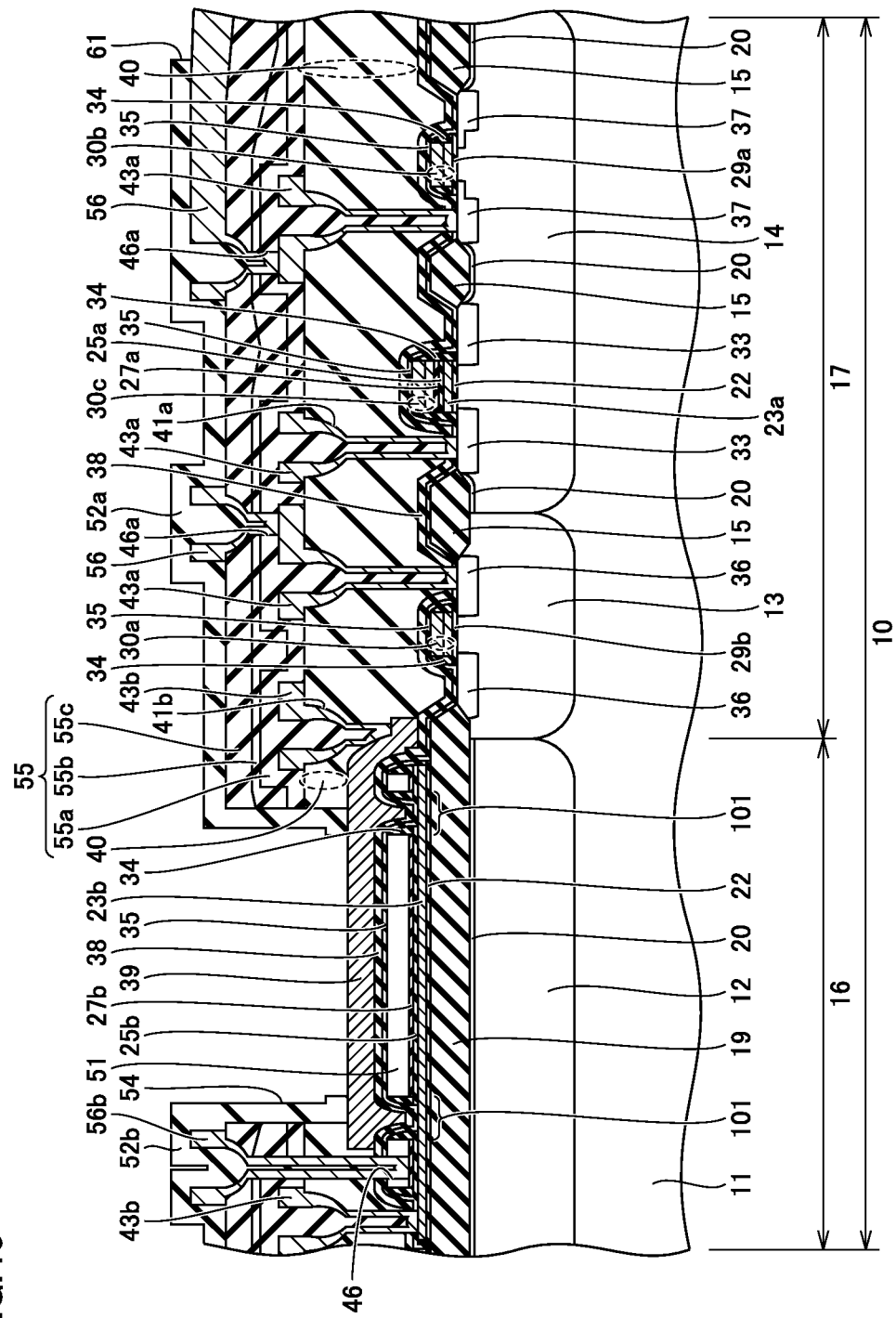
FIG. 46 is a schematic cross sectional view showing a third step of the method of fabricating the first and second regions of the semiconductor pressure sensor of the second example of the fourth embodiment.

Next, with reference to FIG. 46, a resist mask (not shown) is formed to expose a portion in which an opening is to be formed, and the resist mask is used as an etching mask to perform a process similar to the process for forming pressure sensor opening 54 of FIG. 30. Accordingly, in pressure sensor region 16, portions of second interlayer insulation film 45 and first interlayer insulation film 40 are removed from the region in which the pressure sensor opening is to be formed, thereby forming pressure sensor opening 54.

Then, as with the first embodiment, under conditions (relatively low temperature condition and other conditions) in conformity with the specifications of the semiconductor elements formed in MOS region 17, a silicon nitride film (not shown) having a film thickness of about 0.5 to 1.0 μm and to serve as a passivation film is formed by the plasma CVD method on interlayer insulation film 55 to cover first metal sealing film 56b and second interconnection 56. Then, by performing the same process as that in the first embodiment using the resist mask (not shown), a portion of the silicon nitride film is removed from regions in which pressure sensor opening 54 and pad opening 61 are to be formed. Accordingly, passivation film 52a serving as a protection film is formed in MOS region 17, whereas second sealing film 52b further closing etching hole 46 is formed in pressure sensor region 16. Passivation film 52a and second sealing film 52b are the same layer formed using the same material.

In this way, in the present example, vacuum chamber 51 is sealed twice by first metal sealing film 56b and second sealing film 52b (the sealing portion is formed by providing the plurality of thin films made of different materials on each other). Accordingly, reliable vacuum sealing can be attained.

Next, the following describes function and effect of the second example of the present embodiment.

In addition to the first example, in the second example of the present embodiment above, etching hole 46 and first metal sealing film 56b in pressure sensor region 16 are formed as the same layer as contact hole 46a and interconnection 56 in MOS region 17. Accordingly, the MOS standard process can be applied more intentionally to the step of forming pressure sensor region 16, thereby suppressing increase in the number of fabrication steps and further contributing to reduction of the production cost. Thus, the process for pressure sensor region 16 is highly affinitive to the MOS process, thereby facilitating formation of semiconductor pressure sensor device 10 having both pressure sensor region 16 and MOS region 17.

It should be noted that also in the present embodiment, each of the configurations described in the second and third embodiments may be applied appropriately. Moreover, in the above description, although the plurality of layers of interconnections are provided only for MOS region 17, a plurality of layers of interconnections connected to movable electrode 39 in pressure sensor region 16 may be also provided.

(Fifth Embodiment)

Figure 47:
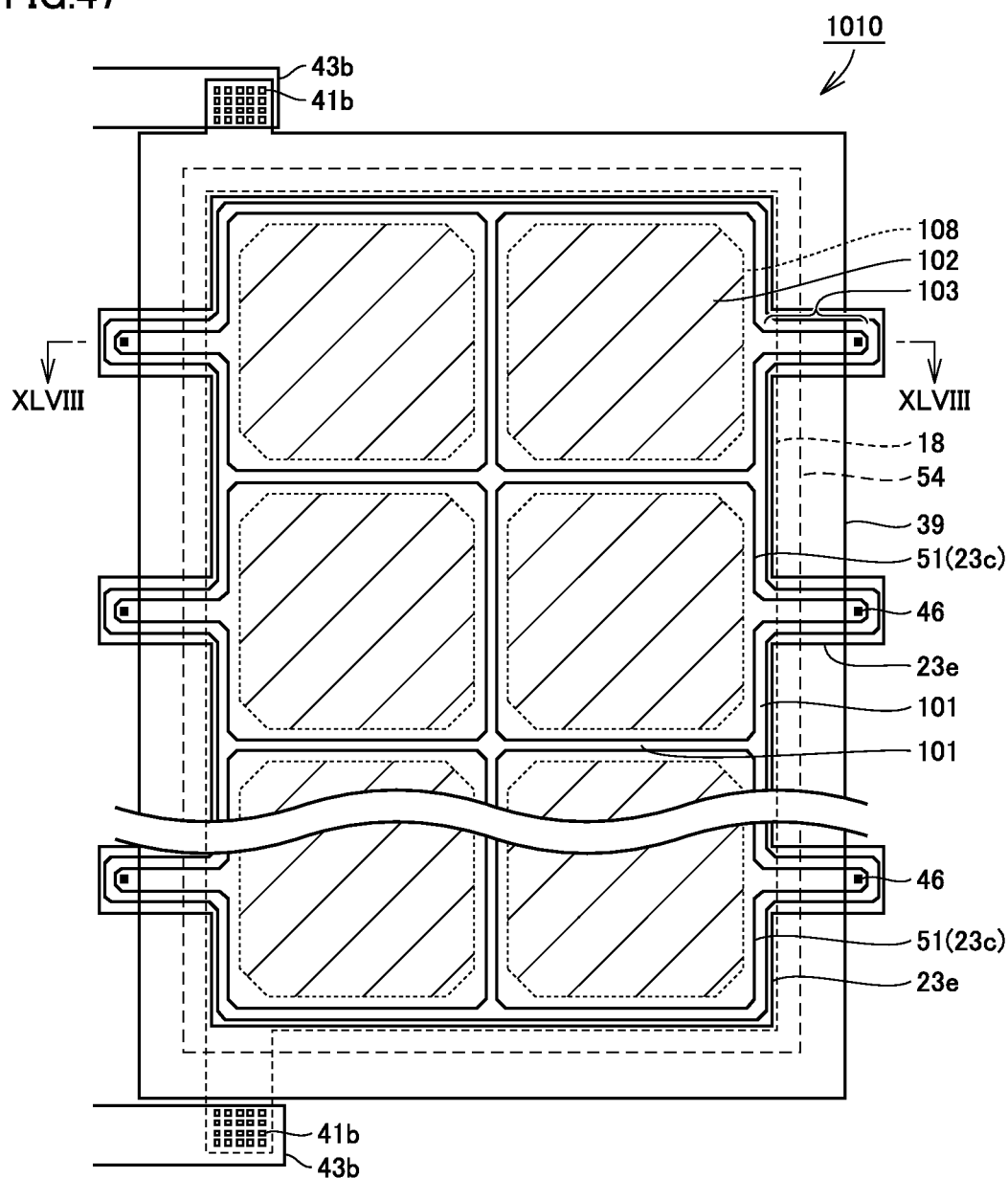
FIG. 47 is a schematic plan view showing a configuration of a detection pressure sensor of a fifth embodiment.
Figure 48:
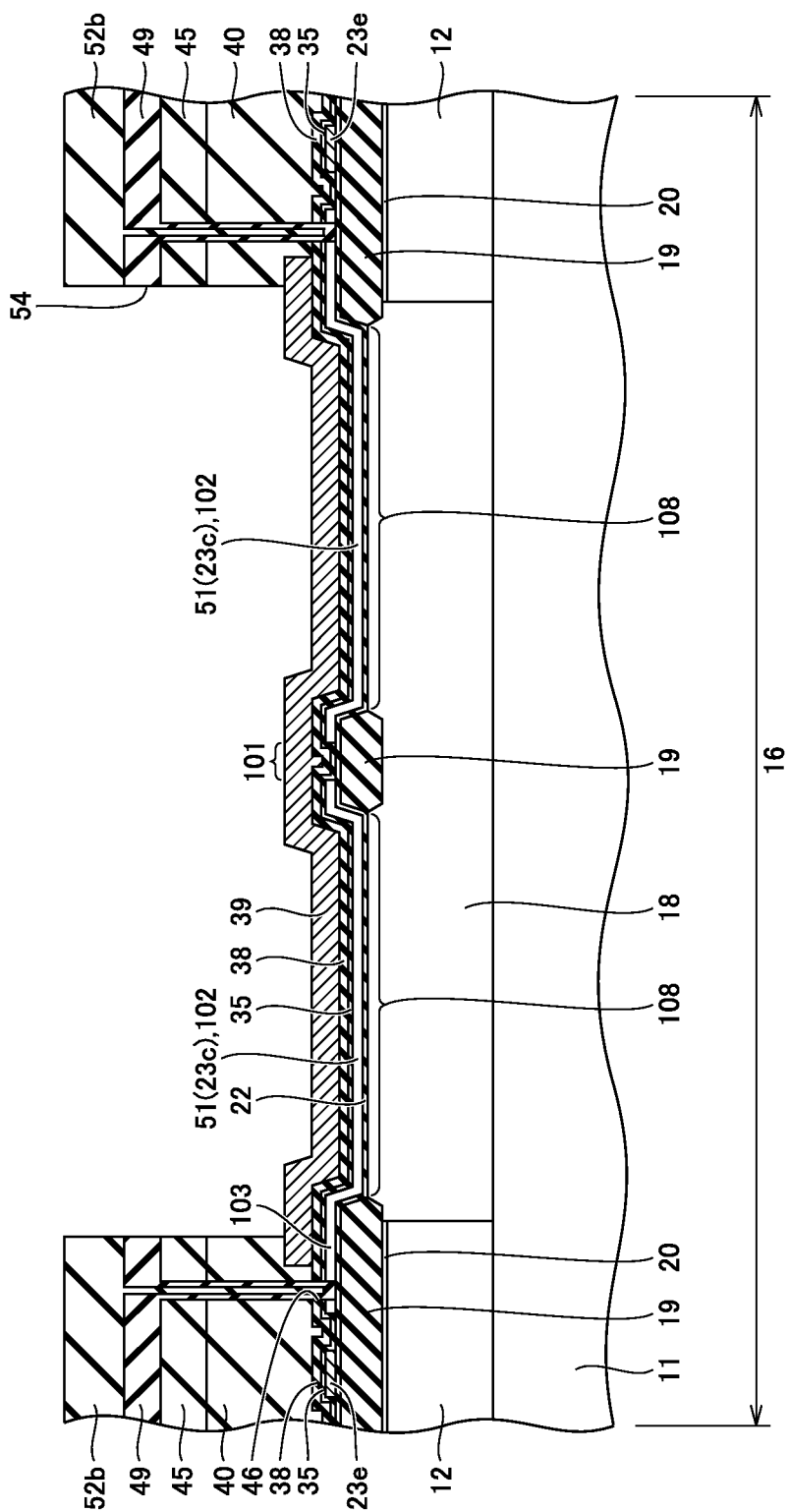
FIG. 48 is a schematic cross sectional view of a first region surrounded by a XLVIII-XLVIII line of FIG. 47.
Figure 49:
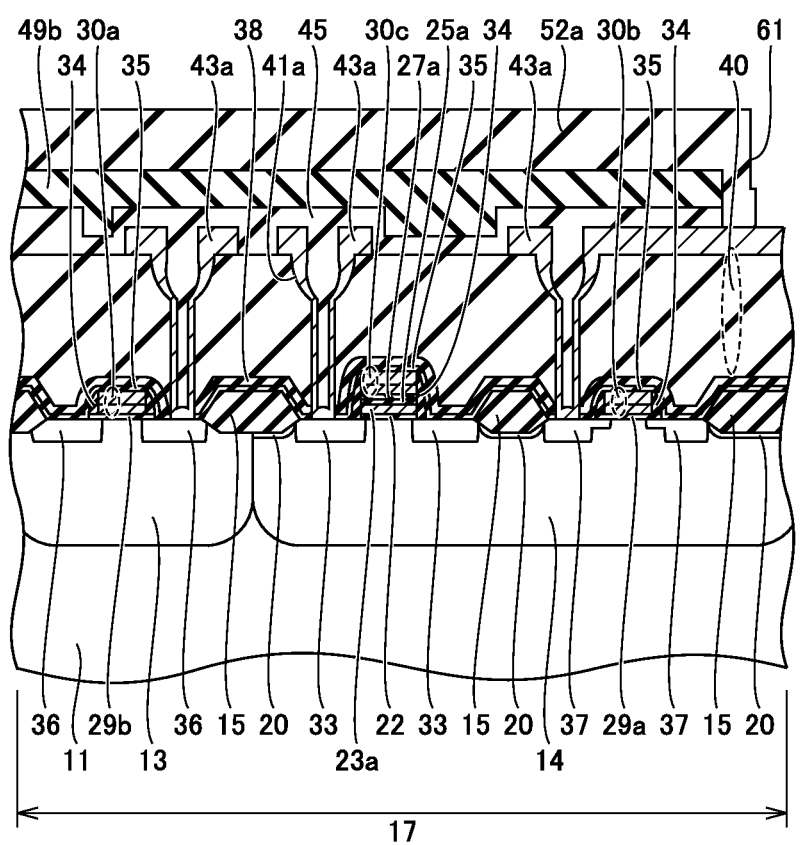
FIG. 49 is a schematic cross sectional view showing a configuration of a second region in the fifth embodiment (basically the same configuration as that in FIG. 3).

A semiconductor pressure sensor device 10 of the present embodiment basically has the same configuration as semiconductor pressure sensor device 10 of the first embodiment, and is different from semiconductor pressure sensor device 10 of the first embodiment in the following points. With reference to FIG. 47 to FIG. 49, although the same description as in the first embodiment may be repeated, the following describes a configuration of a first region 16 in which a detection pressure sensor 1010 of the present embodiment is formed.

With reference to FIG. 47 and FIG. 48, detection pressure sensor 1010 included in semiconductor pressure sensor device 10 of the present embodiment is an exemplary pressure sensor, and is formed in pressure sensor region 16 (first region) as in the first embodiment.

Detection pressure sensor 1010 of the present embodiment has capacitance due to a diffusion layer fixed electrode 18 (fixed electrode) indicated by a dotted line in FIG. 47, a vacuum chamber 51 serving as a void provided above diffusion layer fixed electrode 18, and a movable electrode 39 provided above vacuum chamber 51. Vacuum chamber 51 is formed by removing a conductor film 23c serving as a sacrifice film mentioned later. It should be noted that in FIG. 47, the end portion of vacuum chamber 51 formed by removing conductor film 23c is denoted as a conductor film end portion 23e.

Also in the present embodiment, as with the first embodiment, vacuum chamber 51 is provided with a detection anchor 101 that serves as an anchor portion to support movable electrode 39 and that is formed by (at least partially) removing conductor film 23c, from which vacuum chamber 51 is formed, by means of patterning and forming (thick) movable electrode 39 to fill the opened region and project downward. Detection anchor 101 divides movable electrode 39 into a plurality of movable electrode units 102 when viewed in a plan view. Therefore, a pair of movable electrode units 102 adjacent to each other with detection anchor 101 being interposed therebetween when viewed in a plan view are provided to share a region of the same detection anchor 101.

For example, in pressure sensor region 16, diffusion layer fixed electrode 18 formed of an n type impurity and the same p type well region 12 as that in the first embodiment are formed in the upper main surface of silicon substrate 11. Moreover, a field oxide film 19 is formed on a portion of the surface of silicon substrate 11 in diffusion layer fixed electrode 18 and p type well region 12.

In pressure sensor region 16, a flat region (fixed electrode flat region 108) in (most of) diffusion layer fixed electrode 18 overlapping with each of the plurality of movable electrode units 102 when viewed in a plan view is used as a fixed electrode of the pressure sensor. Each fixed electrode flat region 108 is divided (surrounded) by field oxide film 19.

In pressure sensor region 16, a first gate oxide film 22 is formed on field oxide film 19 or diffusion layer fixed electrode 18 (fixed electrode flat region 108), vacuum chamber 51 (the range thereof is substantially equal to the range of movable electrode unit 102) is formed thereabove, and a silicon oxide film 35 and a TEOS (Tetra Ethyl Ortho Silicate glass) based oxide film 38 are formed thereabove in this order. Moreover, movable electrode 39 is formed on TEOS-based oxide film 38.

Also in the present embodiment, in the non-overlapping region not overlapping with movable electrode 39 in pressure sensor region 16, etching hole 46 is formed in first interlayer insulation film 40 and second interlayer insulation film 45 (covering the pressure sensor) to extend to (communicate with) movable electrode unit 102 (vacuum chamber 51).

Via etching hole 46, conductor film 23c (sacrifice film), which is the same layer (portion constituted of the same film) as polycrystalline silicon film 23a serving as a floating gate electrode (first electrode) mentioned later, is etched from above and removed, thereby forming void (vacuum chamber 51) in the region having had conductor film 23c formed therein. Accordingly, etching hole 46 communicates with vacuum chamber 51. Moreover, first sealing film 49 and second sealing film 52b are formed to fill etching hole 46, as a sealing portion sealing vacuum chamber 51 from outside. First interlayer insulation film 40 and the like are removed from most of the region (central portion) overlapping with movable electrode 39 when viewed in a plan view, with the result that pressure sensor opening 54 (opening) is formed in this region to expose movable electrode 39.

In the present embodiment, detection anchor 101 is formed just above field oxide film 19.

With reference to FIG. 47 and FIG. 49 (particularly FIG. 49), as with the first embodiment, not only pressure sensor region 16 but also a MOS region 17 (second region) are defined in semiconductor pressure sensor device 10 of the present embodiment.

The configuration of MOS region 17 in FIG. 49 is the same as the configuration of MOS region 17 of FIG. 3 of the first embodiment and is therefore not described in detail, but is described briefly as follows. As transistors, a p channel type MOS transistor, an EPROM, and an n channel type MOS transistor are formed. The p channel type MOS transistor is formed in an n type well region 13, whereas the EPROM and the n channel type MOS transistor are formed in a p type well region 14. Moreover, in order to cover these transistors, first interlayer insulation film 40 and second interlayer insulation film 45 are formed.

In the description herein, n type diffusion layer fixed electrode 18 (fixed electrode) in pressure sensor region 16 is formed as the same layer as n type well region 13 (diffusion layer) in silicon substrate 11.

It should be noted that the configuration of MOS region 17 in which the transistors (the p channel type MOS transistor, the n channel type MOS transistor, and the EPROM) are formed is basically the same as that in the first embodiment and no illustration in figures is hence provided therefor.

It should be noted that apart from this, the configuration of the present embodiment is substantially the same as that of the first embodiment, so that the same elements are given the same reference characters and are not repeatedly described.

Next, with reference to FIG. 50 to FIG. 75 and FIG. 48 and FIG. 49, the following describes the semiconductor pressure sensor (semiconductor pressure sensor device 10) including detection pressure sensor 1010 and the MOS circuits in the present embodiment.

Figure 50:
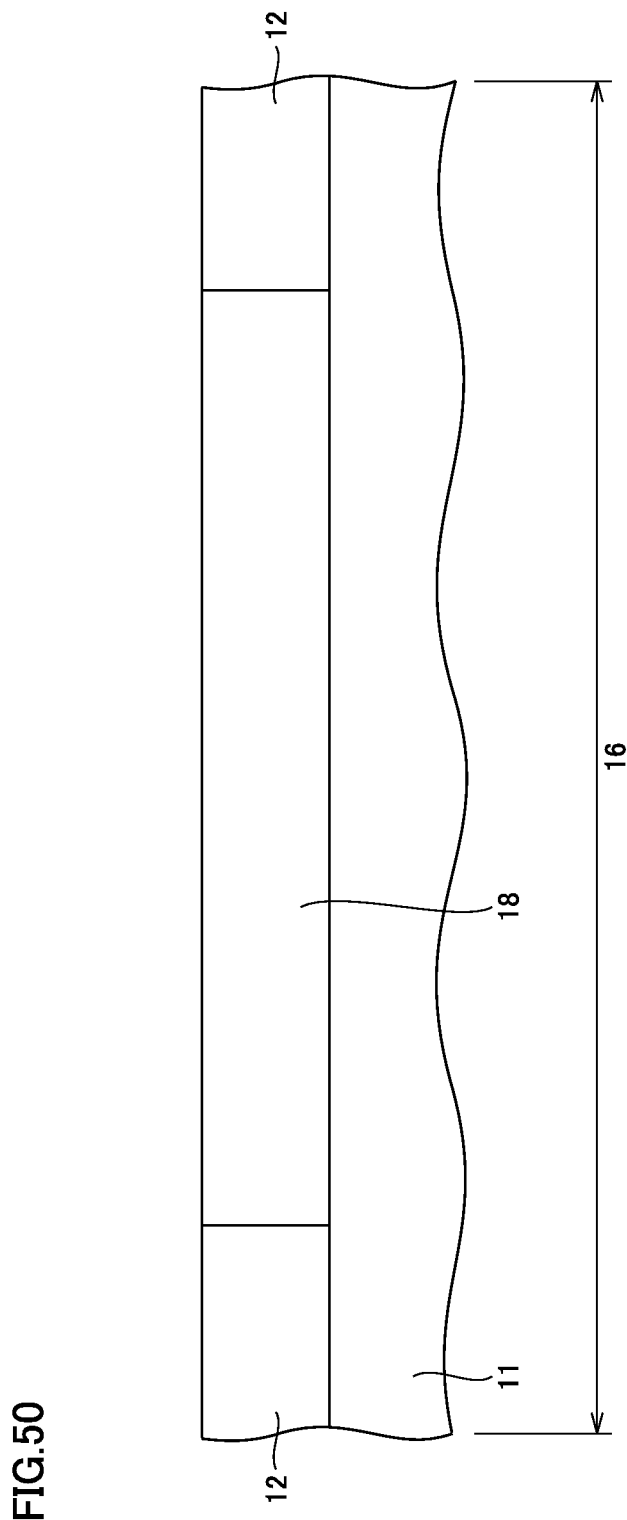
FIG. 50 is a schematic cross sectional view showing a first step of a method of fabricating the first region shown in FIG. 48 in the semiconductor pressure sensor of the fifth embodiment.
Figure 51:
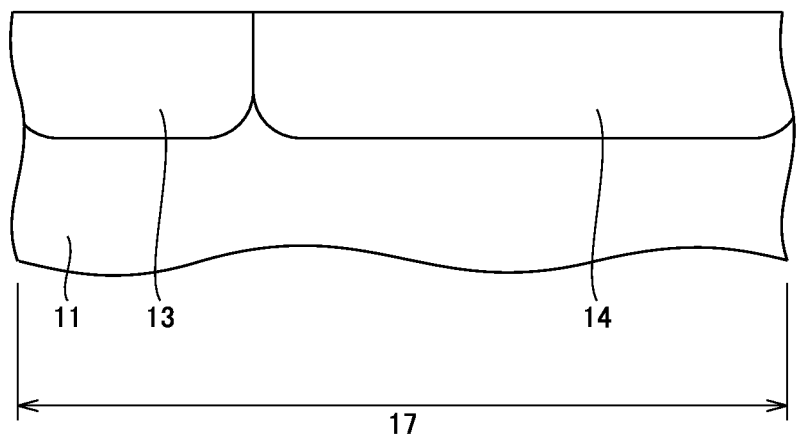
FIG. 51 is a schematic cross sectional view showing a first step of a method of fabricating the second region shown in FIG. 49 in the semiconductor pressure sensor of the fifth embodiment.

With reference to FIG. 50 and FIG. 51, as with FIG. 5 and FIG. 6, for example, a p type silicon substrate is prepared, and pressure sensor region 16 to be provided with detection pressure sensor 1010 and MOS region 17 to be provided with the MOS circuits such as a memory cell transistor are first defined in the surface of silicon substrate 11. In pressure sensor region 16, p type well region 12 and diffusion layer fixed electrode 18 are formed, whereas in MOS region 17, n type well region 13 and p type well region 14 are formed.

Specifically, as with the step of FIG. 5 and FIG. 6, a resist mask (not shown) is formed and is used as an implantation mask to implant an n type impurity (for example, phosphorus) for forming n type well region 13 and diffusion layer fixed electrode 18. Then, by performing an annealing process or the like under a predetermined condition, diffusion layer fixed electrode 18 serving as a fixed electrode is formed in pressure sensor region 16 and n type well region 13 is formed in MOS region 17 through the same step (as a diffusion layer) so as to both extend from the surface of silicon substrate 11 to inside of silicon substrate 11.

Figure 52:
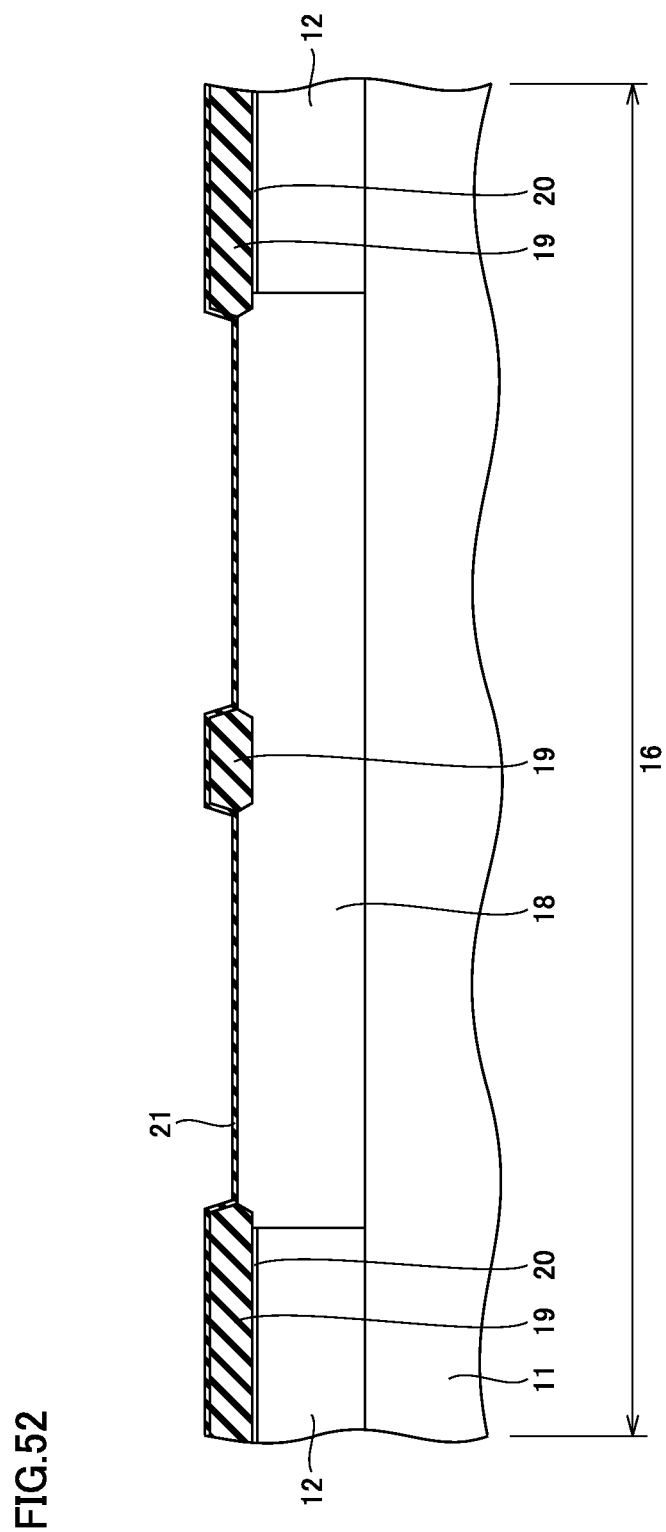
FIG. 52 is a schematic cross sectional view showing a second step of a method of fabricating the first region shown in FIG. 48 in the semiconductor pressure sensor of the fifth embodiment.
Figure 53:
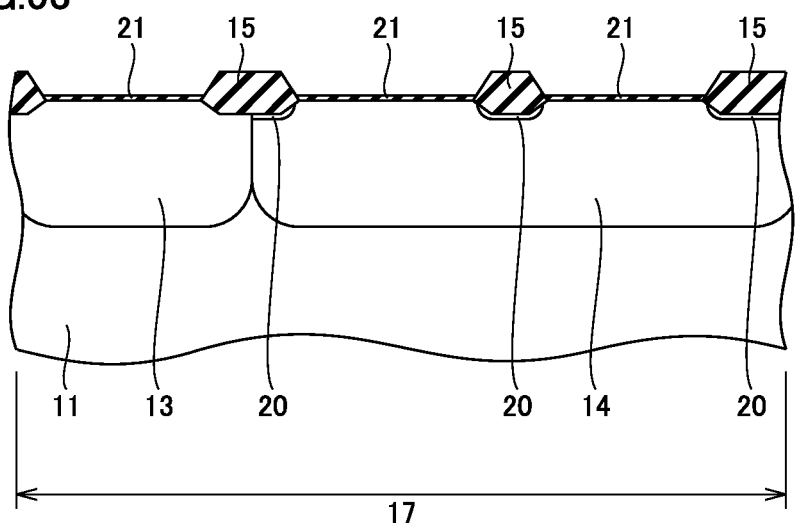
FIG. 53 is a schematic cross sectional view showing a second step of the method of fabricating the second region shown in FIG. 49 in the semiconductor pressure sensor of the fifth embodiment.

With reference to FIG. 52 and FIG. 53, the same process as that in the step of FIG. 7 and FIG. 8 is performed, thereby forming field oxide films 15, 19 on desired regions. Particularly, an underlying oxide film 21 is formed on each of diffusion layer fixed electrode 18 and field oxide film 19 formed in pressure sensor region 16 and n type well region 13 and p type well region 14 formed in MOS region 17. However, underlying oxide film 21 is removed after formation of channel stopper 20.

Figure 54:
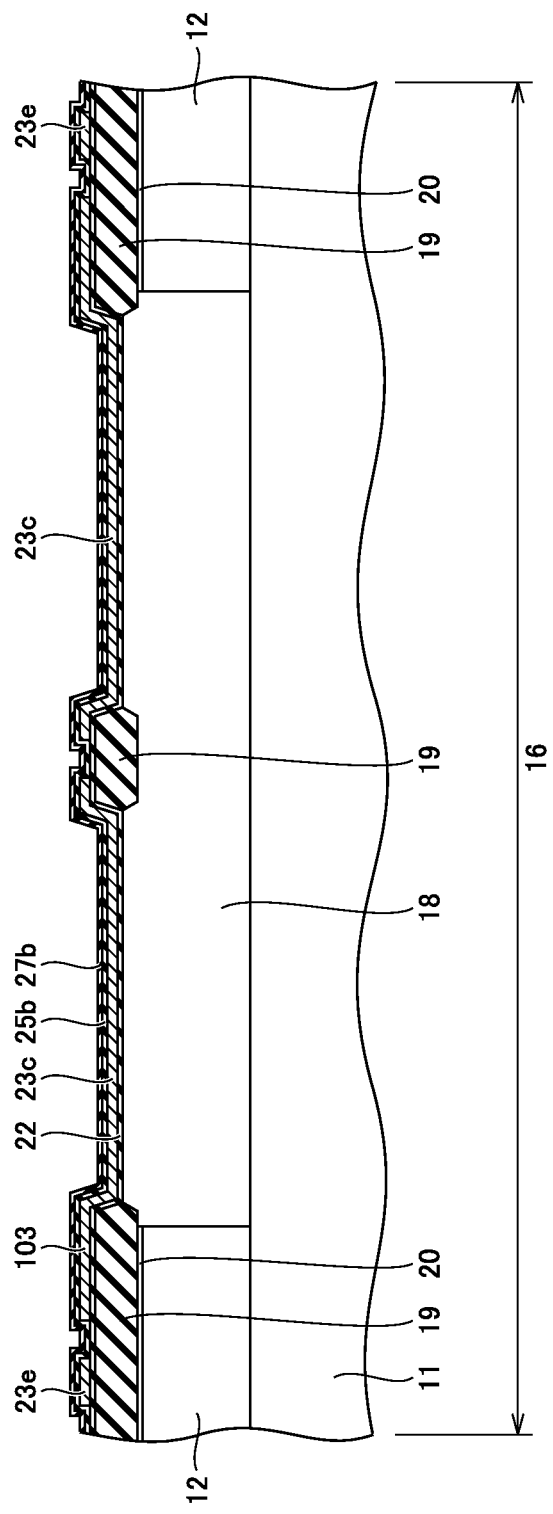
FIG. 54 is a schematic cross sectional view showing a third step of the method of fabricating the first region shown in FIG. 48 in the semiconductor pressure sensor of the fifth embodiment.
Figure 55:
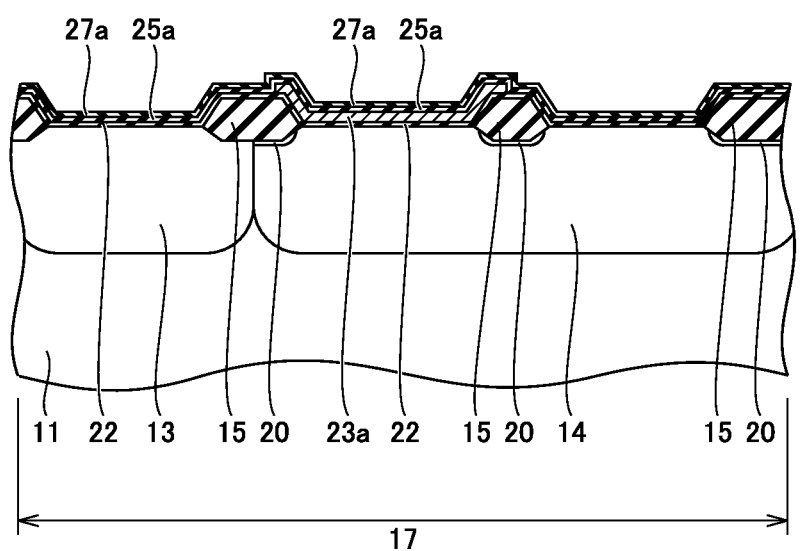
FIG. 55 is a schematic cross sectional view showing a third step of the method of fabricating the second region shown in FIG. 49 in the semiconductor pressure sensor of the fifth embodiment.

With reference to FIG. 54 and FIG. 55, the process proceeds to a step of forming a conductor film pattern by forming a first conductor film in pressure sensor region 16 and MOS region 17 and patterning the first conductor film. In doing so, conductor film 23c in pressure sensor region 16 and polycrystalline silicon film 23a to serve as the floating gate electrode of the EPROM in MOS region 17 are formed as the same layer using the same material.

Specifically, first, as with the step of FIG. 9 and FIG. 10, by applying a thermal oxidation process to silicon substrate 11 from which the underlying oxide film and the like has been removed, first gate oxide film 22 is formed in MOS region 17 and pressure sensor region 16 and on the exposed surface of silicon substrate 11 or the surface of field oxide film 19.

Next, the polycrystalline silicon film (first conductor film) is formed to cover first gate oxide film 22, is provided with a conductive impurity by means of implantation, and is patterned. Accordingly, in pressure sensor region 16, conductor film 23c is formed which serves as a sacrifice film and is constituted of the patterned polycrystalline silicon film. On the other hand, in MOS region 17, a pattern (film thickness of about 50 to 300 nm) of polycrystalline silicon film 23a is formed (as the conductor film pattern) to serve as the floating gate electrode (first electrode) of the EPROM. The pattern of conductor film 23c (serving as the conductor film pattern) is preferably formed to lie on field oxide film 19. Then, the resist mask is removed. Then, as with the step of FIG. 9 and FIG. 10, a second gate oxide film 25a, a first silicon nitride film 27a, a first protection film 25b (made of the same material as first fixed electrode protection film 25b), and a second protection film 27b (made of the same material as second fixed electrode protection film 27b) are formed, and a predetermined impurity is implanted to control the threshold voltage of each of the transistors of MOS region 17.

It should be noted that in the step of forming polycrystalline silicon film 23a and the pattern of conductor film 23c, conductor film 23c is formed to have an opened portion, i.e., to be divided into a plurality of patterns in the horizontal direction of FIG. 54. For example, above field oxide film 19 at the central portion in the horizontal direction of FIG. 54, the opened portion is formed by removing conductor film 23c to expose the surface just therebelow. Thus, the pattern of the sacrifice film is formed to have the previously opened portion.

Figure 56:
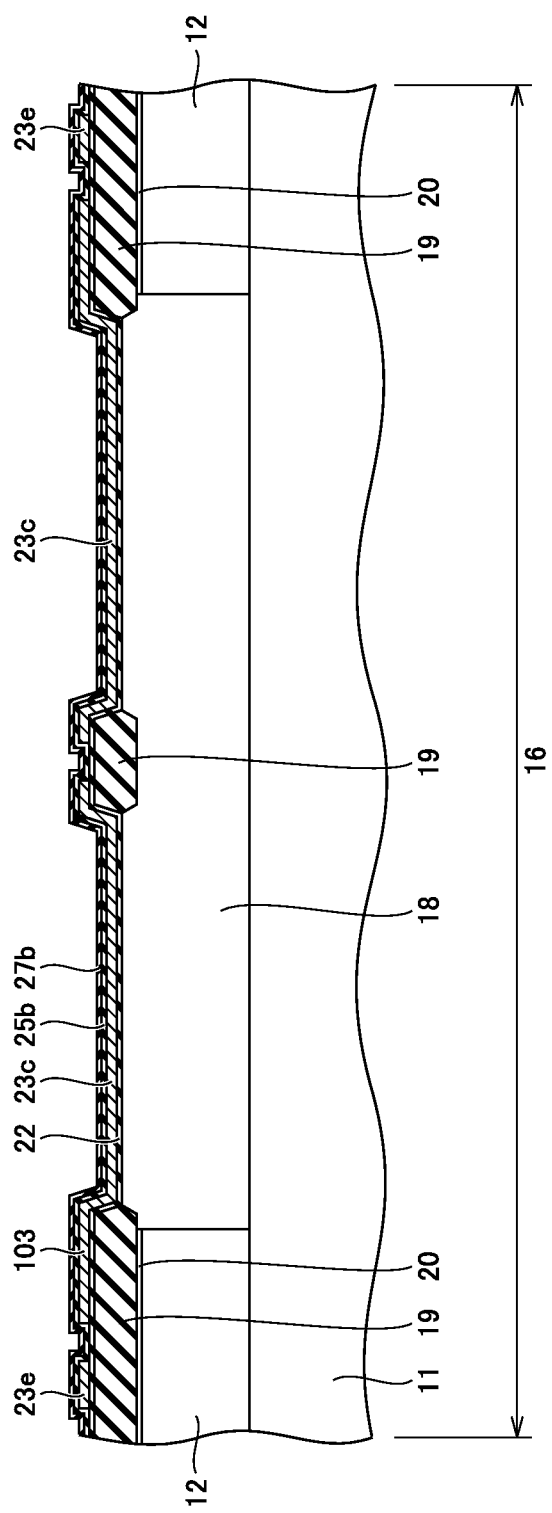
FIG. 56 is a schematic cross sectional view showing a fourth step of the method of fabricating the first region shown in FIG. 48 in the semiconductor pressure sensor of the fifth embodiment.
Figure 57:
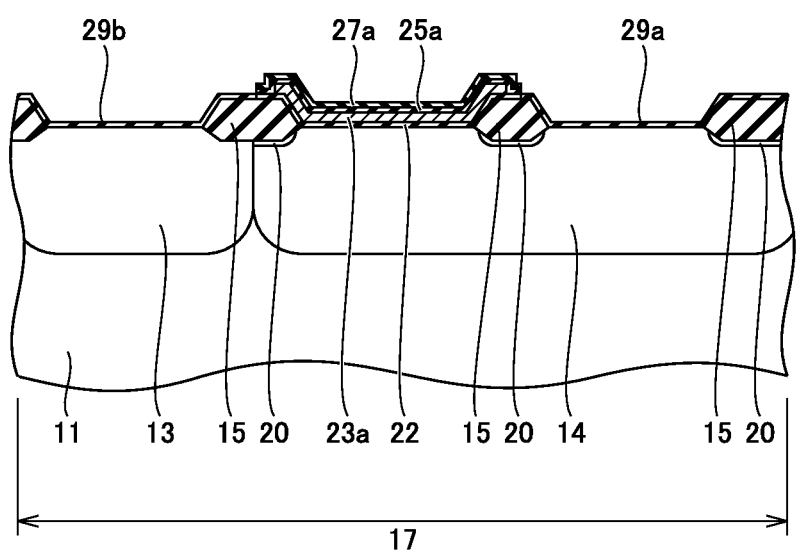
FIG. 57 is a schematic cross sectional view showing a fourth step of the method of fabricating the second region shown in FIG. 49 in the semiconductor pressure sensor of the fifth embodiment.

Next, with reference to FIG. 56 and FIG. 57, as with the step of FIG. 11 and FIG. 12, third gate oxide films 29a, 29b are formed.

Figure 58:
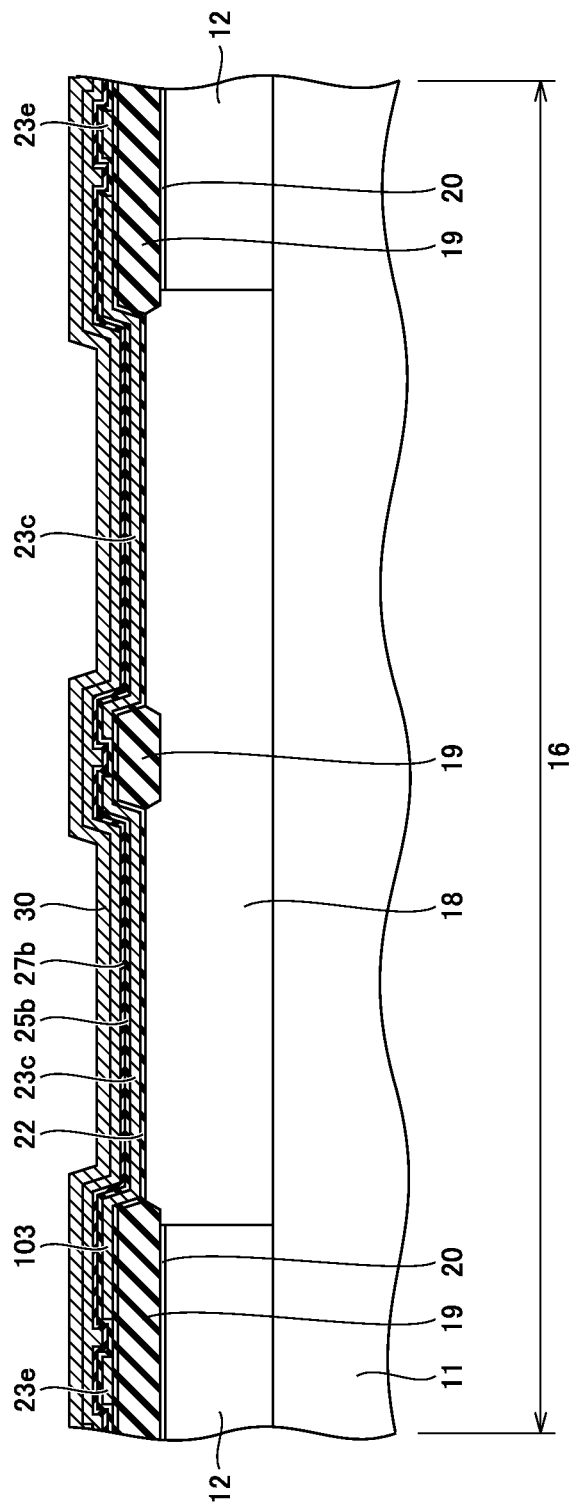
FIG. 58 is a schematic cross sectional view showing a fifth step of the method of fabricating the first region shown in FIG. 48 in the semiconductor pressure sensor of the fifth embodiment.
Figure 59:
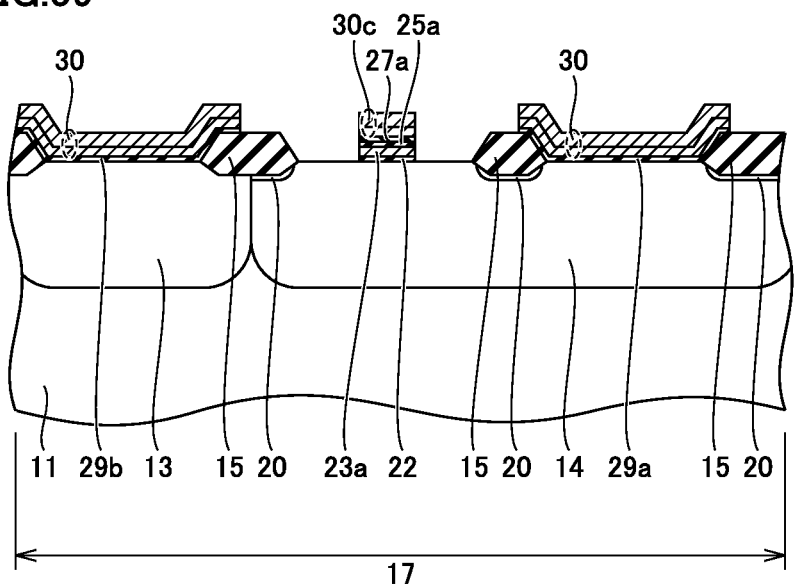
FIG. 59 is a schematic cross sectional view showing a fifth step of the method of fabricating the second region shown in FIG. 49 in the semiconductor pressure sensor of the fifth embodiment.

Next, with reference to FIG. 58 and FIG. 59, as with the step of FIG. 13 and FIG. 14, conductor film 30 serving as a second conductor film is formed in pressure sensor region 16 and MOS region 17.

Next, as with the step of FIG. 13 and FIG. 14, conductor film 30 is patterned, thereby patterning the gate electrode of the EPROM. Accordingly, in MOS region 17, gate electrode 30c (second electrode) provided above floating gate electrode 23a of the EPROM is formed. Accordingly, the gate electrode of the EPROM, inclusive of gate electrode 30c, is formed.

Figure 60:
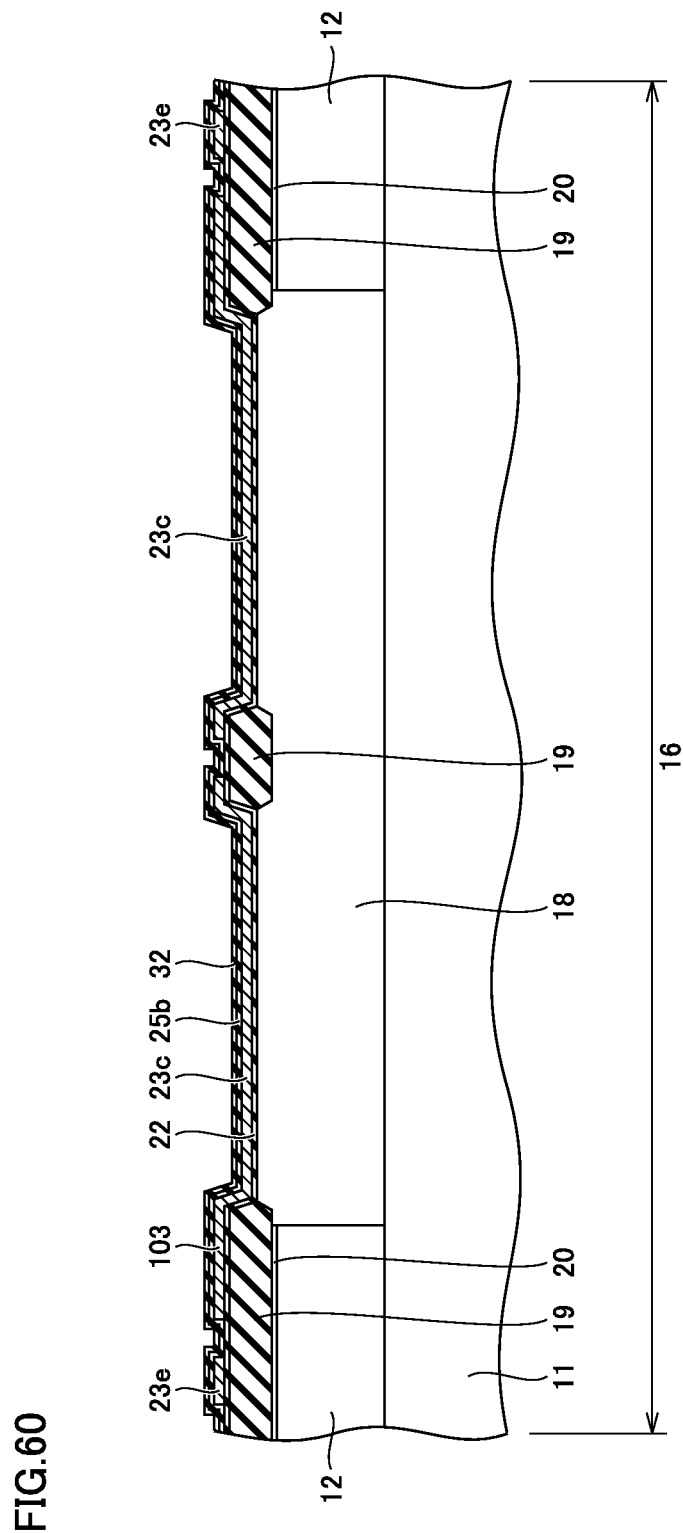
FIG. 60 is a schematic cross sectional view showing a sixth step of the method of fabricating the first region shown in FIG. 48 in the semiconductor pressure sensor of the fifth embodiment.
Figure 61:
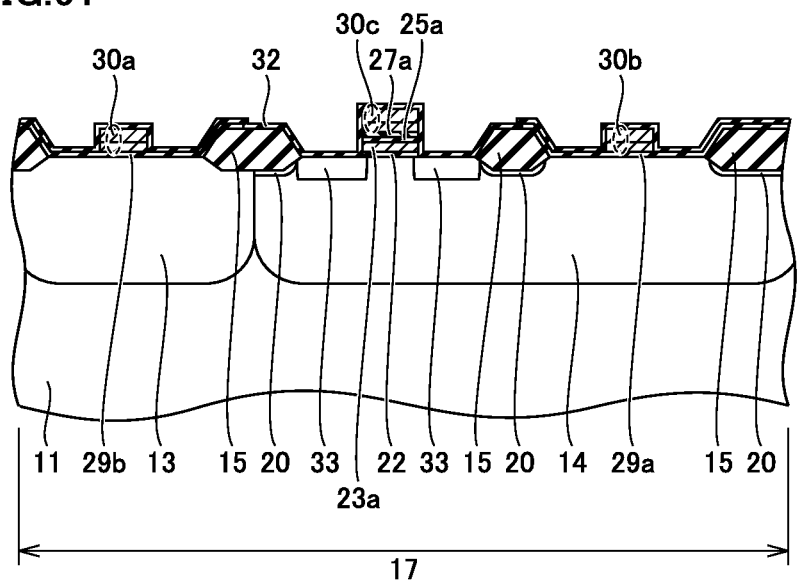
FIG. 61 is a schematic cross sectional view showing a sixth step of the method of fabricating the second region shown in FIG. 49 in the semiconductor pressure sensor of the fifth embodiment.

Next, with reference to FIG. 60 and FIG. 61, as with the step of FIG. 15 and FIG. 16, conductor film 30 is patterned, thereby removing conductor film 30 in pressure sensor region 16. Moreover, as a result of patterning conductor film 30 in MOS region 17, as with the first embodiment, gate electrode 30b of the n channel type MOS transistor and gate electrode 30a of the p channel type MOS transistor are formed. A thin oxide film 32 is formed as in the same manner in FIG. 15 and FIG. 16 to cover second protection film 25b, exposed by removal of conductor film 30, in pressure sensor region 16 and cover gate electrodes 30a, 30b, 30c in MOS region 17.

Figure 62:
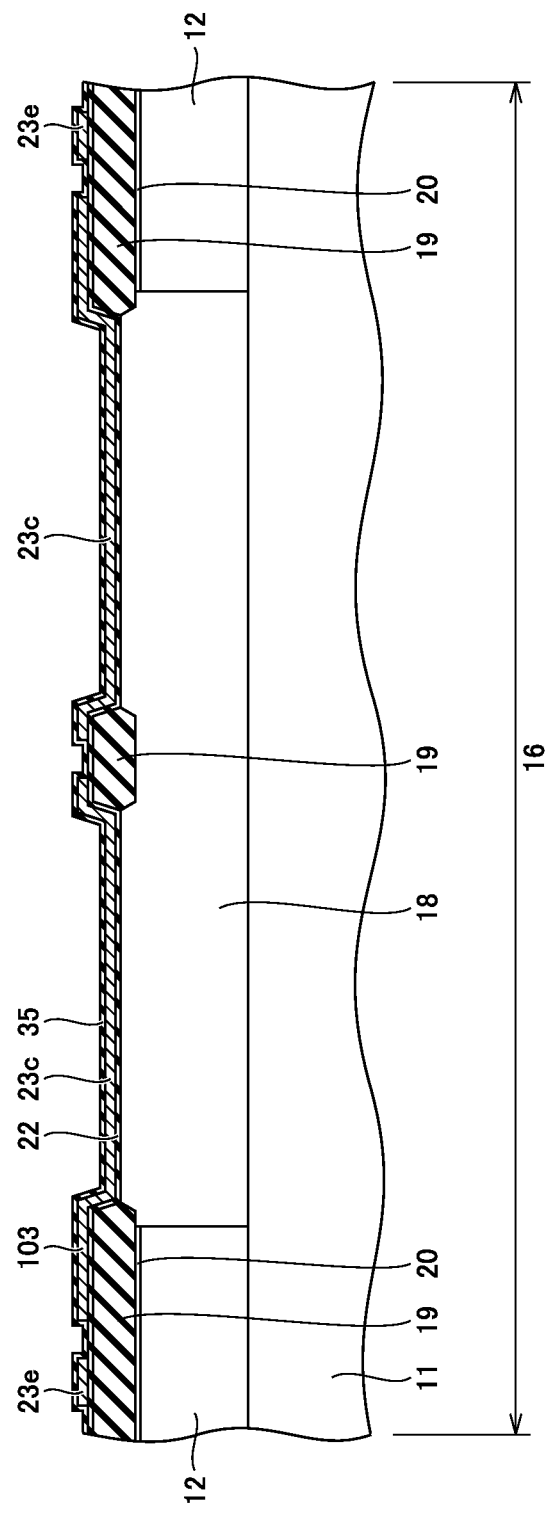
FIG. 62 is a schematic cross sectional view showing a seventh step of the method of fabricating the first region shown in FIG. 48 in the semiconductor pressure sensor of the fifth embodiment.
Figure 63:
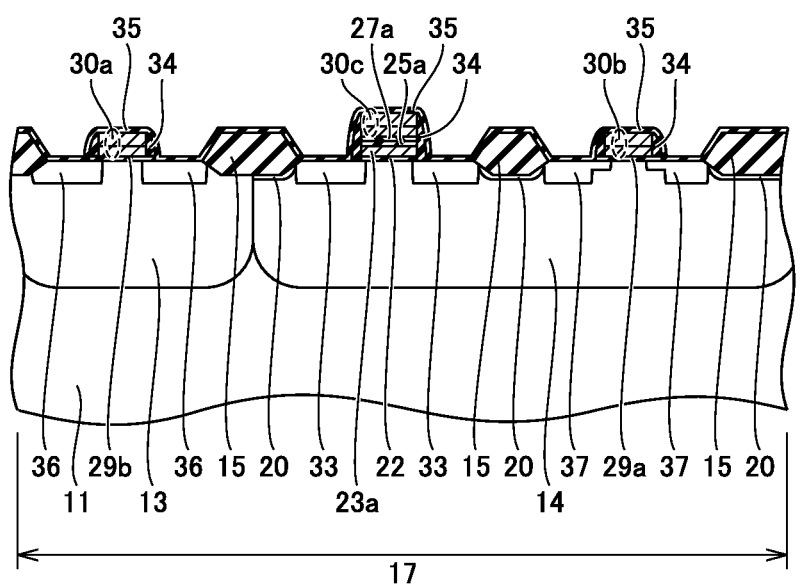
FIG. 63 is a schematic cross sectional view showing a seventh step of the method of fabricating the second region shown in FIG. 49 in the semiconductor pressure sensor of the fifth embodiment.

Next, with reference to FIG. 62 and FIG. 63, as with the step of FIG. 17 and FIG. 18, particularly, side wall oxide film 34 is formed on gate electrodes 30a, 30b, 30c of MOS region 17, and then thin silicon oxide film 35 is formed to cover gate electrodes 30a, 30b, 30c. This thin silicon oxide film 35 is formed in one piece with first protection film 25b, third gate oxide film 29b and thin oxide film 32, so that first protection film 25b, third gate oxide film 29b and thin oxide film 32 are not in FIG. 62 and FIG. 63.

Figure 64:
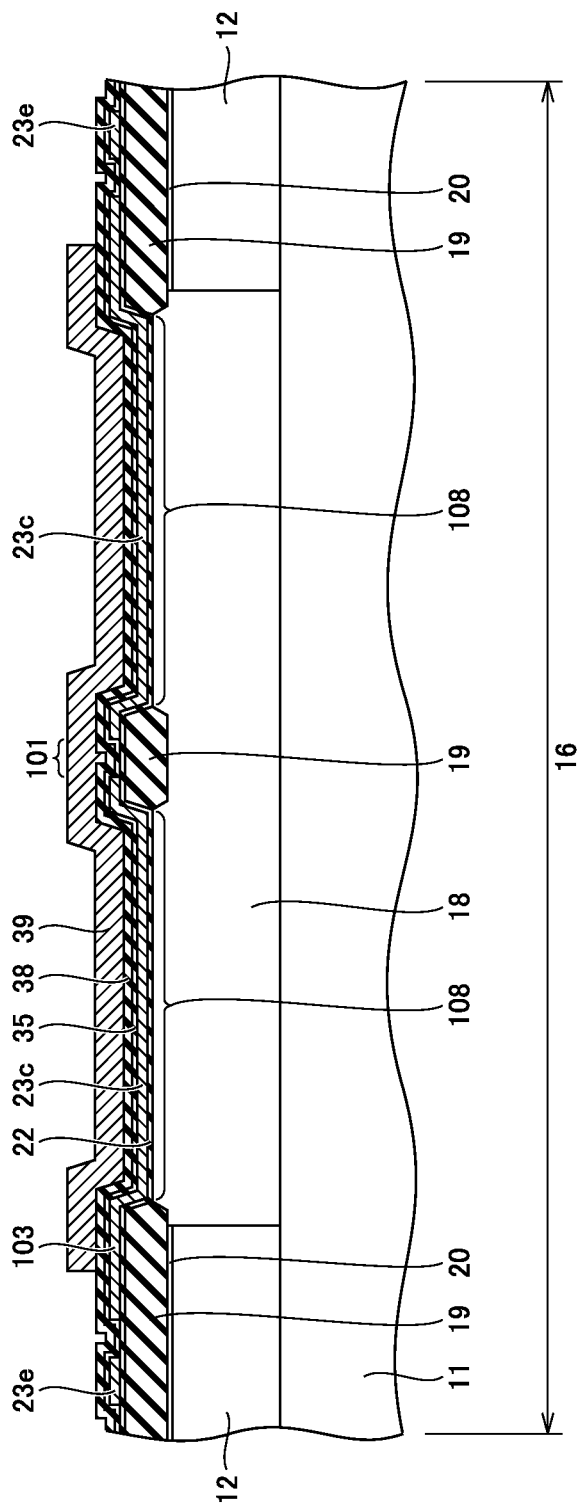
FIG. 64 is a schematic cross sectional view showing an eighth step of the method of fabricating the first region shown in FIG. 48 in the semiconductor pressure sensor of the fifth embodiment.
Figure 65:
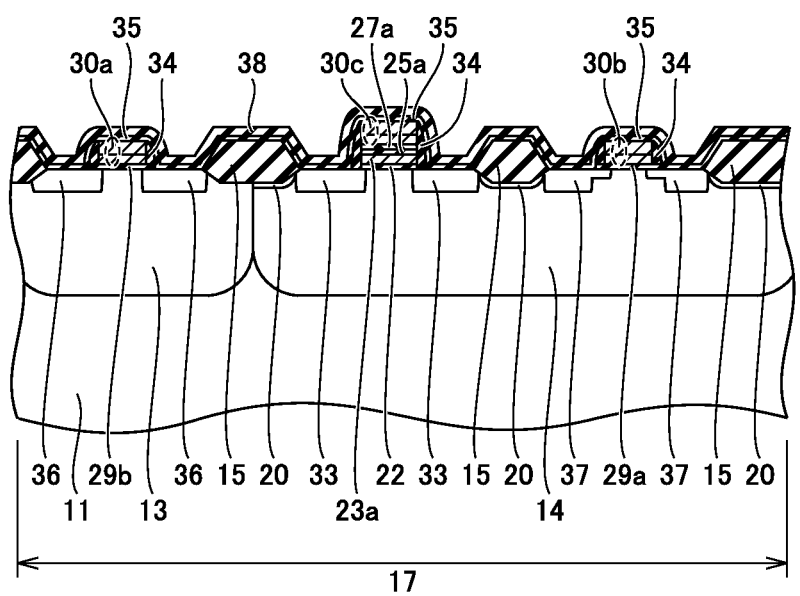
FIG. 65 is a schematic cross sectional view showing an eighth step of the method of fabricating the second region shown in FIG. 49 in the semiconductor pressure sensor of the fifth embodiment.

With reference to FIG. 64 and FIG. 65, as with the step of FIG. 19 and FIG. 20, TEOS-based oxide film 38 is formed to cover silicon oxide film 35, and movable electrode 39 is formed (on conductor film 23c) in pressure sensor region 16 to cover TEOS-based oxide film 38.

Here, as with the first embodiment, the step of forming movable electrode 39 is independent as a step of forming only movable electrode 39 rather than forming movable electrode 39 as the same layer as a region of a portion of MOS region 17, for example. Meanwhile, during the formation of the polycrystalline silicon film for forming movable electrode 39, the polycrystalline silicon film is formed to fill, from above, the opened portion of the sacrifice film (conductor film 23c) (just above field oxide film 19 in FIG. 64 or the like). Accordingly, in the opened portion of conductor film 23c, the same polycrystalline silicon film as movable electrode 39 is formed to project downward in the figure relative to movable electrode 39. The portion of the polycrystalline silicon film thus projecting downward is formed as the anchor portion, i.e., detection anchor 101, thereby supporting movable electrode 39 from below. Detection anchor 101 is formed to include, in at least a portion thereof, the region formed to fill the opened portion of conductor film 23c.

In this way, pressure sensor region 16 is provided with a configuration in which fixed electrode flat region 108 particularly surrounded by field oxide film 19 in diffusion layer fixed electrode 18 serves as the fixed electrode and movable electrode 39 is provided to face the fixed electrode.

Figure 66:
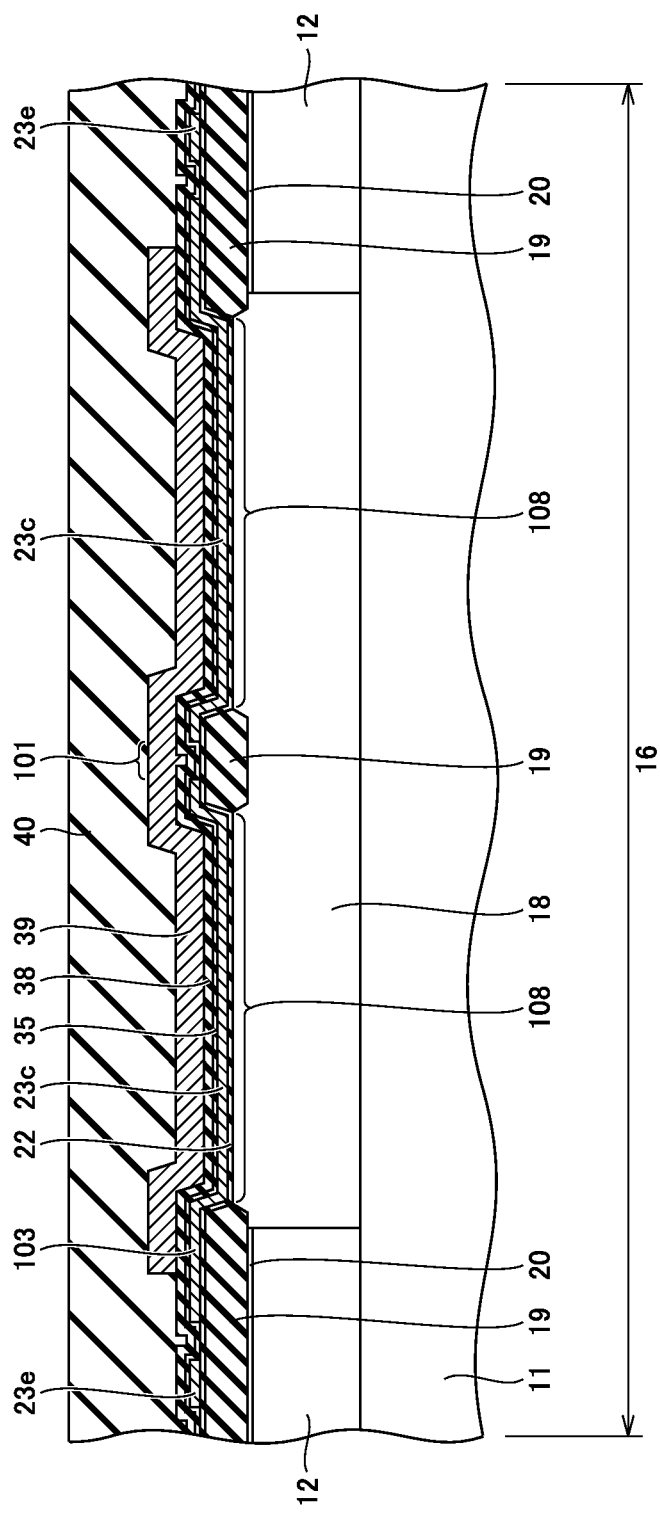
FIG. 66 is a schematic cross sectional view showing a ninth step of the method of fabricating the first region shown in FIG. 48 in the semiconductor pressure sensor of the fifth embodiment.
Figure 67:
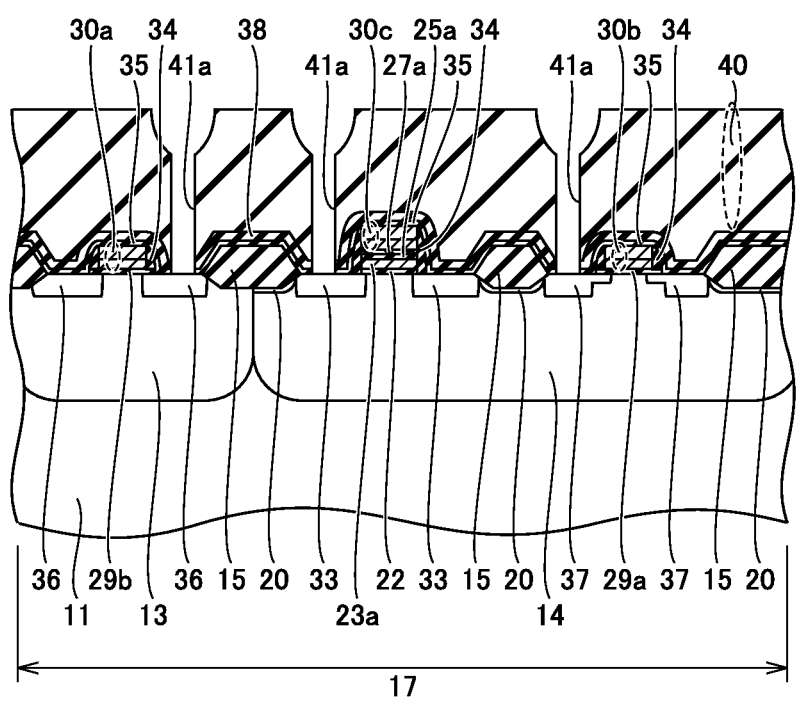
FIG. 67 is a schematic cross sectional view showing a ninth step of the method of fabricating the second region shown in FIG. 49 in the semiconductor pressure sensor of the fifth embodiment.

With reference to FIG. 66 and FIG. 67, as with the step of FIG. 21 and FIG. 22, first interlayer insulation film 40 (interlayer insulation film) is formed to cover TEOS-based oxide film 38 and movable electrode 39, and then contact holes 41a, 41b are formed.

Figure 68:
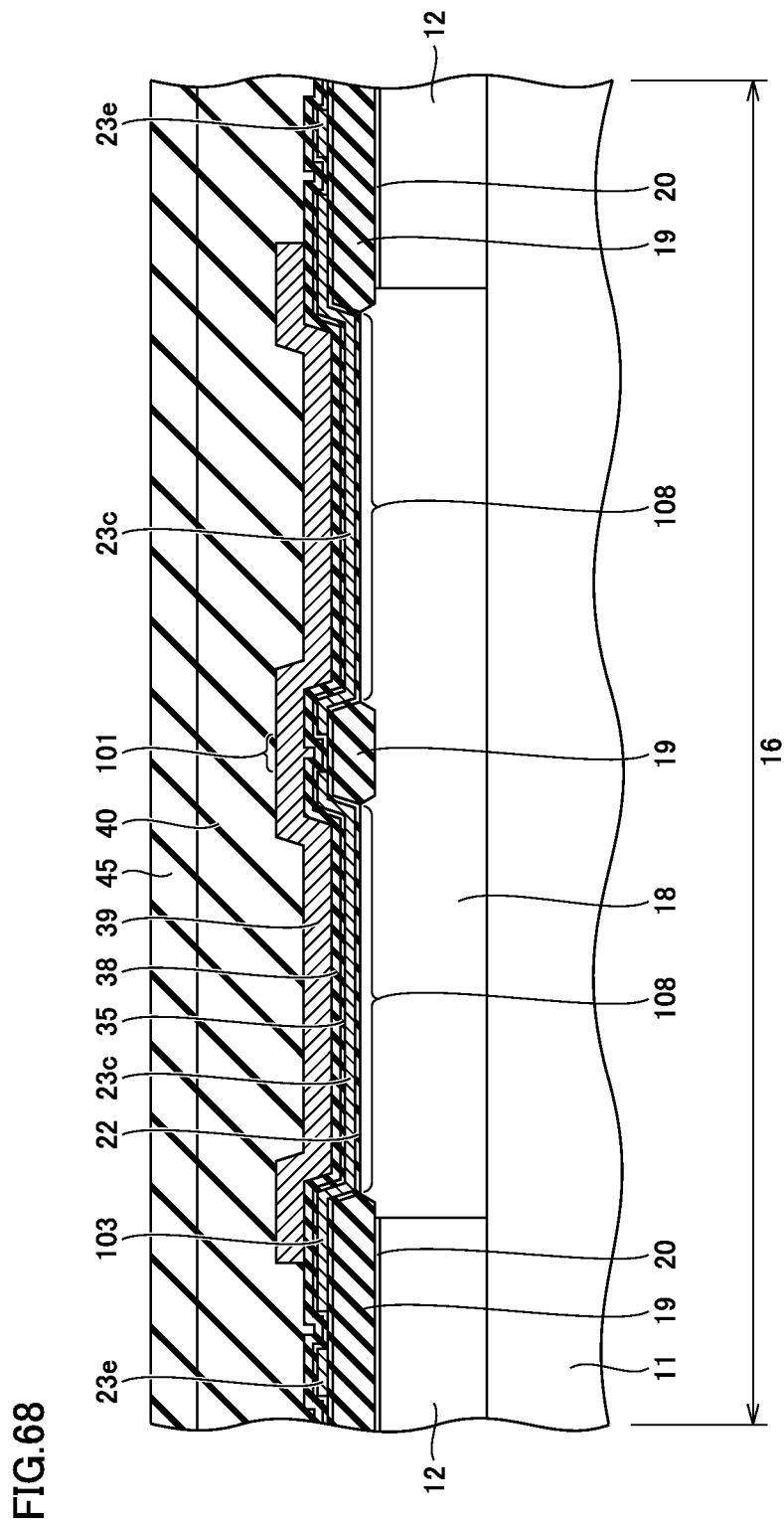
FIG. 68 is a schematic cross sectional view showing a tenth step of the method of fabricating the first region shown in FIG. 48 in the semiconductor pressure sensor of the fifth embodiment.
Figure 69:
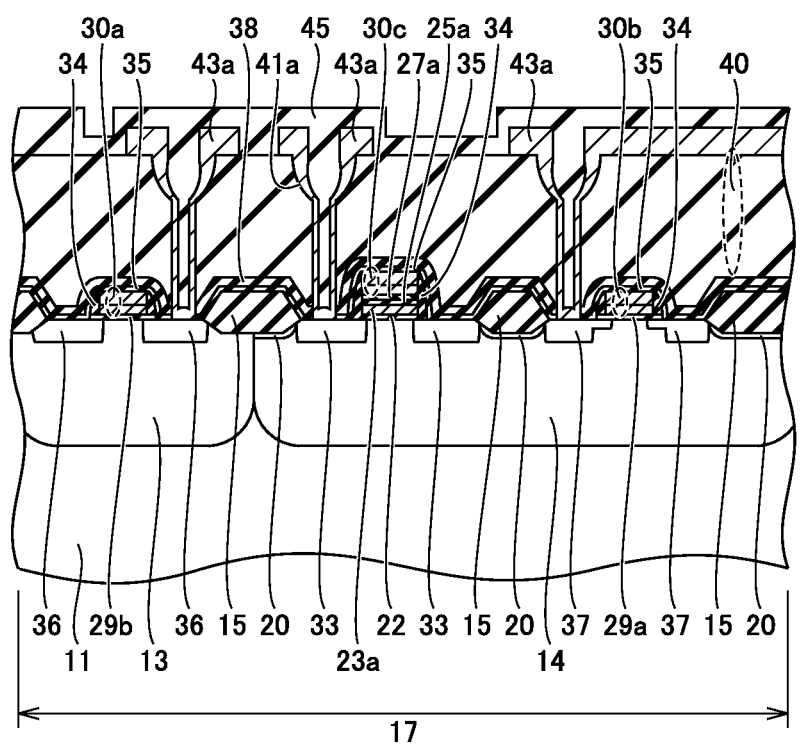
FIG. 69 is a schematic cross sectional view showing a tenth step of the method of fabricating the second region shown in FIG. 49 in the semiconductor pressure sensor of the fifth embodiment.

With reference to FIG. 68 and FIG. 69, as with the step of FIG. 23 and FIG. 24, interconnections 43a, 43b are formed, and second interlayer insulation film 45 (interlayer insulation film) is formed to cover interconnections 43a, 43b.

Figure 70:
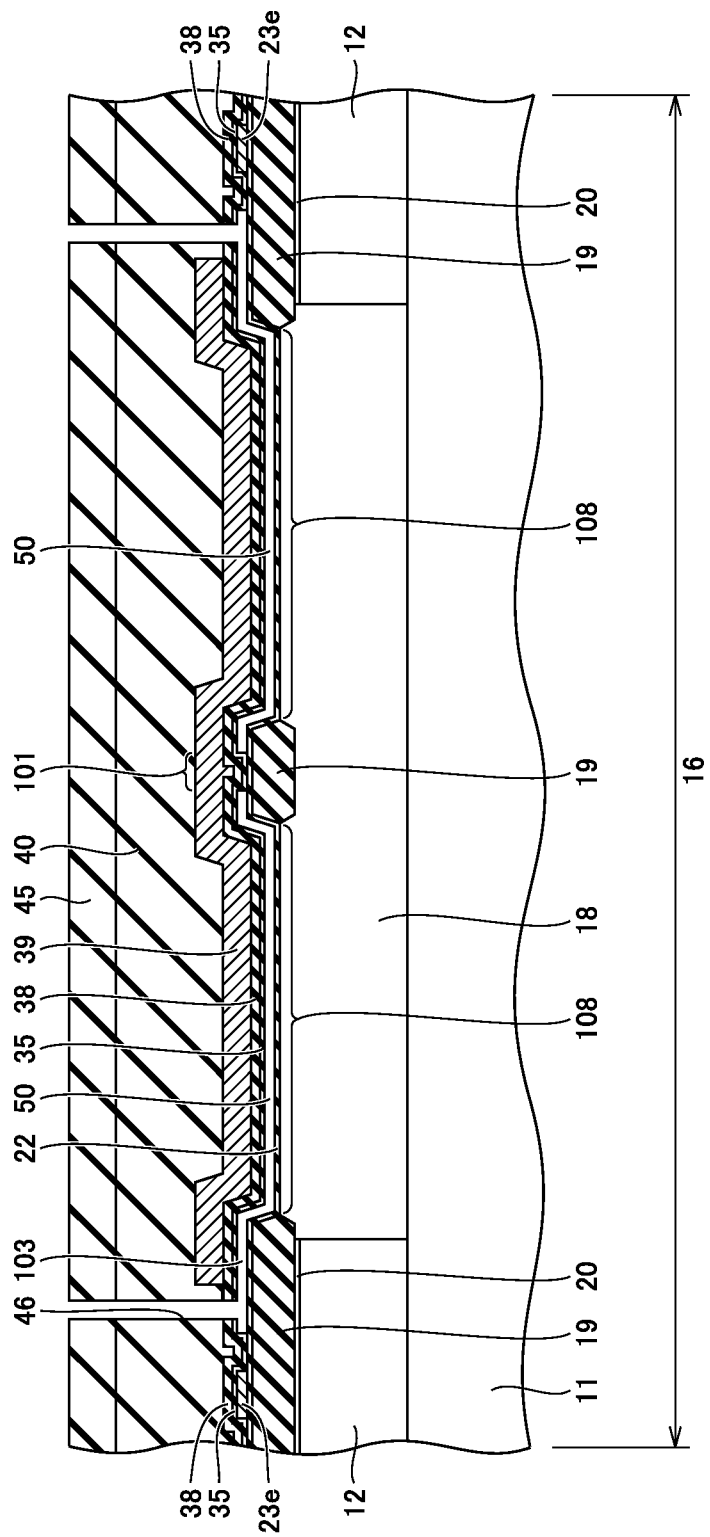
FIG. 70 is a schematic cross sectional view showing an eleventh step of the method of fabricating the first region shown in FIG. 48 in the semiconductor pressure sensor of the fifth embodiment.
Figure 71:
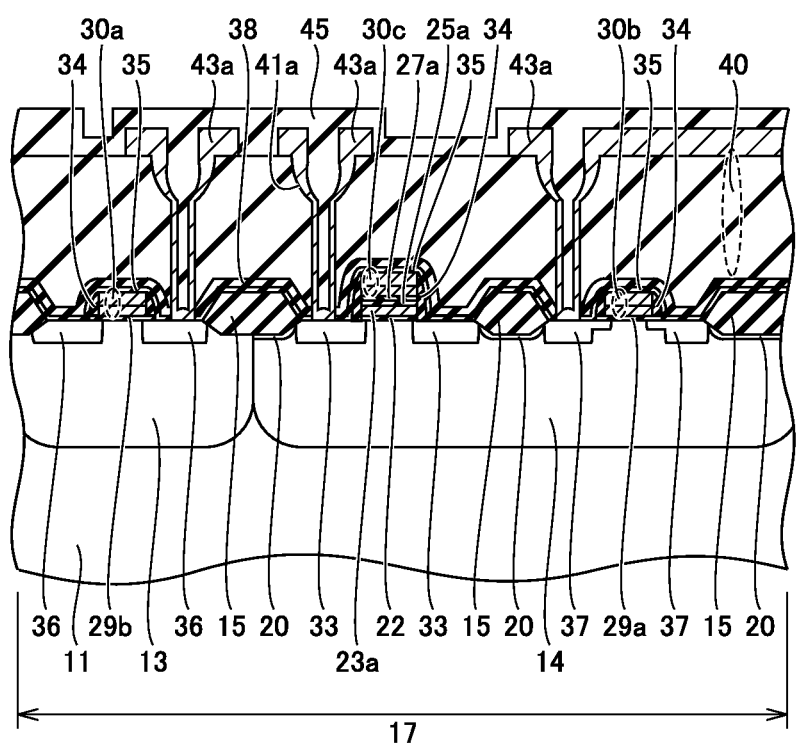
FIG. 71 is a schematic cross sectional view showing an eleventh step of the method of fabricating the second region shown in FIG. 49 in the semiconductor pressure sensor of the fifth embodiment.

With reference to FIG. 70 and FIG. 71, as with the step of FIG. 25 and FIG. 26, a resist mask (not shown) for forming the etching hole is formed. Then, the resist mask is employed as an etching mask to etch portions of first and second interlayer insulation films (interlayer insulation films) in pressure sensor region 16 up to conductor film 23c serving as the sacrifice film. Accordingly, in pressure sensor region 16, etching hole 46 (hole) for etching the sacrifice film is formed external to movable electrode 39. Then, the resist mask is removed.

Next, by applying a wet etching process using etching hole 46, conductor film 23c, which is the polycrystalline silicon film serving as the sacrifice film, is removed. Accordingly, void 50 is formed in the region having had conductor film 23c, i.e., the region between first gate oxide film 22 and thin silicon oxide film 35. For this etching process, TMAH for wet etching is used, for example.

Thus, also in the present embodiment, conductor film 23c serving as the sacrifice film is etched after first interlayer insulation film 40 and second interlayer insulation film 45 are formed on movable electrode 39 and after interconnections 43a, 43b are formed.

Figure 72:
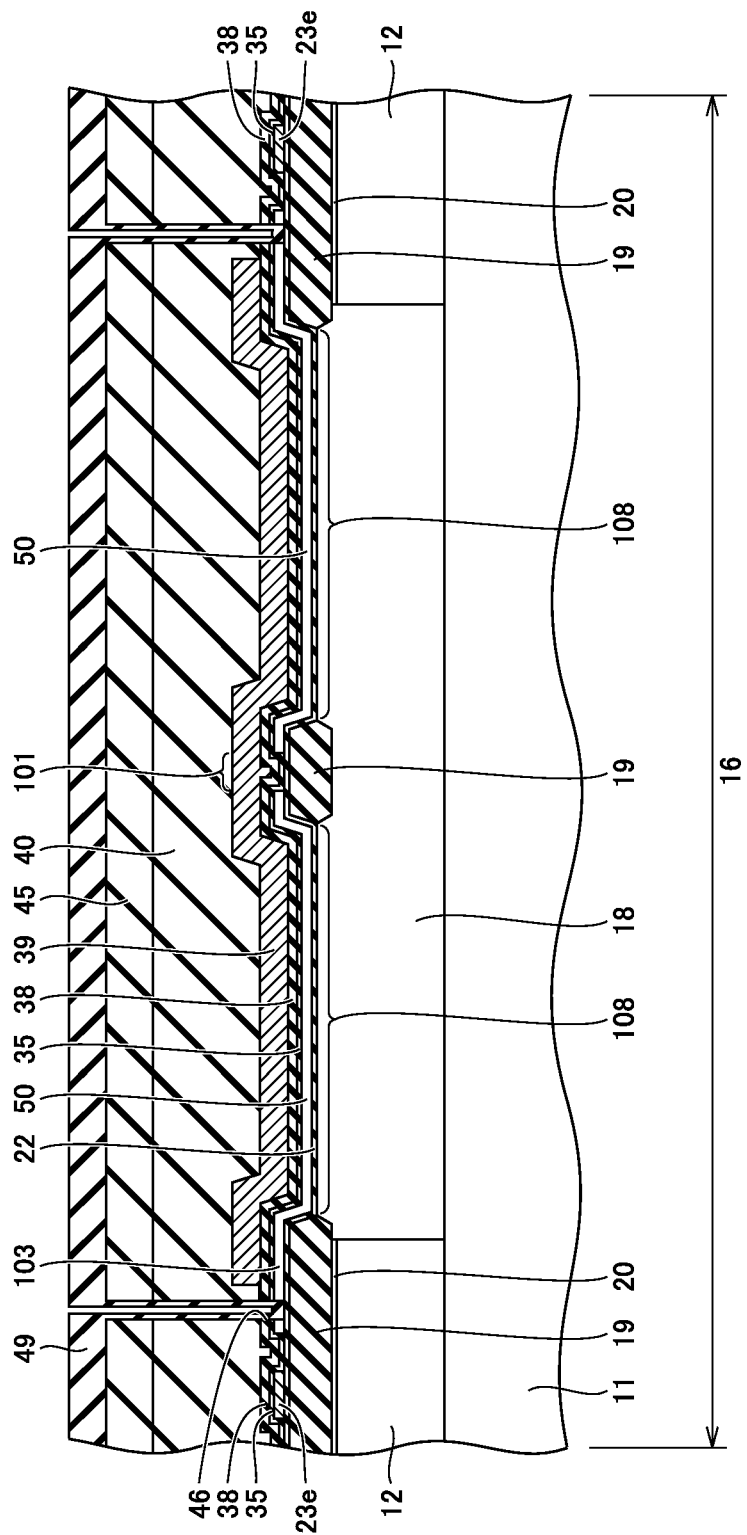
FIG. 72 is a schematic cross sectional view showing a twelfth step of the method of fabricating the first region shown in FIG. 48 in the semiconductor pressure sensor of the fifth embodiment.
Figure 73:
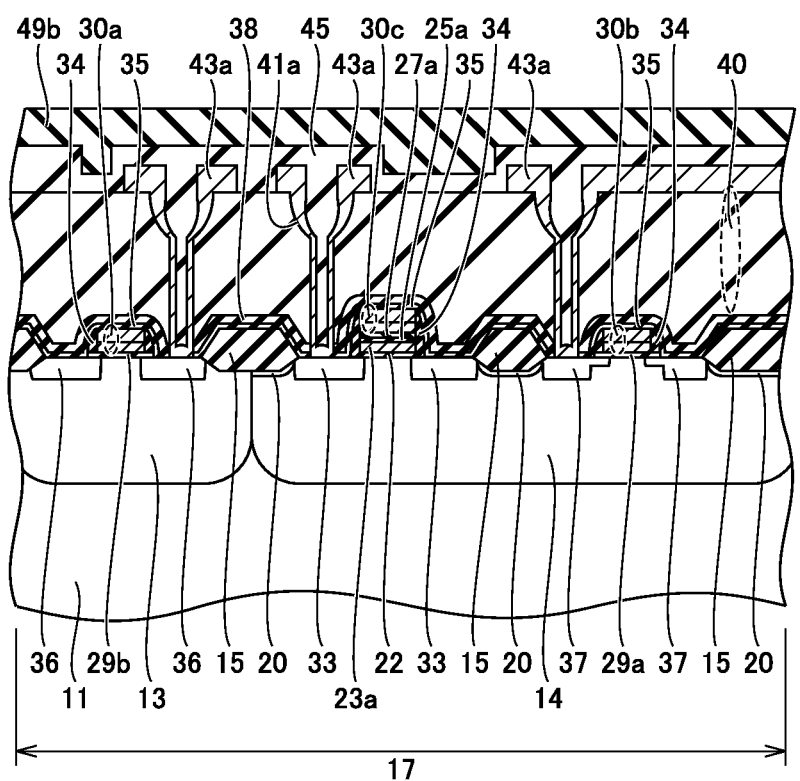
FIG. 73 is a schematic cross sectional view showing a twelfth step of the method of fabricating the second region shown in FIG. 49 in the semiconductor pressure sensor of the fifth embodiment.

With reference to FIG. 72 and FIG. 73, as with the step of FIG. 27 and FIG. 28, first sealing film 49 and third interlayer insulation film 49b (the same layer) are formed all over pressure sensor region 16 and MOS region 17. For example, first sealing film 49 (sealing portion) formed in pressure sensor region 16 using the plasma CVD method closes at least a portion (for example, inner wall surface) of etching hole 46. Accordingly, void 50 is formed into vacuum chamber 51 having reduced pressure, and vacuum chamber 51 becomes a space closed from the outside and sealed against the outside by first sealing film 49 in etching hole 46.

Figure 74:
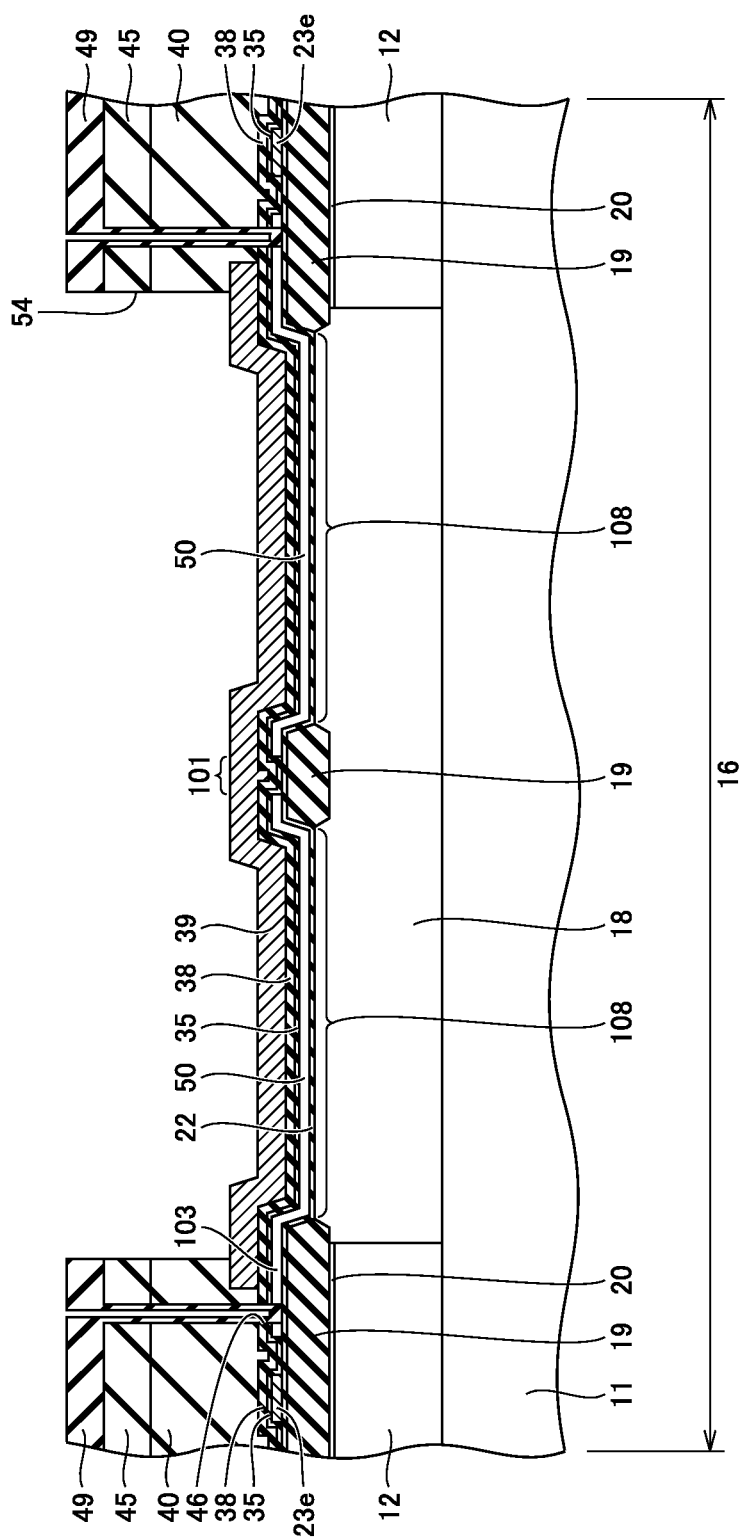
FIG. 74 is a schematic cross sectional view showing a thirteenth step of the method of fabricating the first region shown in FIG. 48 in the semiconductor pressure sensor of the fifth embodiment.
Figure 75:
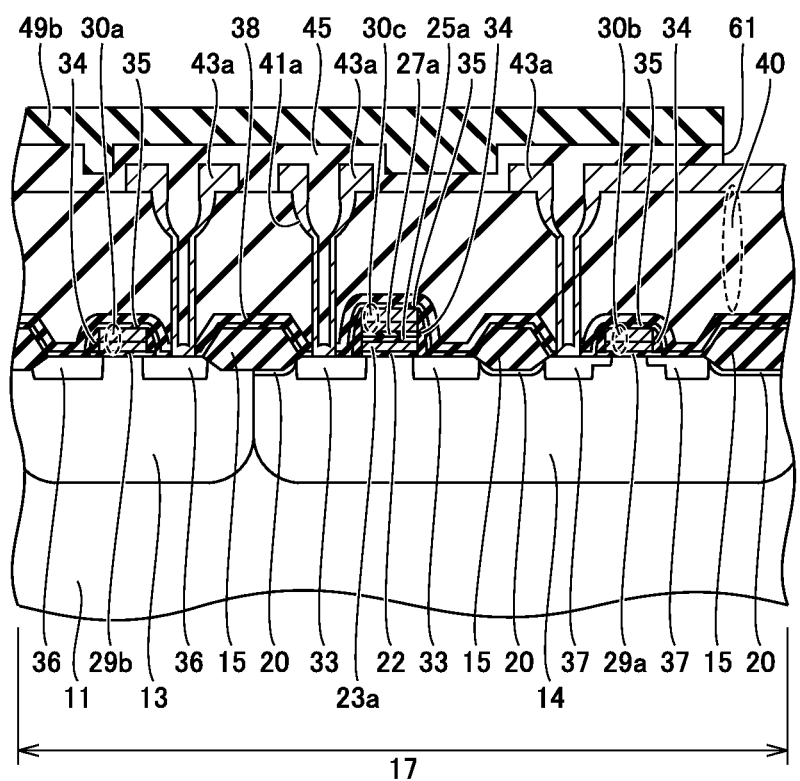
FIG. 75 is a schematic cross sectional view showing a thirteenth step of the method of fabricating the second region shown in FIG. 49 in the semiconductor pressure sensor of the fifth embodiment.

With reference to FIG. 74 and FIG. 75, as with the step of FIG. 29 and FIG. 30, pressure sensor opening 54 (opening) is formed in the portions of second interlayer insulation film 45 and first interlayer insulation film 40 in pressure sensor region 16 so as to expose movable electrode 39. Moreover, in MOS region 17, pad opening 61 is formed to expose interconnection 43a.

Then, with reference to FIG. 48 and FIG. 49 again, as with the first embodiment, a silicon nitride film (not shown) to serve as the passivation film is formed to cover first sealing film 49 and third interlayer insulation film 49b. By patterning this in the same manner as in the first embodiment, passivation film 52a serving as a protection film is formed in MOS region 17, whereas second sealing film 52b further closing etching hole 46 is formed in pressure sensor region 16. Vacuum chamber 51 is sealed twice by first sealing film 49 and second sealing film 52b.

As described above, with reference to FIG. 74 and FIG. 48 particularly, according to the fabrication method in the present embodiment, detection anchor 101 divides movable electrode 39 into the plurality of movable electrode units 102, whereby one pair of adjacent movable electrode units 102 of the plurality of movable electrode units 102 divided are formed to share the same detection anchor 101.

It should be noted that apart from this, the steps of the fabrication method of the present embodiment are substantially the same as those in the fabrication method of the first embodiment, so that the same elements are given the same reference characters and are not repeatedly described.

Next, the following describes function and effect of the present embodiment (particularly in comparison with the first to fourth embodiments). In addition to basically the same function and effect as those in the first embodiment, the present embodiment provides the following function and effect.

For example, in each of the first to fourth embodiments, large field oxide film 19 is formed on substantially the entire surface of pressure sensor region 16, fixed electrode 23b is formed on field oxide film 19 (on silicon substrate 11), and conductor film 30d serving as a sacrifice film is formed on fixed electrode 23b. Fixed electrode 23b is the same layer as floating gate electrode 23a (first electrode) formed (on silicon substrate 11) in MOS region 17, and conductor film 30d is the same layer as gate electrode 30c (second electrode) above floating gate electrode 23a in MOS region 17.

In this case, detection pressure sensor 1010 formed in pressure sensor region 16 is formed to be considerably higher than the transistors formed in MOS region 17, disadvantageously.

However, in the present embodiment, the fixed electrode of pressure sensor region 16 is formed as diffusion layer fixed electrode 18 formed to extend from the surface of silicon substrate 11 into inside of silicon substrate 11. Diffusion layer fixed electrode 18 is formed as the same layer as n type well region 13, which is the diffusion layer of MOS region 17. Furthermore, the sacrifice film of the present embodiment is formed as the same layer as floating gate electrode 23a, which is a layer below gate electrode 30c in MOS region 17, and movable electrode 39 is formed on the sacrifice film. Thus, since the fixed electrode is formed in silicon substrate 11, thick field oxide film 19 does not need to be formed in the region in which the pressure sensor is formed, unlike the first embodiment.

With this fact in addition to no conductor film 30d being required to be formed in pressure sensor region 16, the height of detection pressure sensor 1010 relative to silicon substrate 11 in pressure sensor region 16 can be less than that in the first embodiment.

Moreover, by configuring the sacrifice film as conductor film 23c, which is the same layer as the floating gate electrode, the thickness of the region of the sacrifice film can be thinner than that in the case where the sacrifice film is configured as conductor film 30d, which is the same layer as gate electrode 30c on the floating gate electrode as in the first embodiment. Accordingly, a space between movable electrode 39 and diffusion layer fixed electrode 18 of detection pressure sensor 1010 (in the thickness direction) can be thin. Therefore, sensor capacitance of the pressure sensor can be larger than that in the first embodiment, and sensitivity to a change in pressure applied to movable electrode 39 can be increased as compared with that in the first embodiment. Accordingly, the plane area of the entire semiconductor pressure sensor can be reduced.

Moreover, in the present embodiment, detection anchor 101 is formed just above field oxide film 19. Because the region of detection anchor 101 basically does not form capacitance, the capacitance of the pressure sensor is constituted of fixed electrode flat region 108 and movable electrode 39 provided just thereabove and moved according to a change in pressure.

Regions other than the pressure sensor formation region overlapping with movable electrode 39 when viewed in a plan view are covered with thick field oxide film 19, thereby attaining a small parasitic capacitance in the regions other than the pressure sensor formation region. Accordingly, the sensor capacitance can be constituted of only substantially the net pressure sensor region, thereby attaining a larger change in capacitance value relative to a change in pressure applied to movable electrode 39.

Moreover, in detection anchor 101, the fixed electrode is formed on field oxide film 19 as diffusion layer fixed electrode 18 (fixed electrode flat region 108), whereby movable electrode unit 102 constituting movable electrode 39 can have a recess-like cross sectional shape depressing downward at its end as shown in FIG. 48, for example. Accordingly, when a characteristic of the film constituting movable electrode 39 is changed due to, for example, variation in each condition caused in a semiconductor wafer process or the like, movable electrode 39 can be suppressed from disadvantageously having a projecting cross sectional shape. This facilitates control for pressure applied to movable electrode 39, thereby attaining a wider range of MOS standard process intentionally applicable to the step of forming pressure sensor region 16. Accordingly, the process of pressure sensor region 16 can be highly affinitive to the MOS process, and the number of fabrication steps is suppressed from being increased to contribute to reduction of the production cost.

It should be noted that also in the present embodiment, the configurations described in the first to fourth embodiments may be applied appropriately in combination. For example, although detection anchor 101 has been illustrated in the description above, the present embodiment is applicable also to reference anchor 100 without any modification.

(Sixth Embodiment)

Figure 76:
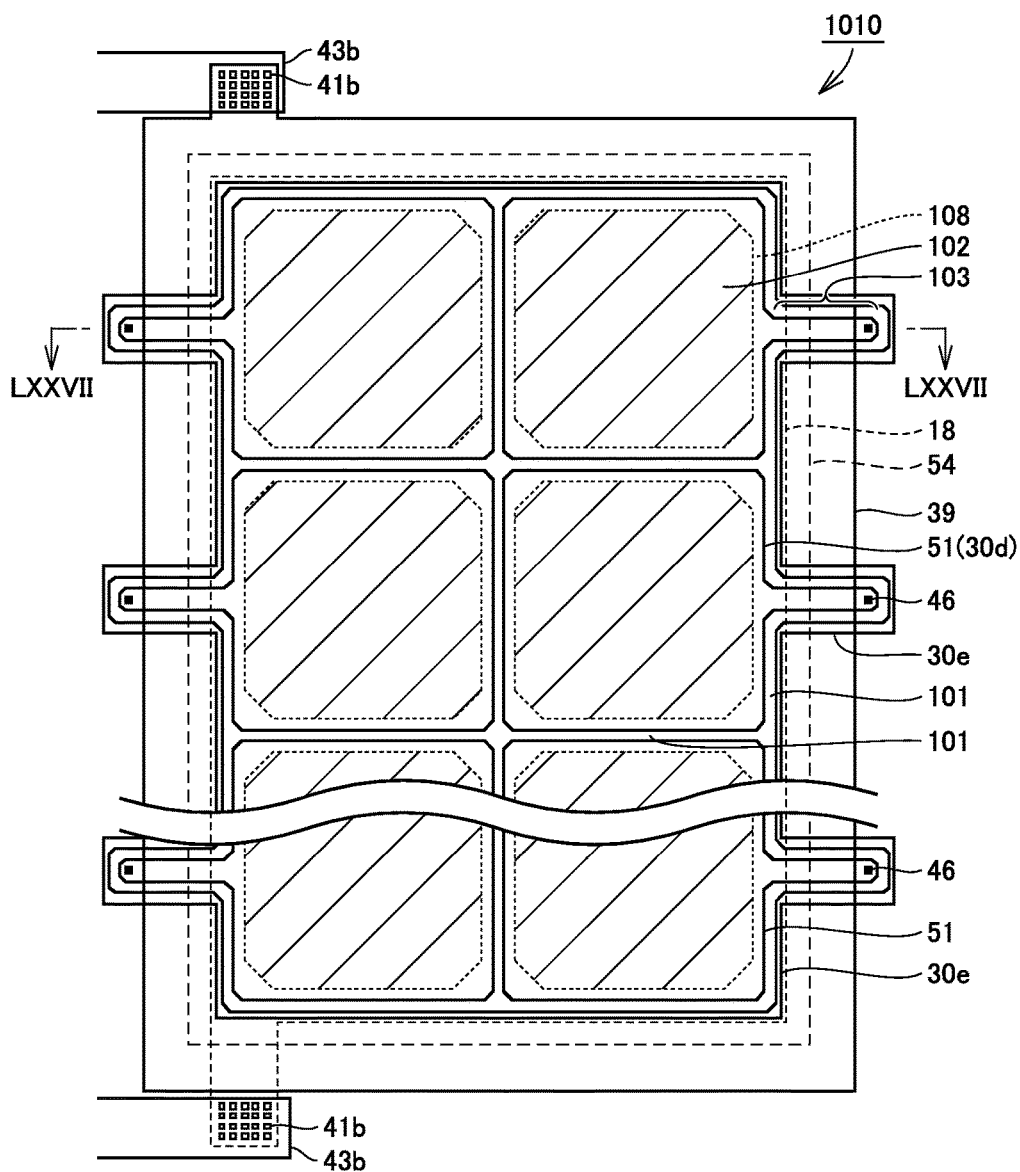
FIG. 76 is a schematic plan view showing a configuration of a detection pressure sensor of a sixth embodiment.
Figure 77:
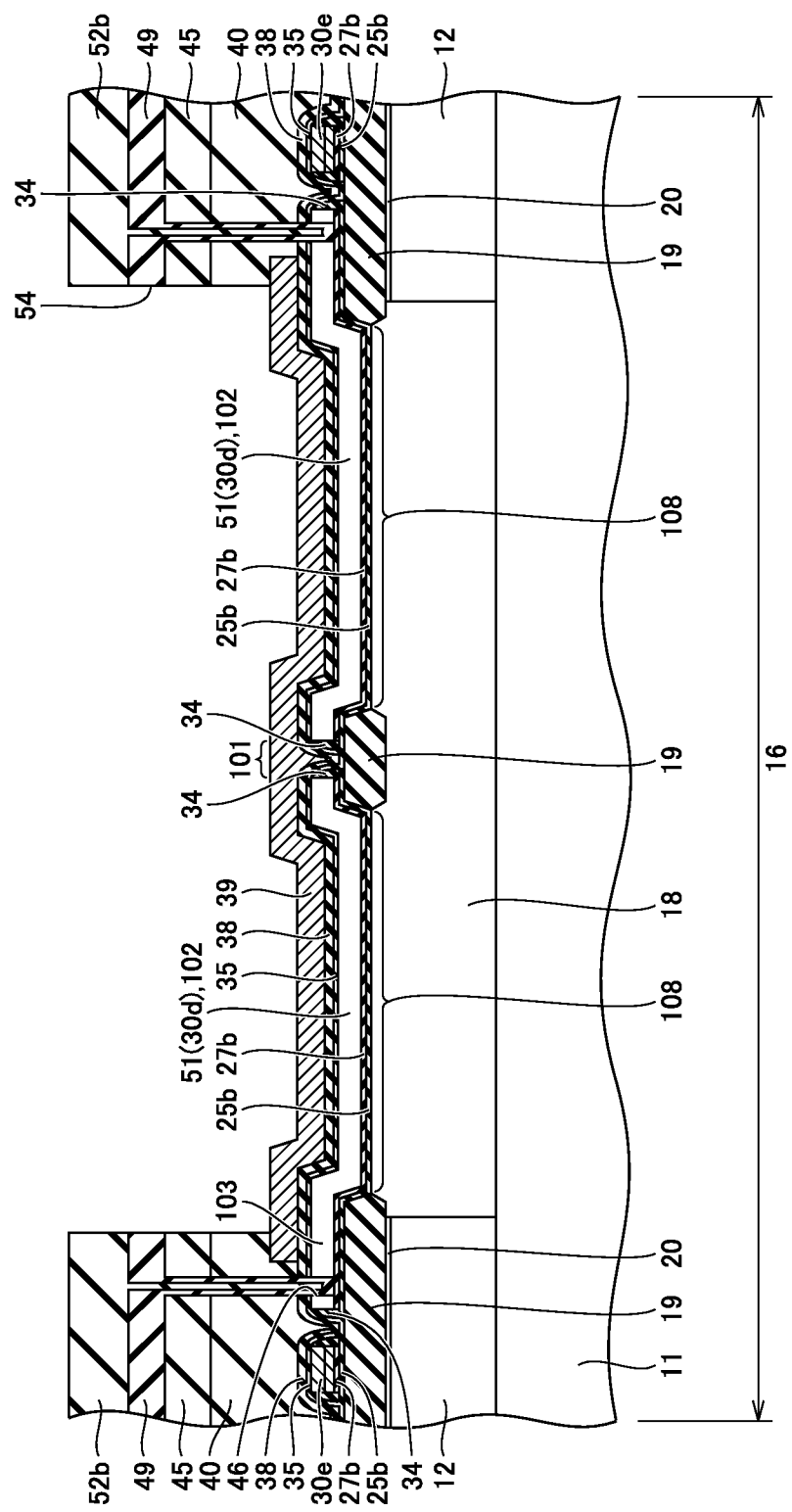
FIG. 77 is a schematic cross sectional view of a first region surrounded by a LXXVII-LXXVII line of FIG. 76.

A semiconductor pressure sensor device 10 of the present embodiment basically has the same configuration as semiconductor pressure sensor device 10 of the fifth embodiment, and is different from semiconductor pressure sensor device 10 of the fifth embodiment in the following points. With reference to FIG. 76 and FIG. 77, although the same description as in the first and fifth embodiments may be repeated, the following describes a configuration of a first region 16 in which a detection pressure sensor 1010 of the present embodiment is formed. It should be noted that a configuration of a second region (MOS region 17) is basically the same as that in each of the first to fifth embodiments (FIG. 49 and each of figures having odd numbers rendered among FIG. 51 to FIG. 75 showing the fabrication method thereof), and is therefore not described here.

With reference to FIG. 76 and FIG. 77, a detection pressure sensor 1010 included in semiconductor pressure sensor device 10 of the present embodiment is an exemplary pressure sensor, and is formed in pressure sensor region 16 (first region) as in the first embodiment.

Detection pressure sensor 1010 of the present embodiment has capacitance due to a diffusion layer fixed electrode 18 (fixed electrode) indicated by a dotted line in FIG. 76, a vacuum chamber 51 serving as a void provided above diffusion layer fixed electrode 18, and a movable electrode 39 provided above vacuum chamber 51. Vacuum chamber 51 is formed by removing a conductor film 30d serving as a sacrifice film mentioned later. It should be noted that in FIG. 76, the end portion of vacuum chamber 51 formed by removing conductor film 30d is denoted as a conductor film end portion 30e.

Also in the present embodiment, as with the first embodiment, vacuum chamber 51 is provided with a detection anchor 101 that serves as an anchor portion to support movable electrode 39 and that is formed by (at least partially) removing conductor film 30d, from which vacuum chamber 51 is formed, by means of patterning and forming (thick) movable electrode 39 to fill the opened region and project downward. Detection anchor 101 divides movable electrode 39 into a plurality of movable electrode units 102 when viewed in a plan view. Therefore, a pair of movable electrode units 102 adjacent to each other with detection anchor 101 being interposed therebetween when viewed in a plan view are provided to share a region of the same detection anchor 101.

In pressure sensor region 16, a first protection film 25b and a second protection film 27b are formed in this order on field oxide film 19 or diffusion layer fixed electrode 18 (fixed electrode flat region 108), vacuum chamber 51 (the range thereof is substantially equal to the range of movable electrode unit 102) is formed thereabove, and a silicon oxide film 35 and a TEOS (Tetra Ethyl Ortho Silicate glass) based oxide film 38 are formed thereabove in this order. Moreover, movable electrode 39 is formed on TEOS-based oxide film 38.

Also in the present embodiment, in the non-overlapping region not overlapping with movable electrode 39 of pressure sensor region 16, etching hole 46 is formed in first interlayer insulation film 40 and second interlayer insulation film 45 (covering the pressure sensor) to extend to (communicate with) movable electrode unit 102 (vacuum chamber 51).

Via etching hole 46, a conductor film 30d (sacrifice film), which is the same layer (portion constituted of the same film) as a gate electrode 30c serving as a gate electrode (second electrode) mentioned later in the same manner as in the first embodiment, is etched from above and removed, thereby forming void (vacuum chamber 51) in the region having had conductor film 30d formed therein. Accordingly, etching hole 46 communicates with vacuum chamber 51.

Moreover, first sealing film 49 and second sealing film 52b are formed to fill etching hole 46, as a sealing portion sealing vacuum chamber 51 from outside. First interlayer insulation film 40 and the like are removed from most of the region (central portion) overlapping with movable electrode 39 when viewed in a plan view, with the result that a pressure sensor opening 54 (opening) is formed in this region to expose movable electrode 39.

In the present embodiment, detection anchor 101 is formed just above field oxide film 19.

As with the first embodiment, not only pressure sensor region 16 but also MOS region 17 (second region) are defined in semiconductor pressure sensor device 10 of the present embodiment.

The configuration of MOS region 17 in FIG. 49 is the same as the configuration of MOS region 17 of FIG. 3 of the first embodiment and is therefore not described in detail, but is described briefly as follows. As transistors, a p channel type MOS transistor, an EPROM, and an n channel type MOS transistor are formed. The p channel type MOS transistor is formed in an n type well region 13, whereas the EPROM and the n channel type MOS transistor are formed in a p type well region 14. Moreover, in order to cover these transistors, a first interlayer insulation film 40 and a second interlayer insulation film 45 are formed.

The EPROM has a laminated structure including: a polycrystalline silicon film 23a serving as a floating gate electrode (first electrode); a second gate oxide film 25a thereon; a first silicon nitride film 27a; and a gate electrode 30c (second electrode). A combination of polycrystalline silicon film 23a and gate electrode 30c is defined as a gate electrode of the whole of the EPROM.

In the description herein, n type diffusion layer fixed electrode 18 (fixed electrode) in pressure sensor region 16 is formed as the same layer as n type well region 13 (diffusion layer) in silicon substrate 11.

It should be noted that apart from this, the configuration of the present embodiment is substantially the same as that of the fifth embodiment, so that the same elements are given the same reference characters and are not repeatedly described.

Next, with reference to FIG. 78 to FIG. 88, FIG. 77 and each of figures having odd numbers rendered among FIG. 55 to FIG. 75, the following describes the semiconductor pressure sensor (semiconductor pressure sensor device 10) including detection pressure sensor 1010 and the MOS circuits in the present embodiment.

Figure 78:
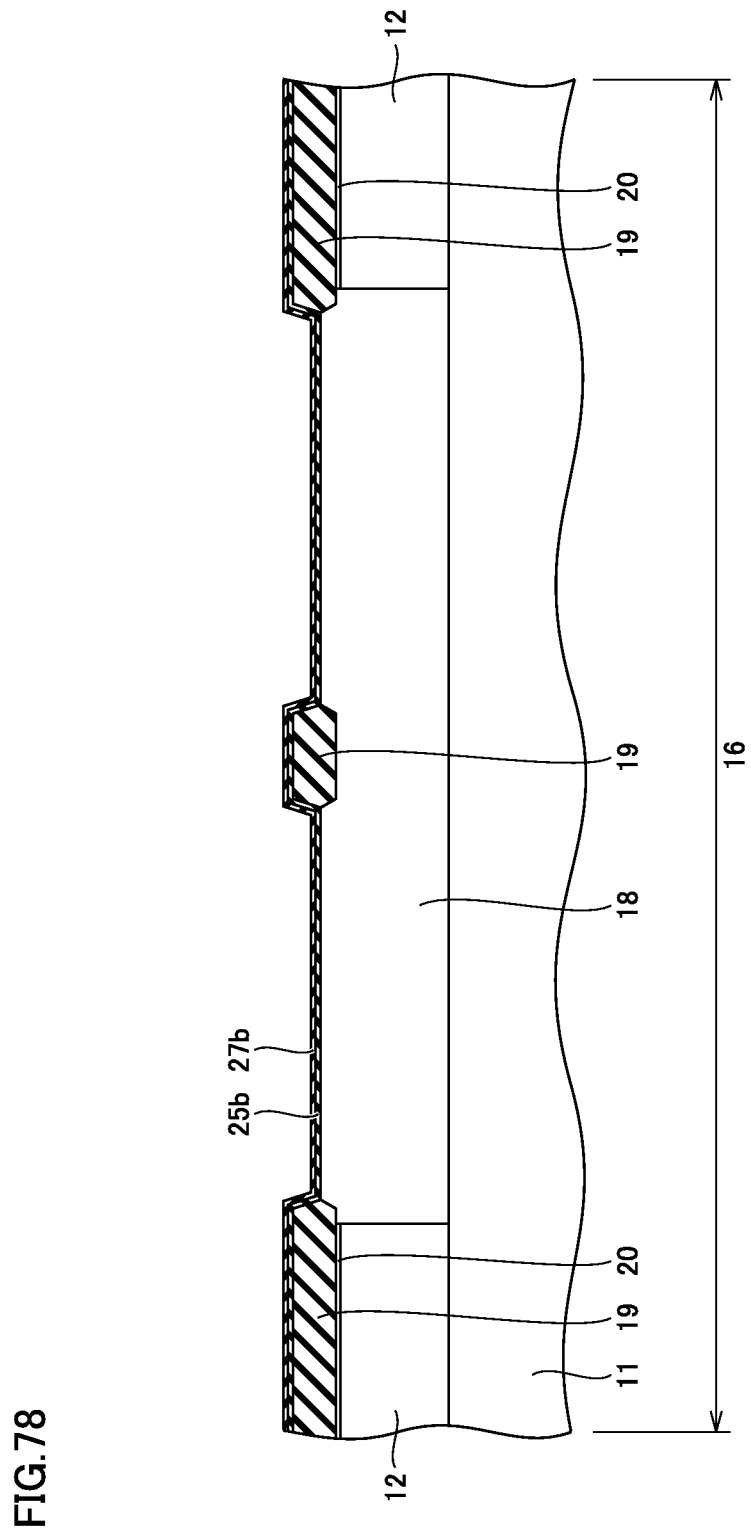
FIG. 78 is a schematic cross sectional view showing a first step of a method of fabricating the first region shown in FIG. 77 in the semiconductor pressure sensor of the sixth embodiment.

With reference to FIG. 78 and FIG. 55, as with FIG. 5 and FIG. 6, for example, a p type silicon substrate is prepared, and pressure sensor region 16 to be provided with detection pressure sensor 1010 and MOS region 17 to be provided with the MOS circuits such as a memory cell transistor are first defined in the surface of silicon substrate 11. In pressure sensor region 16, p type well region 12 and diffusion layer fixed electrode 18 are formed, whereas in MOS region 17, n type well region 13 and p type well region 14 are formed.

Specifically, as with the step of FIG. 5 and FIG. 6, a resist mask (not shown) is formed and is used as an implantation mask to implant an n type impurity (for example, phosphorus) for forming n type well region 13 and diffusion layer fixed electrode 18. Then, by performing an annealing process or the like under a predetermined condition, diffusion layer fixed electrode 18 serving as a fixed electrode is formed in pressure sensor region 16 and n type well region 13 is formed in MOS region 17 through the same step (as a diffusion layer) so as to both extend from the surface of silicon substrate 11 to inside of silicon substrate 11.

By performing the same process as that in the step of FIG. 52 and FIG. 53 (FIG. 7 and FIG. 8), field oxide films 15, 19 and an underlying oxide film 21 are formed on desired regions. However, underlying oxide film 21 is removed after formation of a channel stopper 20.

The process proceeds to a step of forming a first conductor film in pressure sensor region 16 and MOS region 17 and patterning the first conductor film. In doing so, conductor film 23c in pressure sensor region 16 and polycrystalline silicon film 23a to serve as the floating gate electrode of the EPROM in MOS region 17 are formed as the same layer using the same material.

Specifically, in the step of FIG. 55 in MOS region 17, a first gate oxide film 22 is formed in MOS region 17, and simultaneously, a first gate oxide film 22 (not shown) is formed in pressure sensor region 16 on the exposed surface of silicon substrate 11 or the surface of field oxide film 19.

Next, the polycrystalline silicon film (first conductor film) is formed to cover first gate oxide film 22, is provided with a conductive impurity by means of implantation, and is patterned. Accordingly, in pressure sensor region 16, conductor film 23c (not shown) is formed which is constituted of the patterned polycrystalline silicon film. On the other hand, in MOS region 17, a pattern (film thickness of about 50 to 300 nm) of polycrystalline silicon film 23a is formed to serve as the floating gate electrode (first electrode) of the EPROM. The pattern of conductor film 23c is preferably formed to lie on field oxide film 19. Then, the resist mask is removed and first gate oxide film 22 and conductor film 23c of pressure sensor region 16 are removed. In this way, the pattern of polycrystalline silicon film 23a is formed in MOS region 17.

Then, as with the step of FIG. 9 and FIG. 10, a second gate oxide film 25a, a first silicon nitride film 27a, a first protection film 25b (made of the same material as first fixed electrode protection film 25b), and a second protection film 27b (made of the same material as second fixed electrode protection film 27b) are formed, and a predetermined impurity is implanted to control the threshold voltage of each of the transistors of MOS region 17.

Figure 79:
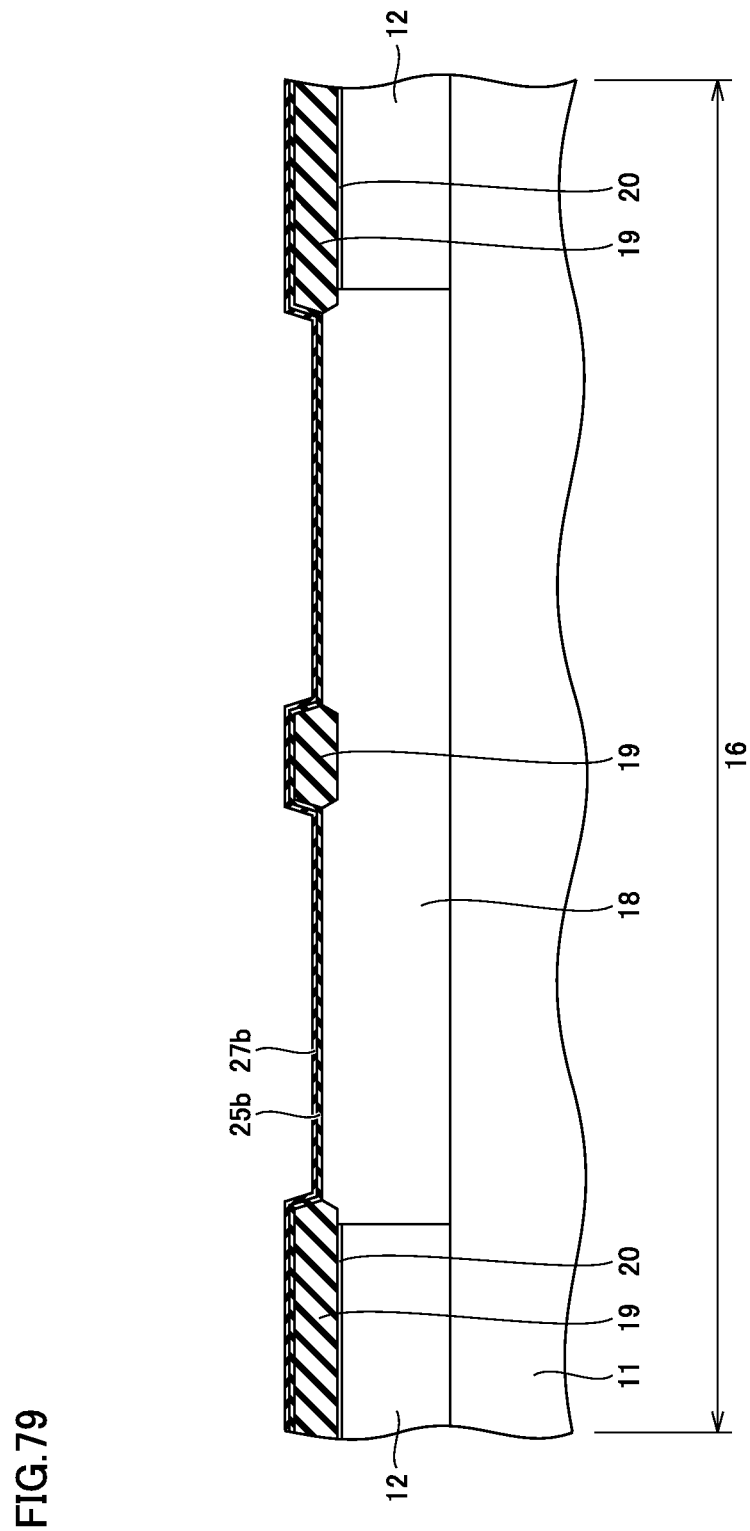
FIG. 79 is a schematic cross sectional view showing a second step of the method of fabricating the first region shown in FIG. 77 in the semiconductor pressure sensor of the sixth embodiment.

Next, with reference to FIG. 79 and FIG. 57, as with the step of FIG. 11 and FIG. 12, third gate oxide films 29a, 29b are formed (after removal of first gate oxide film 22a, second gate oxide film 25a, and first silicon nitride film 27a in the predetermined region of MOS region 17).

Figure 80:
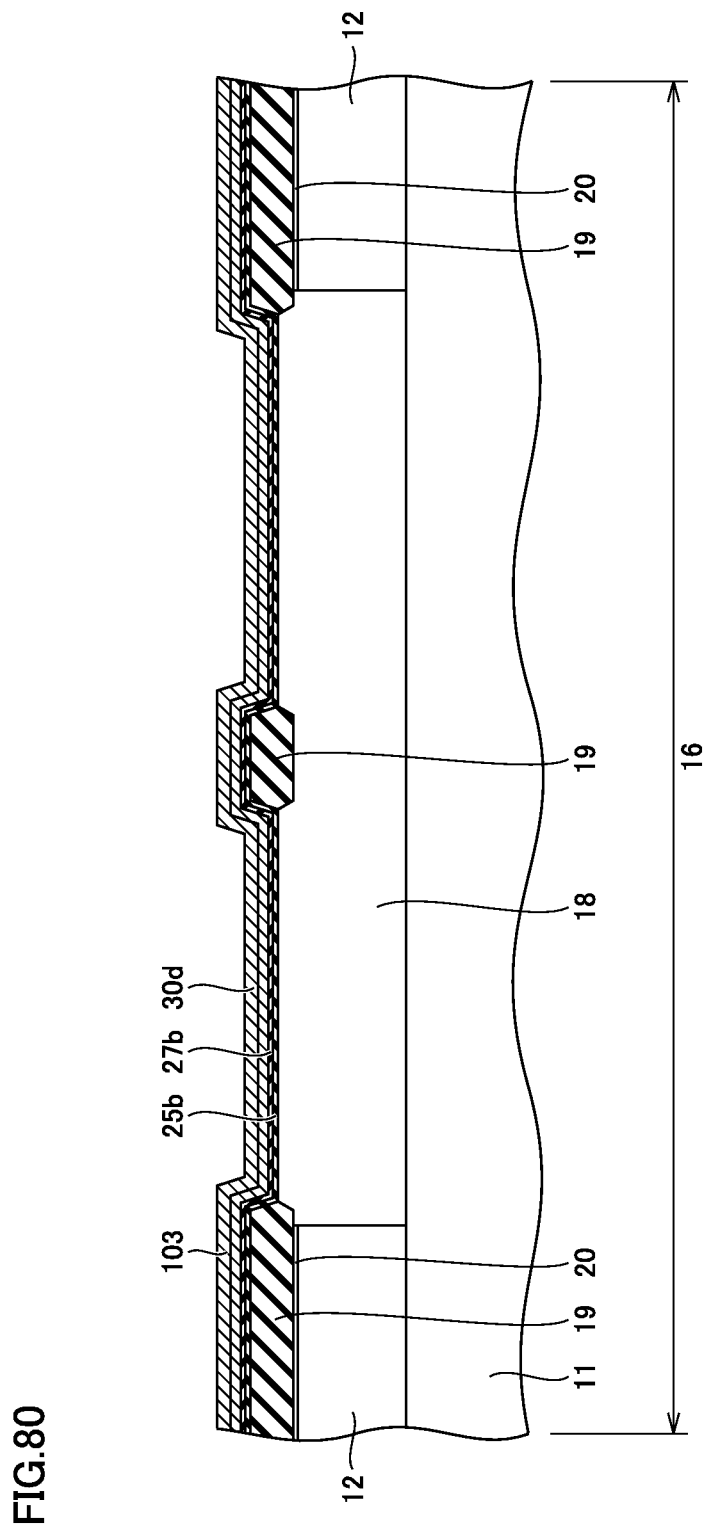
FIG. 80 is a schematic cross sectional view showing a third step of the method of fabricating the first region shown in FIG. 77 in the semiconductor pressure sensor of the sixth embodiment.

Next, with reference to FIG. 80 and FIG. 59, as with the step of FIG. 13 and FIG. 14, conductor film 30 serving as a second conductor film is formed in pressure sensor region 16 and MOS region 17.

Next, as with the step of FIG. 13 and FIG. 14, conductor film 30 is patterned, thereby patterning the gate electrode of the EPROM. Accordingly, in MOS region 17, gate electrode 30c (second electrode: conductor film pattern) provided above floating gate electrode 23a of the EPROM is formed. Accordingly, the gate electrode of the EPROM, inclusive of gate electrode 30c, is formed.

Figure 81:
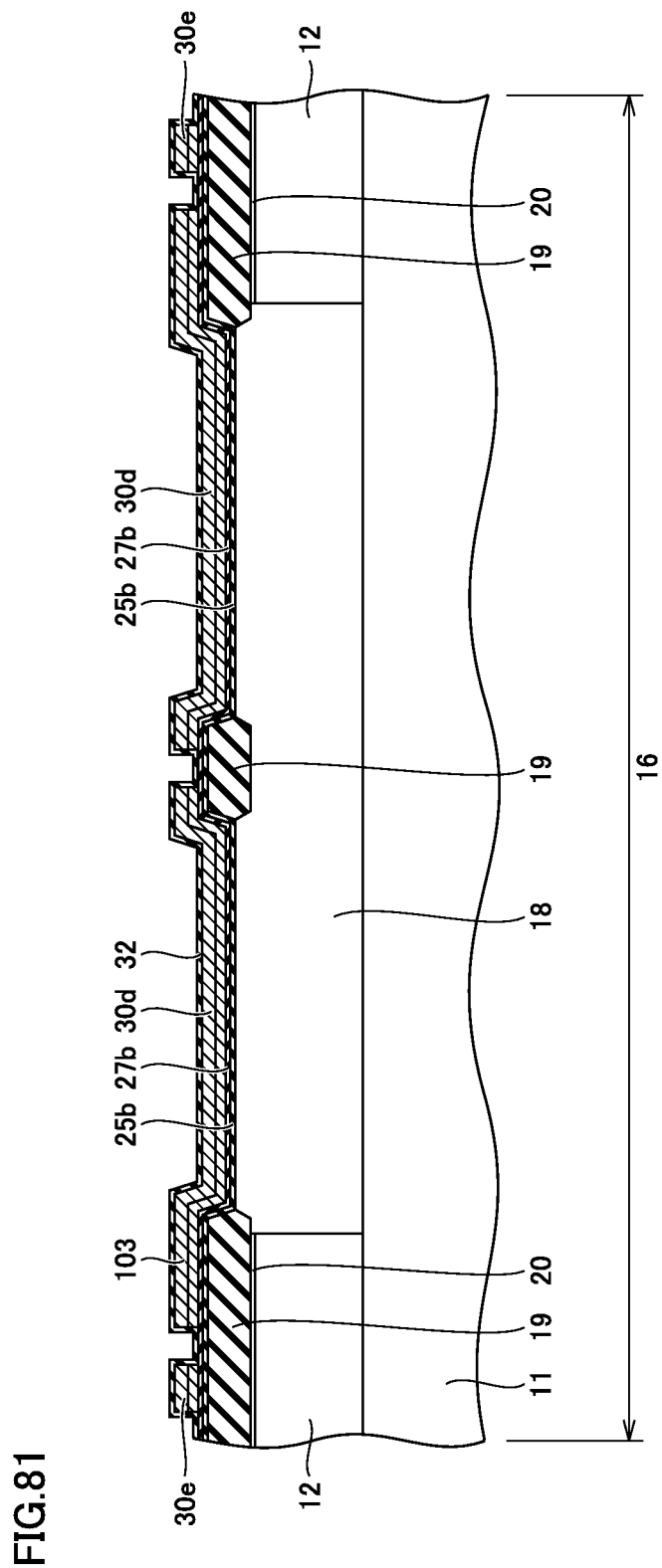
FIG. 81 is a schematic cross sectional view showing a fourth step of the method of fabricating the first region shown in FIG. 77 in the semiconductor pressure sensor of the sixth embodiment.

Next, with reference to FIG. 81 and FIG. 61, as with the step of FIG. 15 and FIG. 16, a pattern (conductor film pattern) of conductor film 30d serving as a sacrifice film is formed by patterning conductor film 30 in pressure sensor region 16. Moreover, as with the first embodiment, as a result of patterning conductor film 30 in MOS region 17, gate electrode 30b of the n channel type MOS transistor and gate electrode 30a of the p channel type MOS transistor are formed. As with FIG. 15 and FIG. 16, a thin oxide film 32 is formed to cover conductor film 30d in pressure sensor region 16 and cover gate electrodes 30a, 30b, 30c in MOS region 17.

It should be noted that in the step of forming the pattern of conductor film 30d, conductor film 30d is formed to have an opened portion, i.e., to be divided into a plurality of patterns in the horizontal direction of FIG. 81. For example, above field oxide film 19 at the central portion in the horizontal direction of FIG. 81, the opened portion is formed by removing conductor film 30d to expose the surface just therebelow. Thus, the pattern of the sacrifice film is formed to have the previously opened portion.

Figure 82:
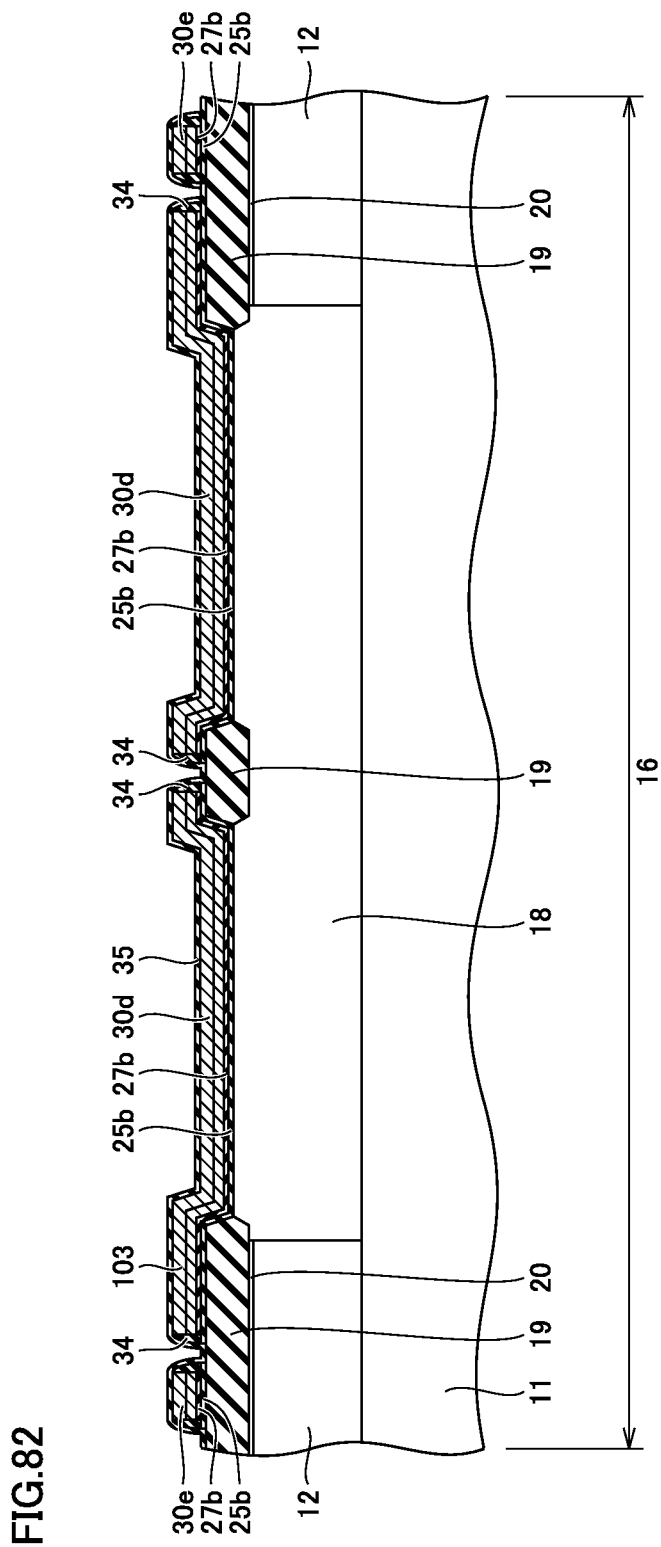
FIG. 82 is a schematic cross sectional view showing a fifth step of the method of fabricating the first region shown in FIG. 77 in the semiconductor pressure sensor of the sixth embodiment.

Next, with reference to FIG. 82 and FIG. 63, as with the step of FIG. 17 and FIG. 18, a side wall oxide film 34 is formed on gate electrodes 30a, 30b, 30c and conductor film 30d, and then, a thin silicon oxide film 35 is formed to cover gate electrodes 30a, 30b, 30c and conductor film 30d. This thin silicon oxide film 35 is formed in one piece with third gate oxide film 29b and thin oxide film 32, so that third gate oxide film 29b and thin oxide film 32 are not in FIG. 82 and FIG. 63.

Figure 83:
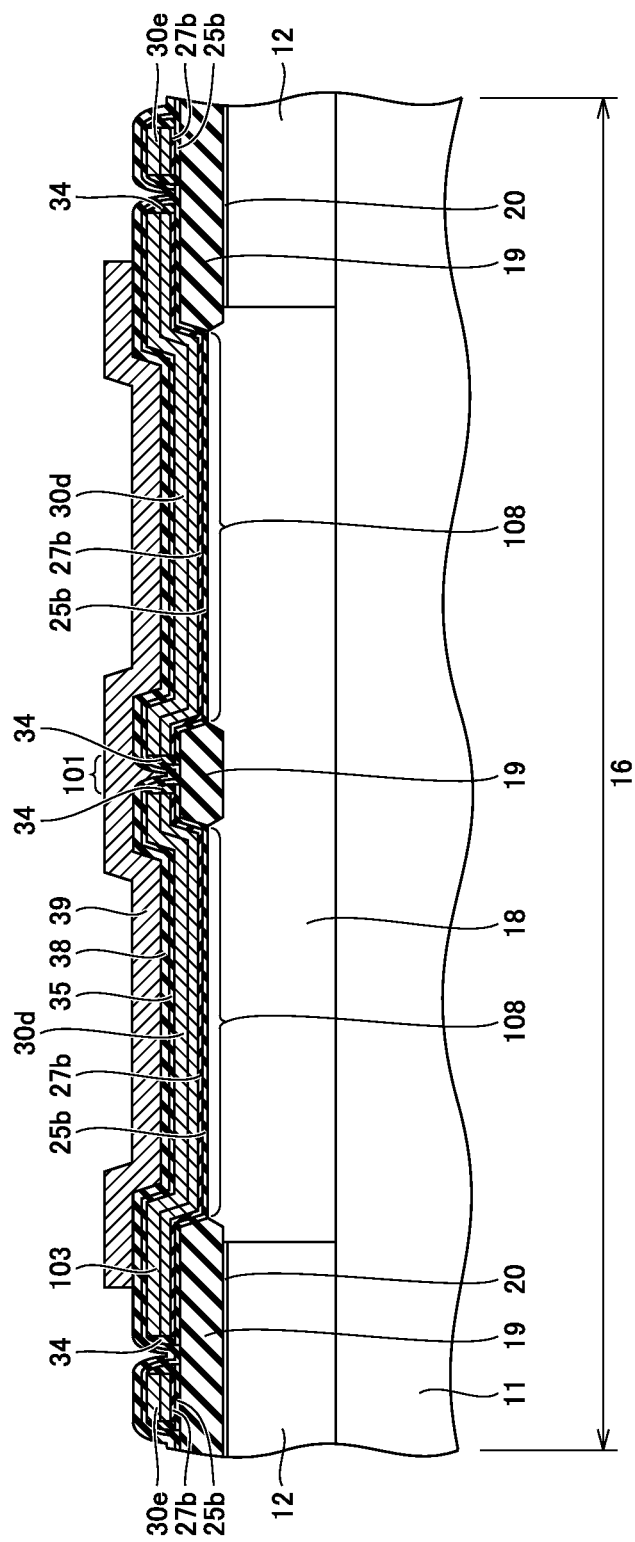
FIG. 83 is a schematic cross sectional view showing a sixth step of the method of fabricating the first region shown in FIG. 77 in the semiconductor pressure sensor of the sixth embodiment.

With reference to FIG. 83 and FIG. 65, as with the step of FIG. 19 and FIG. 20, TEOS-based oxide film 38 is formed to cover silicon oxide film 35, and movable electrode 39 is formed (on conductor film 30d) in pressure sensor region 16 to cover TEOS-based oxide film 38.

Here, as with the first embodiment, the step of forming movable electrode 39 is independent as a step of forming only movable electrode 39 rather than forming movable electrode 39 as the same layer as a region of a portion of MOS region 17. During the formation of the polycrystalline silicon film for forming movable electrode 39, the polycrystalline silicon film is formed to fill, from above, the opened portion in the sacrifice film (conductor film 30d) (just above field oxide film 19 of FIG. 78 or the like). Accordingly, also in the opened portion of conductor film 30d, the same polycrystalline silicon film as movable electrode 39 is formed to project downward in the figure relative to movable electrode 39. The portion of the polycrystalline silicon film thus projecting downward is formed as the anchor portion, i.e., detection anchor 101, and can support movable electrode 39 from below. Detection anchor 101 is formed to include, in at least a portion thereof, the region formed to fill the opened portion of conductor film 30d.

In this way, pressure sensor region 16 is provided with a configuration in which fixed electrode flat region 108 particularly surrounded by field oxide film 19 in diffusion layer fixed electrode 18 serves as the fixed electrode and movable electrode 39 is provided to face the fixed electrode.

Figure 84:
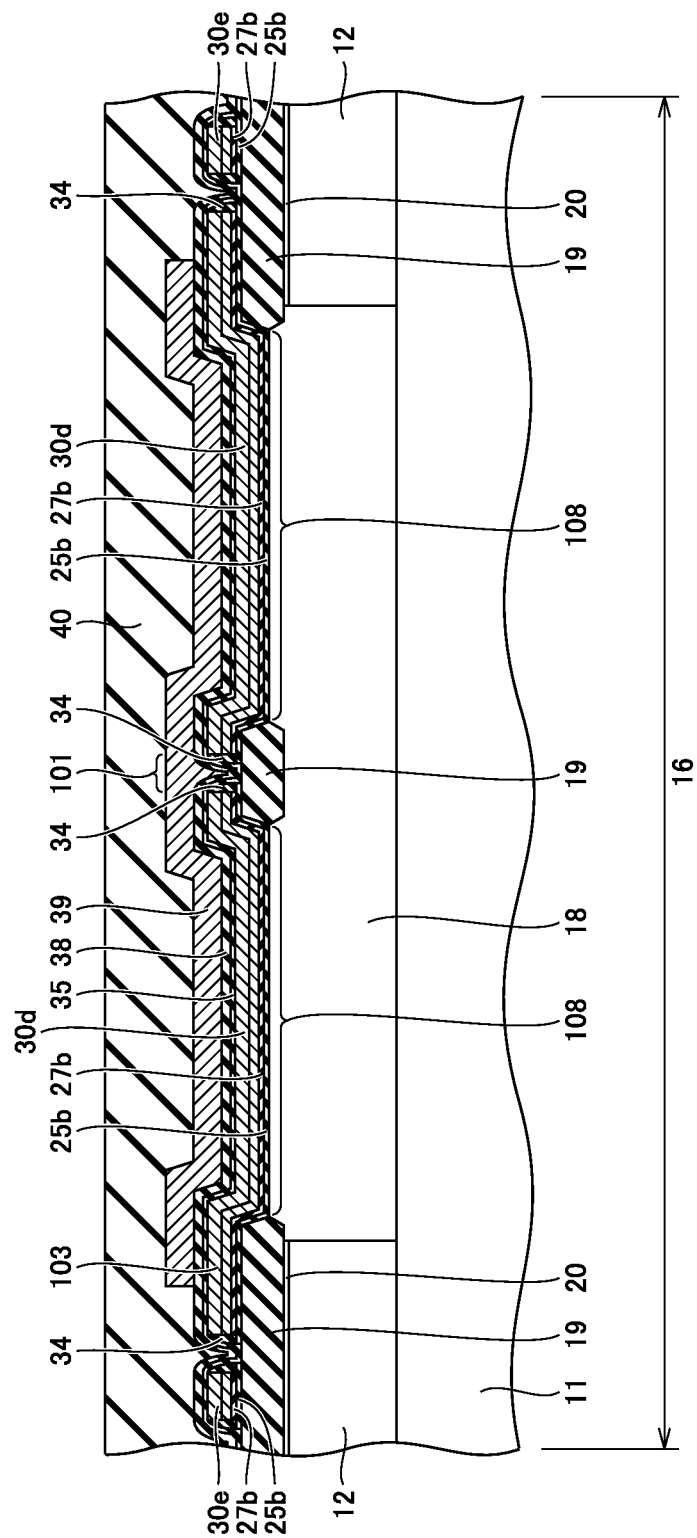
FIG. 84 is a schematic cross sectional view showing a seventh step of the method of fabricating the first region shown in FIG. 77 in the semiconductor pressure sensor of the sixth embodiment.

With reference to FIG. 84 and FIG. 67, as with the step of FIG. 21 and FIG. 22, first interlayer insulation film 40 (interlayer insulation film) is formed to cover TEOS-based oxide film 38 and movable electrode 39, and then contact holes 41a, 41b are formed.

Figure 85:
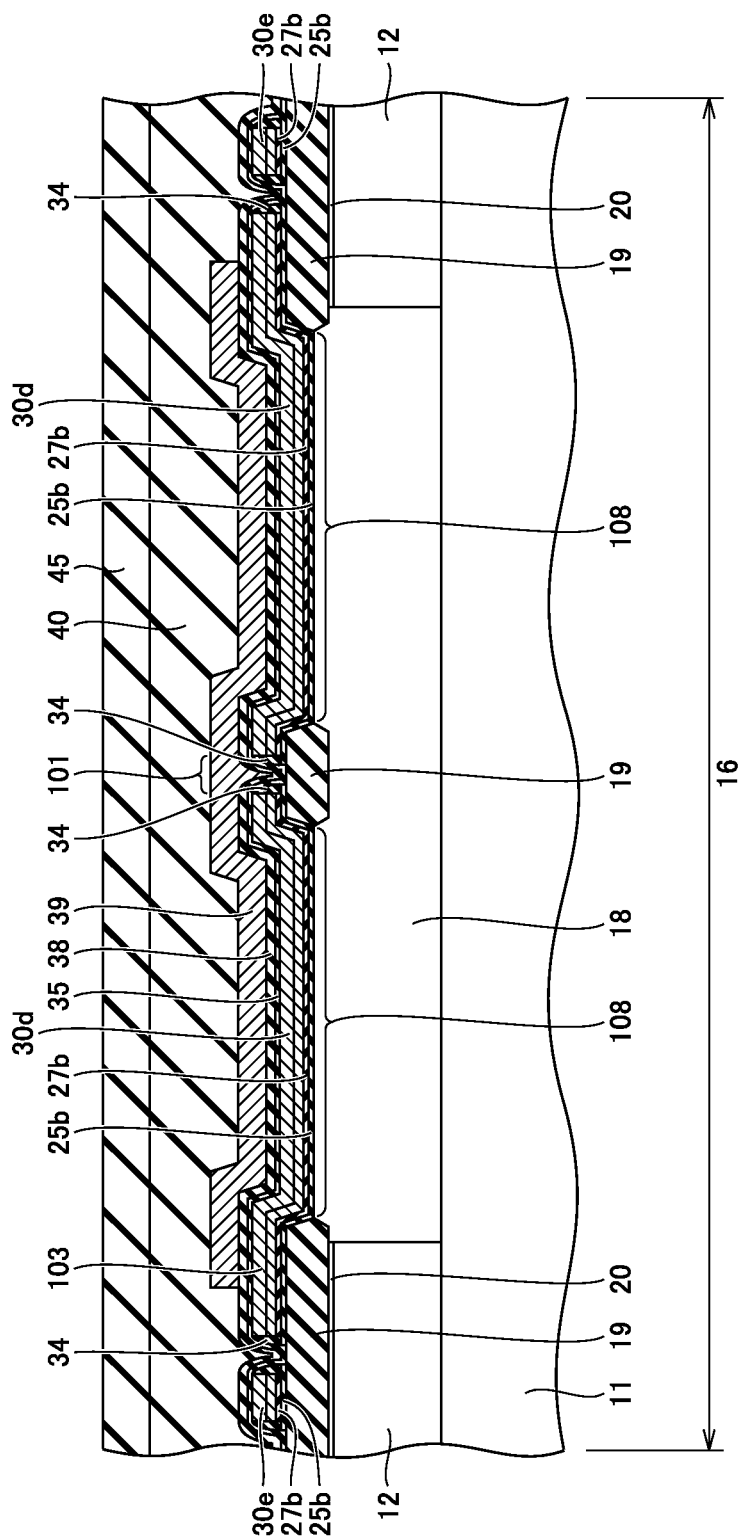
FIG. 85 is a schematic cross sectional view showing an eighth step of the method of fabricating the first region shown in FIG. 77 in the semiconductor pressure sensor of the sixth embodiment.

With reference to FIG. 85 and FIG. 69, as with the step of FIG. 23 and FIG. 24, interconnections 43a, 43b are formed, and second interlayer insulation film 45 (interlayer insulation film) is formed to cover interconnections 43a, 43b.

Figure 86:
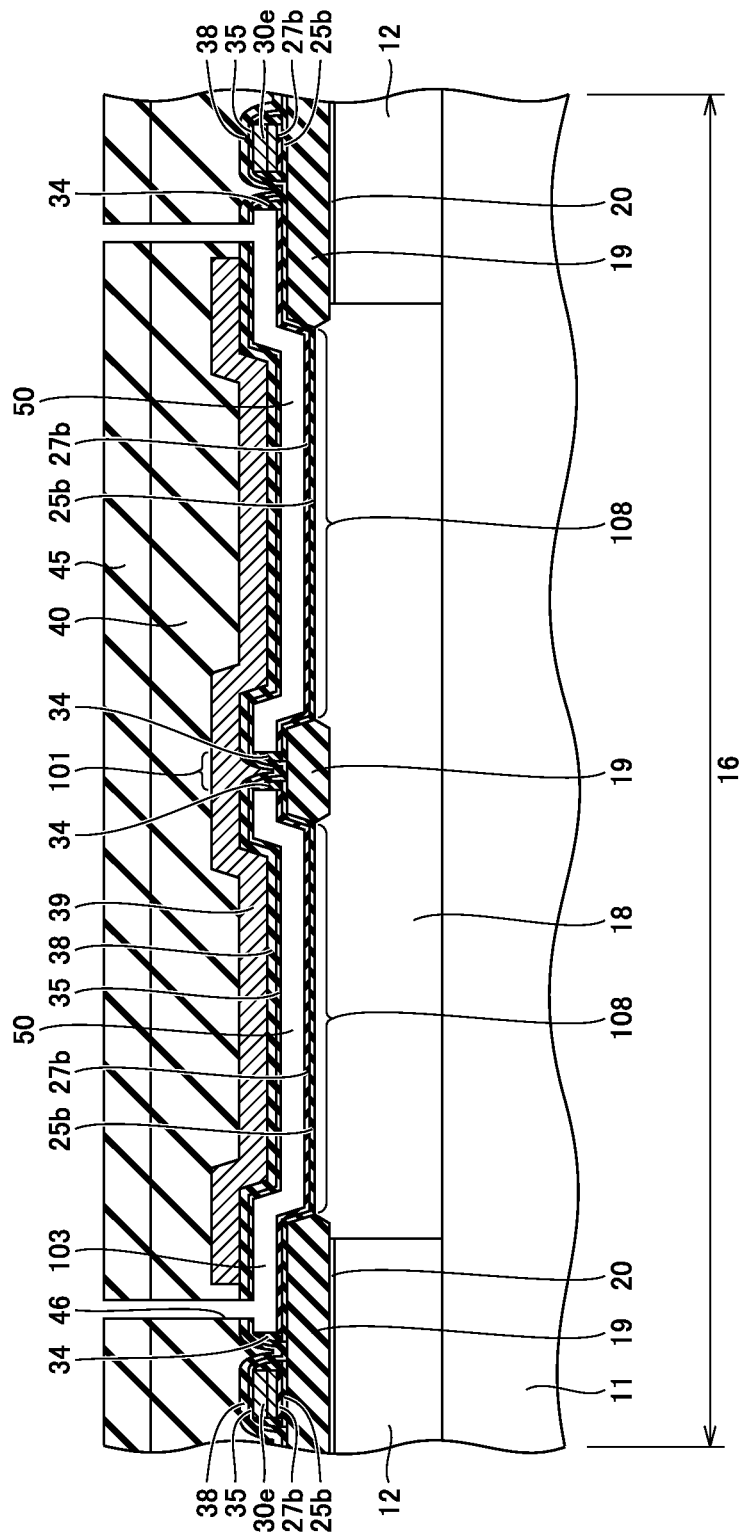
FIG. 86 is a schematic cross sectional view showing a ninth step of the method of fabricating the first region shown in FIG. 77 in the semiconductor pressure sensor of the sixth embodiment.

With reference to FIG. 86 and FIG. 71, as with the step of FIG. 25 and FIG. 26, a resist mask (not shown) for forming the etching hole is formed. The resist mask is employed as an etching mask to etch portions of first and second interlayer insulation films (interlayer insulation films) in pressure sensor region 16 up to conductor film 30d serving as the sacrifice film. Accordingly, in pressure sensor region 16, an etching hole 46 (hole) for etching the sacrifice film is formed external to movable electrode 39. Then, the resist mask is removed.

Next, by applying a wet etching process using etching hole 46, conductor film 30d, which is the polycrystalline silicon film serving as the sacrifice film, is removed. Accordingly, void 50 is formed in the region having had conductor film 30d, i.e., the region between first protection film 27b and thin silicon oxide film 35. For this etching process, TMAH for wet etching is used, for example.

Thus, also in the present embodiment, conductor film 30d serving as a sacrifice film is etched after first interlayer insulation film 40 and second interlayer insulation film 45 are formed on movable electrode 39 and after interconnections 43a, 43b are formed.

Figure 87:
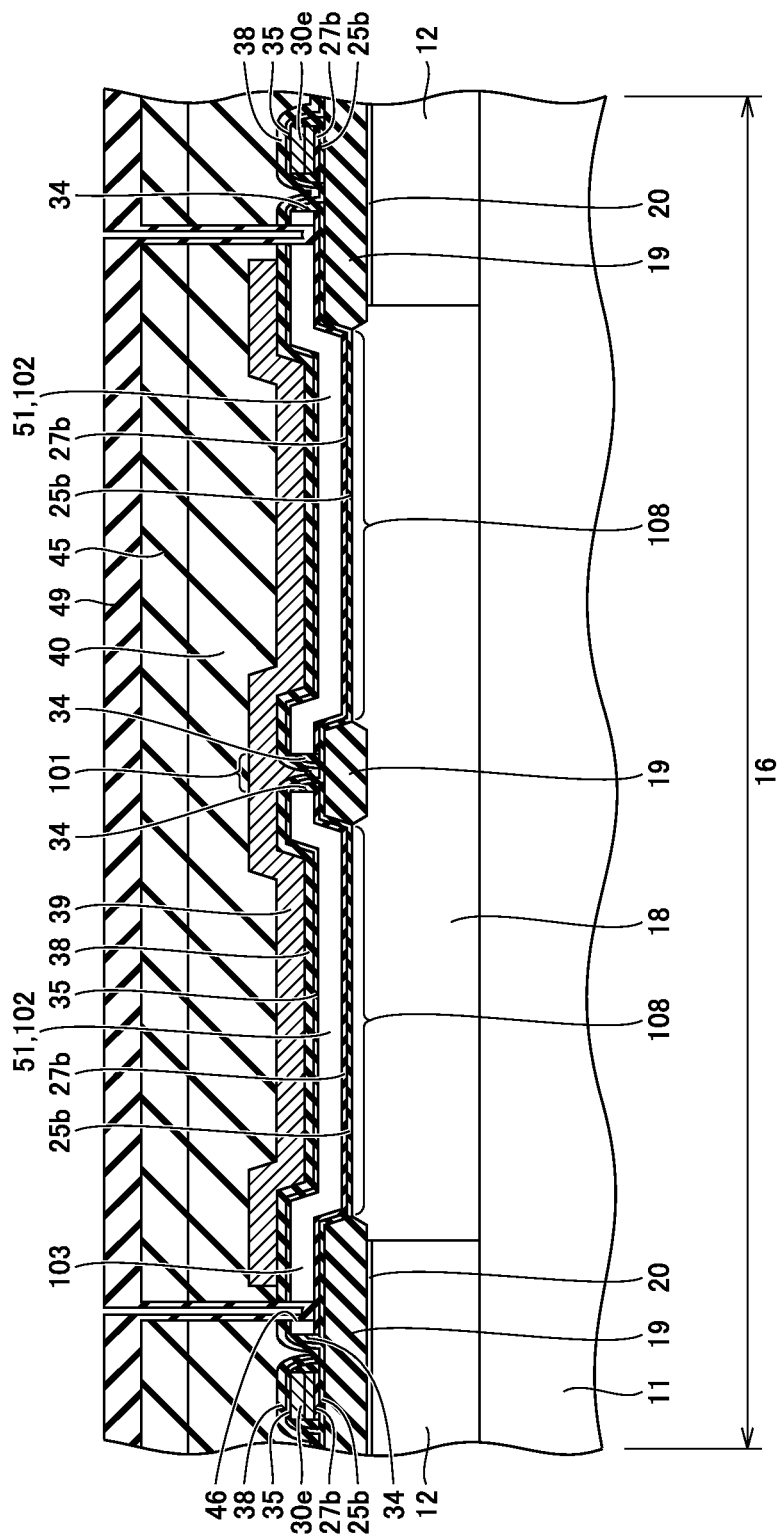
FIG. 87 is a schematic cross sectional view showing a tenth step of a method of fabricating the first region shown in FIG. 77 in the semiconductor pressure sensor of the sixth embodiment.

With reference to FIG. 87 and FIG. 73, as with the step of FIG. 27 and FIG. 28, first sealing film 49 and third interlayer insulation film 49b (the same layer) are formed all over pressure sensor region 16 and MOS region 17. For example, first sealing film 49 (sealing portion) formed in pressure sensor region 16 using the plasma CVD method closes at least a portion (for example, inner wall surface) of etching hole 46. Accordingly, void 50 is formed into vacuum chamber 51 having reduced pressure, and vacuum chamber 51 becomes a space closed from the outside and sealed against the outside by first sealing film 49 in etching hole 46.

Figure 88:
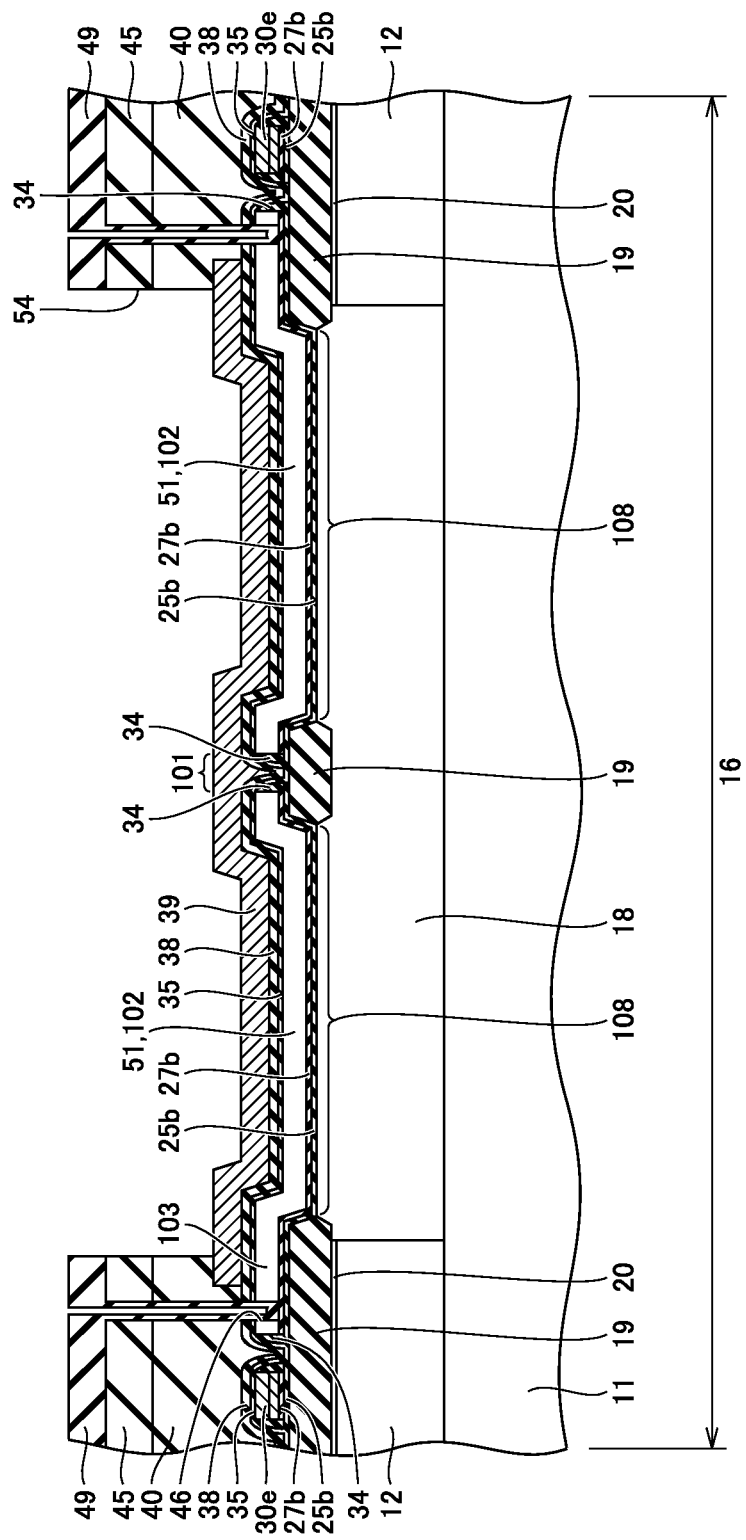
FIG. 88 is a schematic cross sectional view showing an eleventh step of the method of fabricating the first region shown in FIG. 77 in the semiconductor pressure sensor of the sixth embodiment.

With reference to FIG. 88 and FIG. 75, as with the step of FIG. 29 and FIG. 30, a pressure sensor opening 54 (opening) is formed in the portions of second interlayer insulation film 45 and first interlayer insulation film 40 in pressure sensor region 16 so as to expose movable electrode 39. Further, in MOS region 17, a pad opening 61 is formed to expose interconnection 43a.

Then, with reference to FIG. 77 and FIG. 49 again, as with the first embodiment, a silicon nitride film (not shown) to serve as the passivation film is formed to cover first sealing film 49 and third interlayer insulation film 49b. By patterning this in the same manner as in the first embodiment, passivation film 52a serving as a protection film is formed in MOS region 17, whereas second sealing film 52b further closing etching hole 46 is formed in pressure sensor region 16. Vacuum chamber 51 is sealed twice by first sealing film 49 and second sealing film 52b.

As described above, with reference to FIG. 88 and FIG. 77 particularly, according to the fabrication method in the present embodiment, detection anchor 101 divides movable electrode 39 into the plurality of movable electrode units 102, whereby one pair of adjacent movable electrode units 102 of the plurality of movable electrode units 102 divided are formed to share the same detection anchor 101.

It should be noted that apart from this, the steps of the fabrication method of the present embodiment are substantially the same as those of the first embodiment, so that the same elements are given the same reference characters and are not repeatedly described.

Next, the following describes function and effect of the present embodiment (particularly in comparison with the first to fourth embodiments). In addition to the same function and effect as those in the first embodiment, the present embodiment provides the following function and effect.

Also in the present embodiment, as with the fifth embodiment, the fixed electrode of pressure sensor region 16 is formed as diffusion layer fixed electrode 18 formed to extend from the surface of silicon substrate 11 into inside of silicon substrate 11. Diffusion layer fixed electrode 18 is formed as the same layer as n type well region 13, which is the diffusion layer of MOS region 17. Hence, even though the sacrifice film is formed as the same layer as gate electrode 30c, the same layer as the floating gate electrode of MOS region 17 does not need to be formed in pressure sensor region 16. Moreover, also in the present embodiment, as with the fifth embodiment, since the fixed electrode is formed in silicon substrate 11, thick field oxide film 19 does not need to be formed in the region in which the pressure sensor is formed, unlike the first embodiment.

Hence, also in the present embodiment, the height of detection pressure sensor 1010 relative to silicon substrate 11 in pressure sensor region 16 can be less than that in the first embodiment.

Moreover, in the present embodiment, detection anchor 101 is formed just above field oxide film 19. Accordingly, as with the fifth embodiment, a parasitic capacitance can be small in regions other than the pressure sensor formation region.

It should be noted that also in the present embodiment, the configurations described in the first to fourth embodiments may be applied appropriately in combination. For example, although detection anchor 101 has been illustrated in the description above, the present embodiment is applicable also to reference anchor 100 without any modification.

(Seventh Embodiment)

Figure 89:
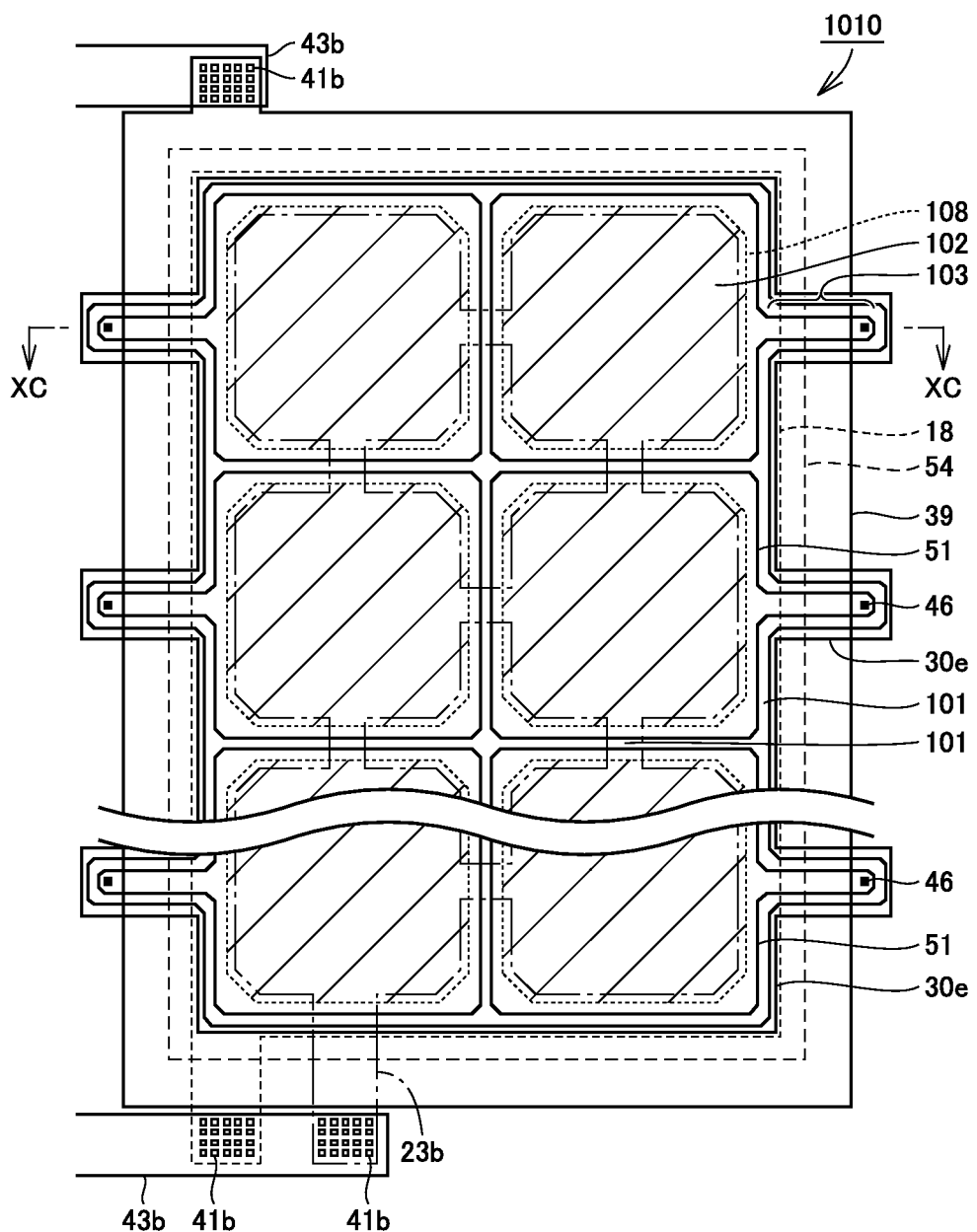
FIG. 89 is a schematic plan view showing a configuration of a detection pressure sensor of a seventh embodiment.
Figure 90:
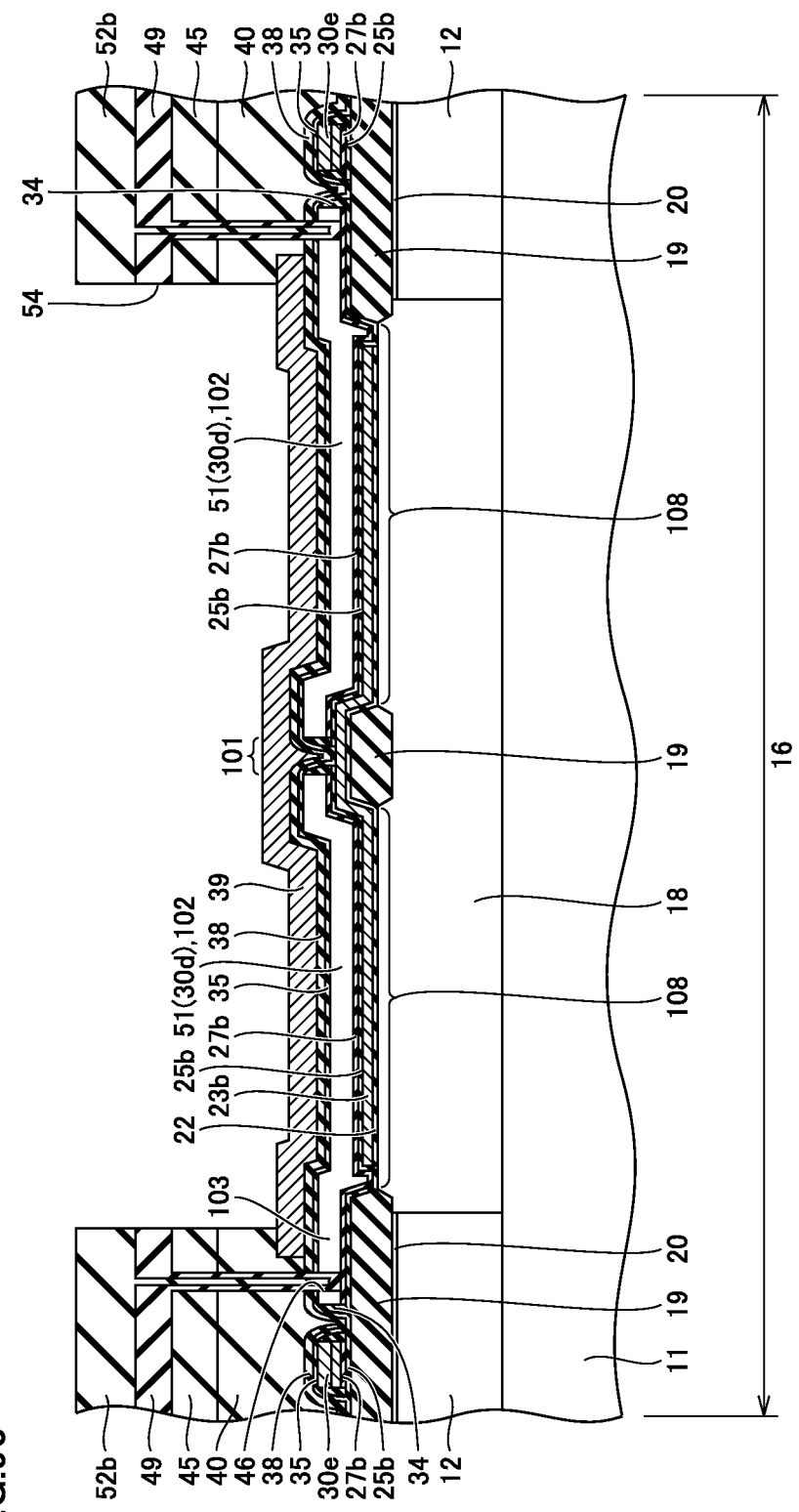
FIG. 90 is a schematic cross sectional view of a first region surrounded by a XC-XC line of FIG. 89.

With reference to FIG. 89 and FIG. 90, a semiconductor pressure sensor device 10 of the present embodiment basically has the same configuration as that of semiconductor pressure sensor device 10 of the sixth embodiment, particularly in terms of the pressure sensor region (detection pressure sensor 1010). However, in the present embodiment, in detection pressure sensor 1010, a fixed electrode 23b is formed as the same layer as a polycrystalline silicon film 23a serving as a floating gate electrode (shown in FIG. 49) of a MOS region 17. A vacuum chamber 51 is formed by removing a conductor film 30d (sacrifice film) serving as the same layer as a gate electrode 30c (shown in FIG. 49) of MOS region 17.

Fixed electrode 23b is formed on a surface (region corresponding to fixed electrode flat region 108 in each of the fifth and sixth embodiments) of, for example, an n type impurity region 18 (corresponding to diffusion layer fixed electrode 18 in each of the fifth and sixth embodiments) formed to extend from the surface of silicon substrate 11 to inside of silicon substrate 11, with a first gate oxide film 22 being interposed therebetween. This fixed electrode 23b extends from a portion on the surface of region 108 constituting the net pressure sensor onto a portion just above field oxide film 19 at the central portion of FIG. 90, and is therefore continuous to connect between regions overlapping with a plurality (two) of movable electrode units 102 obtained by the dividing by detection anchor 101 on field oxide film 19.

It should be noted that apart from this, the configuration of the present embodiment is substantially the same as that of the sixth embodiment, so that the same elements are given the same reference characters and are not repeatedly described.

The present embodiment also provides basically the same function and effect as those in the sixth embodiment. Moreover, as to features in the configuration of the present embodiment, the configurations described in the first to fourth embodiments may be applied appropriately in combination. For example, although detection anchor 101 has been illustrated in the description above, the present embodiment is applicable also to reference anchor 100 without any modification.

(Eighth Embodiment)

A detection pressure sensor 1100 included in a semiconductor pressure sensor device 10 of the present embodiment is an exemplary pressure sensor, and is different from detection pressure sensor 1010 of the first embodiment in the following points.

With reference to FIG. 91 to FIG. 94, semiconductor pressure sensor device 10 in a first example of the present embodiment has a configuration in which detection pressure sensor 1100 (FIG. 91 and FIG. 92) and reference pressure sensor 1000 (FIG. 93 and FIG. 94) are combined with each other as a pressure sensor (to be arranged side by side as shown in FIG. 32, for example).

Figure 91:
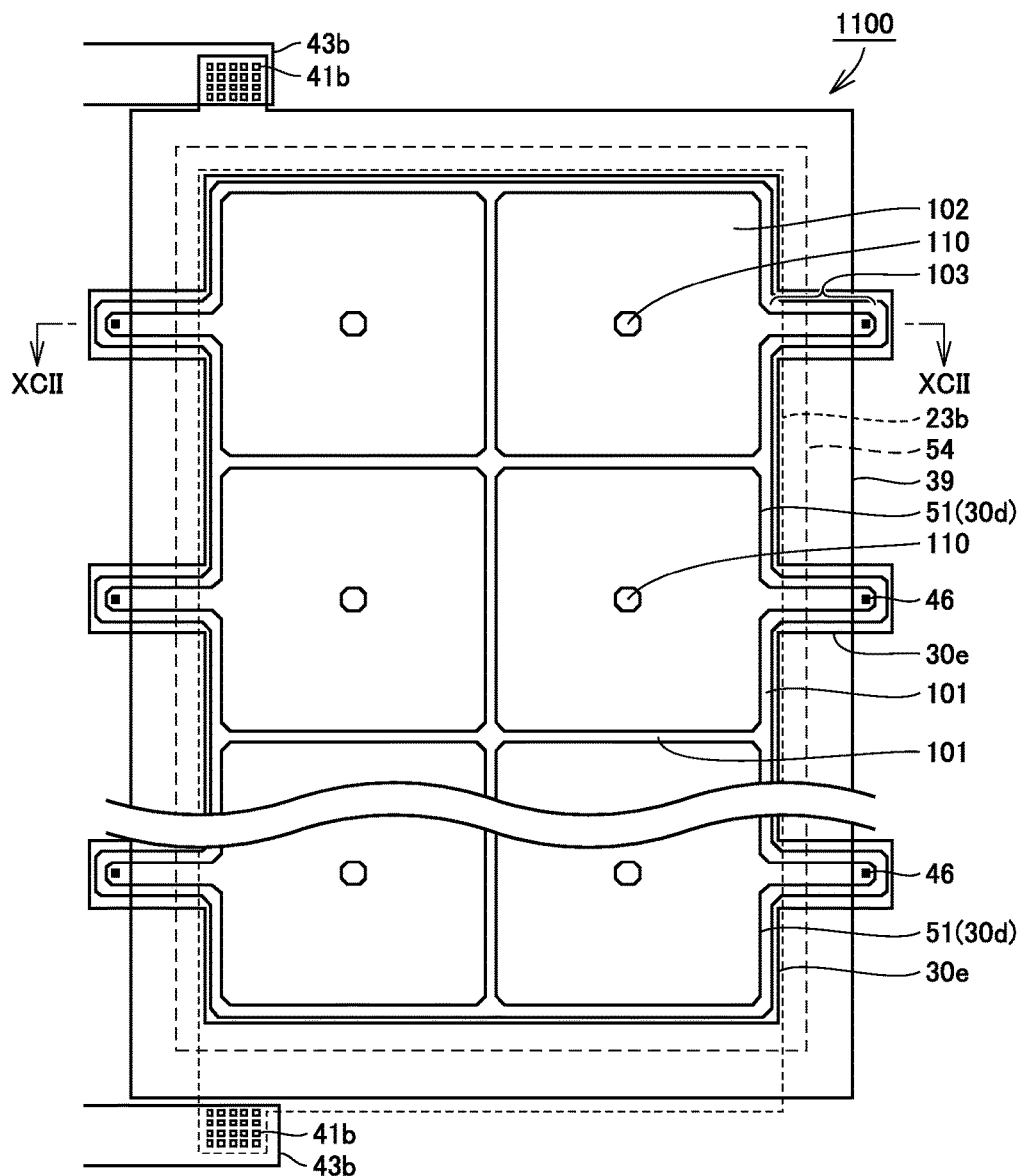
FIG. 91 is a schematic plan view showing a configuration of a detection pressure sensor in first and second examples of an eighth embodiment.

With reference to FIG. 91, detection pressure sensor 1100 basically has the same configuration as detection pressure sensor 1010 of the first embodiment. Namely, detection pressure sensor 1010 has a detection anchor 101 (first anchor) that divides into movable electrode units 102. However, in detection pressure sensor 1100, in addition to detection anchor 101, movable electrode 39 has a detection central anchor 110 (second anchor) serving as an anchor portion in each movable electrode unit 102.

Figure 92:
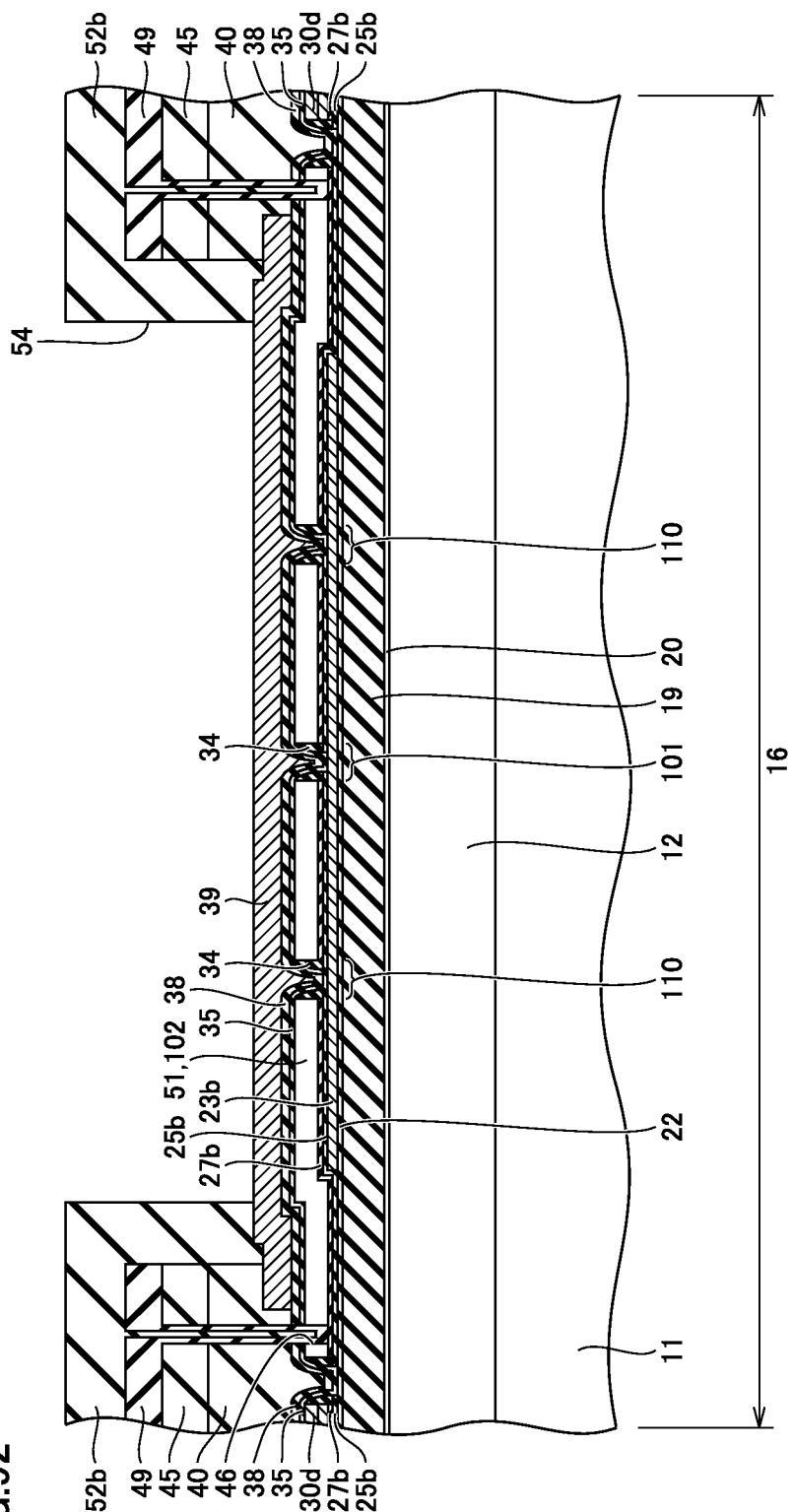
FIG. 92 is a schematic cross sectional view of a first region surrounded by a XCII-XCII line of FIG. 91.

Specifically, with reference to FIG. 92, in detection pressure sensor 1100, in addition to detection anchor 101, detection central anchor 110 is formed in movable electrode unit 102 (for example, the central portion).

Detection central anchor 110 is configured basically the same as detection anchor 101, and is configured such that movable electrode 39 extends downward (silicon substrate 11 side) to fill the opened portion of vacuum chamber 51 serving as the void. However, detection central anchor 110 is not formed as an end portion for which the opened portion of vacuum chamber 51 divides into movable electrode units 102, but is formed to constitute a planar shape (shape extending to spread by a certain area from a certain point as the center) within movable electrode unit 102. When viewed in a plan view, detection central anchor 110 preferably has a maximum size (diameter in the case of a circle; one side in the case of a square; or the like) of about not less than 4 µm. As a result, detection central anchor 110 is formed to have a pillar-like shape in movable electrode unit 102, for example.

Figure 93:
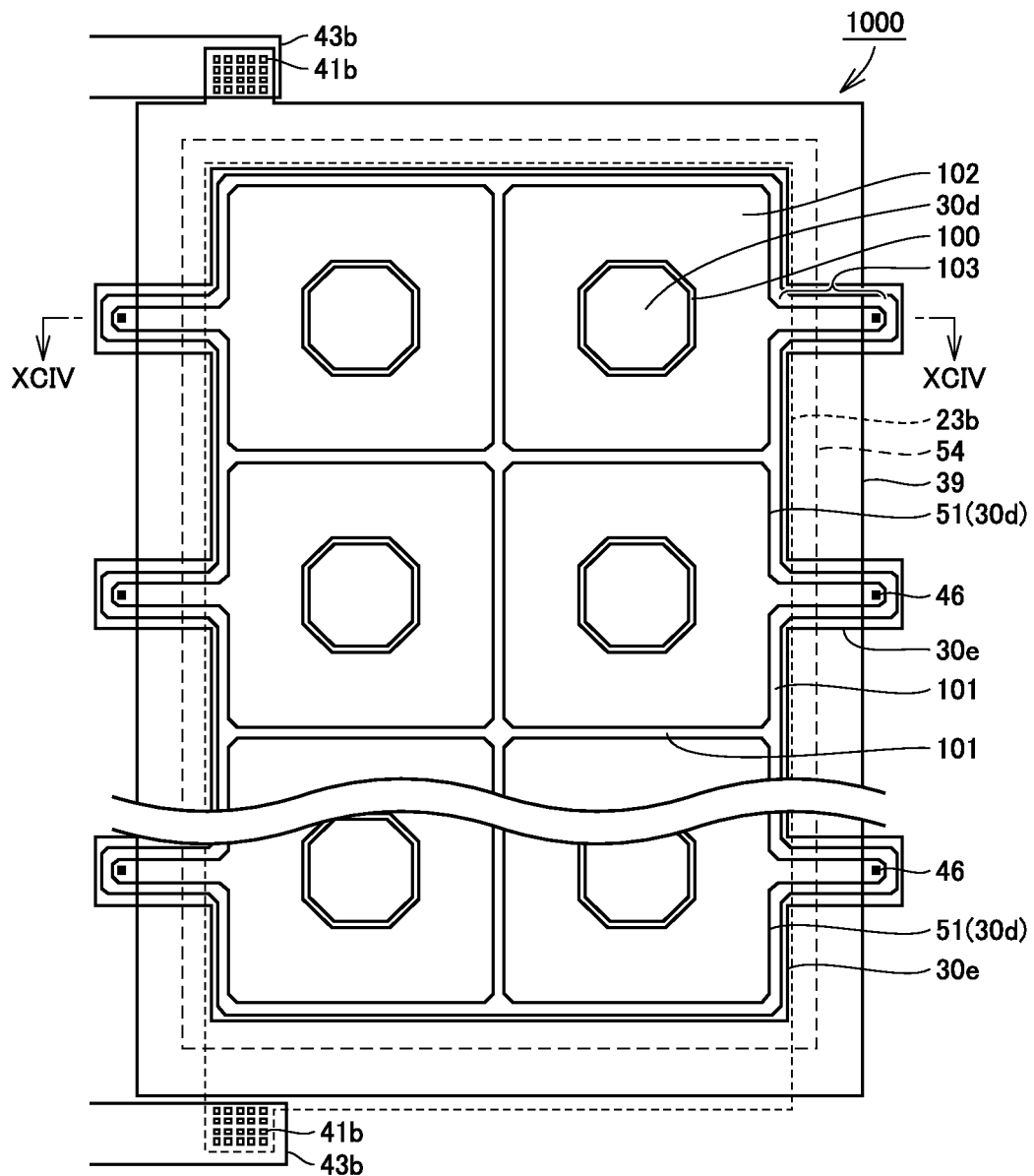
FIG. 93 is a schematic plan view showing a configuration of a reference pressure sensor in the first example of the eighth embodiment.
Figure 94:
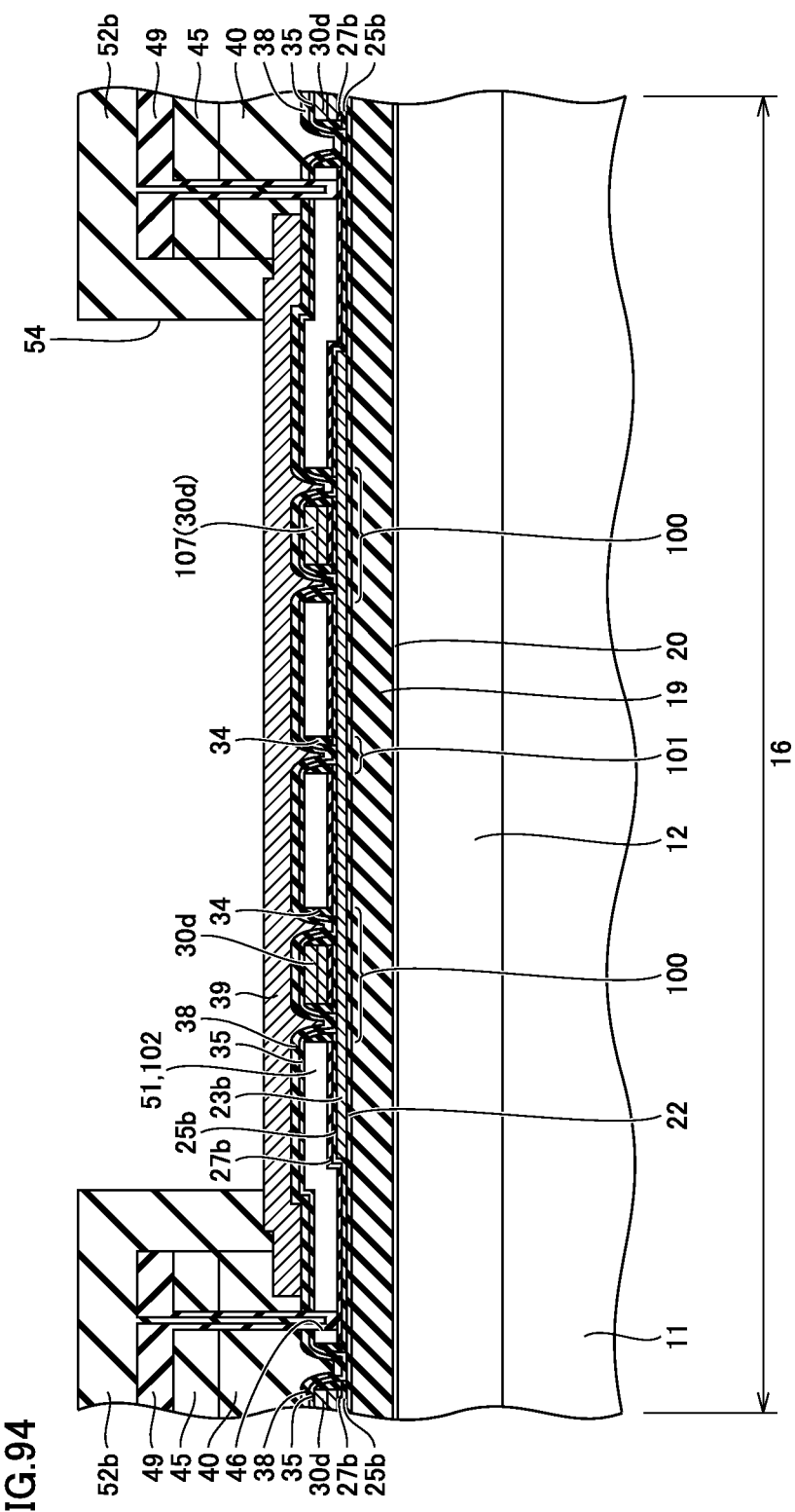
FIG. 94 is a schematic cross sectional view of a first region surrounded by a XCIV-XCIV line of FIG. 93.

With reference to FIG. 93 and FIG. 94, as with reference pressure sensor 1000 of the second embodiment, in reference pressure sensor 1000, in addition to detection anchor 101 (first anchor) that divides into movable electrode units 102, movable electrode 39 has reference anchor 100 (second anchor) serving as an anchor portion in each movable electrode unit 102. Although the structure of this reference pressure sensor 1000 is different from that in the second embodiment employing the rectangular planar shape in that the planar shape of reference anchor 100 is octagonal, the structure of this reference pressure sensor 1000 is basically the same as that of the second embodiment (FIG. 31 and FIG. 33) and is therefore not described in detail.

In the first example of the present embodiment, the anchor portion in movable electrode unit 102 of reference pressure sensor 1000, i.e., the area of reference anchor 100 is larger than the anchor portion in movable electrode unit 102 of detection pressure sensor 1100, i.e., the area of detection central anchor 110. Hence, in FIG. 93 and FIG. 94, one reference anchor 100 is formed in each movable electrode unit 102; however, a plurality of reference anchors 100 may be formed in each movable electrode unit 102.

With reference to FIG. 91, FIG. 92, FIG. 95, and FIG. 96, a semiconductor pressure sensor device 10 in a second example of the present embodiment has a configuration in which a detection pressure sensor 1100 (FIG. 91 and FIG. 92) and a reference pressure sensor 1000 (FIG. 95 and FIG. 96) are combined with each other as a pressure sensor (to be arranged side by side as shown in FIG. 32, for example). The configuration of detection pressure sensor 1100 is the same as that of the first example of the present embodiment, and is therefore not described in detail.

Figure 95:
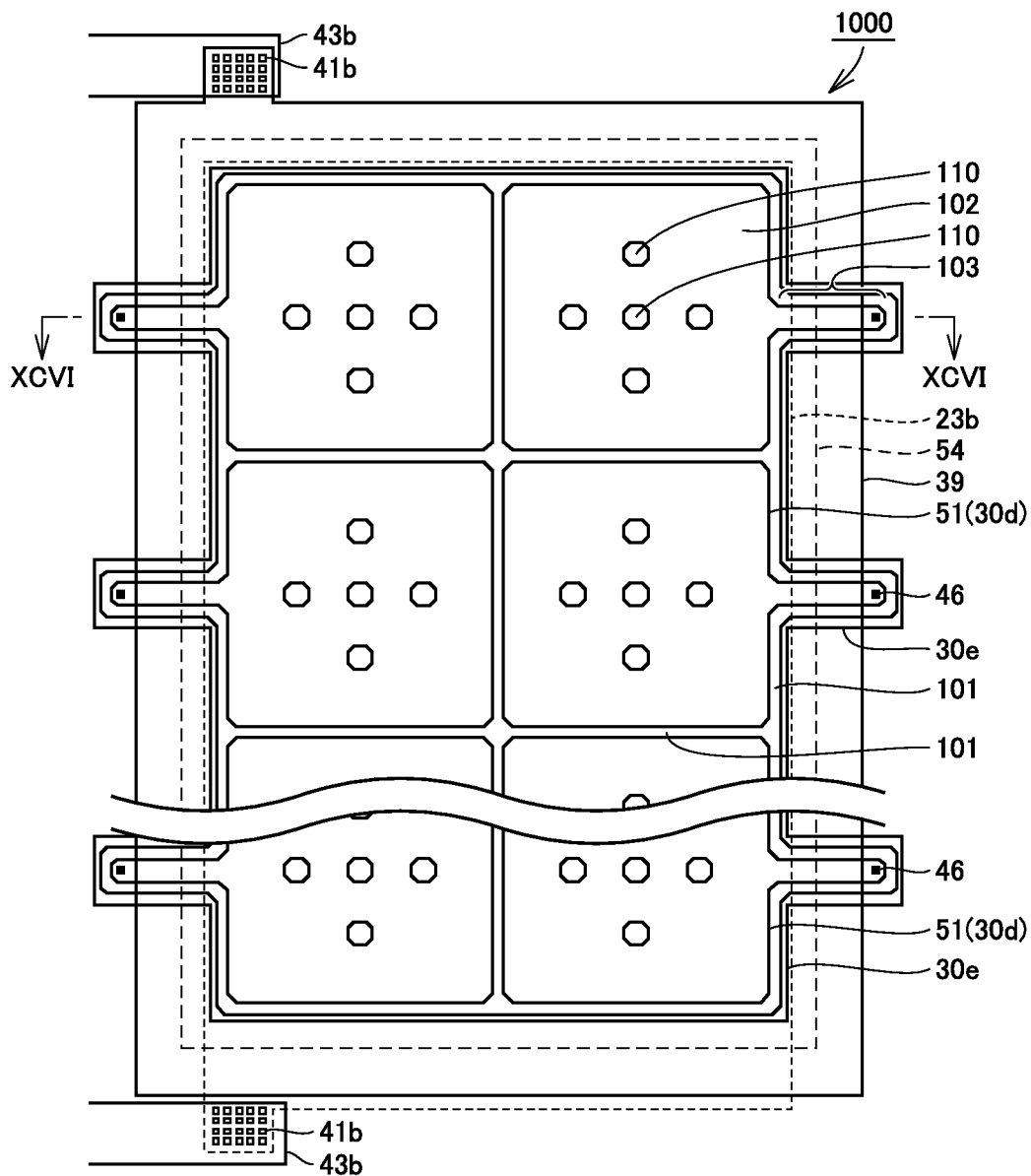
FIG. 95 is a schematic plan view showing a configuration of a reference pressure sensor in the second example of the eighth embodiment.
Figure 96:
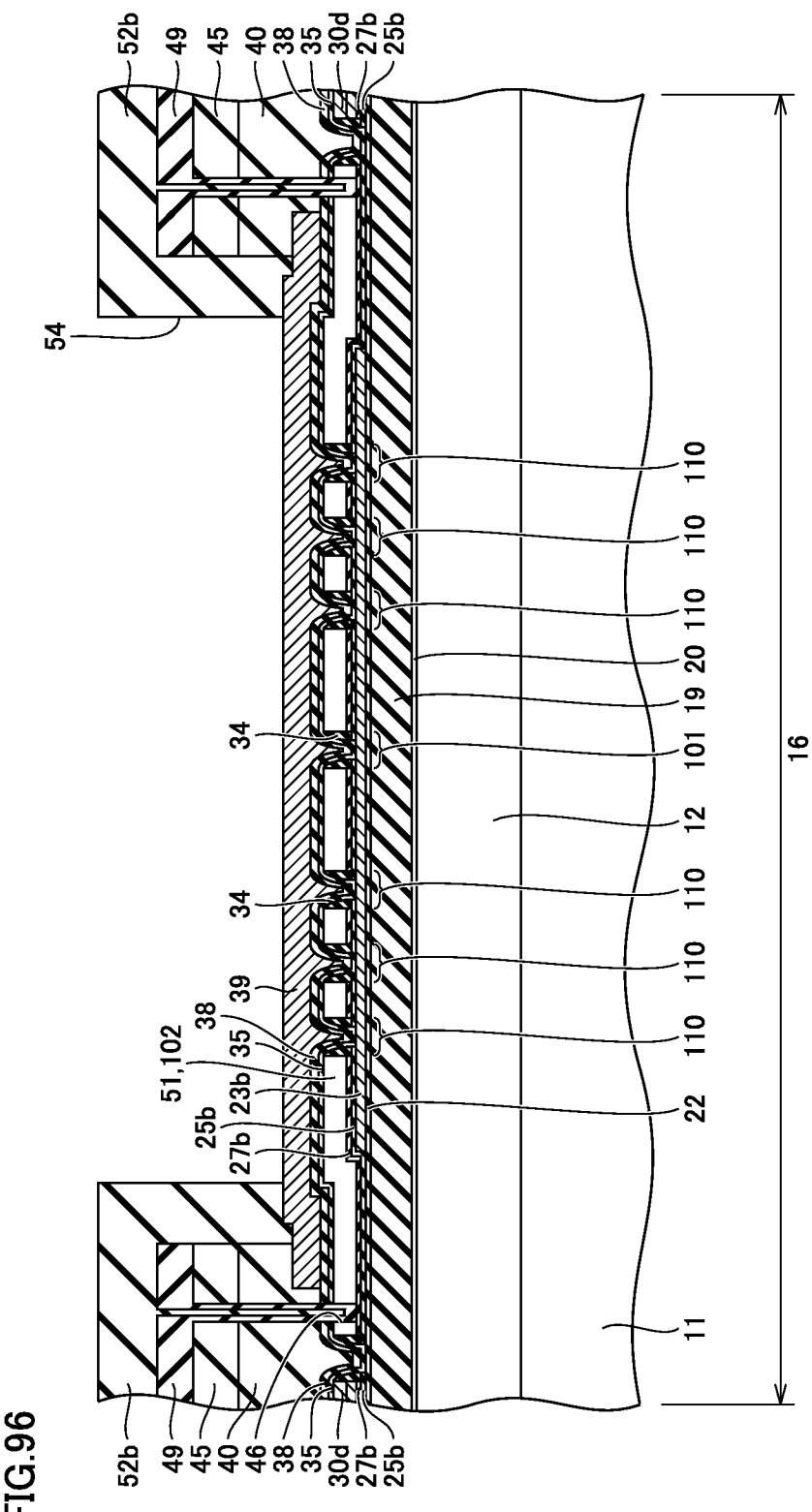
FIG. 96 is a schematic cross sectional view of a first region surrounded by a XCVI-XCVI line of FIG. 95.

With reference to FIG. 95 and FIG. 96, in reference pressure sensor 1000, in addition to detection anchor 101 (first anchor) that divides into movable electrode units 102, movable electrode 39 has a detection central anchor 110 (second anchor) as an anchor portion in each movable electrode unit 102. The structure of this detection central anchor 110 has the same pillar-like shape as detection central anchor 110 of the first example of the present embodiment (has a planar shape extending to spread by a certain area from a certain point as a center and a pillar-like shape extending downward in the thickness direction).

Also in the second example of the present embodiment, the anchor portion in movable electrode unit 102 of reference pressure sensor 1000, i.e., the area of detection central anchor 110 is larger than the anchor portion in movable electrode unit 102 of detection pressure sensor 1100, i.e., the area of detection central anchor 110. Hence, a larger number of (here, five) detection central anchors 110 are formed in movable electrode unit 102 of reference pressure sensor 1000, as compared with that in movable electrode unit 102 of detection pressure sensor 1100.

Regarding each of the points described above, each of the examples of the present embodiment is different from each of the embodiments described above; however, apart from this, the configuration of the present embodiment is substantially the same as that of the first embodiment and therefore the same elements are given the same reference characters and are not repeatedly described.

Next, the following describes function and effect of the present embodiment. Basically, in addition to the function and effect of each of the embodiments described above, the following function and effect are given.

In the present embodiment, the anchor portion (detection central anchor 110) configured such that movable electrode 39 fills the opened portion in the sacrifice film is also formed in movable electrode unit 102 of detection pressure sensor 1100 in a manner similar to movable electrode unit 102 of reference pressure sensor 1000. Accordingly, detection pressure sensor 1100 can be configured such that even when a distance between movable electrode 39 and fixed electrode 23b is changed by a change in pressure applied to movable electrode 39, a change in value of the sensor capacitance of the pressure sensor can be linear as compared with detection pressure sensor 1000 having no anchor portion in movable electrode unit 102. In other words, an abrupt change in value of the sensor capacitance caused by a change in distance between movable electrode 39 and fixed electrode 23b can be suppressed.

It should be noted that detection pressure sensor 1100 having the anchor portion in movable electrode unit 102 is less sensitive to a change in pressure applied to movable electrode 39 than detection pressure sensor 1010. To address this, the area of the anchor portion in movable electrode unit 102 of reference pressure sensor 1000 is made larger than the area of the anchor portion in movable electrode unit 102 of detection pressure sensor 1100. In this way, also in reference pressure sensor 1000, as with detection pressure sensor 1100, the capacitance value can be less likely to be changed according to a change in pressure. As a method of increasing the area of the anchor portion in movable electrode unit 102 of reference pressure sensor 1000 to be larger than the area of the anchor portion in movable electrode unit 102 of detection pressure sensor 1100, (a plurality of) loop-like reference anchor(s) 100 may be formed as shown in FIG. 93, or (a plurality of) detection central anchor(s) 110 having a pillar-like shape may be formed as shown in FIG. 95, for example.

Moreover, as to features in the configuration of the present embodiment, the configurations described in the first and third to sixth embodiments may be applied appropriately in combination. For example, in the description above, fixed electrode 23b is formed as the same layer as polycrystalline silicon film 23a serving as the floating gate electrode of the EPROM; however, as with the fifth and sixth embodiments, the fixed electrode may be formed as the same layer as n type well region 13 in which the EPROM is formed.

(Ninth Embodiment)

Movable electrode unit 102 may have the following configuration in the above-described semiconductor pressure sensor device 10 having the pressure sensor configured such that movable electrode 39 is divided into the plurality of movable electrode units 102 by detection anchor 101.

Figure 97:
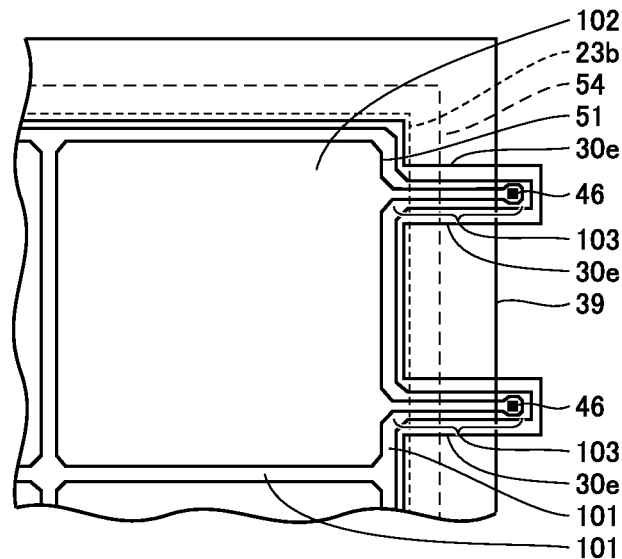
FIG. 97 is an enlarged schematic plan view of the same region as that of FIG. 4 in a first example of a ninth embodiment, i.e., a movable electrode unit.
Figure 98:
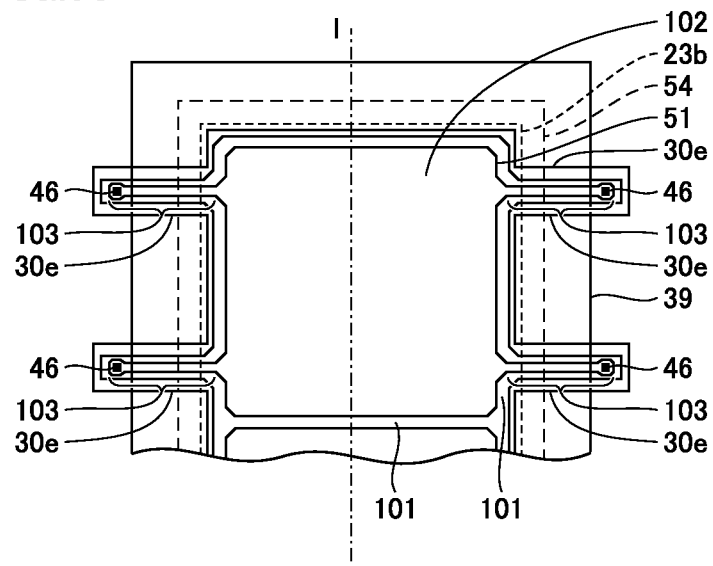
FIG. 98 is an enlarged schematic plan view of the same region as that of FIG. 4 in a second example of a ninth embodiment, i.e., a movable electrode unit.

With reference to FIG. 97 and FIG. 98, each of movable electrode units 102 of the first and second examples of the present embodiment has basically the same configuration as movable electrode unit 102 of the first embodiment shown in FIG. 1 and FIG. 4; however, a plurality of drawn regions 103 (two in FIG. 97 and four in FIG. 98) extend from one movable electrode unit 102. In this point, the present embodiment is different from the other embodiments in which only one drawn region 103 extends from one movable electrode unit 102.

More specifically, in the first example of the present embodiment, with reference to FIG. 97, at the right end portion of movable electrode unit 102, two drawn regions 103 extend with a space being interposed therebetween in the vertical direction in FIG. 97. Each drawn region 103 is provided with an etching hole 46.

On the other hand, in the second example of the present embodiment, with reference to FIG. 98, a total of four drawn regions 103 extend symmetrical to one another with respect to central line 1 of movable electrode unit 102 when viewed in a plan view, in such a manner that two drawn regions 103 are provided, at each of the right and left end portions of movable electrode unit 102 facing each other, with a space interposed therebetween in the vertical direction of FIG. 98. Each of drawn regions 103 is provided with etching hole 46. Therefore, etching holes 46 are formed at the locations at which they are symmetrical to each other with respect to central line 1.

Regarding this point, the present embodiment is different from each of the above-described embodiments; however, the other points are basically the same as those in each of the above-described embodiments and therefore the same elements are given the same reference characters and are not repeatedly described.

Next, the following describes function and effect of the present embodiment. Basically, in addition to the function and effect of each of the embodiments described above, the following function and effect are given.

For example, as shown in FIG. 97, the plurality of etching holes 46 are formed at one side (right side) of movable electrode unit 102 when viewed in a plan view, whereby the sacrifice film communicating with etching hole 46 can be etched and removed in a shorter period of time via etching holes 46. This is because the number of etching holes 46 per movable electrode unit 102 is increased as compared with that in the first embodiment and the like.

Further, when the plurality of etching holes 46 are formed at the locations symmetrical to each other with respect to central line 1 of movable electrode unit 102 as shown in FIG. 98, the number of etching holes 46 per movable electrode unit 102 is increased and balance becomes good in terms of the locations of etching holes 46 when viewed in a plan view. Accordingly, efficiency of removing the sacrifice film is further improved, thereby further shortening time required to remove the sacrifice film. Accordingly, the thickness of the protection film (during etching) in the step of forming etching holes 46 can be thin.

The disclosures of the embodiments described above can be combined with each other appropriately unless technically contradictory even when not clearly stated in the description above.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor pressure sensor comprising:
    first region and second region each defined in a surface of a semiconductor substrate;
    a pressure sensor formed in said first region and including a fixed electrode, a void, and a movable electrode, said void being provided above said fixed electrode, said movable electrode being provided above said void;
    a transistor formed in said second region and including a floating gate electrode;
    an interlayer insulation film formed to cover said pressure sensor and said transistor;
    a hole formed in said interlayer insulation film and communicating with said void;
    a sealing portion sealing said void; and
    an opening formed in said interlayer insulation film to expose said movable electrode,
    said fixed electrode being formed as the same layer as a diffusion layer formed to extend from the surface of said semiconductor substrate to inside of said semiconductor substrate,
    said void being formed by removing a sacrifice film, which is a region constituted of the same film as said floating gate electrode,
    said movable electrode including an anchor portion which supports said movable electrode via said void relative to said fixed electrode and in which said sacrifice film is at least partially opened,
    said anchor portion having a first anchor provided to divide said movable electrode into a plurality of movable electrode units when viewed in a plan view such that one pair of adjacent movable electrode units of said plurality of movable electrode units divided share the same first anchor,
    said void including a drawn region extending to be drawn from an overlapping region to a non-overlapping region, said overlapping region overlapping with said movable electrode when viewed in a plan view, said non-overlapping region being external to said overlapping region, and
    said hole being provided in said first region, and said hole being formed in said non-overlapping region when viewed in a plan view.

2. The semiconductor pressure sensor according to claim 1, wherein
said pressure sensor has a configuration in which a detection pressure sensor and a reference pressure sensor are combined with each other,
said anchor portion has both said first anchor and a second anchor formed in each of said movable electrode units, and
said detection pressure sensor has only said first anchor, and said reference pressure sensor has said first and second anchors.

3. The semiconductor pressure sensor according to claim 1, wherein
said pressure sensor has a configuration in which a detection pressure sensor and a reference pressure sensor are combined with each other,
said anchor portion has both said first anchor and a second anchor formed in each of said movable electrode units, and
each of said detection pressure sensor and said reference pressure sensor has said first and second anchors.

4. The semiconductor pressure sensor according to claim 3, wherein said anchor portion in said movable electrode unit of said reference pressure sensor has an area larger than an area of said anchor portion in said movable electrode unit of said detection pressure sensor.

5. The semiconductor pressure sensor according to claim 1, wherein a region in which said sacrifice film remains is included in at least a portion of said anchor portion.

6. The semiconductor pressure sensor according to claim 1, wherein said plurality of movable electrode units are provided symmetrical to each other with respect to said first anchor when viewed in a plan view.

7. The semiconductor pressure sensor according to claim 1, wherein each of said movable electrode units is provided with a plurality of said holes at locations symmetrical to each other with respect to a central line of said movable electrode unit when viewed in a plan view.

8. The semiconductor pressure sensor according to claim 1, wherein said hole is surrounded by the same layer as said movable electrode when viewed in a plan view.

9. The semiconductor pressure sensor according to claim 1, wherein said anchor portion is formed just above a field oxide film.

10. The semiconductor pressure sensor according to claim 1, wherein said sealing portion is formed as the same layer as a protection film formed on said interlayer insulation film in said second region.

11. A semiconductor pressure sensor comprising:
first region and second region each defined in a surface of a semiconductor substrate;
a pressure sensor formed in said first region and including a fixed electrode, a void, and a movable electrode, said void being provided above said fixed electrode, said movable electrode being provided above said void;
a transistor formed in said second region and including, as a gate electrode, a first electrode and a second electrode, said second electrode being provided above said first electrode;
an interlayer insulation film formed to cover said pressure sensor and said transistor;
a hole formed in said interlayer insulation film and communicating with said void;
a sealing portion sealing said void; and
an opening formed in said interlayer insulation film to expose said movable electrode,
said fixed electrode being formed as the same layer as a diffusion layer formed to extend from the surface of said semiconductor substrate to inside of said semiconductor substrate,
said void being formed by removing a sacrifice film, which is a region constituted of the same film as said second electrode,
said movable electrode including an anchor portion which supports said movable electrode via said void relative to said fixed electrode and in which said sacrifice film is at least partially opened,
said anchor portion having a first anchor provided to divide said movable electrode into a plurality of movable electrode units when viewed in a plan view such that one pair of adjacent movable electrode units of said plurality of movable electrode units divided share the same first anchor,
said void including a drawn region extending to be drawn from an overlapping region to a non-overlapping region, said overlapping region overlapping with said movable electrode when viewed in a plan view, said non-overlapping region being external to said overlapping region, and
said hole being provided in said first region, and said hole being formed in said non-overlapping region when viewed in a plan view.

* * * * *